US009030858B2

(12) United States Patent
Or-Bach et al.

(10) Patent No.: US 9,030,858 B2
(45) Date of Patent: *May 12, 2015

(54) SEMICONDUCTOR DEVICE AND STRUCTURE

(71) Applicant: Monolithic 3D Inc., San Jose, CA (US)

(72) Inventors: Zvi Or-Bach, San Jose, CA (US);
Deepak Sekar, San Jose, CA (US);
Brian Cronquist, San Jose, CA (US);
Paul Lim, Monte Sereno, CA (US)

(73) Assignee: Monolithic 3D Inc., San Jose, CA (US)

( * ) Notice: Subject to any disclaimer, the term of this patent is extended or adjusted under 35 U.S.C. 154(b) by 232 days.

This patent is subject to a terminal disclaimer.

(21) Appl. No.: 13/624,968

(22) Filed: Sep. 23, 2012

(65) Prior Publication Data

US 2013/0083589 A1 Apr. 4, 2013

Related U.S. Application Data

(63) Continuation of application No. 13/251,271, filed on Oct. 2, 2011, now Pat. No. 8,687,399.

(51) Int. Cl.
*G11C 11/34* (2006.01)
*H01L 27/108* (2006.01)
(Continued)

(52) U.S. Cl.
CPC .......... *H01L 27/10873* (2013.01); *G11C 5/025* (2013.01); *G11C 5/063* (2013.01); *H01L 27/0688* (2013.01); *H01L 29/7841* (2013.01); *H01L 27/10802* (2013.01); *H01L 27/10894* (2013.01); *H01L 27/10897* (2013.01); *G11C 11/406* (2013.01); *H01L 24/16* (2013.01); *H01L 24/94* (2013.01); *H01L 2224/16145* (2013.01);
*H01L 2224/16225* (2013.01); *H01L 2224/94* (2013.01); *H01L 2225/06517* (2013.01); *H01L 2924/10253* (2013.01);
(Continued)

(58) Field of Classification Search
USPC .............................................. 365/51, 63, 174
See application file for complete search history.

(56) References Cited

U.S. PATENT DOCUMENTS 3,007,090 A 10/1961 Rutz
3,819,959 A 6/1974 Chang et al.
(Continued)

FOREIGN PATENT DOCUMENTS

EP 1267594 A2 12/2002
EP 1909311 A2 4/2008
WO PCT/US2008/063483 5/2008

OTHER PUBLICATIONS

Huet, K., et al., "Ultra Low Thermal Budget Anneals for 3D Memories: Access Device Formation," Ion Implantation Technology 2012, AIP Conf Proceedings 1496, 135-138 (2012).
(Continued)

*Primary Examiner* — Son Dinh

(57) ABSTRACT

A semiconductor device, including: a first semiconductor layer including first transistors, wherein the first transistors are interconnected by at least one metal layer including aluminum or copper; and a second mono-crystallized semiconductor layer including second transistors and overlaying the at least one metal layer, wherein the at least one metal layer is in-between the first semiconductor layer and the second mono-crystallized semiconductor layer, wherein the second mono-crystallized semiconductor layer is less than 100 nm in thickness, and wherein the second transistors include horizontally oriented transistors.

25 Claims, 81 Drawing Sheets

(51) Int. Cl.

| | | |
|---|---|---|
| G11C 5/02 | (2006.01) | |
| G11C 5/06 | (2006.01) | |
| H01L 27/06 | (2006.01) | |
| H01L 29/78 | (2006.01) | |
| G11C 11/406 | (2006.01) | |
| H01L 23/00 | (2006.01) | |
| H01L 27/02 | (2006.01) | |

(52) U.S. Cl.
CPC .............. *H01L 2924/1431* (2013.01); *H01L 2924/1434* (2013.01); *H01L 2225/06513* (2013.01); *H01L 2225/06541* (2013.01); *H01L 2225/06565* (2013.01); *H01L 27/0203* (2013.01); *H01L 29/785* (2013.01); *G11C 2211/4016* (2013.01)

(56) References Cited

U.S. PATENT DOCUMENTS

| | | |
|---|---|---|
| 4,197,555 A | 4/1980 | Uehara et al. |
| 4,400,715 A | 8/1983 | Barbee et al. |
| 4,487,635 A | 12/1984 | Kugimiya et al. |
| 4,522,657 A | 6/1985 | Rohatgi et al. |
| 4,612,083 A | 9/1986 | Yasumoto et al. |
| 4,643,950 A | 2/1987 | Ogura et al. |
| 4,704,785 A | 11/1987 | Curran |
| 4,711,858 A | 12/1987 | Harder et al. |
| 4,721,885 A | 1/1988 | Brodie |
| 4,732,312 A | 3/1988 | Kennedy et al. |
| 4,733,288 A | 3/1988 | Sato |
| 4,829,018 A | 5/1989 | Wahlstrom |
| 4,854,986 A | 8/1989 | Raby |
| 4,866,304 A | 9/1989 | Yu |
| 4,939,568 A | 7/1990 | Kato et al. |
| 4,956,307 A | 9/1990 | Pollack et al. |
| 5,012,153 A | 4/1991 | Atkinson et al. |
| 5,032,007 A | 7/1991 | Silverstein et al. |
| 5,047,979 A | 9/1991 | Leung |
| 5,087,585 A | 2/1992 | Hayashi |
| 5,093,704 A | 3/1992 | Saito et al. |
| 5,106,775 A | 4/1992 | Kaga et al. |
| 5,152,857 A | 10/1992 | Ito et al. |
| 5,162,879 A | 11/1992 | Gill |
| 5,217,916 A | 6/1993 | Anderson et al. |
| 5,250,460 A | 10/1993 | Yamagata et al. |
| 5,258,643 A | 11/1993 | Cohen |
| 5,265,047 A | 11/1993 | Leung et al. |
| 5,266,511 A | 11/1993 | Takao |
| 5,277,748 A | 1/1994 | Sakaguchi et al. |
| 5,286,670 A | 2/1994 | Kang et al. |
| 5,294,556 A | 3/1994 | Kawamura |
| 5,308,782 A | 5/1994 | Mazure et al. |
| 5,312,771 A | 5/1994 | Yonehara |
| 5,317,236 A | 5/1994 | Zavracky et al. |
| 5,324,980 A | 6/1994 | Kusunoki |
| 5,355,022 A | 10/1994 | Sugahara et al. |
| 5,371,037 A | 12/1994 | Yonehara |
| 5,374,564 A | 12/1994 | Bruel |
| 5,374,581 A | 12/1994 | Ichikawa et al. |
| 5,424,560 A | 6/1995 | Norman et al. |
| 5,475,280 A | 12/1995 | Jones et al. |
| 5,478,762 A | 12/1995 | Chao |
| 5,485,031 A | 1/1996 | Zhang et al. |
| 5,498,978 A | 3/1996 | Takahashi et al. |
| 5,527,423 A | 6/1996 | Neville et al. |
| 5,535,342 A | 7/1996 | Taylor |
| 5,554,870 A | 9/1996 | Fitch et al. |
| 5,563,084 A | 10/1996 | Ramm et al. |
| 5,583,349 A | 12/1996 | Norman et al. |
| 5,583,350 A | 12/1996 | Norman et al. |
| 5,594,563 A | 1/1997 | Larson |
| 5,604,137 A | 2/1997 | Yamazaki et al. |
| 5,617,991 A | 4/1997 | Pramanick et al. |
| 5,627,106 A | 5/1997 | Hsu |
| 5,656,548 A | 8/1997 | Zavracky et al. |
| 5,656,553 A | 8/1997 | Leas et al. |
| 5,670,411 A | 9/1997 | Yonehara et al. |
| 5,681,756 A | 10/1997 | Norman et al. |
| 5,695,557 A | 12/1997 | Yamagata et al. |
| 5,701,027 A | 12/1997 | Gordon et al. |
| 5,707,745 A | 1/1998 | Forrest et al. |
| 5,714,395 A | 2/1998 | Bruel |
| 5,721,160 A | 2/1998 | Forrest et al. |
| 5,737,748 A | 4/1998 | Shigeeda |
| 5,739,552 A | 4/1998 | Kimura et al. |
| 5,744,979 A | 4/1998 | Goetting |
| 5,748,161 A | 5/1998 | Lebby et al. |
| 5,757,026 A | 5/1998 | Forrest et al. |
| 5,770,881 A | 6/1998 | Pelella et al. |
| 5,781,031 A | 7/1998 | Bertin et al. |
| 5,829,026 A | 10/1998 | Leung et al. |
| 5,835,396 A | 11/1998 | Zhang |
| 5,854,123 A | 12/1998 | Sato et al. |
| 5,861,929 A | 1/1999 | Spitzer |
| 5,877,070 A | 3/1999 | Goesele et al. |
| 5,882,987 A | 3/1999 | Srikrishnan |
| 5,883,525 A | 3/1999 | Tavana et al. |
| 5,889,903 A | 3/1999 | Rao |
| 5,893,721 A | 4/1999 | Huang et al. |
| 5,915,167 A | 6/1999 | Leedy |
| 5,937,312 A | 8/1999 | Iyer et al. |
| 5,943,574 A | 8/1999 | Tehrani et al. |
| 5,952,680 A | 9/1999 | Strite |
| 5,952,681 A | 9/1999 | Chen |
| 5,965,875 A | 10/1999 | Merrill |
| 5,977,579 A | 11/1999 | Noble |
| 5,977,961 A | 11/1999 | Rindal |
| 5,980,633 A | 11/1999 | Yamagata et al. |
| 5,985,742 A | 11/1999 | Henley et al. |
| 5,998,808 A | 12/1999 | Matsushita |
| 6,001,693 A | 12/1999 | Yeouchung et al. |
| 6,009,496 A | 12/1999 | Tsai |
| 6,020,252 A | 2/2000 | Aspar et al. |
| 6,020,263 A | 2/2000 | Shih et al. |
| 6,027,958 A | 2/2000 | Vu et al. |
| 6,030,700 A | 2/2000 | Forrest et al. |
| 6,052,498 A | 4/2000 | Paniccia |
| 6,054,370 A | 4/2000 | Doyle |
| 6,057,212 A | 5/2000 | Chan et al. |
| 6,071,795 A | 6/2000 | Cheung et al. |
| 6,075,268 A | 6/2000 | Gardner et al. |
| 6,103,597 A | 8/2000 | Aspar et al. |
| 6,111,260 A | 8/2000 | Dawson et al. |
| 6,125,217 A | 9/2000 | Paniccia et al. |
| 6,153,495 A | 11/2000 | Kub et al. |
| 6,191,007 B1 | 2/2001 | Matsui et al. |
| 6,222,203 B1 | 4/2001 | Ishibashi et al. |
| 6,229,161 B1 | 5/2001 | Nemati et al. |
| 6,242,324 B1 | 6/2001 | Kub et al. |
| 6,242,778 B1 | 6/2001 | Marmillion et al. |
| 6,259,623 B1 | 7/2001 | Takahashi |
| 6,264,805 B1 | 7/2001 | Forrest et al. |
| 6,281,102 B1 | 8/2001 | Cao et al. |
| 6,294,018 B1 | 9/2001 | Hamm et al. |
| 6,306,705 B1 | 10/2001 | Parekh et al. |
| 6,321,134 B1 | 11/2001 | Henley et al. |
| 6,322,903 B1 | 11/2001 | Siniaguine et al. |
| 6,331,468 B1 | 12/2001 | Aronowitz et al. |
| 6,331,790 B1 | 12/2001 | Or-Bach et al. |
| 6,353,492 B2 | 3/2002 | McClelland et al. |
| 6,355,501 B1 | 3/2002 | Fung et al. |
| 6,358,631 B1 | 3/2002 | Forrest et al. |
| 6,365,270 B2 | 4/2002 | Forrest et al. |
| 6,376,337 B1 | 4/2002 | Wang et al. |
| 6,380,046 B1 | 4/2002 | Yamazaki |
| 6,392,253 B1 | 5/2002 | Saxena |
| 6,417,108 B1 | 7/2002 | Akino et al. |
| 6,420,215 B1 | 7/2002 | Knall et al. |
| 6,423,614 B1 | 7/2002 | Doyle |
| 6,429,481 B1 | 8/2002 | Mo et al. |
| 6,429,484 B1 | 8/2002 | Yu |
| 6,430,734 B1 | 8/2002 | Zahar |
| 6,475,869 B1 | 11/2002 | Yu |

(56) References Cited

U.S. PATENT DOCUMENTS

| | | |
|---|---|---|
| 6,476,493 B2 | 11/2002 | Or-Bach et al. |
| 6,479,821 B1 | 11/2002 | Hawryluk et al. |
| 6,515,511 B2 | 2/2003 | Sugibayashi et al. |
| 6,526,559 B2 | 2/2003 | Schiefele et al. |
| 6,528,391 B1 | 3/2003 | Henley et al. |
| 6,534,352 B1 | 3/2003 | Kim |
| 6,534,382 B1 | 3/2003 | Sakaguchi et al. |
| 6,544,837 B1 | 4/2003 | Divakauni et al. |
| 6,545,314 B2 | 4/2003 | Forbes et al. |
| 6,555,901 B1 | 4/2003 | Yoshihara et al. |
| 6,563,139 B2 | 5/2003 | Hen |
| 6,580,289 B2 | 6/2003 | Cox |
| 6,600,173 B2 | 7/2003 | Tiwari |
| 6,620,659 B2 | 9/2003 | Emmma et al. |
| 6,624,046 B1 | 9/2003 | Zavracky et al. |
| 6,627,518 B1 | 9/2003 | Inoue et al. |
| 6,630,713 B2 | 10/2003 | Geusic |
| 6,635,552 B1 | 10/2003 | Gonzalez |
| 6,635,588 B1 | 10/2003 | Hawryluk et al. |
| 6,638,834 B2 | 10/2003 | Gonzalez |
| 6,642,744 B2 | 11/2003 | Or-Bach et al. |
| 6,653,209 B1 | 11/2003 | Yamagata |
| 6,661,085 B2 | 12/2003 | Kellar et al. |
| 6,677,204 B2 | 1/2004 | Cleeves et al. |
| 6,686,253 B2 | 2/2004 | Or-Bach |
| 6,703,328 B2 | 3/2004 | Tanaka et al. |
| 6,756,633 B2 | 6/2004 | Wang et al. |
| 6,756,811 B2 | 6/2004 | Or-Bach |
| 6,759,282 B2 | 7/2004 | Campbell et al. |
| 6,762,076 B2 | 7/2004 | Kim et al. |
| 6,774,010 B2 | 8/2004 | Chu et al. |
| 6,805,979 B2 | 10/2004 | Ogura et al. |
| 6,806,171 B1 | 10/2004 | Ulyashin et al. |
| 6,809,009 B2 | 10/2004 | Aspar et al. |
| 6,815,781 B2 | 11/2004 | Vyvoda et al. |
| 6,819,136 B2 | 11/2004 | Or-Bach |
| 6,821,826 B1 | 11/2004 | Chan et al. |
| 6,841,813 B2 | 1/2005 | Walker et al. |
| 6,844,243 B1 | 1/2005 | Gonzalez |
| 6,864,534 B2 | 3/2005 | Ipposhi et al. |
| 6,875,671 B2 | 4/2005 | Faris |
| 6,882,572 B2 | 4/2005 | Wang et al. |
| 6,888,375 B2 | 5/2005 | Feng et al. |
| 6,917,219 B2 | 7/2005 | New |
| 6,927,431 B2 | 8/2005 | Gonzalez |
| 6,930,511 B2 | 8/2005 | Or-Bach |
| 6,943,067 B2 | 9/2005 | Greenlaw |
| 6,943,407 B2 | 9/2005 | Ouyang et al. |
| 6,949,421 B1 | 9/2005 | Padmanabhan et al. |
| 6,953,956 B2 | 10/2005 | Or-Bach et al. |
| 6,967,149 B2 | 11/2005 | Meyer et al. |
| 6,985,012 B2 | 1/2006 | Or-Bach |
| 6,989,687 B2 | 1/2006 | Or-Bach |
| 6,995,430 B2 | 2/2006 | Langdo et al. |
| 6,995,456 B2 | 2/2006 | Nowak |
| 7,015,719 B1 | 3/2006 | Feng et al. |
| 7,016,569 B2 | 3/2006 | Mule et al. |
| 7,018,875 B2 | 3/2006 | Madurawe |
| 7,019,557 B2 | 3/2006 | Madurawe |
| 7,043,106 B2 | 5/2006 | West et al. |
| 7,052,941 B2 | 5/2006 | Lee |
| 7,064,579 B2 | 6/2006 | Madurawe |
| 7,067,396 B2 | 6/2006 | Aspar et al. |
| 7,067,909 B2 | 6/2006 | Reif et al. |
| 7,068,070 B2 | 6/2006 | Or-Bach |
| 7,068,072 B2 | 6/2006 | New et al. |
| 7,078,739 B1 | 7/2006 | Nemati et al. |
| 7,094,667 B1 | 8/2006 | Bower |
| 7,098,691 B2 | 8/2006 | Or-Bach et al. |
| 7,105,390 B2 | 9/2006 | Brask et al. |
| 7,105,871 B2 | 9/2006 | Or-Bach et al. |
| 7,109,092 B2 | 9/2006 | Tong |
| 7,110,629 B2 | 9/2006 | Bjorkman et al. |
| 7,111,149 B2 | 9/2006 | Eilert |
| 7,115,945 B2 | 10/2006 | Lee et al. |
| 7,115,966 B2 | 10/2006 | Ido et al. |
| 7,141,853 B2 | 11/2006 | Campbell et al. |
| 7,148,119 B1 | 12/2006 | Sakaguchi et al. |
| 7,157,787 B2 | 1/2007 | Kim et al. |
| 7,157,937 B2 | 1/2007 | Apostol et al. |
| 7,166,520 B1 | 1/2007 | Henley |
| 7,170,807 B2 | 1/2007 | Fazan et al. |
| 7,173,369 B2 | 2/2007 | Forrest et al. |
| 7,180,091 B2 | 2/2007 | Yamazaki et al. |
| 7,180,379 B1 | 2/2007 | Hopper et al. |
| 7,189,489 B2 | 3/2007 | Kunimoto et al. |
| 7,205,204 B2 | 4/2007 | Ogawa et al. |
| 7,209,384 B1 | 4/2007 | Kim |
| 7,217,636 B1 | 5/2007 | Atanackovic |
| 7,223,612 B2 | 5/2007 | Sarma |
| 7,242,012 B2 | 7/2007 | Leedy |
| 7,245,002 B2 | 7/2007 | Akino et al. |
| 7,256,104 B2 | 8/2007 | Ito et al. |
| 7,259,091 B2 | 8/2007 | Schuehrer et al. |
| 7,265,421 B2 | 9/2007 | Madurawe |
| 7,271,420 B2 | 9/2007 | Cao |
| 7,282,951 B2 | 10/2007 | Huppenthal et al. |
| 7,284,226 B1 | 10/2007 | Kondapalli |
| 7,296,201 B2 | 11/2007 | Abramovici |
| 7,304,355 B2 | 12/2007 | Zhang |
| 7,312,109 B2 | 12/2007 | Madurawe |
| 7,312,487 B2 | 12/2007 | Alam et al. |
| 7,335,573 B2 | 2/2008 | Takayama et al. |
| 7,337,425 B2 | 2/2008 | Kirk |
| 7,338,884 B2 | 3/2008 | Shimoto et al. |
| 7,351,644 B2 | 4/2008 | Henley |
| 7,358,601 B1 | 4/2008 | Plants et al. |
| 7,362,133 B2 | 4/2008 | Madurawe |
| 7,369,435 B2 | 5/2008 | Forbes |
| 7,371,660 B2 | 5/2008 | Henley et al. |
| 7,378,702 B2 | 5/2008 | Lee |
| 7,393,722 B1 | 7/2008 | Issaq et al. |
| 7,419,844 B2 | 9/2008 | Lee et al. |
| 7,436,027 B2 | 10/2008 | Ogawa et al. |
| 7,439,773 B2 | 10/2008 | Or-Bach et al. |
| 7,446,563 B2 | 11/2008 | Madurawe |
| 7,459,752 B2 | 12/2008 | Doris et al. |
| 7,459,763 B1 | 12/2008 | Issaq et al. |
| 7,459,772 B2 | 12/2008 | Speers |
| 7,463,062 B2 | 12/2008 | Or-Bach et al. |
| 7,470,142 B2 | 12/2008 | Lee |
| 7,470,598 B2 | 12/2008 | Lee |
| 7,476,939 B2 | 1/2009 | Okhonin et al. |
| 7,477,540 B2 | 1/2009 | Okhonin et al. |
| 7,485,968 B2 | 2/2009 | Enquist et al. |
| 7,486,563 B2 | 2/2009 | Waller et al. |
| 7,488,980 B2 | 2/2009 | Takafuji et al. |
| 7,492,632 B2 | 2/2009 | Carman |
| 7,495,473 B2 | 2/2009 | McCollum et al. |
| 7,498,675 B2 | 3/2009 | Farnworth et al. |
| 7,499,352 B2 | 3/2009 | Singh |
| 7,499,358 B2 | 3/2009 | Bauser |
| 7,508,034 B2 | 3/2009 | Takafuji et al. |
| 7,514,748 B2 | 4/2009 | Fazan et al. |
| 7,525,186 B2 | 4/2009 | Kim et al. |
| 7,535,089 B2 | 5/2009 | Fitzgerald |
| 7,541,616 B2 | 6/2009 | Fazan et al. |
| 7,547,589 B2 | 6/2009 | Iriguchi |
| 7,557,367 B2 | 7/2009 | Rogers et al. |
| 7,563,659 B2 | 7/2009 | Kwon et al. |
| 7,566,855 B2 | 7/2009 | Olsen et al. |
| 7,586,778 B2 | 9/2009 | Ho et al. |
| 7,589,375 B2 | 9/2009 | Jang et al. |
| 7,608,848 B2 | 10/2009 | Ho et al. |
| 7,622,367 B1 | 11/2009 | Nuzzo et al. |
| 7,632,738 B2 | 12/2009 | Lee |
| 7,633,162 B2 | 12/2009 | Lee |
| 7,666,723 B2 | 2/2010 | Frank et al. |
| 7,671,371 B2 | 3/2010 | Lee |
| 7,671,460 B2 | 3/2010 | Lauxtermann et al. |
| 7,674,687 B2 | 3/2010 | Henley |
| 7,687,372 B2 | 3/2010 | Jain |
| 7,688,619 B2 | 3/2010 | Lung et al. |
| 7,692,202 B2 | 4/2010 | Bensch |

(56) References Cited

U.S. PATENT DOCUMENTS

| | | |
|---|---|---|
| 7,692,448 B2 | 4/2010 | Solomon |
| 7,692,944 B2 | 4/2010 | Bernstein et al. |
| 7,697,316 B2 | 4/2010 | Lai et al. |
| 7,709,932 B2 | 5/2010 | Nemoto et al. |
| 7,718,508 B2 | 5/2010 | Lee |
| 7,723,207 B2 | 5/2010 | Alam et al. |
| 7,728,326 B2 | 6/2010 | Yamazaki et al. |
| 7,732,301 B1 | 6/2010 | Pinnington et al. |
| 7,741,673 B2 | 6/2010 | Tak et al. |
| 7,742,331 B2 | 6/2010 | Watanabe |
| 7,745,250 B2 | 6/2010 | Han |
| 7,749,884 B2 | 7/2010 | Mathew et al. |
| 7,750,669 B2 | 7/2010 | Spangaro |
| 7,759,043 B2 | 7/2010 | Tanabe et al. |
| 7,768,115 B2 | 8/2010 | Lee et al. |
| 7,774,735 B1 | 8/2010 | Sood |
| 7,776,715 B2 | 8/2010 | Wells et al. |
| 7,777,330 B2 | 8/2010 | Pelley et al. |
| 7,786,460 B2 | 8/2010 | Lung et al. |
| 7,786,535 B2 | 8/2010 | Abou-Khalil et al. |
| 7,790,524 B2 | 9/2010 | Abadeer et al. |
| 7,795,619 B2 | 9/2010 | Hara |
| 7,799,675 B2 | 9/2010 | Lee |
| 7,800,099 B2 | 9/2010 | Yamazaki et al. |
| 7,800,148 B2 | 9/2010 | Lee et al. |
| 7,800,199 B2 | 9/2010 | Oh et al. |
| 7,843,718 B2 | 11/2010 | Koh et al. |
| 7,846,814 B2 | 12/2010 | Lee |
| 7,863,095 B2 | 1/2011 | Sasaki et al. |
| 7,867,822 B2 | 1/2011 | Lee |
| 7,888,764 B2 | 2/2011 | Lee |
| 7,915,164 B2 | 3/2011 | Konevecki et al. |
| 7,968,965 B2 | 6/2011 | Kim |
| 7,969,193 B1 | 6/2011 | Wu et al. |
| 7,982,250 B2 | 7/2011 | Yamazaki et al. |
| 8,013,399 B2 | 9/2011 | Thomas et al. |
| 8,014,195 B2 | 9/2011 | Okhonin et al. |
| 8,022,493 B2 | 9/2011 | Bang |
| 8,026,521 B1 * | 9/2011 | Or-Bach et al. ............... 257/67 |
| 8,030,780 B2 | 10/2011 | Kirby et al. |
| 8,031,544 B2 | 10/2011 | Kim et al. |
| 8,044,464 B2 | 10/2011 | Yamazaki et al. |
| 8,106,520 B2 | 1/2012 | Keeth et al. |
| 8,107,276 B2 | 1/2012 | Breitwisch et al. |
| 8,129,256 B2 | 3/2012 | Farooq et al. |
| 8,136,071 B2 | 3/2012 | Solomon |
| 8,138,502 B2 | 3/2012 | Nakamura et al. |
| 8,158,515 B2 | 4/2012 | Farooq et al. |
| 8,183,630 B2 | 5/2012 | Batude et al. |
| 8,184,463 B2 | 5/2012 | Saen et al. |
| 8,203,187 B2 | 6/2012 | Lung et al. |
| 8,208,279 B2 | 6/2012 | Lue |
| 8,264,065 B2 | 9/2012 | Su et al. |
| 8,343,851 B2 | 1/2013 | Kim et al. |
| 8,354,308 B2 | 1/2013 | Kang et al. |
| 8,497,512 B2 | 7/2013 | Nakamura et al. |
| 8,525,342 B2 | 9/2013 | Chandrasekaran |
| 8,546,956 B2 | 10/2013 | Nguyen |
| 8,687,399 B2 * | 4/2014 | Sekar et al. .................. 365/51 |
| 2001/0000005 A1 | 3/2001 | Forrest et al. |
| 2001/0014391 A1 | 8/2001 | Forrest et al. |
| 2001/0028059 A1 | 10/2001 | Emma et al. |
| 2002/0024140 A1 | 2/2002 | Nakajima et al. |
| 2002/0025604 A1 | 2/2002 | Tiwari |
| 2002/0074668 A1 | 6/2002 | Hofstee et al. |
| 2002/0081823 A1 | 6/2002 | Cheung et al. |
| 2002/0090758 A1 | 7/2002 | Henley et al. |
| 2002/0096681 A1 | 7/2002 | Yamazaki et al. |
| 2002/0113289 A1 | 8/2002 | Cordes et al. |
| 2002/0132465 A1 | 9/2002 | Leedy |
| 2002/0141233 A1 | 10/2002 | Hosotani et al. |
| 2002/0153243 A1 | 10/2002 | Forrest et al. |
| 2002/0180069 A1 | 12/2002 | Houston |
| 2002/0190232 A1 | 12/2002 | Chason |
| 2002/0199110 A1 | 12/2002 | Kean |
| 2003/0015713 A1 | 1/2003 | Yoo |
| 2003/0032262 A1 | 2/2003 | Dennison et al. |
| 2003/0059999 A1 | 3/2003 | Gonzalez |
| 2003/0060034 A1 | 3/2003 | Beyne et al. |
| 2003/0061555 A1 | 3/2003 | Kamei et al. |
| 2003/0067043 A1 | 4/2003 | Zhang |
| 2003/0102079 A1 | 6/2003 | Kalvesten et al. |
| 2003/0107117 A1 | 6/2003 | Antonelli et al. |
| 2003/0113963 A1 | 6/2003 | Wurzer |
| 2003/0119279 A1 | 6/2003 | Enquist |
| 2003/0139011 A1 | 7/2003 | Cleeves et al. |
| 2003/0157748 A1 | 8/2003 | Kim et al. |
| 2003/0160888 A1 | 8/2003 | Yoshikawa |
| 2003/0206036 A1 | 11/2003 | Or-Bach |
| 2003/0213967 A1 | 11/2003 | Forrest et al. |
| 2003/0224582 A1 | 12/2003 | Shimoda et al. |
| 2003/0224596 A1 | 12/2003 | Marxsen et al. |
| 2004/0007376 A1 | 1/2004 | Urdahl et al. |
| 2004/0014299 A1 | 1/2004 | Moriceau et al. |
| 2004/0033676 A1 | 2/2004 | Coronel et al. |
| 2004/0036126 A1 | 2/2004 | Chau et al. |
| 2004/0047539 A1 | 3/2004 | Okubora et al. |
| 2004/0061176 A1 | 4/2004 | Takafuji et al. |
| 2004/0113207 A1 | 6/2004 | Hsu et al. |
| 2004/0150068 A1 | 8/2004 | Leedy |
| 2004/0152272 A1 | 8/2004 | Fladre et al. |
| 2004/0155301 A1 | 8/2004 | Zhang |
| 2004/0156233 A1 | 8/2004 | Bhattacharyya |
| 2004/0164425 A1 | 8/2004 | Urakawa |
| 2004/0166649 A1 | 8/2004 | Bressot et al. |
| 2004/0175902 A1 | 9/2004 | Rayssac et al. |
| 2004/0178819 A1 | 9/2004 | New |
| 2004/0195572 A1 | 10/2004 | Kato et al. |
| 2004/0259312 A1 | 12/2004 | Schlosser et al. |
| 2004/0262635 A1 | 12/2004 | Lee |
| 2004/0262772 A1 | 12/2004 | Ramanathan et al. |
| 2005/0003592 A1 | 1/2005 | Jones |
| 2005/0010725 A1 | 1/2005 | Eilert |
| 2005/0023656 A1 | 2/2005 | Leedy |
| 2005/0067620 A1 | 3/2005 | Chan et al. |
| 2005/0067625 A1 | 3/2005 | Hata |
| 2005/0073060 A1 | 4/2005 | Datta et al. |
| 2005/0098822 A1 | 5/2005 | Mathew |
| 2005/0110041 A1 | 5/2005 | Boutros et al. |
| 2005/0121676 A1 | 6/2005 | Fried et al. |
| 2005/0121789 A1 | 6/2005 | Madurawe |
| 2005/0130351 A1 | 6/2005 | Leedy |
| 2005/0130429 A1 | 6/2005 | Rayssac et al. |
| 2005/0148137 A1 | 7/2005 | Brask et al. |
| 2005/0176174 A1 | 8/2005 | Leedy |
| 2005/0218521 A1 | 10/2005 | Lee |
| 2005/0225237 A1 | 10/2005 | Winters |
| 2005/0266659 A1 | 12/2005 | Ghyselen et al. |
| 2005/0273749 A1 | 12/2005 | Kirk |
| 2005/0280061 A1 | 12/2005 | Lee |
| 2005/0280090 A1 | 12/2005 | Anderson et al. |
| 2005/0280154 A1 | 12/2005 | Lee |
| 2005/0280155 A1 | 12/2005 | Lee |
| 2005/0280156 A1 | 12/2005 | Lee |
| 2005/0282019 A1 | 12/2005 | Fukushima et al. |
| 2006/0014331 A1 | 1/2006 | Tang et al. |
| 2006/0024923 A1 | 2/2006 | Sarma et al. |
| 2006/0033110 A1 | 2/2006 | Alam et al. |
| 2006/0033124 A1 | 2/2006 | Or-Bach et al. |
| 2006/0043367 A1 | 3/2006 | Chang et al. |
| 2006/0067122 A1 | 3/2006 | Verhoeven |
| 2006/0071322 A1 | 4/2006 | Kitamura |
| 2006/0071332 A1 | 4/2006 | Speers |
| 2006/0083280 A1 | 4/2006 | Tauzin et al. |
| 2006/0113522 A1 | 6/2006 | Lee et al. |
| 2006/0118935 A1 | 6/2006 | Kamiyama et al. |
| 2006/0121690 A1 | 6/2006 | Pogge et al. |
| 2006/0170046 A1 | 8/2006 | Hara |
| 2006/0179417 A1 | 8/2006 | Madurawe |
| 2006/0181202 A1 | 8/2006 | Liao et al. |
| 2006/0189095 A1 | 8/2006 | Ghyselen et al. |
| 2006/0194401 A1 | 8/2006 | Hu et al. |
| 2006/0195729 A1 | 8/2006 | Huppenthal et al. |
| 2006/0207087 A1 | 9/2006 | Jafri et al. |

(56) References Cited

U.S. PATENT DOCUMENTS

| | | |
|---|---|---|
| 2006/0249859 A1 | 11/2006 | Eiles et al. |
| 2006/0275962 A1 | 12/2006 | Lee |
| 2007/0014508 A1 | 1/2007 | Chen et al. |
| 2007/0035329 A1 | 2/2007 | Madurawe |
| 2007/0063259 A1 | 3/2007 | Derderian et al. |
| 2007/0072391 A1 | 3/2007 | Pocas et al. |
| 2007/0076509 A1 | 4/2007 | Zhang |
| 2007/0077694 A1 | 4/2007 | Lee |
| 2007/0077743 A1 | 4/2007 | Rao et al. |
| 2007/0090416 A1 | 4/2007 | Doyle et al. |
| 2007/0102737 A1 | 5/2007 | Kashiwabara et al. |
| 2007/0108523 A1 | 5/2007 | Ogawa et al. |
| 2007/0111386 A1 | 5/2007 | Kim et al. |
| 2007/0111406 A1 | 5/2007 | Joshi et al. |
| 2007/0132049 A1 | 6/2007 | Stipe |
| 2007/0132369 A1 | 6/2007 | Forrest et al. |
| 2007/0135013 A1 | 6/2007 | Faris |
| 2007/0158659 A1 | 7/2007 | Bensce |
| 2007/0158831 A1 | 7/2007 | Cha et al. |
| 2007/0187775 A1 | 8/2007 | Okhonin et al. |
| 2007/0190746 A1 | 8/2007 | Ito et al. |
| 2007/0194453 A1 | 8/2007 | Chakraborty et al. |
| 2007/0210336 A1 | 9/2007 | Madurawe |
| 2007/0215903 A1 | 9/2007 | Sakamoto et al. |
| 2007/0218622 A1 | 9/2007 | Lee et al. |
| 2007/0228383 A1 | 10/2007 | Bernstein et al. |
| 2007/0252203 A1 | 11/2007 | Zhu et al. |
| 2007/0262457 A1 | 11/2007 | Lin |
| 2007/0275520 A1 | 11/2007 | Suzuki |
| 2007/0281439 A1 | 12/2007 | Bedell et al. |
| 2007/0283298 A1 | 12/2007 | Bernstein et al. |
| 2007/0287224 A1 | 12/2007 | Alam et al. |
| 2008/0032463 A1 | 2/2008 | Lee |
| 2008/0038902 A1 | 2/2008 | Lee |
| 2008/0048327 A1 | 2/2008 | Lee |
| 2008/0054359 A1 | 3/2008 | Yang et al. |
| 2008/0067573 A1 | 3/2008 | Jang et al. |
| 2008/0070340 A1 | 3/2008 | Borrelli et al. |
| 2008/0072182 A1 | 3/2008 | He et al. |
| 2008/0099780 A1 | 5/2008 | Tran |
| 2008/0108171 A1 | 5/2008 | Rogers et al. |
| 2008/0124845 A1 | 5/2008 | Yu et al. |
| 2008/0128745 A1 | 6/2008 | Mastro et al. |
| 2008/0136455 A1 | 6/2008 | Diamant et al. |
| 2008/0142959 A1 | 6/2008 | DeMulder et al. |
| 2008/0150579 A1 | 6/2008 | Madurawe |
| 2008/0160431 A1 | 7/2008 | Scott et al. |
| 2008/0160726 A1 | 7/2008 | Lim et al. |
| 2008/0179678 A1 | 7/2008 | Dyer et al. |
| 2008/0191247 A1 | 8/2008 | Yin et al. |
| 2008/0191312 A1 | 8/2008 | Oh et al. |
| 2008/0194068 A1 | 8/2008 | Temmler et al. |
| 2008/0203452 A1 | 8/2008 | Moon et al. |
| 2008/0213982 A1 | 9/2008 | Park et al. |
| 2008/0220558 A1 | 9/2008 | Zehavi et al. |
| 2008/0220565 A1 | 9/2008 | Hsu et al. |
| 2008/0224260 A1 | 9/2008 | Schmit et al. |
| 2008/0237591 A1 | 10/2008 | Leedy |
| 2008/0248618 A1 | 10/2008 | Ahn et al. |
| 2008/0251862 A1 | 10/2008 | Fonash et al. |
| 2008/0254561 A2 | 10/2008 | Yoo |
| 2008/0254572 A1 | 10/2008 | Leedy |
| 2008/0261378 A1 | 10/2008 | Yao et al. |
| 2008/0272492 A1 | 11/2008 | Tsang |
| 2008/0277778 A1 | 11/2008 | Furman et al. |
| 2008/0283875 A1 | 11/2008 | Mukasa et al. |
| 2008/0284611 A1 | 11/2008 | Leedy |
| 2008/0296681 A1 | 12/2008 | Georgakos et al. |
| 2008/0315351 A1 | 12/2008 | Kakehata |
| 2009/0001469 A1 | 1/2009 | Yoshida et al. |
| 2009/0001504 A1 | 1/2009 | Takei et al. |
| 2009/0016716 A1 | 1/2009 | Ishida |
| 2009/0032899 A1 | 2/2009 | Irie |
| 2009/0032951 A1 | 2/2009 | Andry et al. |
| 2009/0039918 A1 | 2/2009 | Madurawe |
| 2009/0052827 A1 | 2/2009 | Durfee et al. |
| 2009/0055789 A1 | 2/2009 | McIlrath |
| 2009/0057879 A1 | 3/2009 | Garrou et al. |
| 2009/0061572 A1 | 3/2009 | Hareland et al. |
| 2009/0064058 A1 | 3/2009 | McIlrath |
| 2009/0066365 A1 | 3/2009 | Solomon |
| 2009/0066366 A1 | 3/2009 | Solomon |
| 2009/0070721 A1 | 3/2009 | Solomon |
| 2009/0070727 A1 | 3/2009 | Solomon |
| 2009/0079000 A1 | 3/2009 | Yamazaki et al. |
| 2009/0081848 A1 | 3/2009 | Erokhin |
| 2009/0087759 A1 | 4/2009 | Matsumoto et al. |
| 2009/0096009 A1 | 4/2009 | Dong et al. |
| 2009/0096024 A1 | 4/2009 | Shingu et al. |
| 2009/0115042 A1 | 5/2009 | Koyanagi |
| 2009/0128189 A1 | 5/2009 | Madurawe et al. |
| 2009/0134397 A1 | 5/2009 | Yokoi et al. |
| 2009/0144669 A1 | 6/2009 | Bose et al. |
| 2009/0144678 A1 | 6/2009 | Bose et al. |
| 2009/0146172 A1 | 6/2009 | Pumyea |
| 2009/0159870 A1 | 6/2009 | Lin et al. |
| 2009/0160482 A1 | 6/2009 | Karp et al. |
| 2009/0161401 A1 | 6/2009 | Bigler et al. |
| 2009/0179268 A1 | 7/2009 | Abou-Khalil et al. |
| 2009/0194152 A1 | 8/2009 | Liu et al. |
| 2009/0194768 A1 | 8/2009 | Leedy |
| 2009/0194836 A1 | 8/2009 | Kim |
| 2009/0204933 A1 | 8/2009 | Rezgui |
| 2009/0212317 A1 | 8/2009 | Kolodin et al. |
| 2009/0218627 A1 | 9/2009 | Zhu |
| 2009/0221110 A1 | 9/2009 | Lee et al. |
| 2009/0224364 A1 | 9/2009 | Oh et al. |
| 2009/0234331 A1 | 9/2009 | Langereis et al. |
| 2009/0236749 A1 | 9/2009 | Otremba et al. |
| 2009/0242893 A1 | 10/2009 | Tomiyasu |
| 2009/0242935 A1 | 10/2009 | Fitzgerald |
| 2009/0250686 A1 | 10/2009 | Sato et al. |
| 2009/0262583 A1 | 10/2009 | Lue |
| 2009/0263942 A1 | 10/2009 | Ohnuma et al. |
| 2009/0267233 A1 | 10/2009 | Lee |
| 2009/0272989 A1 | 11/2009 | Shum et al. |
| 2009/0290434 A1 | 11/2009 | Kurjanowicz |
| 2009/0294822 A1 | 12/2009 | Batude et al. |
| 2009/0294861 A1 | 12/2009 | Thomas et al. |
| 2009/0302387 A1 | 12/2009 | Joshi et al. |
| 2009/0302394 A1 | 12/2009 | Fujita |
| 2009/0309152 A1 | 12/2009 | Knoefler et al. |
| 2009/0317950 A1 | 12/2009 | Okihara |
| 2009/0321830 A1 | 12/2009 | Maly |
| 2009/0321853 A1 | 12/2009 | Cheng |
| 2009/0321948 A1 | 12/2009 | Wang et al. |
| 2009/0325343 A1 | 12/2009 | Lee |
| 2010/0001282 A1 | 1/2010 | Mieno |
| 2010/0025766 A1 | 2/2010 | Nuttinck et al. |
| 2010/0031217 A1 | 2/2010 | Sinha et al. |
| 2010/0038743 A1 | 2/2010 | Lee |
| 2010/0052134 A1 | 3/2010 | Werner et al. |
| 2010/0058580 A1 | 3/2010 | Yazdani |
| 2010/0059796 A1 | 3/2010 | Scheuerlein |
| 2010/0081232 A1 | 4/2010 | Furman et al. |
| 2010/0112753 A1 | 5/2010 | Lee |
| 2010/0112810 A1 | 5/2010 | Lee et al. |
| 2010/0123202 A1 | 5/2010 | Hofmann |
| 2010/0133695 A1 | 6/2010 | Lee |
| 2010/0133704 A1 | 6/2010 | Marimuthu et al. |
| 2010/0137143 A1 | 6/2010 | Rothberg et al. |
| 2010/0139836 A1 | 6/2010 | Horikoshi |
| 2010/0140790 A1 | 6/2010 | Setiadi et al. |
| 2010/0157117 A1 | 6/2010 | Wang |
| 2010/0190334 A1 | 7/2010 | Lee |
| 2010/0193884 A1 | 8/2010 | Park et al. |
| 2010/0193964 A1 | 8/2010 | Farooq et al. |
| 2010/0224915 A1 | 9/2010 | Kawashima et al. |
| 2010/0225002 A1 | 9/2010 | Law et al. |
| 2010/0276662 A1 | 11/2010 | Colinge |
| 2010/0307572 A1 | 12/2010 | Bedell et al. |
| 2010/0308211 A1 | 12/2010 | Cho et al. |
| 2010/0308863 A1 | 12/2010 | Gliese et al. |
| 2011/0001172 A1 | 1/2011 | Lee |

(56) References Cited

U.S. PATENT DOCUMENTS

| | | |
|---|---|---|
| 2011/0003438 A1 | 1/2011 | Lee |
| 2011/0024724 A1 | 2/2011 | Frolov et al. |
| 2011/0026263 A1 | 2/2011 | Xu |
| 2011/0037052 A1 | 2/2011 | Schmidt et al. |
| 2011/0042696 A1 | 2/2011 | Smith et al. |
| 2011/0049336 A1 | 3/2011 | Matsunuma |
| 2011/0050125 A1 | 3/2011 | Medendorp et al. |
| 2011/0053332 A1 | 3/2011 | Lee |
| 2011/0101537 A1 | 5/2011 | Barth et al. |
| 2011/0102014 A1 | 5/2011 | Madurawe |
| 2011/0143506 A1 | 6/2011 | Lee |
| 2011/0147791 A1 | 6/2011 | Norman et al. |
| 2011/0147849 A1 | 6/2011 | Augendre et al. |
| 2011/0221022 A1 | 9/2011 | Toda |
| 2011/0227158 A1 | 9/2011 | Zhu |
| 2011/0241082 A1 | 10/2011 | Bernstein et al. |
| 2011/0284992 A1 | 11/2011 | Zhu |
| 2011/0286283 A1 | 11/2011 | Lung et al. |
| 2011/0304765 A1 | 12/2011 | Yogo et al. |
| 2012/0001184 A1 | 1/2012 | Ha et al. |
| 2012/0003815 A1 | 1/2012 | Lee |
| 2012/0013013 A1 | 1/2012 | Sadaka et al. |
| 2012/0025388 A1 | 2/2012 | Law et al. |
| 2012/0063090 A1 | 3/2012 | Hsiao et al. |
| 2012/0074466 A1 | 3/2012 | Setiadi et al. |
| 2012/0178211 A1 | 7/2012 | Hebert |
| 2012/0181654 A1 | 7/2012 | Lue |
| 2012/0182801 A1 | 7/2012 | Lue |
| 2012/0241919 A1 | 9/2012 | Mitani |
| 2012/0319728 A1 | 12/2012 | Madurawe |
| 2013/0026663 A1 | 1/2013 | Radu et al. |
| 2013/0193550 A1 | 8/2013 | Sklenard et al. |
| 2013/0196500 A1 | 8/2013 | Batude et al. |
| 2013/0203248 A1 | 8/2013 | Ernst et al. |

OTHER PUBLICATIONS

Batude, P., et al., "3D Monolithic Integration," ISCAS 2011 pp. 2233-2236.
Batude, P., et al., "3D Sequential Integration: A Key Enabling Technology for Heterogeneous C-Integration of New Function With CMOS," IEEE Journal on Emerging and Selected Topics in Circuits and Systems (JETCAS), vol. 2, No. 4, Dec. 2012, pp. 714-722.
Vinet, M., et.al., "Germanium on Insulator and new 3D architectures opportunities for integration", International Journal of Nanotechnology, vol. 7, No. 4, pp. 304-319.
Kawaguchi, N., et al., "Pulsed Green-Laser Annealing for Single-Crystalline Silicon. Film Transferred onto Silicon wafer and Non-alkaline Glass by Hydrogen-Induced Exfoliation," Japanese Journal of Appl,ied Physics, vol. 46, No. 1, 2007, pp. 21-23.
Kuroda, T., "ThruChip Interface for Heterogeneous Chip Stacking," ElectroChemicalSociety Transactions, 50 (14) 63-68 (2012).
Miura, N., et al., "A Scalable 3D Heterogeneous Multi-Core Processor with Inductive-Coupling ThruChip Interface," IEEE Micro Cool Chips XVI, Yokohama, Apr. 17-19, 2013, pp. 1-3.
Kuroda, T., "Wireless Proximity Communications for 3D System Integration," Future Directions in IC and Package Design Workshop, Oct. 29, 2007.
Faynot, O. et al., "Planar Fully depleted SOI technology: A Powerful architecture for the 20nm node and beyond," Electron Devices Meeting (IEDM), 2010 IEEE International, vol., No., pp. 3.2.1, 3.2.4, Dec. 6-8, 2010.
Khakifirooz, A., "ETSOI Technology for 20nm and Beyond", SOI Consortium Workshop: Fully Depleted SOI, Apr. 28, 2011, Hsinchu Taiwan.
Bernstein, K., et al., "Interconnects in the Third Dimension: Design Challenges for 3DICs," Design Automation Conference, 2007, DAC'07, 44th ACM/IEEE, vol., No., pp. 562-567, Jun. 4-8, 2007.
Colinge, J. P., et al., "Nanowire transistors without Junctions", Nature Nanotechnology, Feb. 21, 2010, pp. 1-5.
Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.
Kim, J.Y., et al., "The excellent scalability of the RCAT (recess-channel-array-transistor) technology for sub-70nm DRAM feature size and beyond," 2005 IEEE VLSI-TSA International Symposium, pp. 33-34, Apr. 25-27, 2005.
Abramovici, Breuer and Friedman, Digital Systems Testing and Testable Design, Computer Science Press, 1990, pp. 432-447.
Topol, A.W., et al., "Enabling SOI-Based Assembly Technology for Three-Dimensional (3D) Integrated Circuits (ICS)," IEDM Tech. Digest, Dec. 5, 2005, pp. 363-366.
Demeester, P., et al., "Epitaxial lift-off and its applications," Semicond. Sci. Technol., 1993, pp. 1124-1135, vol. 8.
Yoon, J., et al., "GaAs Photovoltaics and optoelectronics using releasable multilayer epitaxial assemblies", Nature, vol. 465, May 20, 2010, pp. 329-334.
Yonehara, T., et al., "ELTRAN: SOI-Epi Wafer by Epitaxial Layer transfer from porous Silicon", the 198th Electrochemical Society Meeting, abstract No. 438 (2000).
Yonehara, T., et al., "Eltran®, Novel SOI Wafer Technology," JSAP International, Jul. 2001, pp. 10-16, No. 4.
Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.
Bangsaruntip, S., et al., "High performance and highly uniform gate-all-around silicon nanowire MOSFETs with wire size dependent scaling," Electron Devices Meeting (IEDM), 2009 IEEE International , pp. 297-300, Dec. 7-9, 2009.
Bakir and Meindl, "Integrated Interconnect Technologies for 3D Nanoelectronic Systems", Artech House, 2009, Chapter 13, pp. 389-419.
Tanaka, H., et al., "Bit Cost Scalable Technology with Punch and Plug Process for Ultra High Density Flash Memory," VLSI Technology, 2007 IEEE Symposium on , vol., No., pp. 14-15, Jun. 12-14, 2007.
Burr, G. W., et al., "Overview of candidate device technologies for storage-class memory," IBM Journal of Research and Development, vol. 52, No. 4.5, pp. 449-464, Jul. 2008.
Lue, H.-T., et al., "A Highly Scalable 8-Layer 3D Vertical-Gate (VG) TFT Nand Flash Using Junction-Free Buried Channel BE-SONOS Device," Symposium on VLSI Technology, 2010, pp. 131-132.
Bez, R., et al., "Introduction to Flash memory," Proceedings IEEE, 91(4), 489-502 (2003).
Kim, W., et al., "Multi-layered Vertical Gate NAND Flash overcoming stacking limit for terabit density storage", Symposium on VLSI Technology Digest of Technical Papers, 2009, pp. 188-189.
Auth, C., et al., "45nm High-k + Metal Gate Strain-Enhanced Transistors," Symposium on VLSI Technology Digest of Technical Papers, 2008, pp. 128-129.
Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.
Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.
Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.
Sen, P. & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.
Iwai, H., et.al., "NiSi Salicide Technology for Scaled CMOS," Microelectronic Engineering, 60 (2002), pp. 157-169.
Froment, B., et al., "Nickel vs. Cobalt Silicide integration for sub-50nm CMOS", IMEC ESS Circuits, 2003. pp. 215-219.
James, D., "65 and 45-nm Devices—an Overview", Semicon West, Jul. 2008, paper No. ctr_024377.

(56) References Cited

OTHER PUBLICATIONS

Davis, J.A., et.al., "Interconnect Limits on Gigascale Integration(GSI) in the 21st Century", Proc. IEEE, vol. 89, No. 3, pp. 305-324, Mar. 2001.

Dicioccio, L., et. al., "Direct bonding for wafer level 3D integration", ICICDT 2010, pp. 110-113.

Shino, T., et al., "Floating Body RAM Technology and its Scalability to 32nm Node and Beyond," Electron Devices Meeting, 2006, IEDM '06, International, pp. 1-4, Dec. 11-13, 2006.

Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.

Okhonin, S., et al., "New Generation of Z-RAM", Electron Devices Meeting, 2007. IEDM 2007. IEEE International, pp. 925-928, Dec. 10-12, 2007.

Kim, W., et al., "Multi-Layered Vertical Gate NAND Flash Overcoming Stacking Limit for Terabit Density Storage," Symposium on VLSI Technology, 2009, pp. 188-189.

Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.

Hubert, A., et al., "A Stacked SONOS Technology, Up to 4 Levels and 6nm Crystalline Nanowires, with Gate-All-Around or Independent Gates (φFlash), Suitable for Full 3D Integration", International Electron Devices Meeting, 2009, pp. 637-640.

Celler, G.K., et al., "Frontiers of silicon-on-insulator," J. App. Phys., May 1, 2003, pp. 4955-4978, vol. 93, No. 9.

Henttinen, K. et al., "Mechanically Induced Si Layer Transfer in Hydrogen-Implanted Si Wafers," Applied Physics Letters, Apr. 24, 2000, p. 2370-2372, vol. 76, No. 17.

Lee, C.-W., et al., "Junctionless multigate field-effect transistor," Applied Physics Letters, vol. 94, pp. 053511-1 to 053511-2, 2009.

Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.

Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.

Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European, pp. 177-180, Sep. 12-16, 2005.

Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.

Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.

Henttinen, K. et al., "Cold ion-cutting of hydrogen implanted Si," J. Nucl. Instr. And Meth. in Phys. Res. B, 2002, pp. 761-766, vol. 190.

Brumfiel, G., "Solar cells sliced and diced", May 19, 2010, Nature News.

Dragoi, et al., "Plasma-activated wafer bonding: the new low-temperature tool for MEMS fabrication", Proc. SPIE, vol. 6589, 65890T (2007).

Rajendran, B., et al., "Electrical Integrity of MOS Devices in Laser Annealed 3D IC Structures", proceedings VLSI Multi Level Interconnect Conference 2004, pp. 73-74.

Rajendran, B., "Sequential 3D IC Fabrication: Challenges and Prospects", Proceedings of VLSI Multi Level Interconnect Conference 2006, pp. 57-64.

Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.

Vengurlekar, A., et al., "Mechanism of Dopant Activation Enhancement in Shallow Junctions by Hydrogen", Proceedings of the Materials Research Society, vol. 864, Spring 2005, E9.28.1-6.

Hui, K. N., et al., "Design of vertically-stacked polychromatic light-emitting diodes," Optics Express, Jun. 8, 2009, pp. 9873-9878, vol. 17, No. 12.

Yamada, M., et al., "Phosphor Free High-Luminous-Efficiency White Light-Emitting Diodes Composed of InGaN Multi-Quantum Well," Japanese Journal of Applied Physics, 2002, pp. L246-L248, vol. 41.

Guo, X., et al., "Cascade single-chip phosphor-free white light emitting diodes," Applied Physics Letters, 2008, pp. 013507-1-013507-3, vol. 92.

Chuai, D. X., et al., "A Trichromatic Phosphor-Free White Light-Emitting Diode by Using Adhesive Bonding Scheme," Proc. SPIE, 2009, vol. 7635.

Suntharalingam, V., et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.

Coudrain, P., et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.

Takafuji, Y., et al., "Integration of Single Crystal Si TFTs and Circuits on a Large Glass Substrate," IEEE International Electron Devices Meeting (IEDM), Dec. 7-9, 2009, pp. 1-4.

Flamand, G., et al., "Towards Highly Efficient 4-Terminal Mechanical Photovoltaic Stacks," III-Vs Review, Sep.-Oct. 2006, pp. 24-27, vol. 19, Issue 7.

Zahler, J.M., et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.

Wierer, J.J., et al., "High-power AlGaInN flip-chip light-emitting diodes," Applied Physics Letters, May 28, 2001, pp. 3379-3381, vol. 78, No. 22.

El-Gamal, A., "Trends in CMOS Image Sensor Technology and Design," International Electron Devices Meeting Digest of Technical Papers, Dec. 2002.

Ahn, S.W., "Fabrication of a 50 nm half-pitch wire grid polarizer using nanoimprint lithography," Nanotechnology, 2005, pp. 1874-1877, vol. 16, No. 9.

Johnson, R.C., "Switching LEDs on and off to enlighten wireless communications," EE Times, Jun. 2010, last accessed Oct. 11, 2010, <http://www.embeddedinternetdesign.com/design/225402094>.

Ohsawa, et al.,"Autonomous Refresh of Floating Body Cell (FBC)", International Electron Device Meeting, 2008, pp. 801-804.

Sekar, D. C., et al., "A 3D-IC Technology with Integrated Microchannel Cooling", Proc. Intl. Interconnect Technology Conference, 2008, pp. 13-15.

Brunschweiler, T., et al., "Forced Convective Interlayer Cooling in Vertically Integrated Packages," Proc. Intersoc. Conference on Thermal Management (ITHERM), 2008, pp. 1114-1125.

Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.

Chen, P., et al., "Effects of Hydrogen Implantation Damage on the Performance of InP/InGaAs/InP p-i-n. Photodiodes, Transferred on Silicon," Applied Physics Letters, vol. 94, No. 1, Jan. 2009, pp. 012101-1 to 012101-3.

Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.

Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.

(56) References Cited

OTHER PUBLICATIONS

Chen, W., et al., "InP Layer Transfer with Masked Implantation," Electrochemical and Solid-State Letters, Issue 12, No. 4, Apr. 2009, H149-150.

Motoyoshi, M., "3D-IC Integration," 3rd Stanford and Tohoku University Joint Open Workshop, Dec. 4, 2009, pp. 1-52.

Wong, S., et al., "Monolithic 3D Integrated Circuits," VLSI Technology, Systems and Applications, 2007, International Symposium on VLSI-TSA 2007, pp. 1-4.

Feng, J., et al., "Integration of Germanium-on-Insulator and Silicon MOSFETs on a Silicon Substrate, " IEEE Electron Device Letters, vol. 27, No. 11, Nov. 2006, pp. 911-913.

Zhang, S., et al., "Stacked CMOS Technology on SOI Substrate," IEEE Electron Device Letters, vol. 25, No. 9, Sep. 2004, pp. 661-663.

Batude, P., et al., "Advances in 3D CMOS Sequential Integration," 2009 IEEE International Electron Devices Meeting (Baltimore, Maryland), Dec. 7-9, 2009, pp. 345-348.

Tan, C.S., et al., "Wafer Level 3-D ICs Process Technology," ISBN-10: 0387765328, Springer, 1st Ed., Sep. 19, 2008, pp. v-xii, 34, 58, and 59.

Yoon, S.W. et al., "Fabrication and Packaging of Microbump Interconnections for 3D TSV," IEEE International Conference on 3D System Integration (3DIC), Sep. 28-30, 2009, pp. 1-5.

Franzon, P.D., et al., "Design and CAD for 3D Integrated Circuits," 45th ACM/IEEE Design, Automation Conference (DAC), Jun. 8-13, 2008, pp. 668-673.

Brebner, G., "Tooling up for Reconfigurable System Design," IEE Colloquium on Reconfigurable Systems, 1999, Ref. No. 1999/061, pp. 2/1-2/4.

Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.

Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.

Dong, C., et al., "Reconfigurable Circuit Design with Nanomaterials," Design, Automation & Test in Europe Conference & Exhibition, Apr. 20-24, 2009, pp. 442-447.

Razavi, S.A., et al., "A Tileable Switch Module Architecture for Homogeneous 3D FPGAs," IEEE International Conference on 3D System Integration (3DIC), Sep. 28-30, 2009, 4 pages.

Bakir M., et al., "3D Device-Stacking Technology for Memory," pp. 407-410.

Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.

Valsamakis, E.A., "Generator for a Custom Statistical Bipolar Transistor Model," IEEE Journal of Solid-State Circuits, Apr. 1985, pp. 586-589, vol. SC-20, No. 2.

Srivastava, P., et al., "Silicon Substrate Removal of GaN DHFETs for enhanced (>1100V) Breakdown Voltage," Aug. 2010, IEEE Electron Device Letters, vol. 31, No. 8, pp. 851-852.

Weis, M., et al., "Stacked 3-Dimensional 6T SRAM Cell with Independent Double Gate Transistors," IC Design and Technology, May 18-20, 2009.

Doucette, P., "Integrating Photonics: Hitachi, Oki Put LEDs on Silicon," Solid State Technology, Jan. 2007, p. 22, vol. 50, No. 1.

Gosele, U., et al., "Semiconductor Wafer Bonding," Annual Review of Materials Science, Aug. 1998, pp. 215-241, vol. 28.

Spangler, L.J., et al., "A Technology for High Performance Single-Crystal Silicon-on-Insulator Transistors," IEEE Electron Device Letters, Apr. 1987, pp. 137-139, vol. 8, No. 4.

Luo, Z.S., et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.

Zahler, J.M. et al., "Wafer Bonding and Layer Transfer Processes for High Efficiency Solar Cells," NCPV and Solar Program Review Meeting, 2003, pp. 723-726.

Larrieu, G., et al., "Low Temperature Implementation of Dopant-Segregated Band-edger Metallic S/D junctions in Thin-Body SOI p-MOSFETs", Proceedings IEDM, 2007, pp. 147-150.

Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.

Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.

Abramovici, M., "In-system silicon validation and debug", (2008) IEEE Design and Test of Computers, 25 (3), pp. 216-223.

Saxena, P., et al., "Repeater Scaling and Its Impact on CAD", IEEE Transactions on Computer-Aided Design of Integrated Circuits and Systems, vol. 23, No. 4, Apr. 2004.

Abrmovici, M., et al., A reconfigurable design-for-debug infrastructure for SoCs, (2006) Proceedings—Design Automation Conference, pp. 7-12.

Anis, E., et al., "Low cost debug architecture using lossy compression for silicon debug", (2007) Proceedings of the IEEE/ACM Design, pp. 225-230.

Anis, E., et al., "On using lossless compression of debug data in embedded logic analysis", (2007) Proceedings of the IEEE International Test Conference, paper 18.3, pp. 1-10.

Boule, M., et al., "Adding debug enhancements to assertion checkers for hardware emulation and silicon debug", (2006) Proceedings of the IEEE International Conference on Computer Design, pp. 294-299.

Boule, M., et al., "Assertion checkers in verification, silicon debug and in-field diagnosis", (2007) Proceedings—Eighth International Symposium on Quality Electronic Design, ISQED 2007, pp. 613-618.

Burtscher, M., et al., "The VPC trace-compression algorithms", (2005) IEEE Transactions on Computers, 54 (11), Nov. 2005, pp. 1329-1344.

Frieden, B., "Trace port on powerPC 405 cores", (2007) Electronic Product Design, 28 (6), pp. 12-14.

Hopkins, A.B.T., et al., "Debug support for complex systems on-chip: A review", (2006) IEEE Proceedings: Computers and Digital Techniques, 153 (4), Jul. 2006, pp. 197-207.

Hsu, Y.-C., et al., "Visibility enhancement for silicon debug", (2006) Proceedings—Design Automation Conference, Jul. 24-28, 2006, San Francisco, pp. 13-18.

Josephson, D., et al., "The crazy mixed up world of silicon debug", (2004) Proceedings of the Custom Integrated Circuits Conference, paper 30-1, pp. 665-670.

Josephson, D.D., "The manic depression of microprocessor debug", (2002) IEEE International Test Conference (TC), paper 23.4, pp. 657-663.

Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.

Ko, H.F., et al., "Distributed embedded logic analysis for post-silicon validation of SOCs", (2008) Proceedings of the IEEE International Test Conference, paper 16.3, pp. 755-763.

Ko, H.F., et al., "Functional scan chain design at RTL for skewed-load delay fault testing", (2004) Proceedings of the Asian Test Symposium, pp. 454-459.

Ko, H.F., et al., "Resource-efficient programmable trigger units for post-silicon validation", (2009) Proceedings of the 14th IEEE European Test Symposium, ETS 2009, pp. 17-22.

Liu, X., et al., "On reusing test access mechanisms for debug data transfer in SoC post-silicon validation", (2008) Proceedings of the Asian Test Symposium, pp. 303-308.

Liu, X., et al., "Trace signal selection for visibility enhancement in post-silicon validation", (2009) Proceedings Date, pp. 1338-1343.

(56) References Cited

OTHER PUBLICATIONS

McLaughlin, R., et al., "Automated debug of speed path failures using functional tests", (2009) Proceedings of the IEEE VLSI Test Symposium, pp. 91-96.
Morris, K., "On-Chip Debugging—Built-in Logic Analyzers on your FPGA", (2004) Journal of FPGA and Structured ASIC, 2 (3).
Nicolici, N., et al., "Design-for-debug for post-silicon validation: Can high-level descriptions help?", (2009) Proceedings—IEEE International High-Level Design Validation and Test Workshop, HLDVT, pp. 172-175.
Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.
Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.
Moore, B., et al., "High Throughput Non-contact SiP Testing", (2007) Proceedings—International Test Conference, paper 12.3.
Riley, M.W., et al., "Cell broadband engine debugging for unknown events", (2007) IEEE Design and Test of Computers, 24 (5), pp. 486-493.
Vermeulen, B., "Functional debug techniques for embedded systems", (2008) IEEE Design and Test of Computers, 25 (3), pp. 208-215.
Vermeulen, B., et al., "Automatic Generation of Breakpoint Hardware for Silicon Debug", Proceeding of the 41st Design Automation Conference, Jun. 7-11, 2004, p. 514-517.
Vermeulen, B., et al., "Design for debug: Catching design errors in digital chips", (2002) IEEE Design and Test of Computers, 19 (3), pp. 37-45.
Vermeulen, B., et al., "Core-based scan architecture for silicon debug", (2002) IEEE International Test Conference (TC), pp. 638-647.
Vanrootselaar, G. J., et al., "Silicon debug: scan chains alone are not enough", (1999) IEEE International Test Conference (TC), pp. 892-902.
Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D IC Conference, Proceedings.
Kada, M., "Development of functionally innovative 3D-integrated circuit (dream chip) technology / high-density 3D-integration technology for multifunctional devices", (2009) IEEE International Conference on 3D System Integration, 3DIC 2009.
Kim, G.-S., et al., "A 25-mV-sensitivity 2-Gb/s optimum-logic-threshold capacitive-coupling receiver for wireless wafer probing systems", (2009) IEEE Transactions on Circuits and Systems II: Express Briefs, 56 (9), pp. 709-713.
Marchal, P., et al., "3-D technology assessment: Path-finding the technology/design sweet-spot", (2009) Proceedings of the IEEE, 97 (1), pp. 96-107.
Xie, Y., et al., "Design space exploration for 3D architectures", (2006) ACM Journal on Emerging Technologies in Computing Systems, 2 (2), Apr. 2006, pp. 65-103.
Sellathamby, C.V., et al., "Non-contact wafer probe using wireless probe cards", (2005) Proceedings—International Test Conference, 2005, pp. 447-452.
Souri, S., et al., "Multiple Si layers ICs: motivation, performance analysis, and design Implications", (2000) Proceedings—Design Automation Conference, pp. 213-220.
Vinet, M., et.al., "3D monolithic integration: Technological challenges and electrical results", Microelectronic Engineering Apr. 2011 vol. 88, Issue 4, pp. 331-335.
Bobba, S., et al., "CELONCEL: Effective Design Technique for 3-D Monolithic Integration targeting High Performance Integrated Circuits", *Asia pacific DAC 2011*, paper 4A-4.
Choudhury, D., "3D Integration Technologies for Emerging Microsystems", IEEE Proceedings of the IMS 2010, pp. 1-4.
Lee, Y.-J., et. al, "3D 65nm CMOS with 320° C. Microwave Dopant Activation", IEDM 2010, pp. 1-4.
Crnogorac, F., et al., "Semiconductor crystal islands for three-dimensional integration", J. Vac. Sci. Technol. B 28(6), Nov./Dec. 2010, pp. C6P53-C6P58.
Park, J.-H., et al., "N-Channel Germanium MOSFET Fabricated Below 360° C. by Cobalt-Induced Dopant Activation for Monolithic Three-Dimensional-ICs", IEEE Electron Device Letters, vol. 32, No. 3, Mar. 2011, pp. 234-236.
Jung, S.-M., et al., "Soft Error Immune 0.46pm2 SRAM Cell with MIM Node Capacitor by 65nm CMOS Technology for Ultra High Speed SRAM", IEDM 2003, pp. 289-292.
Brillouet, M., "Emerging Technologies on Silicon", IEDM 2004, pp. 17-24.
Jung, S.-M., et al., "Highly Area Efficient and Cost Effective Double Stacked S3(Stacked Single-crystal Si) Peripheral CMOS SSTFT and SRAM Cell Technology for 512M bit density SRAM", IEDM 2003, pp. 265-268.
Joyner, J.W., "Opportunities and Limitations of Three-dimensional Integration for Interconnect Design", PhD Thesis, Georgia Institute of Technology, Jul. 2003.
Choi, S.-J., "A Novel TFT with a Laterally Engineered Bandgap for of 3D Logic and Flash Memory", 2010 Symposium of VLSI Technology Digest, pp. 111-112.
Meindl, J. D., "Beyond Moore'S Law: The Interconnect Era", IEEE Computing in Science & Engineering, Jan./Feb. 2003, pp. 20-24.
Radu, I., et al., "Recent Developments of Cu—Cu non-thermo compression bonding for wafer-to-wafer 3D stacking", IEEE 3D Systems Integration Conference (3DIC), Nov. 16-18, 2010.
Gaudin, G., et al., "Low temperature direct wafer to wafer bonding for 3D integration", 3D Systems Integration Conference (3DIC), IEEE, 2010, Munich, Nov. 16-18, 2010, pp. 1-4.
Jung, S.-M., et al., "Three Dimensionally Stacked NAND Flash Memory Technology Using Stacking Single Crystal Si Layers on ILD and TANOS Structure for Beyond 30nm Node", IEDM 2006, Dec. 11-13, 2006.
Souri, S. J., "Interconnect Performance in 3-Dimensional Integrated Circuits", PhD Thesis, Stanford, Jul. 2003.
Uemoto, Y., et al., "A High-Performance Stacked-CMOS SRAM Cell by Solid Phase Growth Technique", Symposium on VLSI Technology, 2010, pp. 21-22.
Jung, S.-M., et al., "Highly Cost Effective and High Performance 65nm S3( Stacked Single-crystal Si) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.
Steen, S.E., et al., "Overlay as the key to drive wafer scale 3D integration", Microelectronic Engineering 84 (2007) 1412-1415.
Maeda, N., et al., "Development of Sub 10-μm Ultra-Thinning Technology using Device Wafers for 3D Manufacturing of Terabit Memory", 2010 Symposium on VLSI Technology Digest of Technical Papers, pp. 105-106.
Lin, X., et al., "Local Clustering 3-D Stacked CMOS Technology for Interconnect Loading Reduction", IEEE Transactions on electron Devices, vol. 53, No. 6, Jun. 2006, pp. 1405-1410.
Chan, M., et al., "3-Dimensional Integration for Interconnect Reduction in for Nano-CMOS Technologies", IEEE Tencon, Nov. 23, 2006, Hong Kong.
Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.
Naito, T., et al., "World's first monolithic 3D-FPGA with TFT SRAM over 90nm 9 layer Cu CMOS", 2010 Symposium on VLSI Technology Digest of Technical Papers, pp. 219-220.
Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.

(56) References Cited

OTHER PUBLICATIONS

Cong, J., et al., "Quantitative Studies of Impact of 3D IC Design on Repeater Usage", Proceedings of International VLSI/ULSI Multilevel Interconnection Conference, pp. 344-348, 2008.

Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.

Crnogorac, F., et al., "Nano-graphoepitaxy of semiconductors for 3D integration", Microelectronic Engineering 84 (2007) 891-894.

Koyanagi, M, "Different Approaches to 3D Chips", 3D IC Review, Stanford University, May 2005.

Koyanagi, M, "Three-Dimensional Integration Technology and Integrated Systems", ASPDAC 2009 presentation.

Koyanagi, M., et al., "Three-Dimensional Integration Technology and Integrated Systems", ASPDAC 2009, paper 4D-1, pp. 409-415.

Hayashi, Y., et al., "A New Three Dimensional IC Fabrication Technology Stacking Thin Film Dual-CMOS Layers", IEDM 1991, paper 25.6.1, pp. 657-660.

Clavelier, L., et al., "Engineered Substrates for Future More Moore and More Than Moore Integrated Devices", IEDM 2010, paper 2.6.1, pp. 42-45.

Kim, K., "From the Future Si Technology Perspective: Challenges and Opportunities", IEDM 2010, pp. 1.1.1-1.1.9.

Ababei, C., et al., "Exploring Potential Benefits of 3D FPGA Integration", in book by Becker, J.et al. Eds., "Field Programmable Logic 2004", LNCS 3203, pp. 874-880, 2004, Springer-Verlag Berlin Heidelberg.

Ramaswami, S., "3D TSV IC Processing", 3DIC Technology Forum Semicon Taiwan, Sep. 9, 2010.

Davis, W.R., et al., "Demystifying 3D Ics: Pros and Cons of Going Vertical", IEEE Design and Test of Computers, Nov.-Dec. 2005, pp. 498-510.

Lin, M., et al., "Performance Benefits of Monolithically Stacked 3DFPGA", FPGA06, Feb. 22-24, 2006, Monterey, California, pp. 113-122.

Dong, C., et al., "Performance and Power Evaluation of a 3D CMOS/ Nanomaterial Reconfigurable Architecture", ICCAD 2007, pp. 758-764.

Gojman, B., et al., "3D Nanowire-Based Programmable Logic", International Conference on Nano-Networks (Nanonets 2006), Sep. 14-16, 2006.

He, T., et al., "Controllable Molecular Modulation of Conductivity in Silicon-Based Devices", J. Am. Chem. Soc. 2009, 131, 10023-10030.

Henley, F., "Engineered Substrates Using the Nanocleave Process", SemiconWest, TechXPOT Conference—Challenges in Device Scaling, Jul. 19, 2006, San Francisco.

Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.

Diamant, G., et al., "Integrated Circuits based on Nanoscale Vacuum Phototubes", Applied Physics Letters 92, 262903-1 to 262903-3 (2008).

Landesberger, C., et al., "Carrier techniques for thin wafer processing", CS ManTech Conference, May 14-17, 2007 Austin, Texas, pp. 33-36.

Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.

Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.

Rajendran, B., et al., "Thermal Simulation of laser Annealing for 3D Integration", Proceedings VMIC 2003.

Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.

Borland, J.O., "Low Temperature Activation of Ion Implanted Dopants: A Review", International Workshop on Junction technology 2002, S7-3, Japan Society of Applied Physics, pp. 85-88.

Vengurlekar, A., et al., "Hydrogen Plasma Enhancement of Boron Activation in Shallow Junctions", Applied Physics Letters, vol. 85, No. 18, Nov. 1, 2004, pp. 4052-4054.

El-Maleh, A. H., et al., "Transistor-Level Defect Tolerant Digital System Design at the Nanoscale", Research Proposal Submitted to Internal Track Research Grant Programs, 2007. Internal Track Research Grant Programs.

Austin, T., et al., "Reliable Systems on Unreliable Fabrics", IEEE Design & Test of Computers, Jul./Aug. 2008, vol. 25, issue 4, pp. 322-332.

Borkar, S., "Designing Reliable Systems from Unreliable Components: The Challenges of Transistor Variability and Degradation", IEEE Micro, IEEE Computer Society, Nov.-Dec. 2005, pp. 10-16.

Zhu, S., et al., "N-Type Schottky Barrier Source/Drain MOSFET Using Ytterbium Silicide", IEEE Electron Device Letters, vol. 25, No. 8, Aug. 2004, pp. 565-567.

Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.

Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.

Awano, M., et al., "Advanced DSS MOSFET Technology for Ultrahigh Performance Applications", 2008 Symposium on VLSI Technology Digest of Technical Papers, pp. 24-25.

Choi, S.-J., et al., "Performance Breakthrough in NOR Flash Memory with Dopant-Segregated Schottky-Barrier (DSSB) Sonos Devices", 2009 Symposium of VLSI Technology Digest, pp. 222-223.

Zhang, M., et al., "Schottky barrier height modulation using dopant segregation in Schottky-barrier SOI-MOSFETs", Proceeding of ESSDERC, Grenoble, France, 2005, pp. 457-460.

Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.

Ko, C.H., et al., "NiSi Schottky Barrier Process-Strained Si (SB-PSS) CMOS Technology for High Performance Applications", 2006 Symposium on VLSI Technology Digest of Technical Papers.

Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.

Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.

Kaneko, A., et al., "High-Performance FinFET with Dopant-Segregated Schottky Source/Drain", IEDM 2006.

Kinoshita, A., et al., "Ultra Low Voltage Operations in Bulk CMOS Logic Circuits with Dopant Segregated Schottky Source/Drain Transistors", IEDM 2006.

Kinoshita, A., et al., "Comprehensive Study on Injection Velocity Enhancement in Dopant-Segregated Schottky MOSFETs", IEDM 2006.

Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.

Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.

Agoura Technologies white paper, "Wire Grid Polarizers: a New High Contrast Polarizer Technology for Liquid Crystal Displays", 2008, pp. 1-12.

Unipixel Displays, Inc. white paper, "Time Multi-plexed Optical Shutter (TMOS) Displays", Jun. 2007, pp. 1-49.

(56) References Cited

OTHER PUBLICATIONS

Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.
Azevedo, I. L., et al., "The Transition to Solid-State Lighting", Proc. IEEE, vol. 97, No. 3, Mar. 2009, pp. 481-510.
Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.
Tong, Q.-Y., et al., "A "smarter-cut" approach to low temperature silicon layer transfer", Applied Physics Letters, vol. 72, No. 1, Jan. 5, 1998, pp. 49-51.
Sadaka, M., et al., "Building Blocks for wafer level 3D integration", www.electroiq.com , Aug. 18, 2010, last accessed Aug 18, 2010.
Tong, Q.-Y., et al., "Low Temperature Si Layer Splitting", Proceedings 1997 IEEE International SOI Conference, Oct. 1997, pp. 126-127.
Nguyen, P., et al., "Systematic study of the splitting kinetic of H/He co-implanted substrate", SOI Conference, 2003, pp. 132-134.
Ma, X., et al., "A high-quality SOI structure fabricated by low-temperature technology with B+/H+ co-implantation and plasma bonding", Semiconductor Science and Technology, vol. 21, 2006, pp. 959-963.
Yu, C.Y., et al., "Low-temperature fabrication and characterization of Ge-on-insulator structures", Applied Physics Letters, vol. 89, 101913-1 to 101913-2 (2006).
Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.
Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.
Aspar, B., et al., "Transfer of structured and patterned thin silicon films using the Smart-Cut process", Electronics Letters, Oct. 10, 1996, vol. 32, No. 21, pp. 1985-1986.
Madan, N., et al., "Leveraging 3D Technology for Improved Reliability," Proceedings of the 40th Annual IEEE/ACM International Symposium on Microarchitecture (Micro 2007), IEEE Computer Society.
Hayashi, Y., et al., "Fabrication of Three Dimensional IC Using "Cumulatively Bonded IC" (CUBIC) Technology", 1990 Symposium on VLSI Technology, pp. 95-96.
Akasaka, Y., "Three Dimensional IC Trends," Proceedings of the IEEE, vol. 24, No. 12, Dec. 1986.
Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.
Kunio, T., et al., "Three Dimensional ICs, Having Four Stacked Active Device Layers," IEDM 1989, paper 34.6, pp. 837-840.
Agarwal, A., et al., "Efficient production of silicon-on-insulator films by co-implantation of He+ with H+" Applied Physics Letters, vol. 72, No. 9, Mar. 1998, pp. 1086-1088.
Cook III, G. O., et al., "Overview of transient liquid phase and partial transient liquid phase bonding," Journal of Material Science, vol. 46, 2011, pp. 5305-5323.
Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.
Gaillardon, P-E., et al., "Can We Go Towards True 3-D Architectures?," DAC 2011, paper 58, pp. 282-283.
Subbarao, M., et al., "Depth from Defocus: A Spatial Domain Approach," International Journal of Computer Vision, vol. 13, No. 3, pp. 271-294 (1994).
Subbarao, M., et al., "Focused Image Recovery from Two Defocused Images Recorded with Different Camera Settings," IEEE Transactions on Image Processing, vol. 4, No. 12, Dec. 1995, pp. 1613-1628.

Yun, J-G., et al., "Single-Crystalline Si Stacked Array (STAR) NAND Flash Memory," IEEE Transactions on Electron Devices, vol. 58, No. 4, Apr. 2011, pp. 1006-1014.
Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.
Goplen, B., et al., "Thermal Via Placement in 3DICs," Proceedings of the International Symposium on Physical Design, Apr. 3-6, 2005, San Francisco.
Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).
Gawlik, G., et al., "GaAs on Si: towards a low-temperature "smart-cut" technology", Vacuum, vol. 70, pp. 103-107 (2003).
Weldon, M. K., et al., "Mechanism of Silicon Exfoliation Induced by Hydrogen/Helium Co-implantation," Applied Physics Letters, vol. 73, No. 25, pp. 3721-3723 (1998).
Bobba, S., et al., "Performance Analysis of 3-D Monolithic Integrated Circuits," 2010 IEEE International 3D Systems Integration Conference (3DIC), Nov. 2010, Munich, pp. 1-4.
Batude, P., et al., "Demonstration of low temperature 3D sequential FSOI integration down to 50nm gate length," 2011 Symposium on VLSI Technology Digest of Technical Papers, pp. 158-159.
Batude, P., et al., "Advances, Challenges and Opportunities in 3D CMOS Sequential Integration," 2011 IEEE International Electron Devices Meeting, paper 7.3, Dec. 2011, pp. 151-154.
Miller, D.A.B., "Optical interconnects to electronic chips," Applied Optics, vol. 49, No. 25, Sep. 1, 2010, pp. F59-F70.
Yun, C. H., et al., "Transfer of patterned ion-cut silicon layers", Applied Physics Letters, vol. 73, No. 19, Nov. 1998, pp. 2772-2774.
En, W. G., et al., "The Genesis Process: A New SOI wafer fabrication method", Proceedings 1998 IEEE International SOI Conference, Oct. 1998, pp. 163-164.
Ishihara, R., et al., "Monolithic 3D-ICs with single grain Si thin film transistors," Solid-State Electronics 71 (2012) pp. 80-87.
Lee, S. Y., et al., "Architecture of 3D Memory Cell Array on 3D IC," IEEE International Memory Workshop, May 20, 2012, Monterey, CA.
Lee, S. Y., et al., "3D IC Architecture for High Density Memories," IEEE International Memory Workshop, p. 1-6, May 2010.
Rajendran, B., et al., "CMOS transistor processing compatible with monolithic 3-D Integration," Proceedings VMIC 2005.
Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.
Uchikoga, S., et al., "Low temperature poly-Si TFT-LCD by excimer laser anneal," Thin Solid Films, vol. 383 (2001), pp. 19-24.
He, M., et al., "Large Polycrystalline Silicon Grains Prepared by Excimer Laser Crystallization of Sputtered Amorphous Silicon Film with Process Temperature at 100 C," Japanese Journal of Applied Physics, vol. 46, No. 3B, 2007, pp. 1245-1249.
Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.
Kim, S.D., et al., "Advanced source/drain engineering for box-shaped ultra shallow junction formation using laser annealing and pre-amorphization implantation in sub-100-nm SOI CMOS," IEEE Trans. Electron Devices, vol. 49, No. 10, pp. 1748-1754, Oct. 2002.
Ahn, J., et al., "High-quality MOSFET's with ultrathin LPCVD gate SiO2," IEEE Electron Device Lett., vol. 13, No. 4, pp. 186-188, Apr. 1992.
Kim, J., et al., "A Stacked Memory Device on Logic 3D Technology for Ultra-high-density Data Storage," Nanotechnology, vol. 22, 254006 (2011).
Yang, M., et al., "High Performance CMOS Fabricated on Hybrid Substrate with Different Crystal Orientation," Proceedings IEDM 2003.
Lee, K. W., et al., "Three-dimensional shared memory fabricated using wafer stacking technology," IEDM Tech. Dig., 2000, pp. 165-168.

(56) References Cited

OTHER PUBLICATIONS

Yin, H., et al., "Scalable 3-D finlike poly-Si TFT and its nonvolatile memory application," IEEE Trans. Electron Devices, vol. 55, No. 2, pp. 578-584, Feb. 2008.

Chen, H. Y., et al., "HfOx Based Vertical Resistive Random Access Memory for Cost Effective 3D Cross-Point Architecture without Cell Selector," Proceedings IEDM 2012, pp. 497-499.

Kim, I.-K., et al.,"Advanced Integration Technology for a Highly Scalable SOI DRAM with SOC (Silicon-On-Capacitors)", IEDM 1996, pp. 96-605-96-608, 22.5.4.

Lee, B.H., et al., "A Novel CMP Method for cost-effective Bonded SOI Wafer Fabrication," Proceedings 1995 IEEE International SOI Conference, Oct. 1995, pp. 60-61.

Lee, B.H., et al., "A Novel Pattern Transfer Process for Bonded SOI Giga-bit DRAMs," Proceedings 1996 IEEE International SOI Conference, Oct. 1996, pp. 114-115.

Qiang, J-Q, "3-D Hyperintegration and Packaging Technologies for Micro-Nano Systems," Proceedings of the IEEE, 97.1 (2009) pp. 18-30.

* cited by examiner

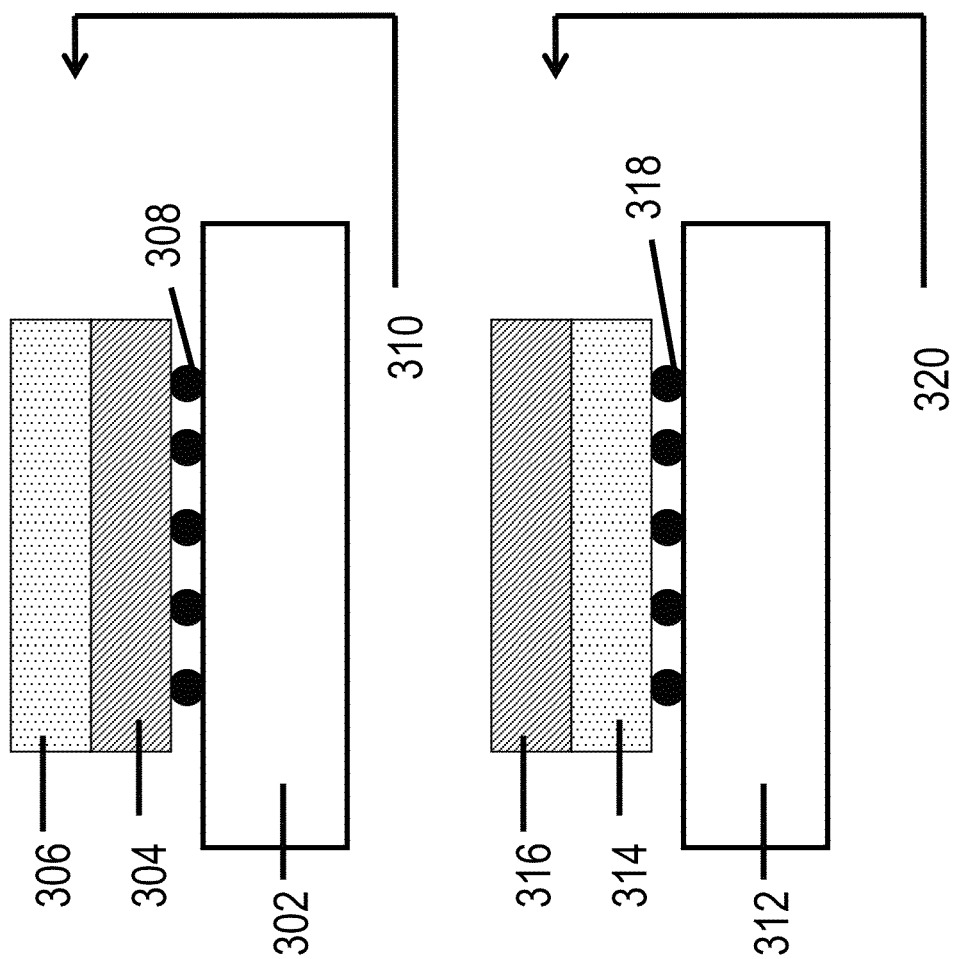

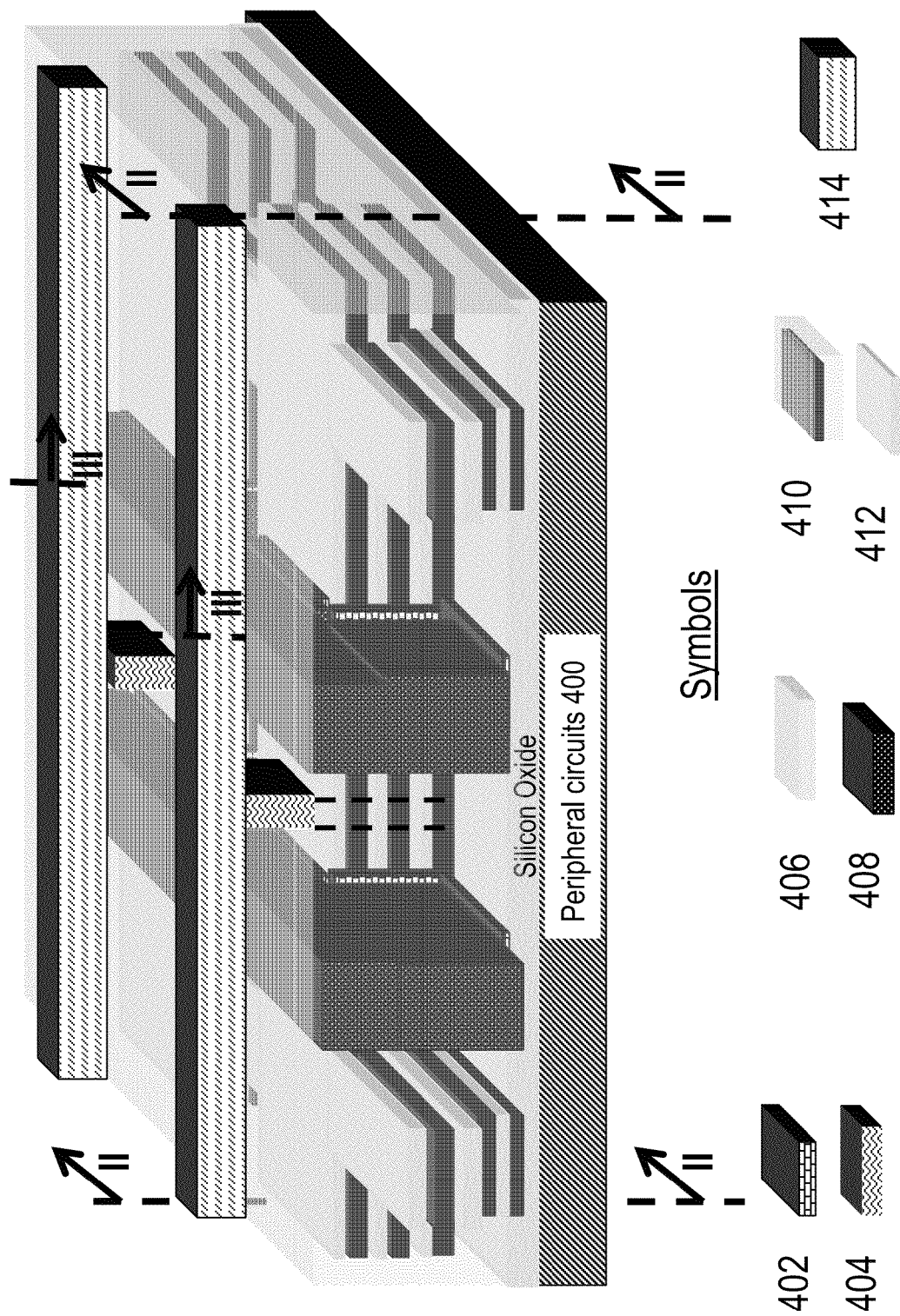

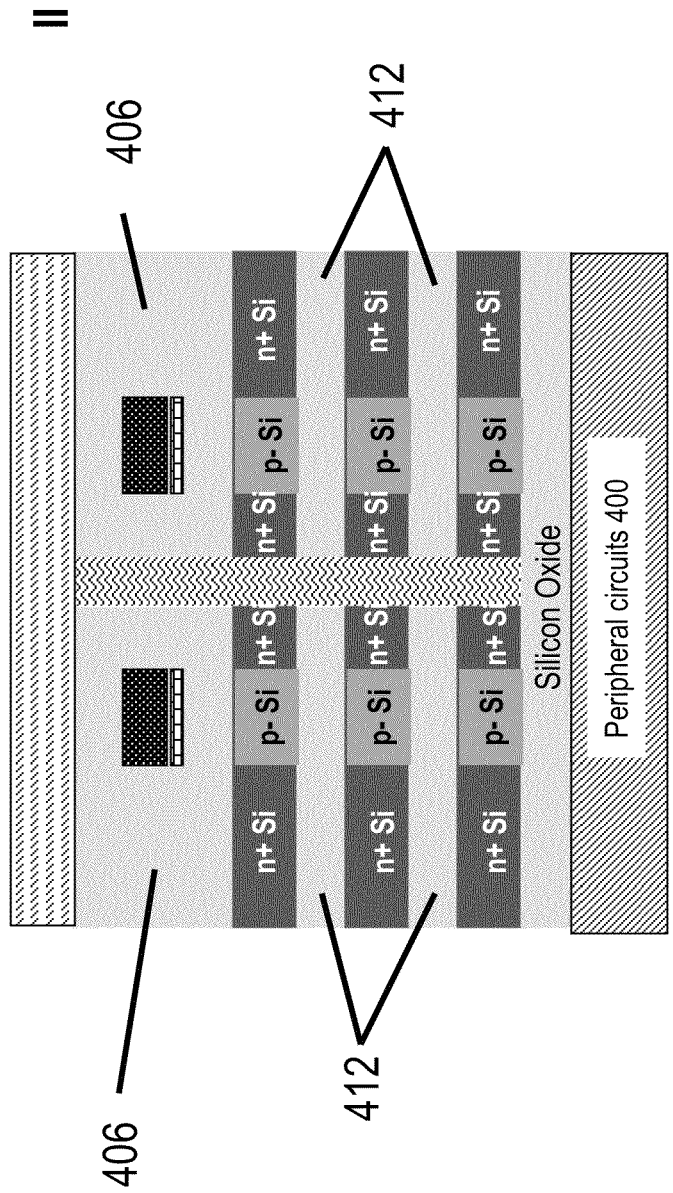
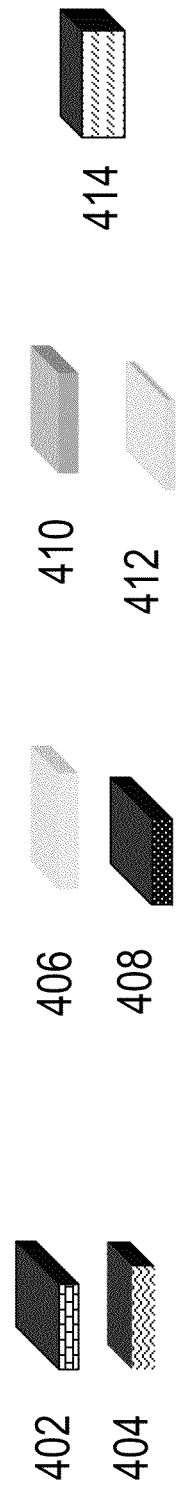
Fig. 4B

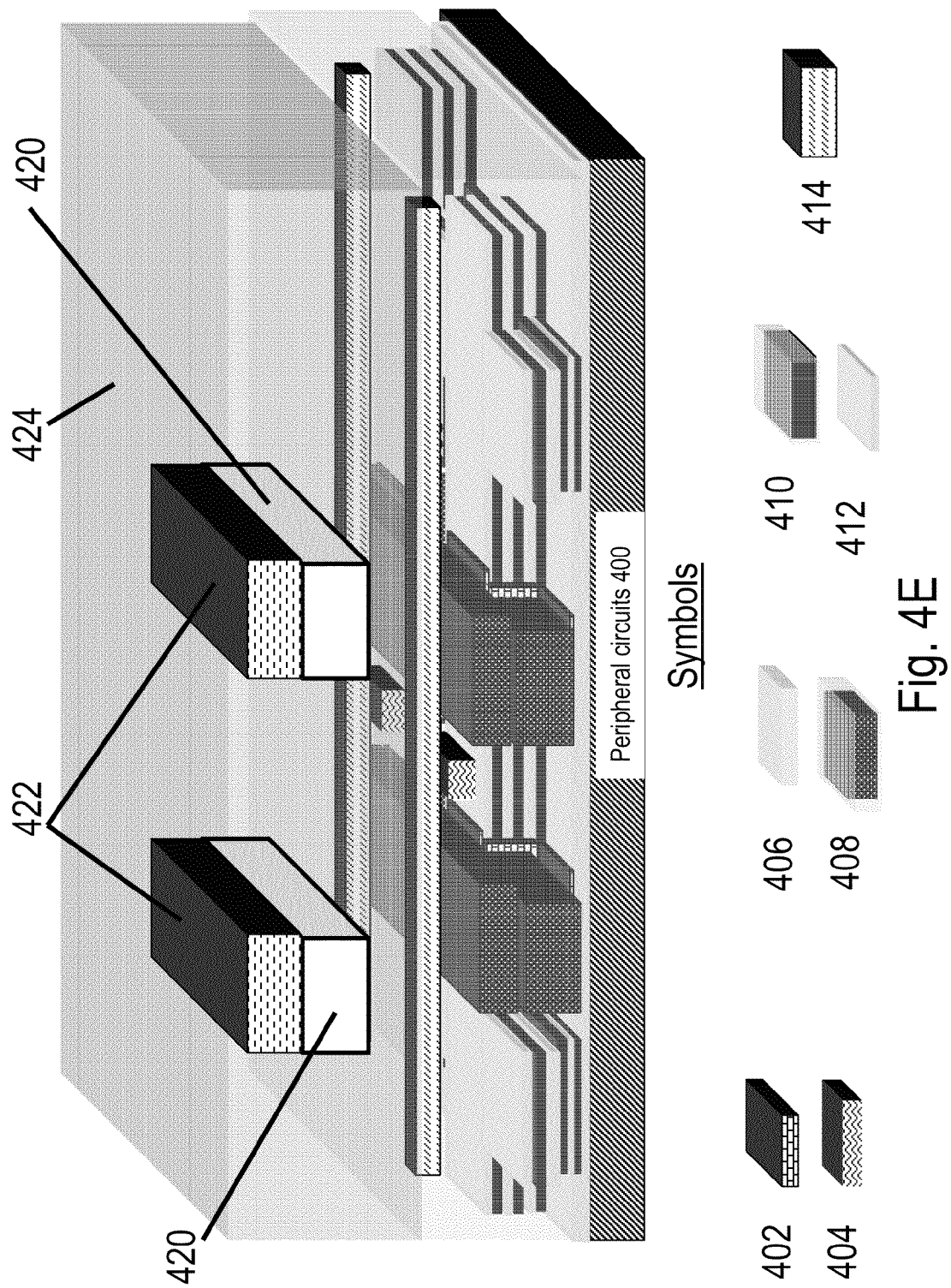

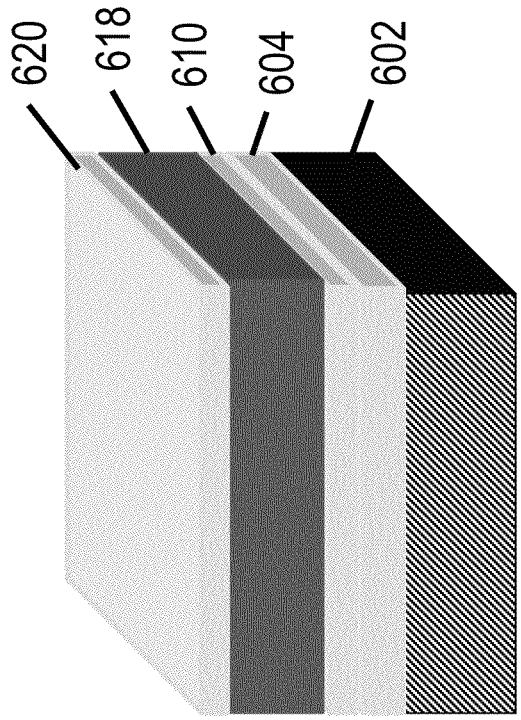
Symbols
Fig. 6C

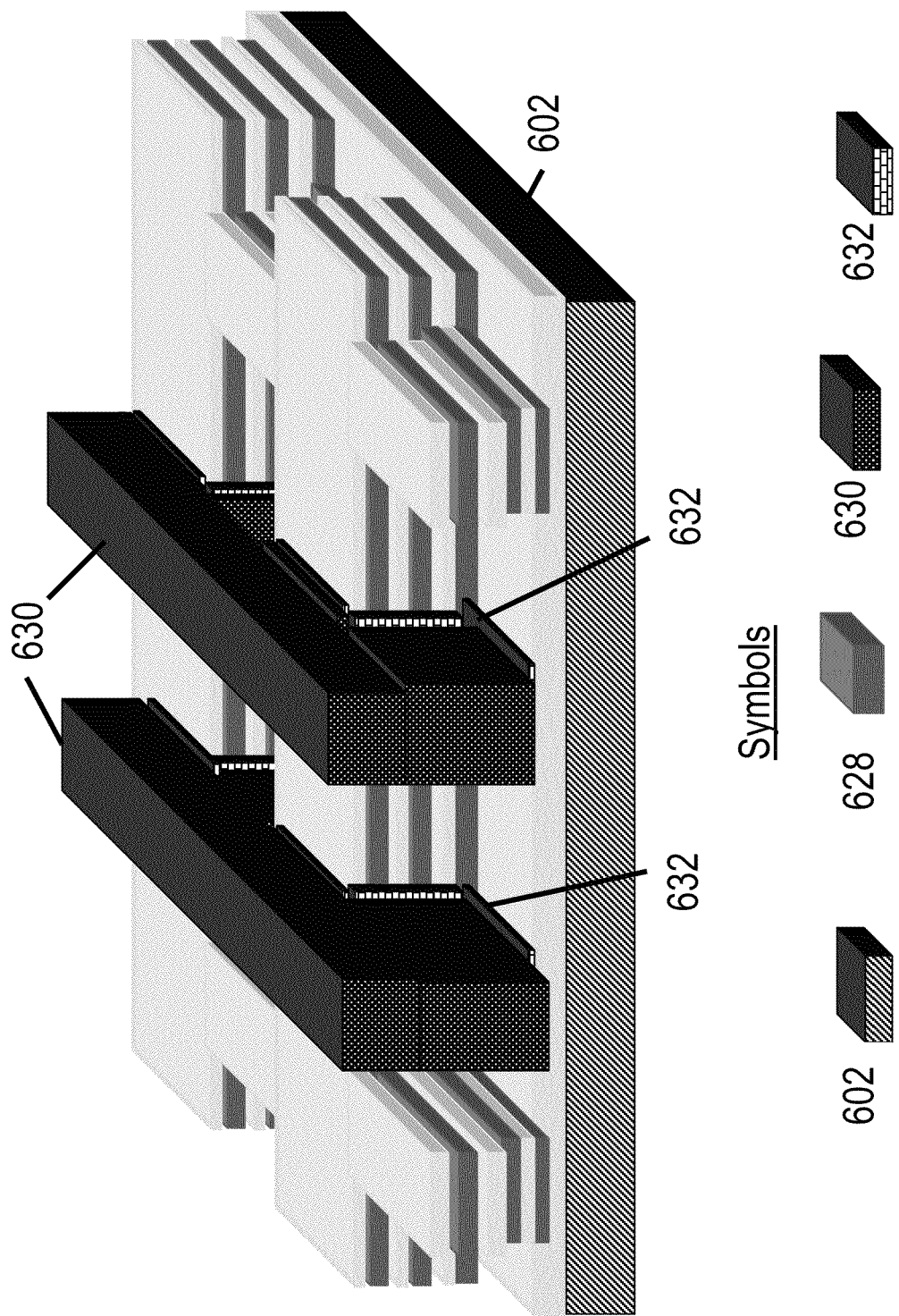

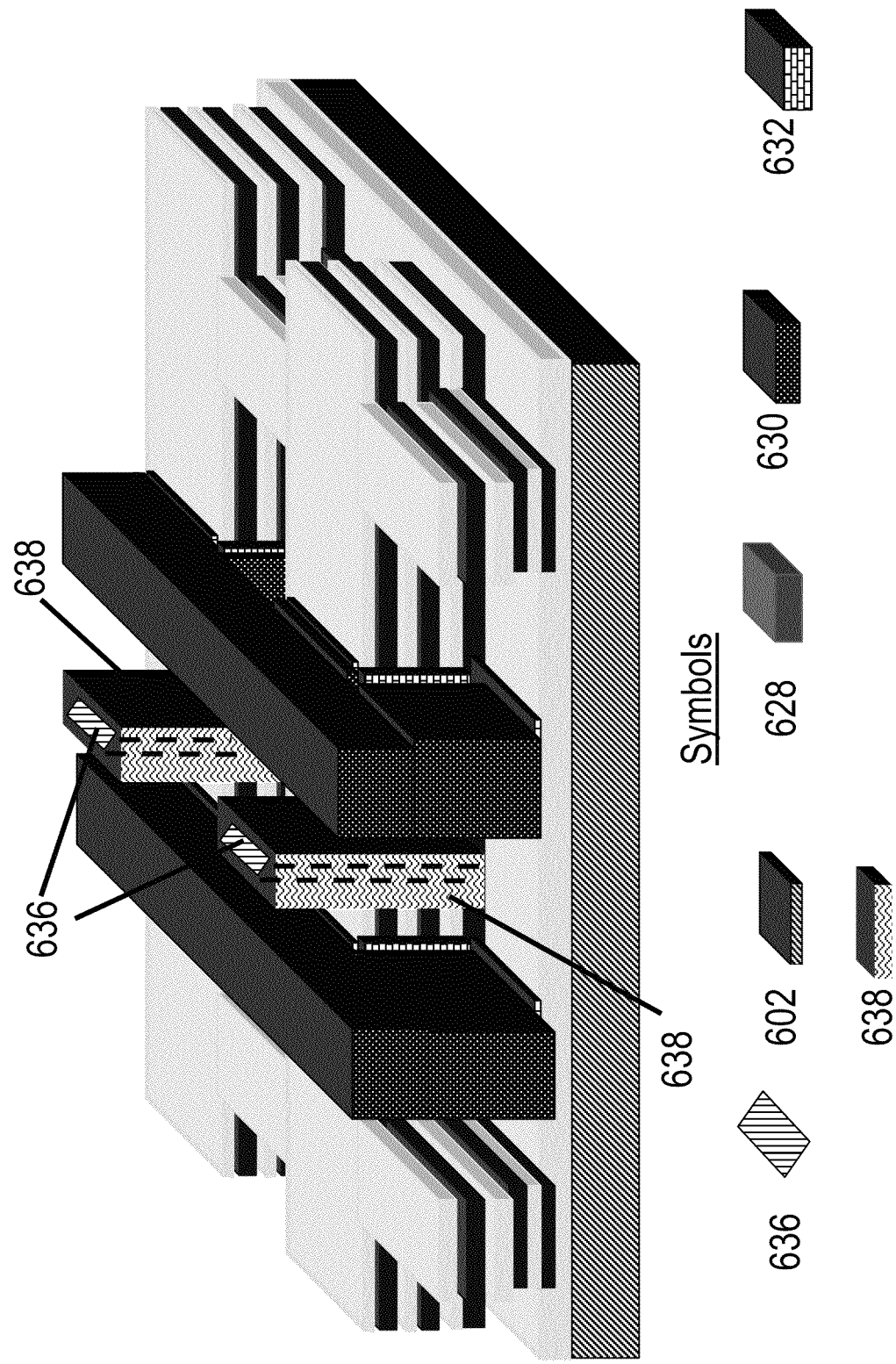

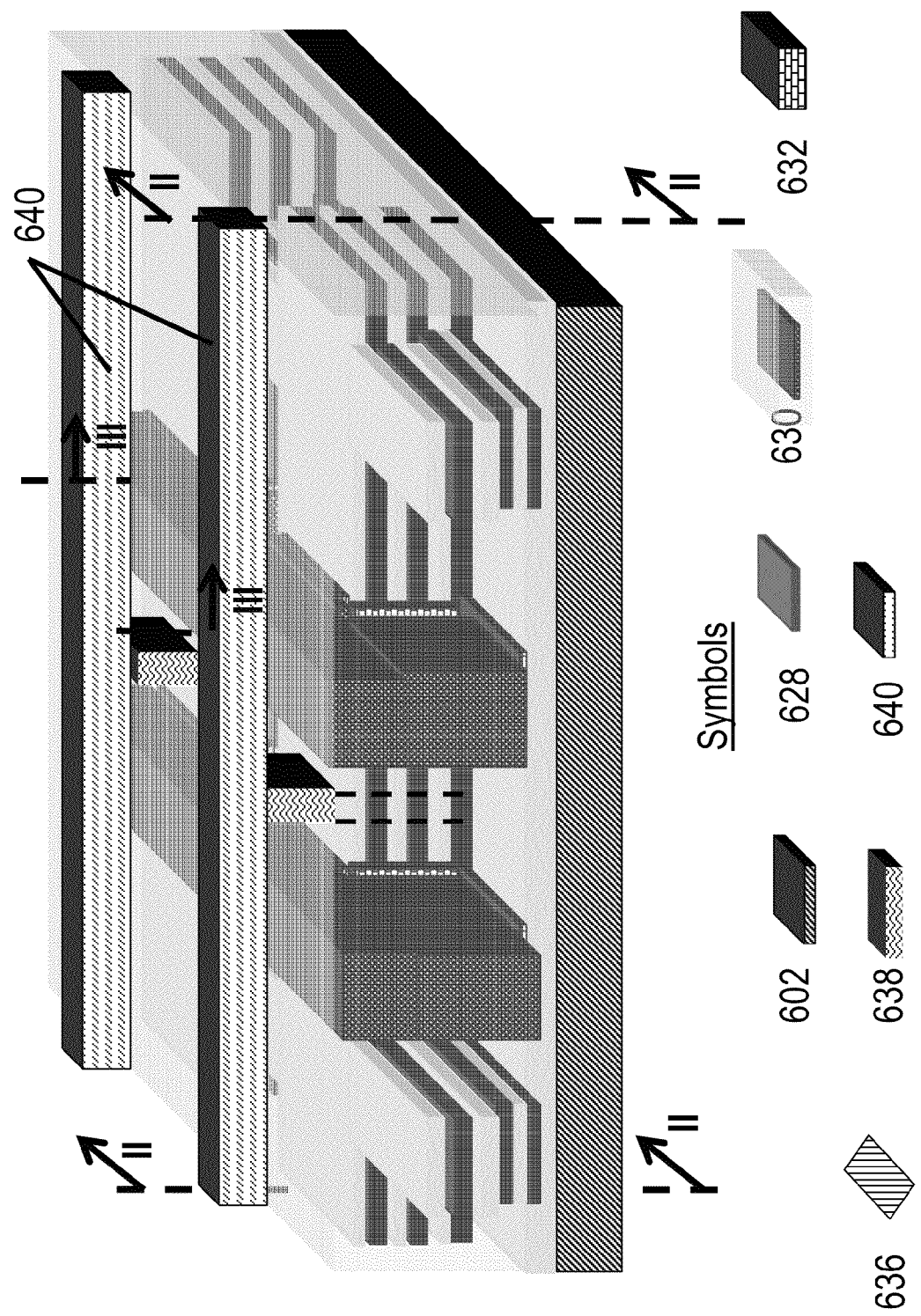

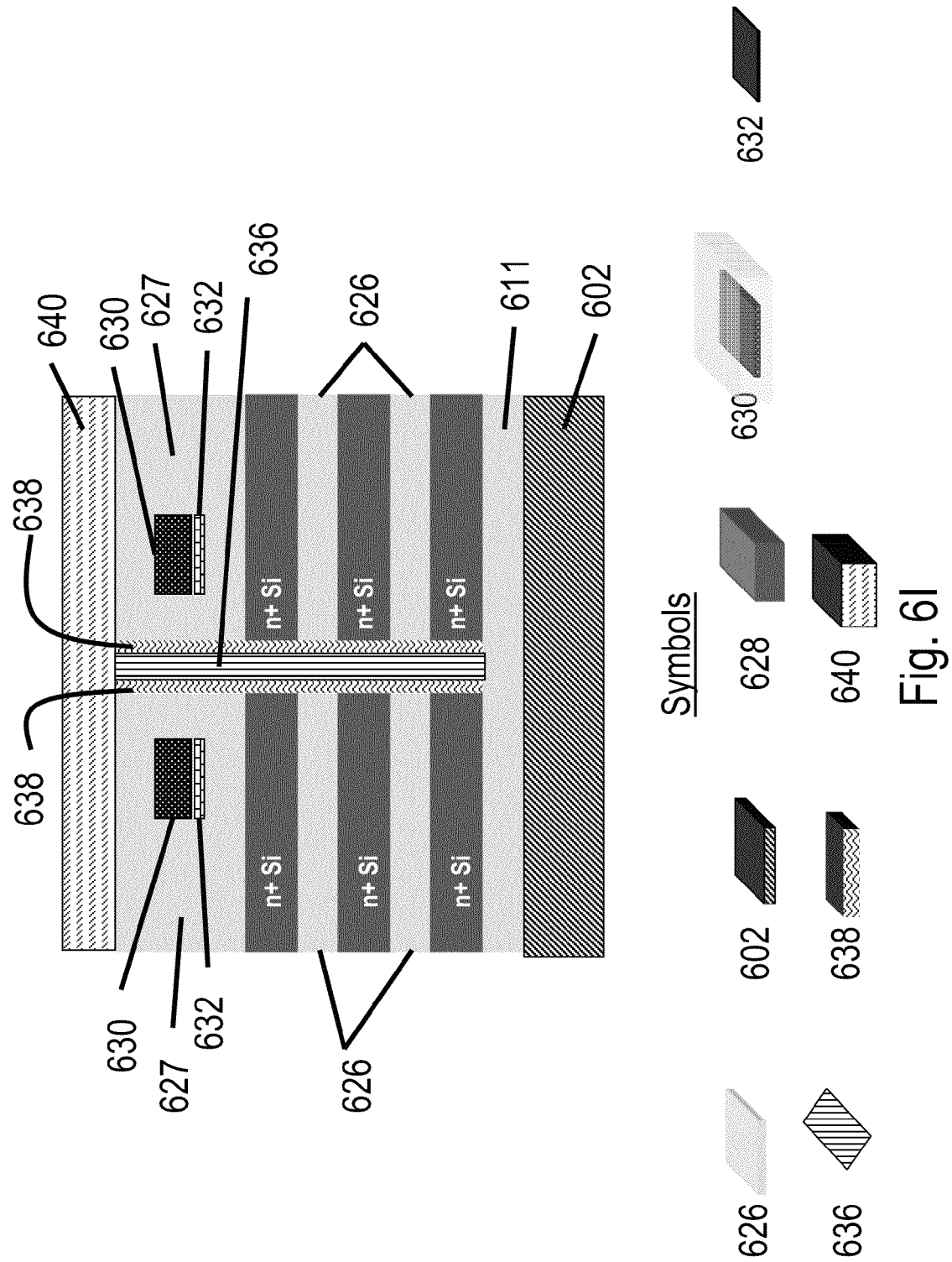

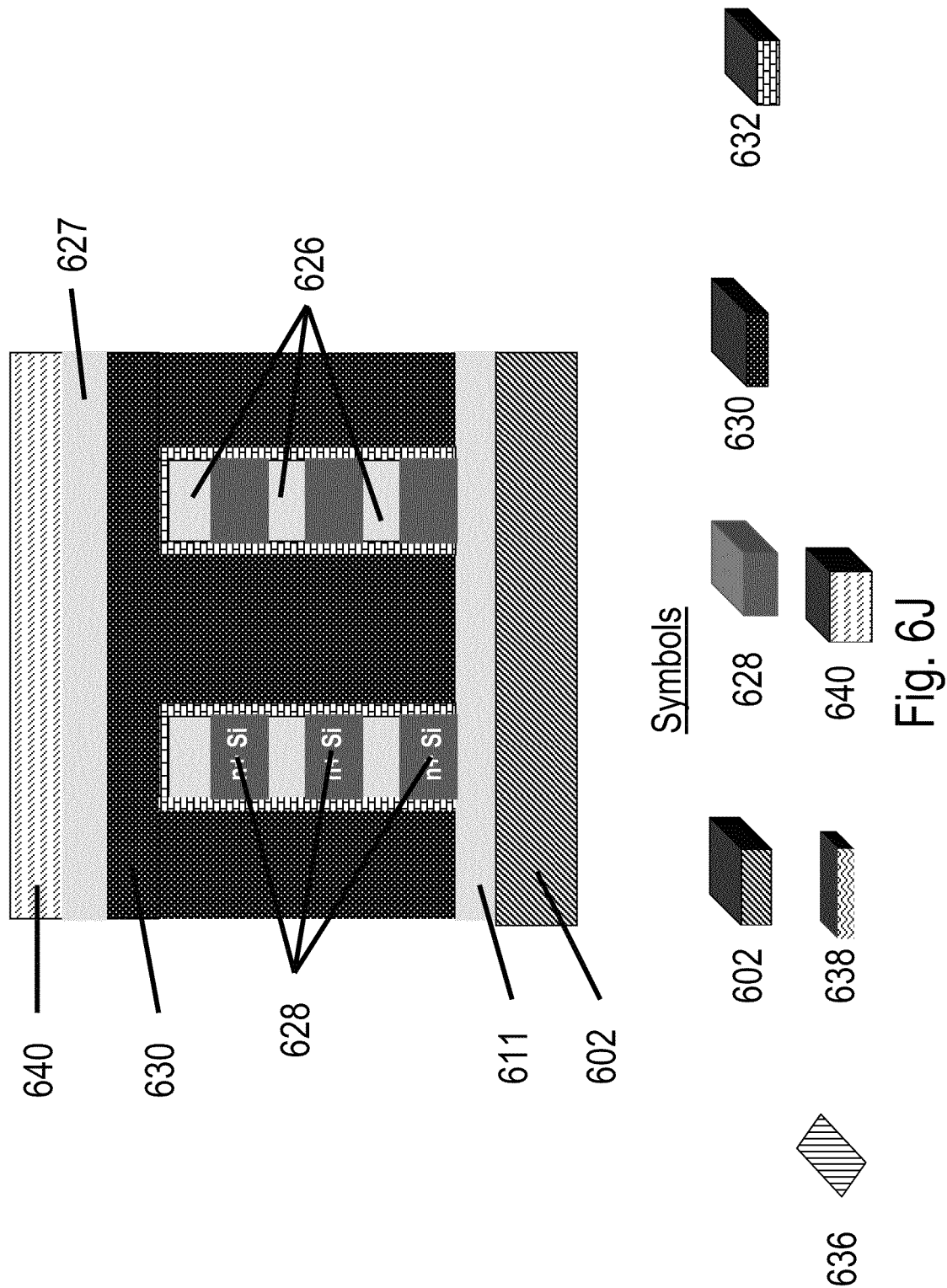

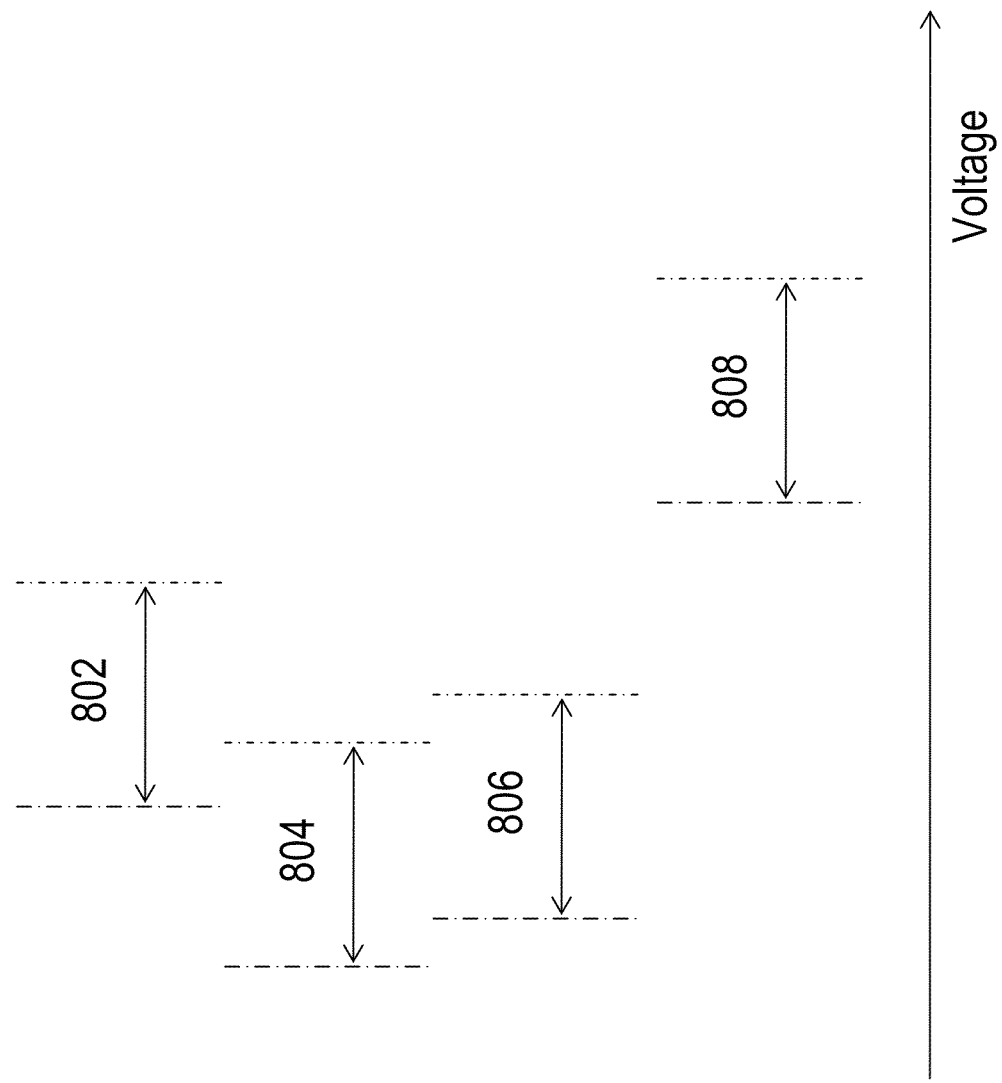

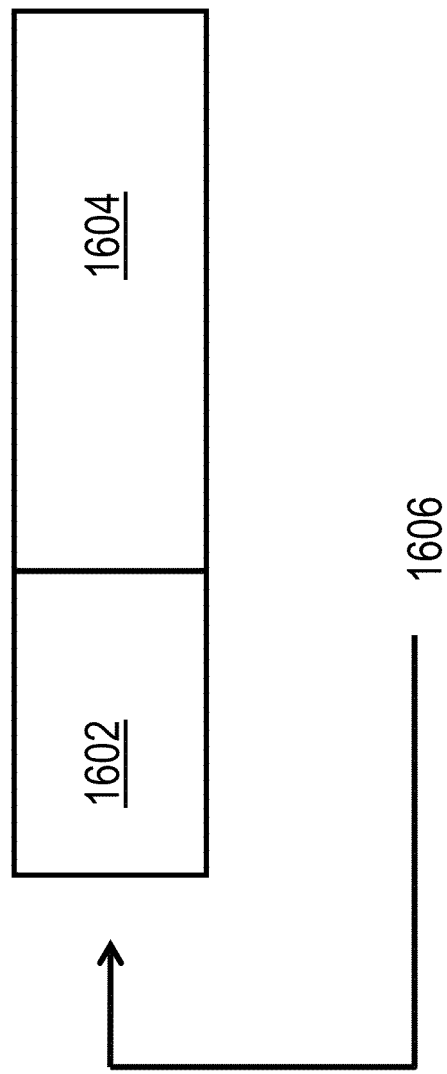

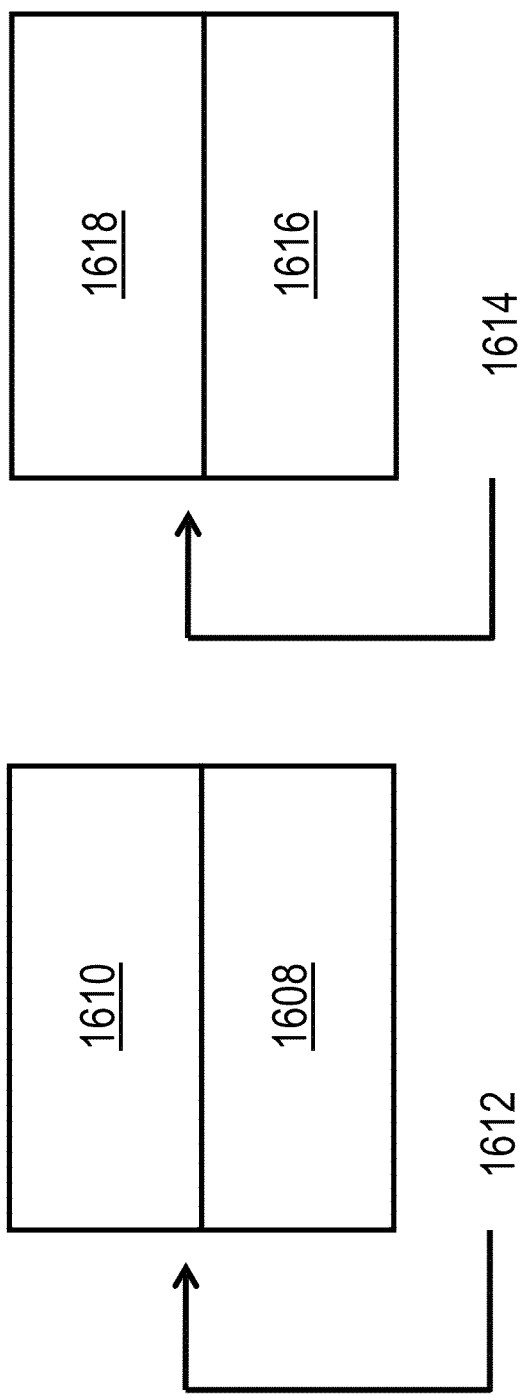

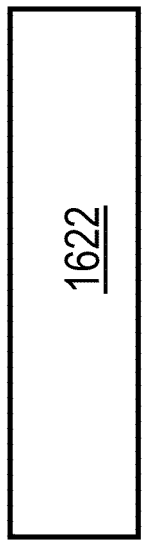
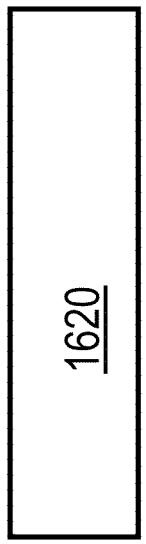
Fig. 16C

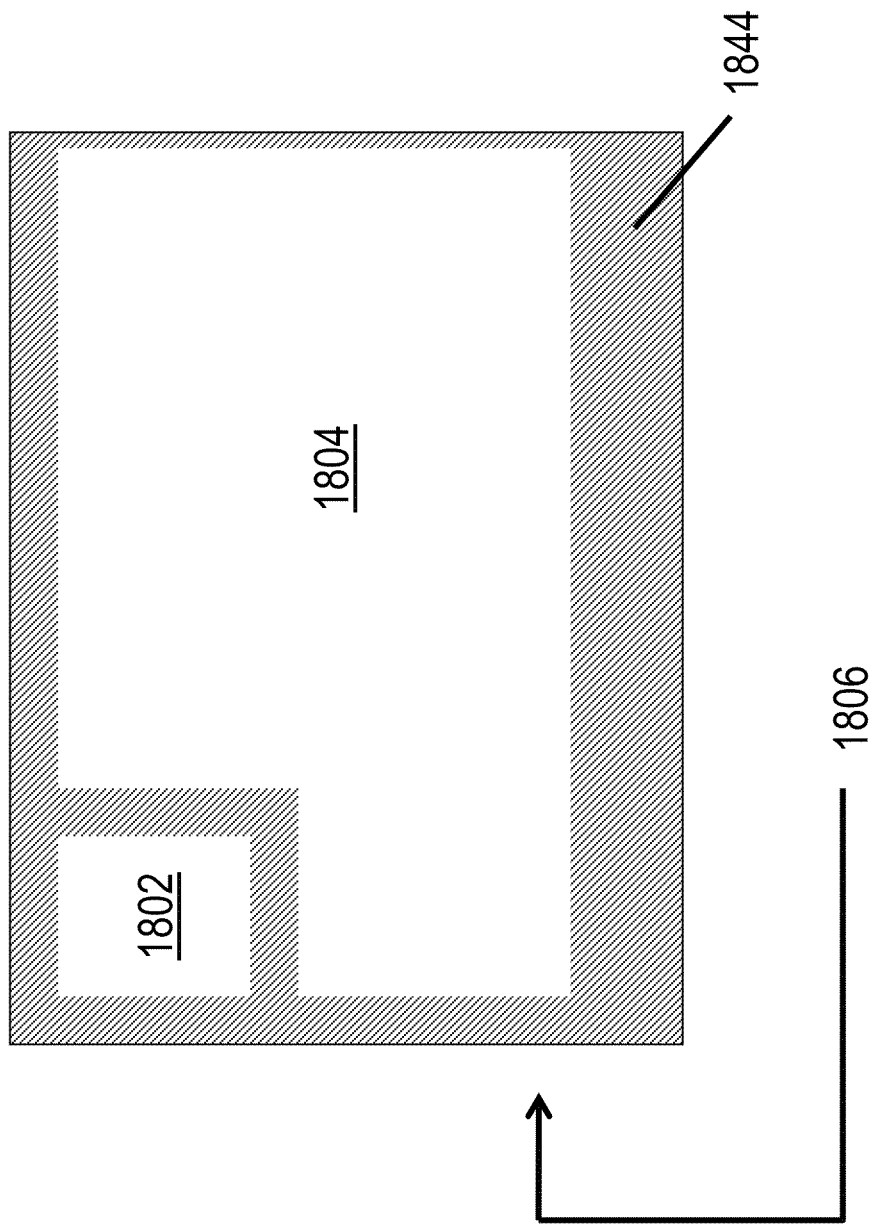

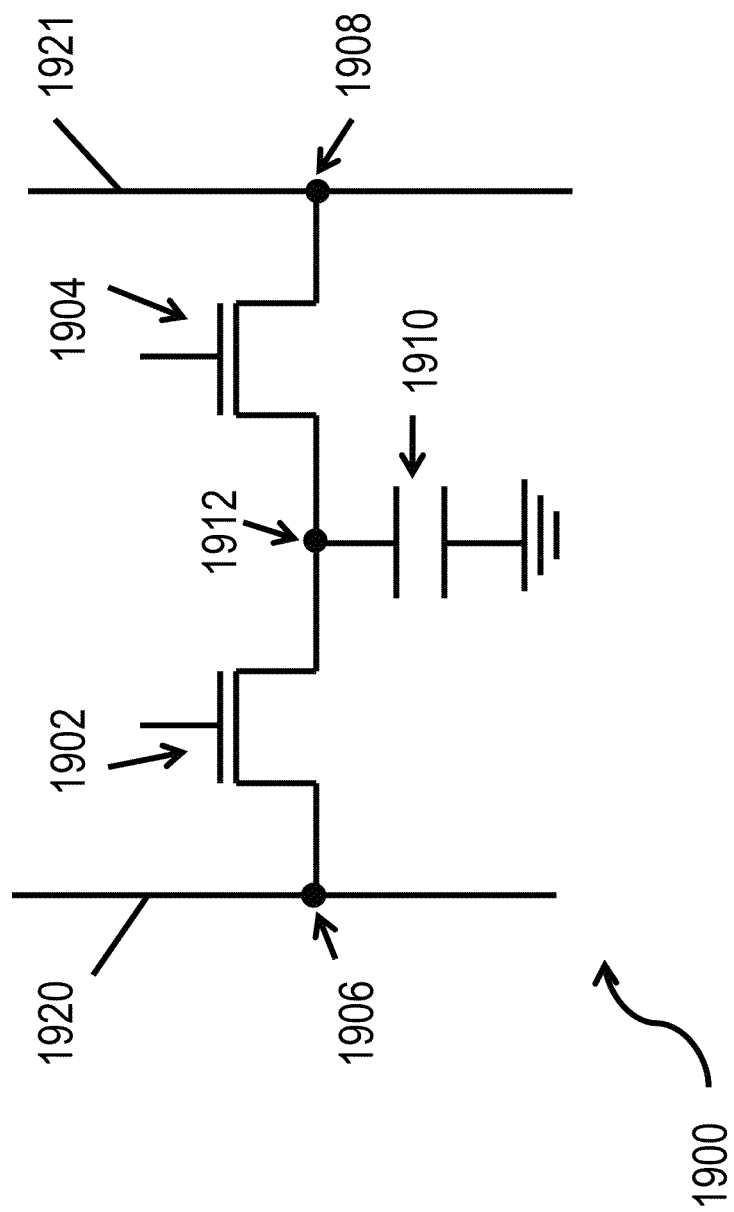

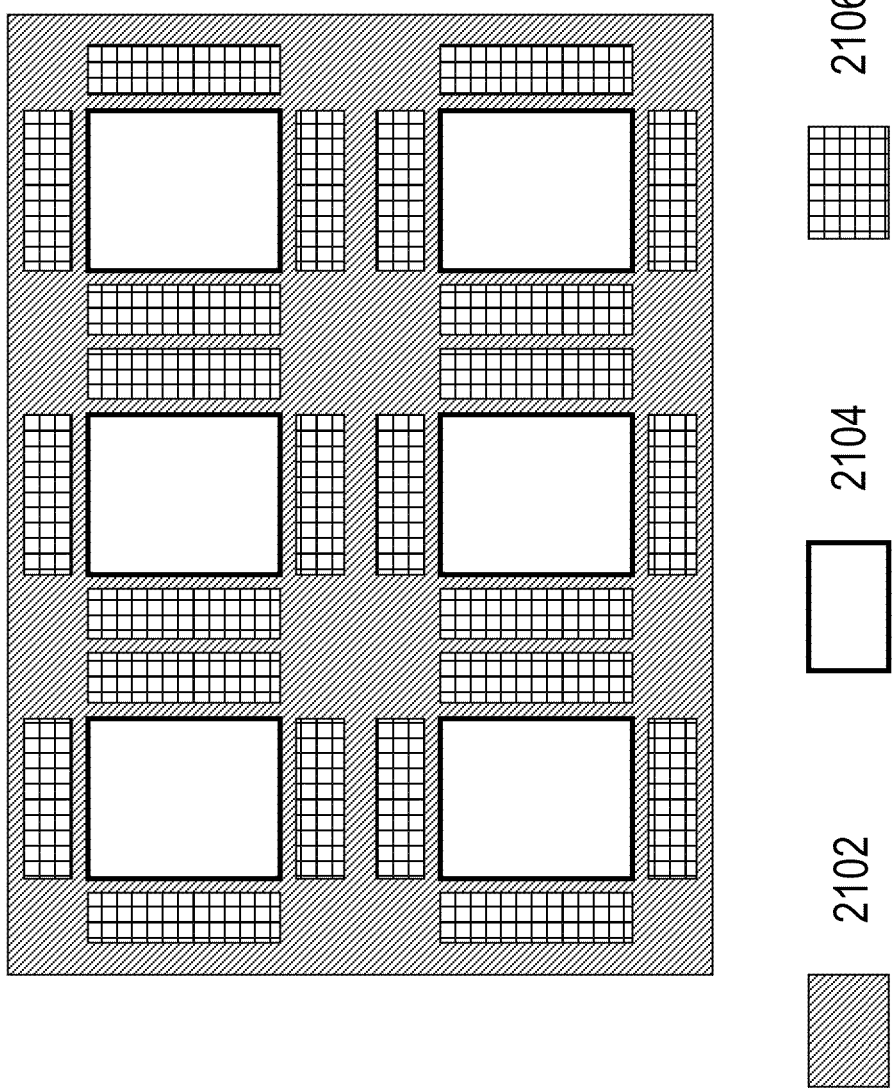

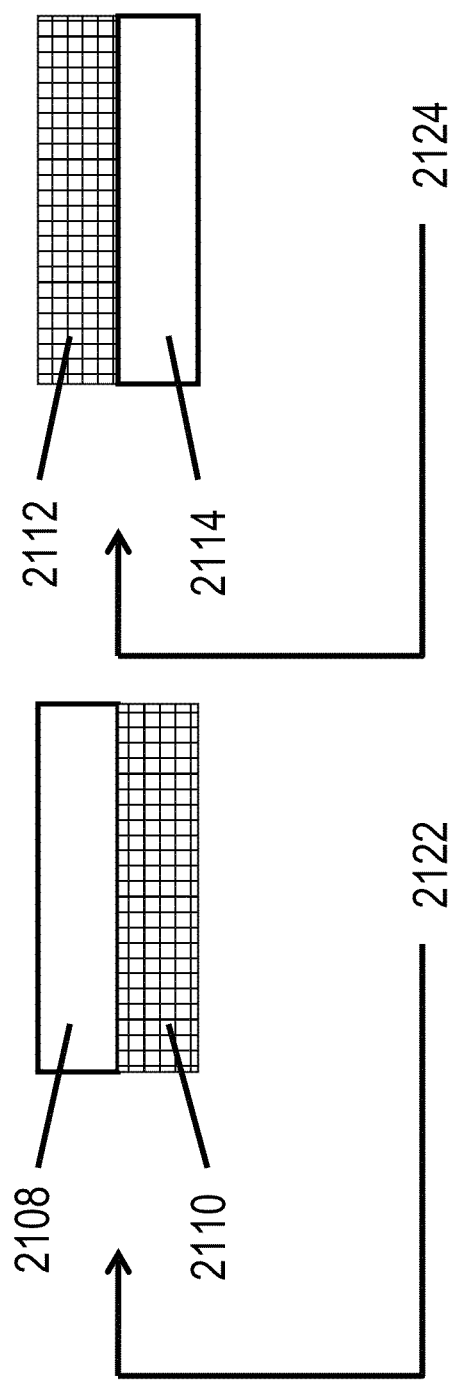

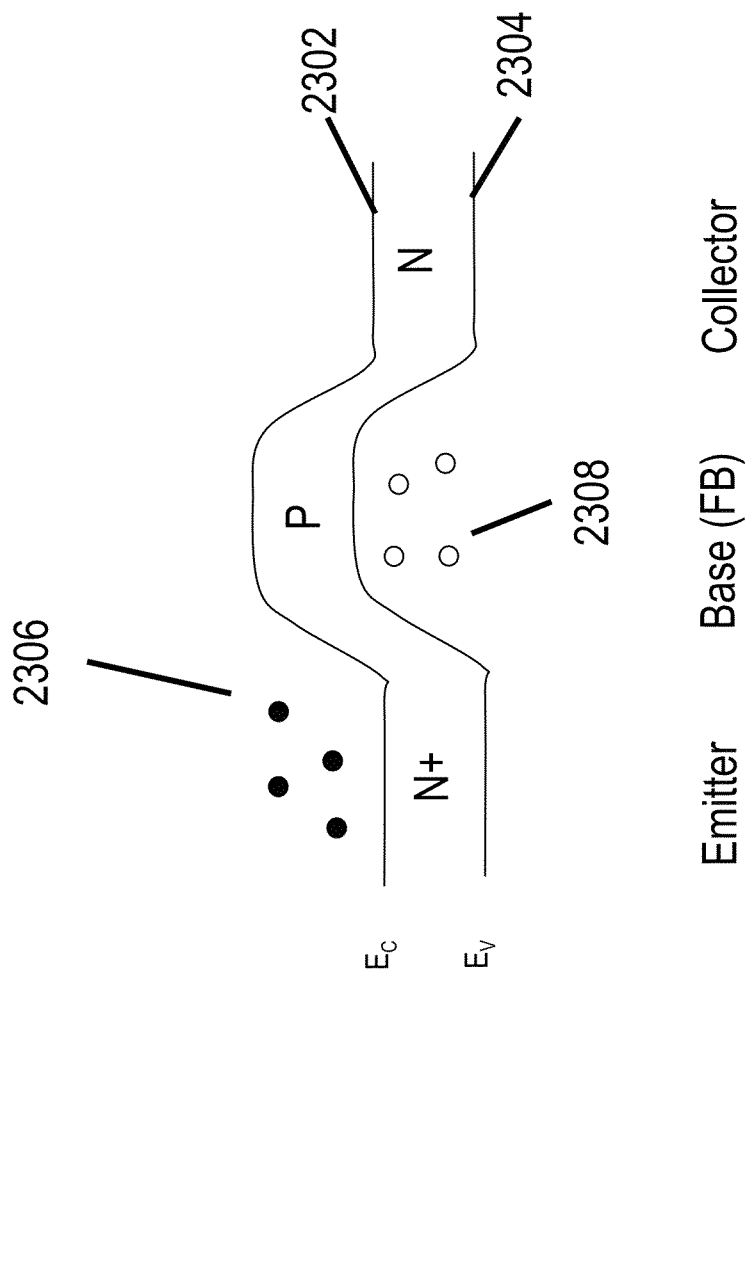

2903

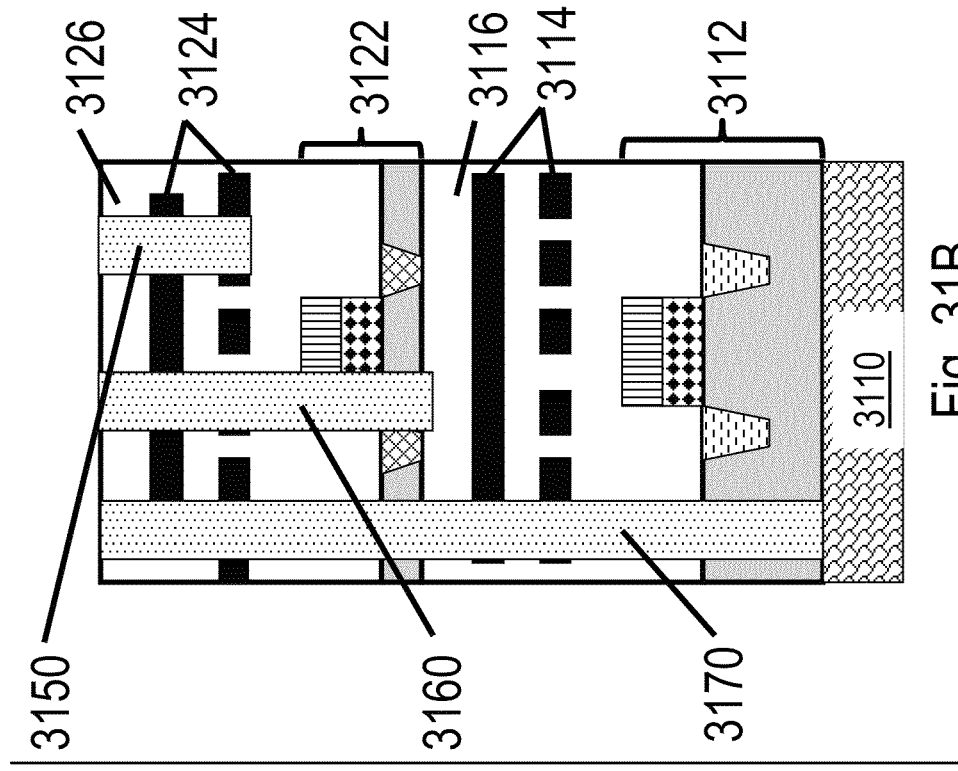
Fig. 31B
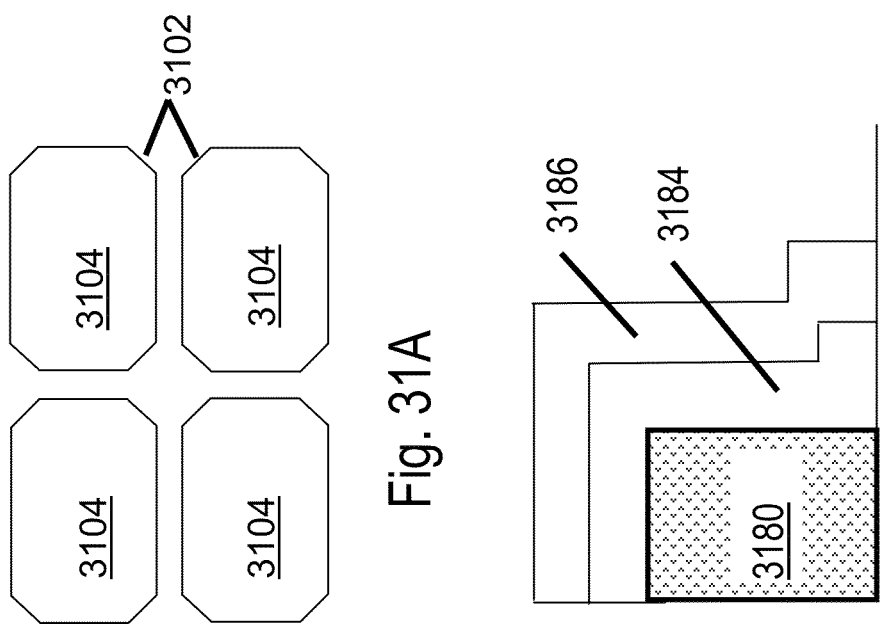
Fig. 31A
Fig. 31C

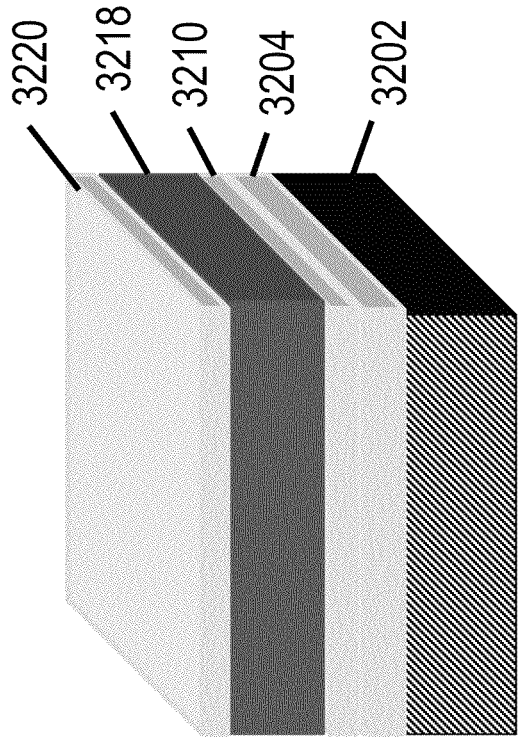
Symbols
Fig. 32C

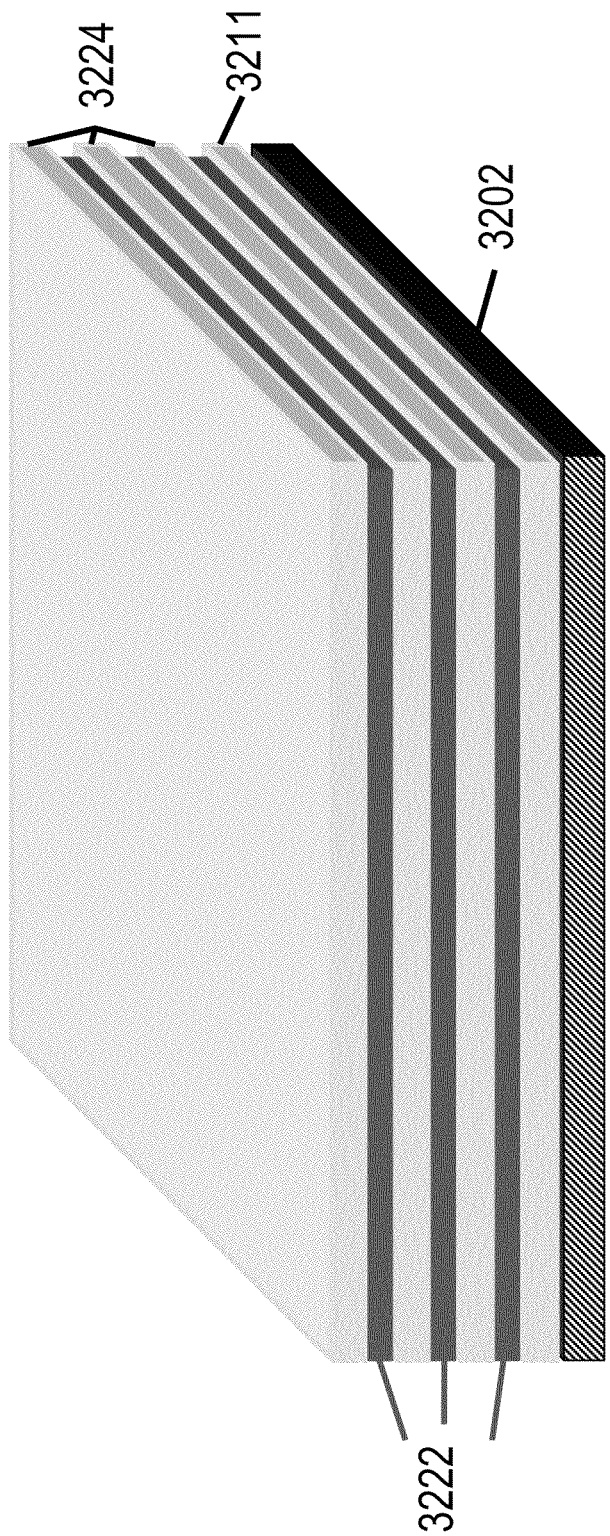
Symbols
 3202
 3222
Fig. 32D

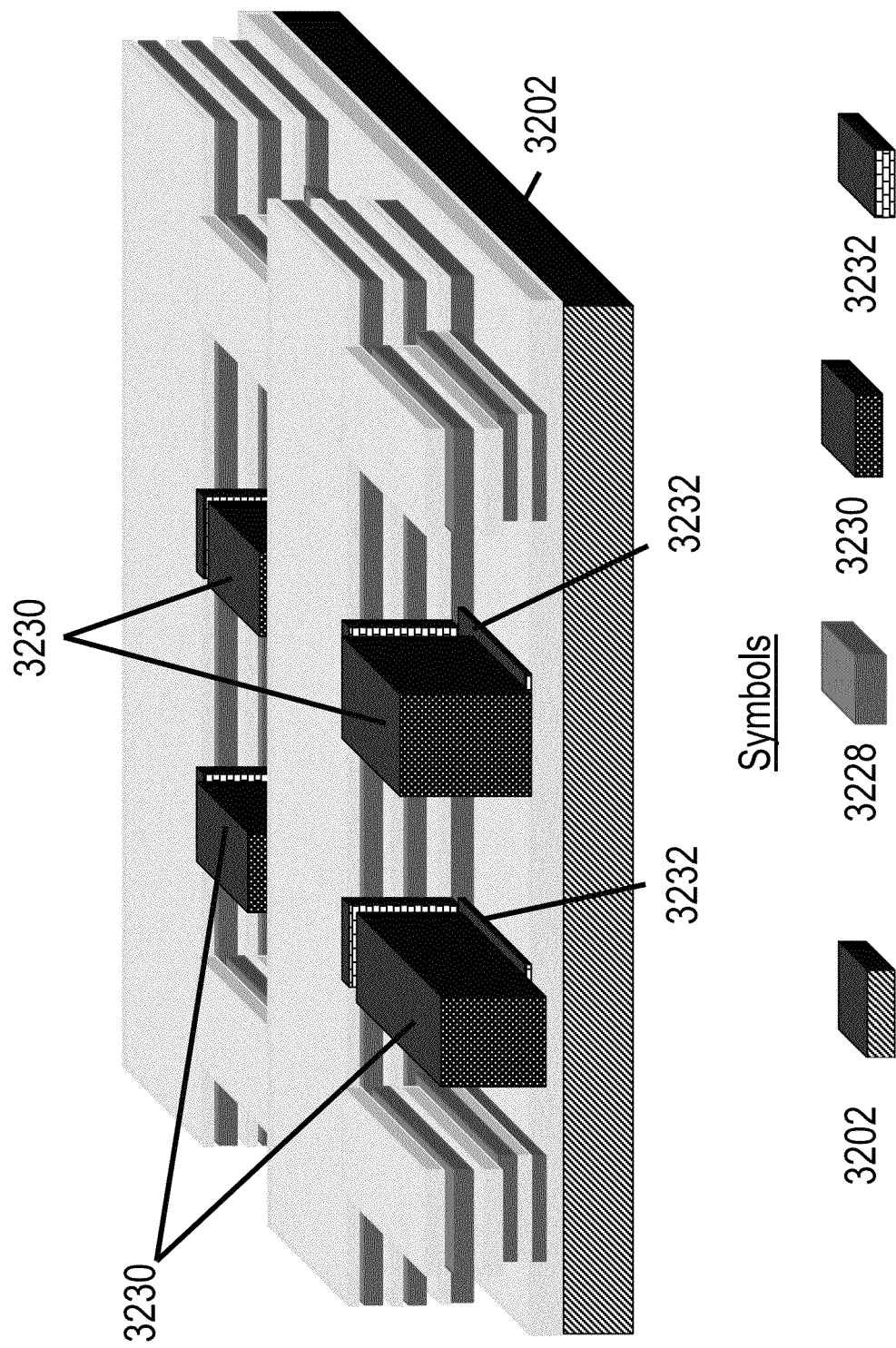

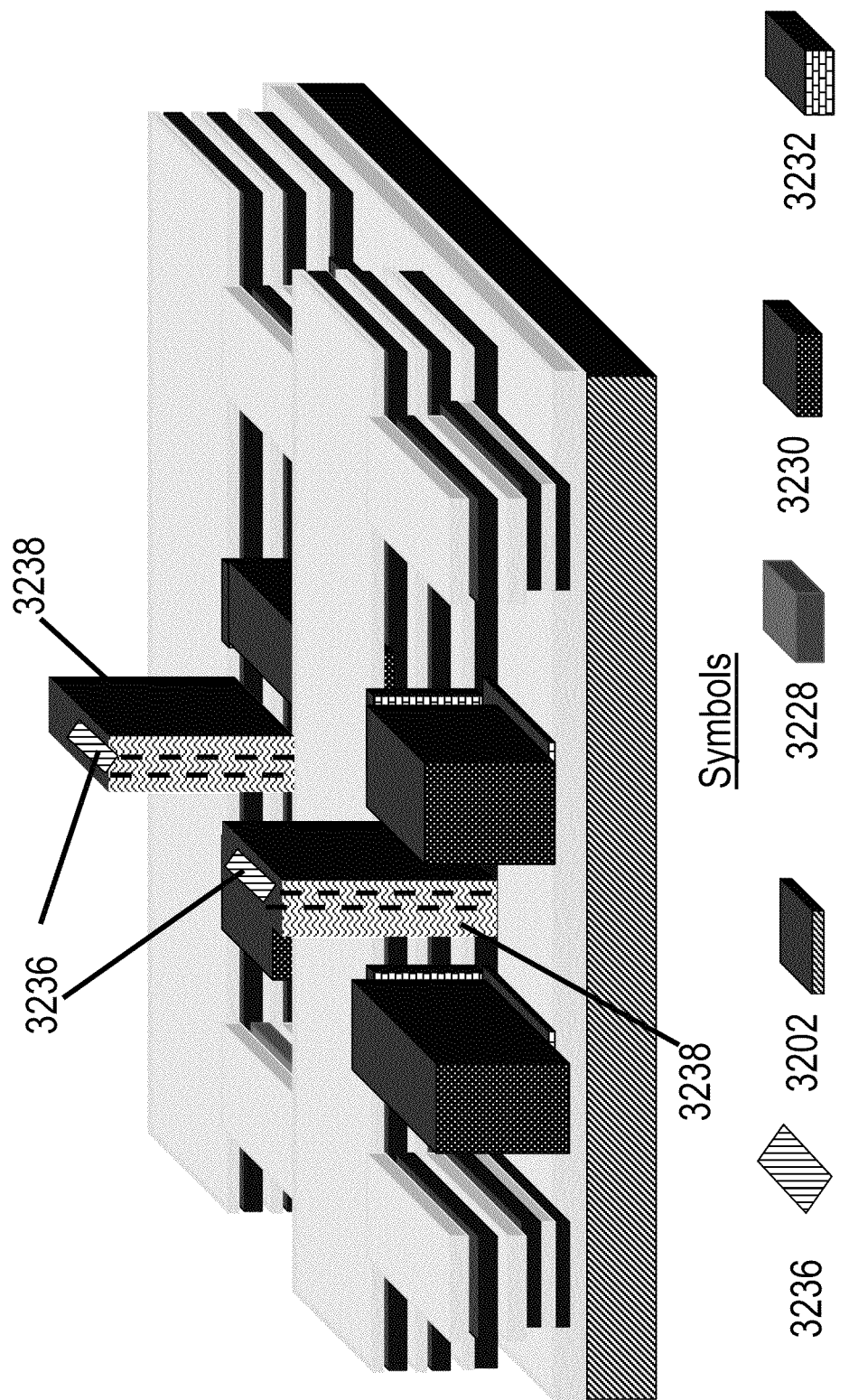

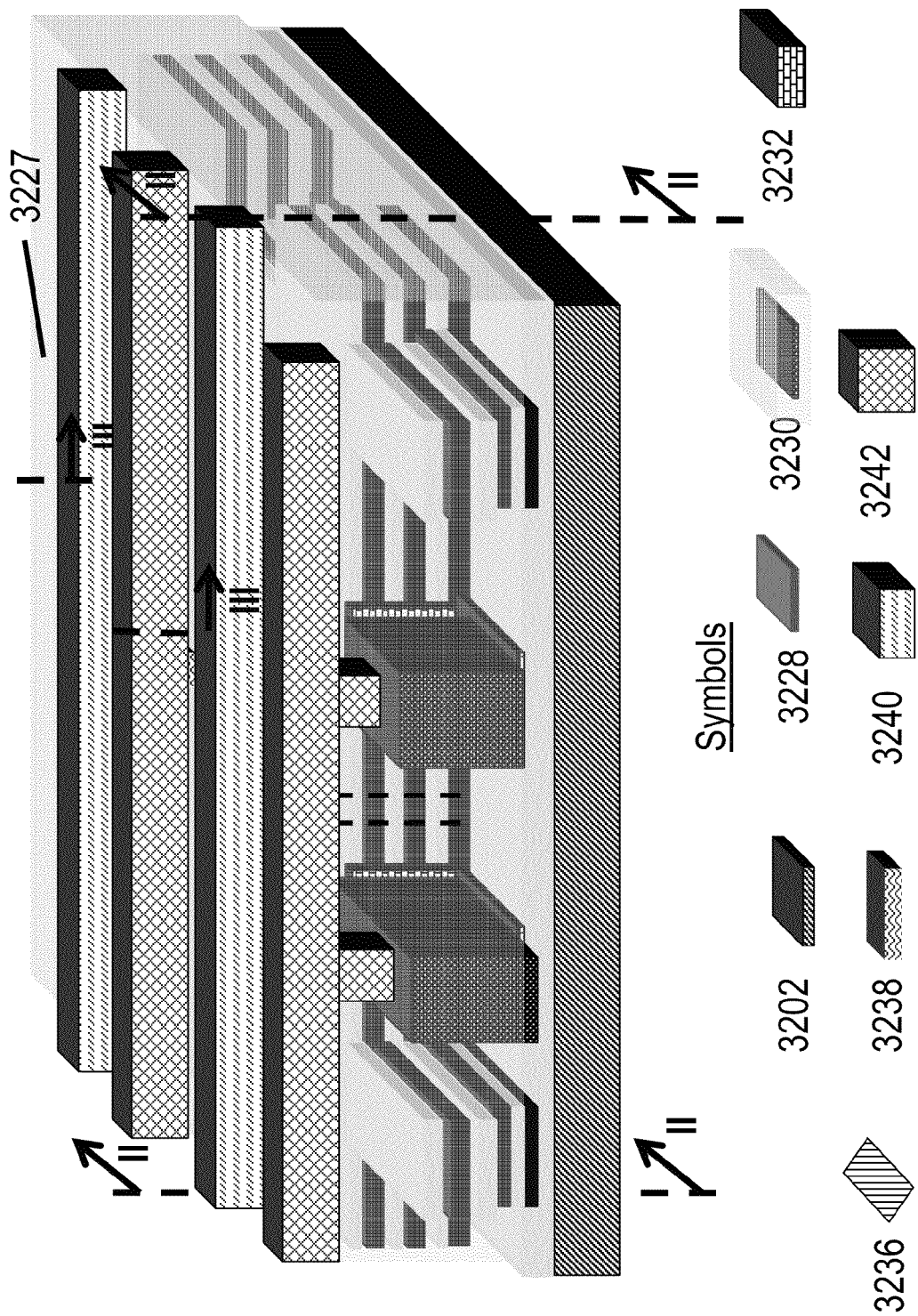

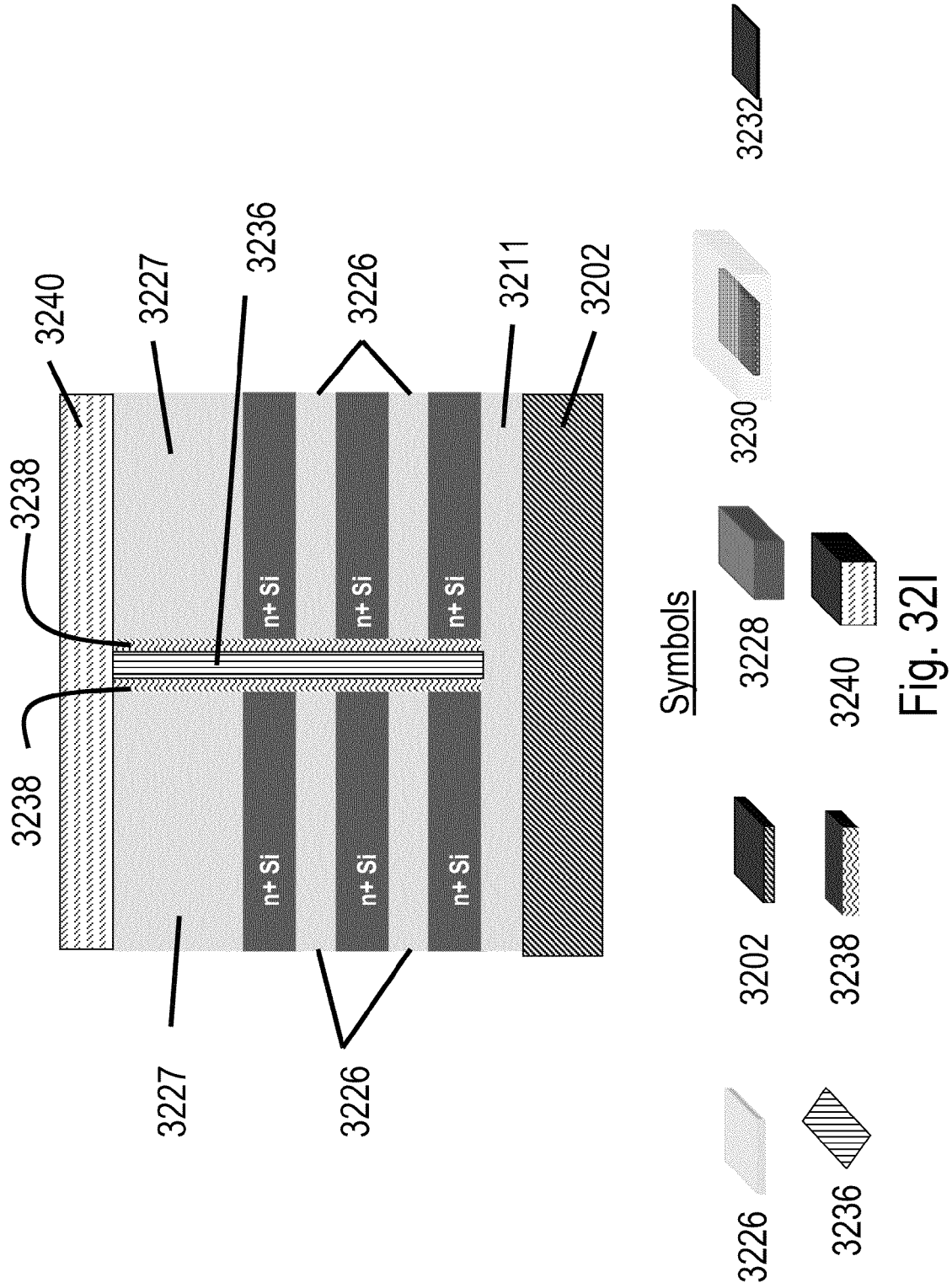

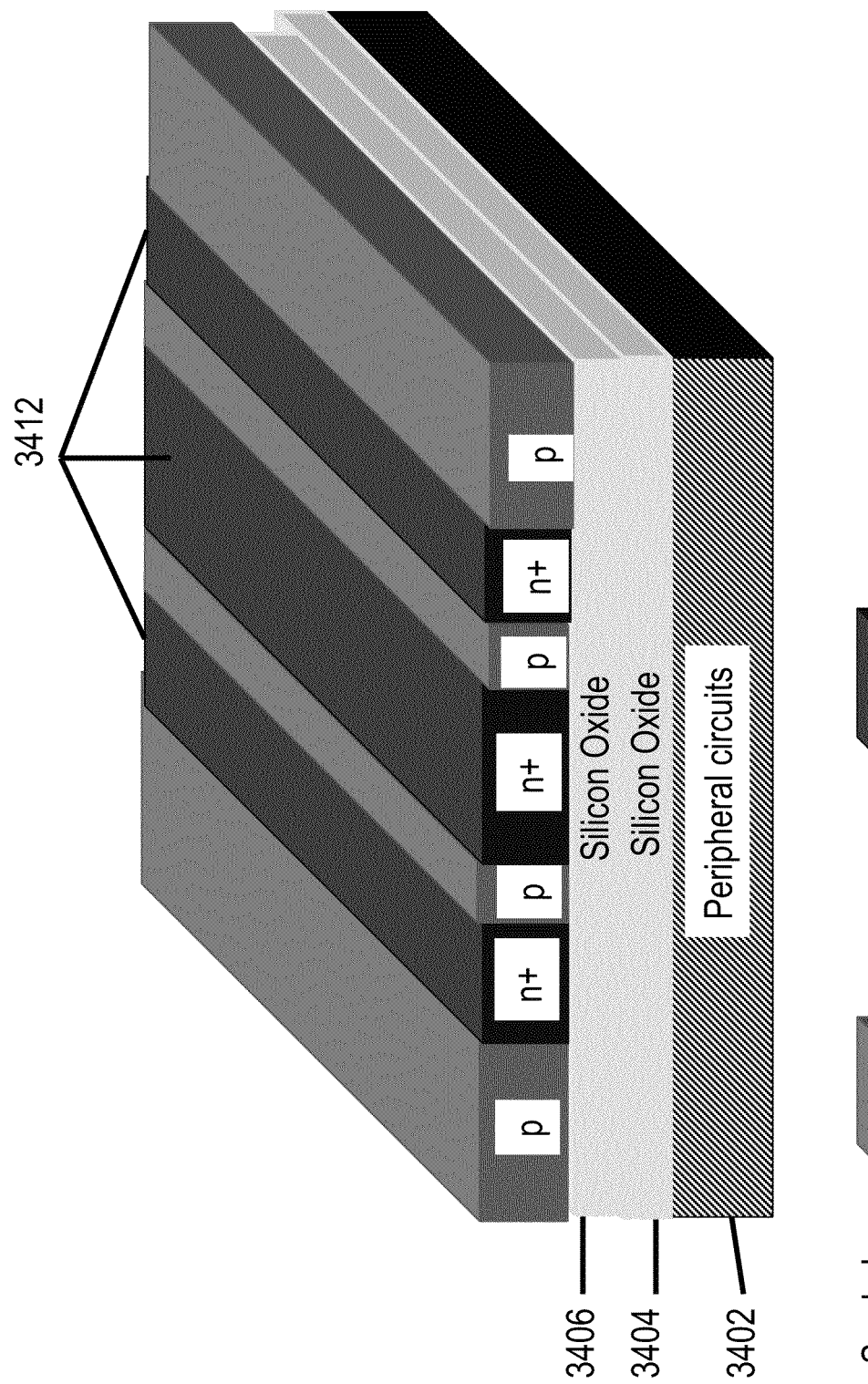

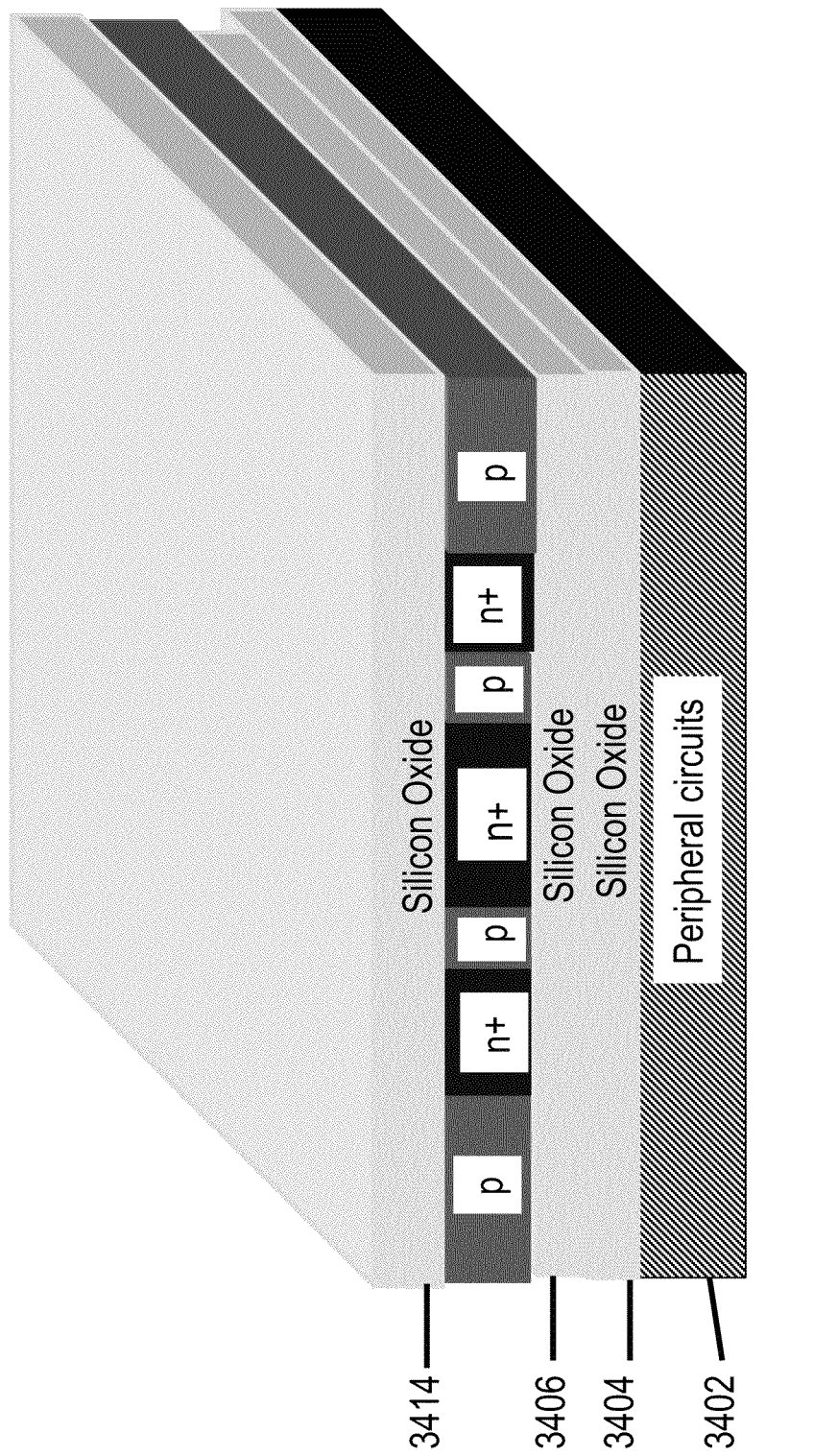

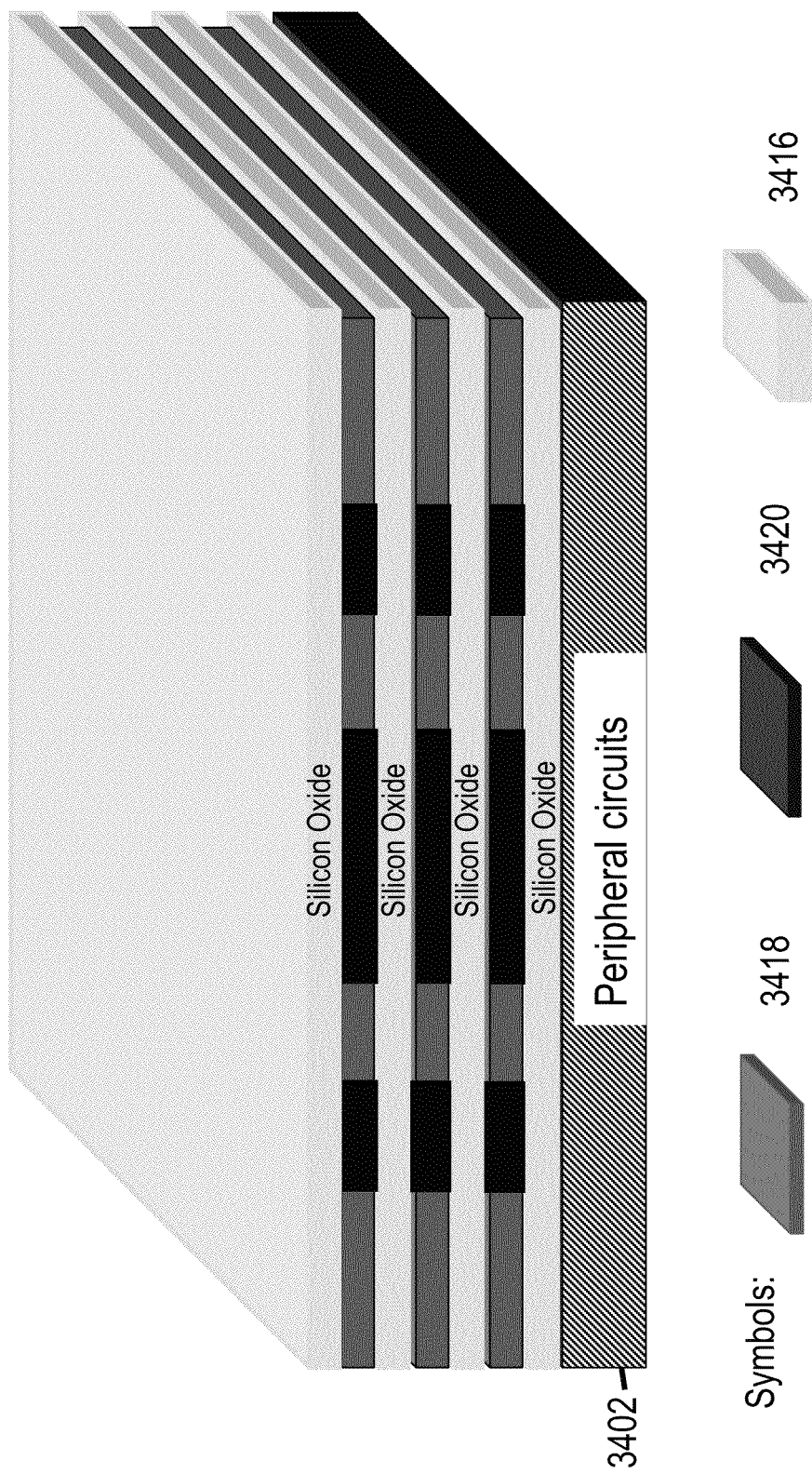

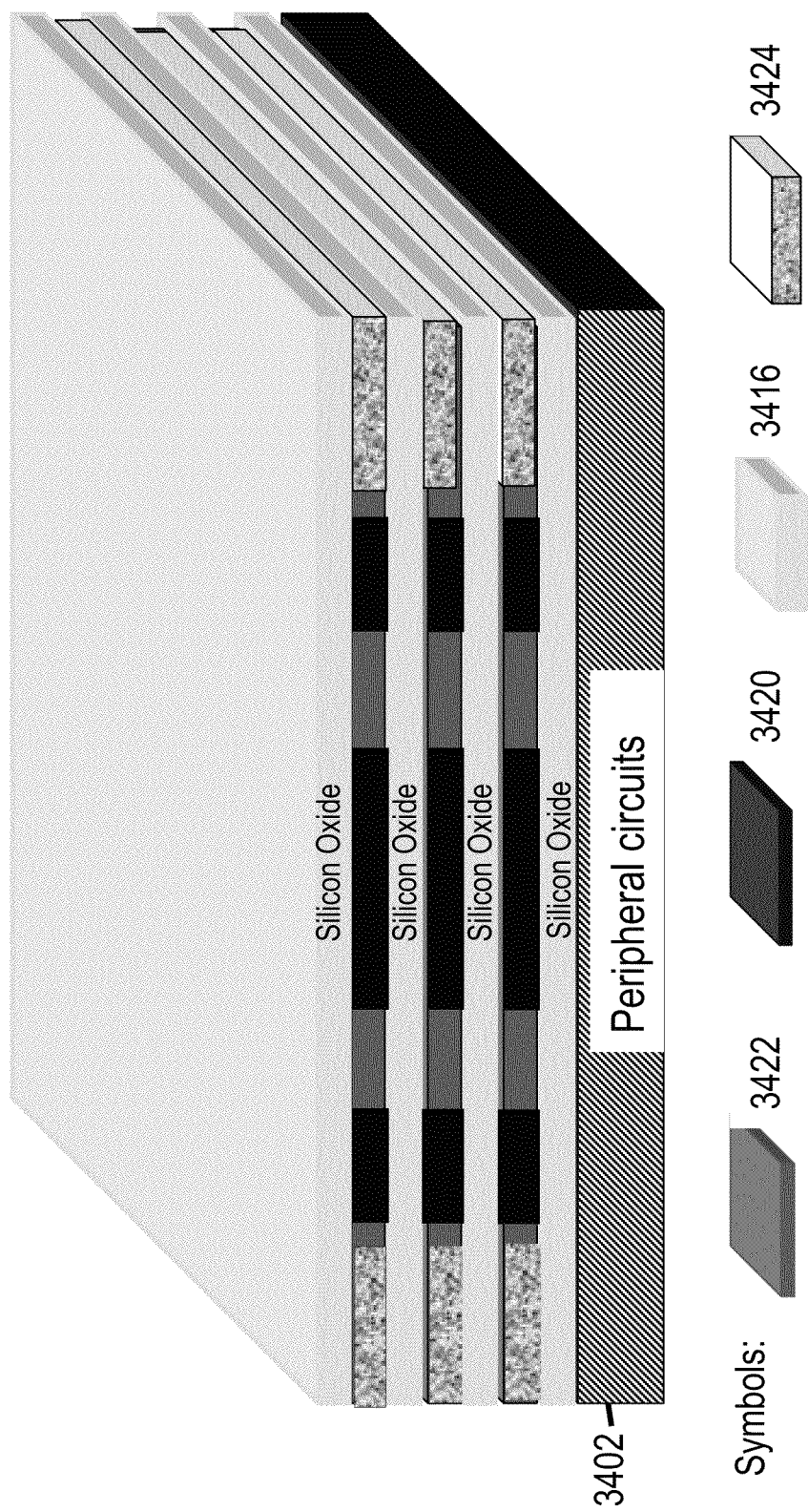

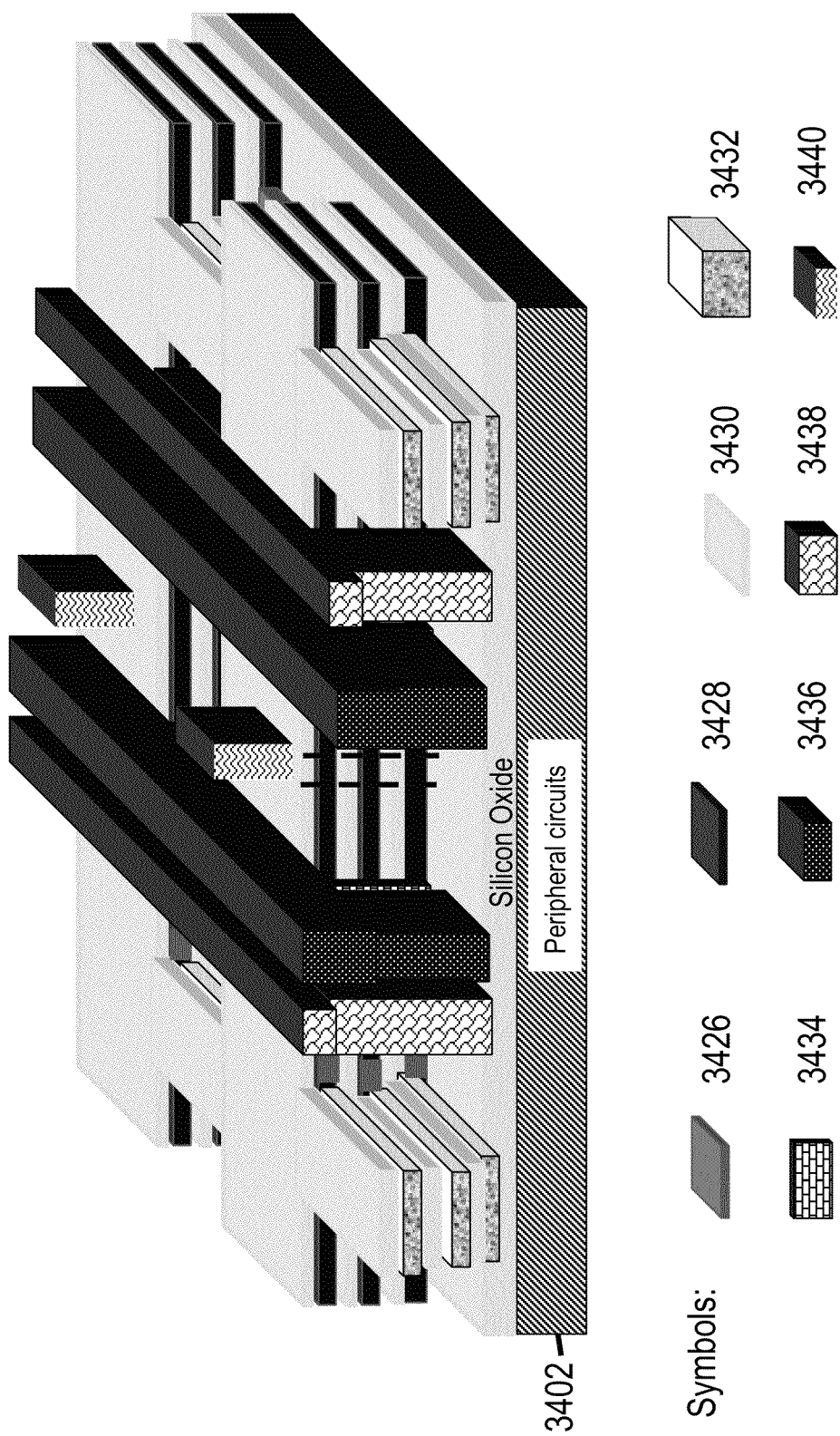

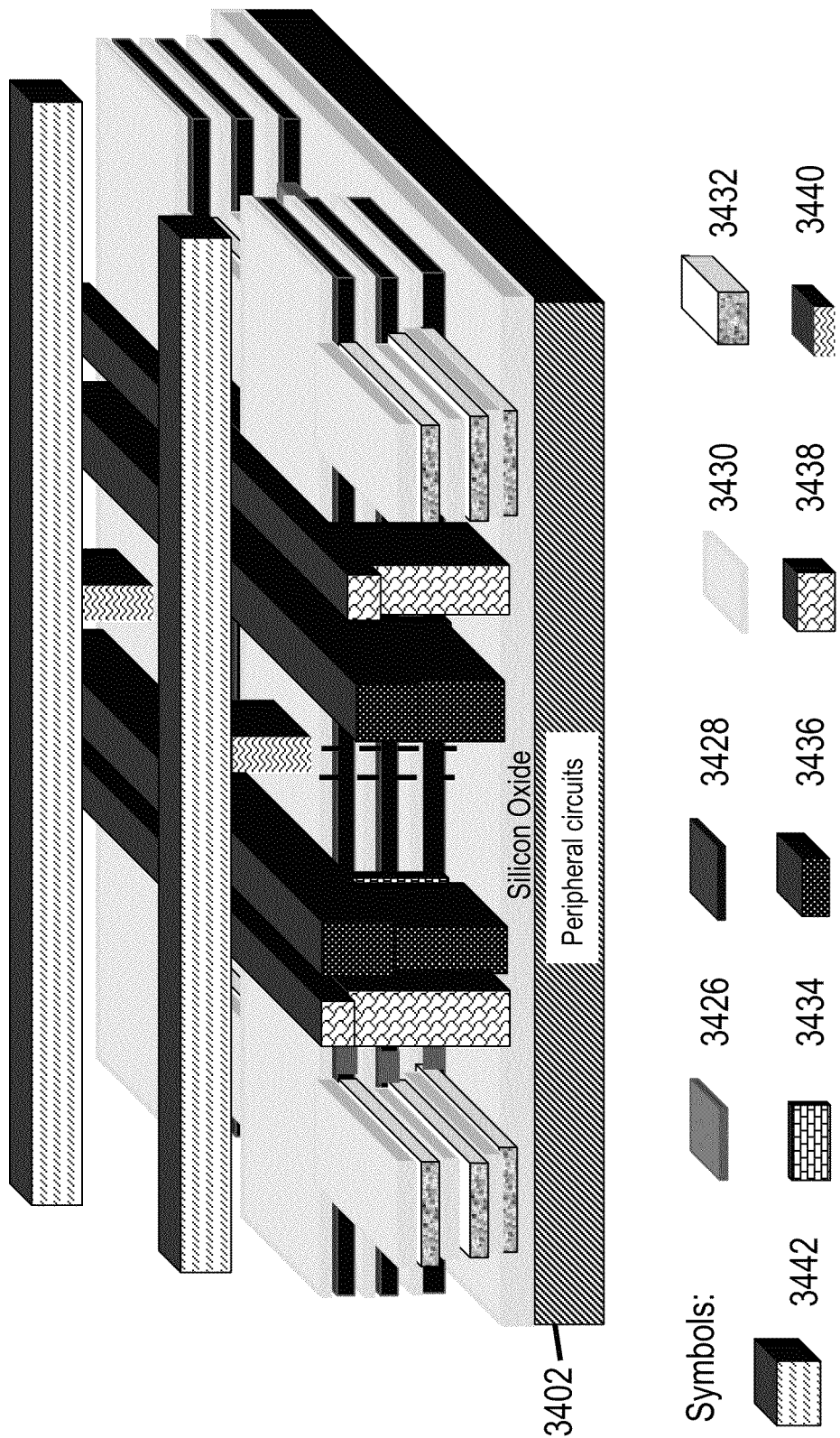

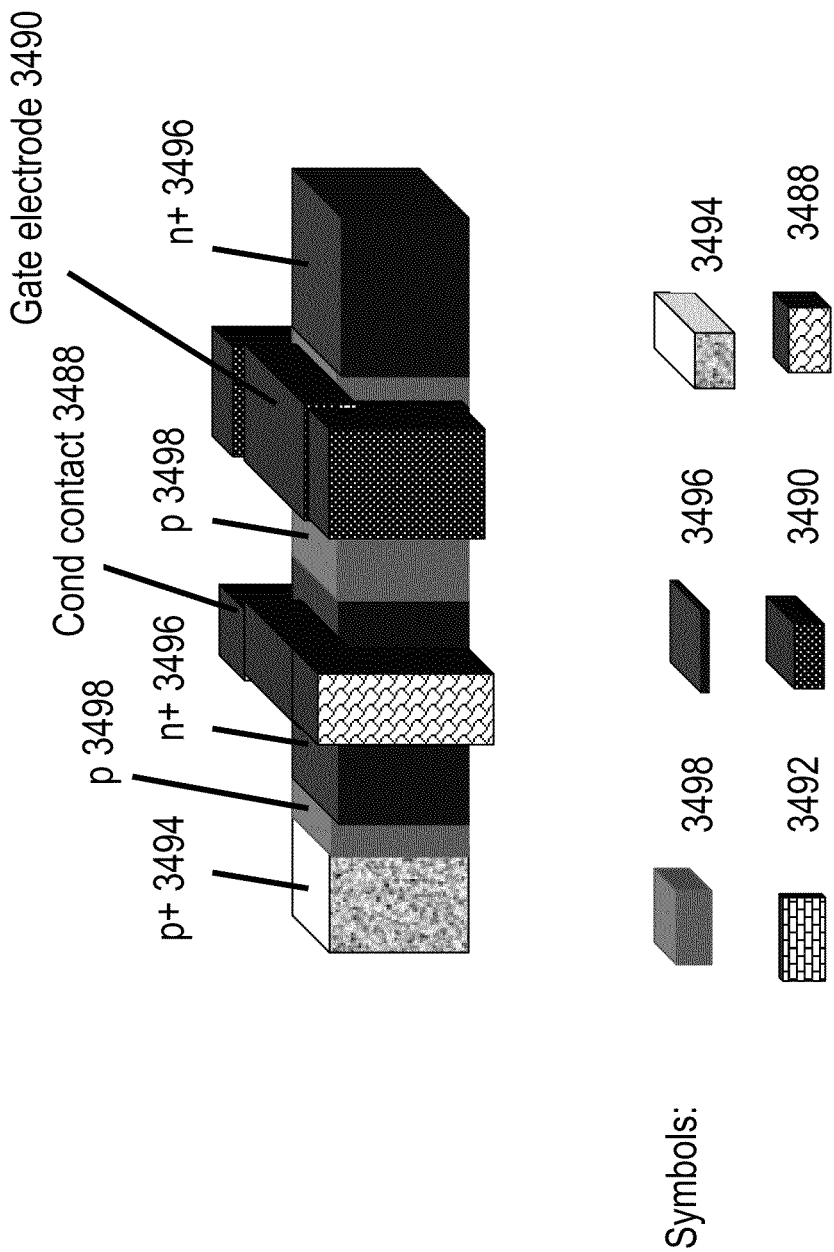

SEMICONDUCTOR DEVICE AND STRUCTURE

This application is a continuation of U.S. patent application Ser. No. 13/251,271, filed on Oct. 2, 2011, of which priority to is claimed. The contents of the foregoing applications are incorporated herein by reference.

BACKGROUND OF THE INVENTION

1. Field of the Invention

This application relates to the general field of Integrated Circuit (IC) devices and fabrication methods, and more particularly to multilayer or Three Dimensional Integrated Circuit (3D IC) devices and fabrication methods.

2. Discussion of Background Art

Logic chips such as microprocessors and Systems-on-Chips (SoCs) typically include a significant amount of on-die memory. This on-die memory can be in the form of Static Random Access Memory (SRAM), Dynamic Random Access Memory (DRAM), Flash Memory and/or another type of memory. In many chips today, as much as 50%-80% of the die area could be consumed by these memory types. Additionally, integrating memories such as DRAM with logic technologies may be difficult, and may add additional costs. Techniques to reduce area overhead of memories embedded on the chip, henceforth referred to as embedded memory, will be useful. Methods to improve performance of embedded memories, reduce power consumption, and reduce integration penalties with logic technologies will also be helpful.

3D stacking of semiconductor chips is one avenue to tackle issues with embedded memories. By arranging transistors in 3 dimensions instead of 2 dimensions (as was the case in the 1990s), embedded memories can be placed in a separate device layer from the logic transistors. This may allow unique optimization of logic and memory transistors and interconnects. However, there may be many barriers to practical implementation of 3D stacked chips. These include:

Constructing transistors in ICs typically require high temperatures (higher than about 700° C.) while wiring levels are constructed at low temperatures (lower than about 400° C.). Copper or Aluminum wiring levels, in fact, can get damaged when exposed to temperatures higher than about 400° C. If transistors were arranged in 3 dimensions along with wires, it may have the challenge described below. For example, consider a 2 layer stack of transistors and wires, i.e. Bottom Transistor Layer, above it Bottom Wiring Layer, above it Top Transistor Layer and above it Top Wiring Layer. When the Top Transistor Layer is constructed using Temperatures higher than about 700° C., it can damage the Bottom Wiring Layer.

Generally due to the above mentioned problem with forming transistor layers above wiring layers at temperatures lower than about 400° C., the semiconductor industry has largely explored alternative architectures for 3D stacking. In these alternative architectures, Bottom Transistor Layers, Bottom Wiring Layers and Contacts to the Top Layer may be constructed on one silicon wafer. Top Transistor Layers, Top Wiring Layers and Contacts to the Bottom Layer may be constructed on another silicon wafer. These two wafers may be bonded to each other and contacts may be aligned, bonded and connected to each other. Unfortunately, the size of Contacts to the other Layer may be large and the number of these Contacts may be small. In fact, prototypes of 3D stacked chips today utilize as few as about 10,000 conductive connections between two layers ('vertical connectivity'), compared to billions of conductive connections within a layer ('horizontal connectivity'). This low connectivity between layers may be because of two reasons: (i) Landing pad size may need to be relatively large due to alignment issues during wafer bonding. These could be due to many reasons, including bowing of wafers to be bonded to each other, thermal expansion differences between the two wafers, and lithographic or placement misalignment. This misalignment between two wafers may potentially limit the minimum contact landing pad area for electrical connection between two layers; (ii) The contact size may need to be relatively large. Forming contacts to another stacked wafer typically may involve having a Through-Silicon Via (TSV) on a chip. Etching deep holes in silicon with small lateral dimensions and filling them with dielectric and metal to form TSVs may not be easy. This may place a restriction on lateral dimensions of TSVs, which in turn may impact TSV density and contact density to another stacked layer. Therefore, connectivity between two the embedded memory and logic transistors may be limited.

U.S. Pat. No. 7,052,941 from Sang-Yun Lee ("S-Y Lee") describes methods to construct embedded memories with vertical transistors above wiring layers at less than 400° C. In these single crystal Si transistors, current flow in the transistor's channel region is in the vertical direction. Unfortunately, however, almost all semiconductor devices in the market today (logic, DRAM, flash memory) utilize horizontal (or planar) transistors due to their many advantages, and it may be difficult to convince the industry to move to vertical transistor technology.

It is highly desirable to circumvent these issues and build 3D stacked embedded memories with a reasonable connection density to logic transistors.

SUMMARY

The invention may be directed to multilayer or Three Dimensional Integrated Circuit (3D IC) devices and fabrication methods.

In one aspect, a semiconductor device, including: a first semiconductor layer including first transistors, wherein the first transistors are interconnected by at least one metal layer including aluminum or copper; and a second mono-crystallized semiconductor layer including second transistors and overlaying the at least one metal layer, wherein the at least one metal layer is in-between the first semiconductor layer and the second mono-crystallized semiconductor layer, wherein the second mono-crystallized semiconductor layer is less than 100 nm in thickness, and wherein the second transistors include horizontally oriented transistors.

In another aspect, an integrated device, including: a first monocrystalline layer including first transistors; a first metal layer including copper or aluminum and providing connections to the first transistors; and a second layer including monocrystalline material and including at least one memory cell constructed above the first metal layer, wherein the at least one memory cell includes second transistors, wherein the second transistors include drain and source that are horizontally oriented with respect to the second layer; and at least one via through the second layer providing connection between at least one of the second transistors and at least one of the first transistors, wherein said at least one via has a radius of less than 100 nm.

In another aspect, an integrated device, including: a semiconductor substrate and at least one metal layer, wherein the metal layer includes copper or aluminum; and an overlying layer including monocrystalline material of less than 100 nm thickness including memory regions, wherein the memory regions include horizontally oriented transistors.

In another aspect, an integrated device, including: a semiconductor substrate including first transistors and at least one metal layer providing connection to the transistors, wherein the metal layer includes copper or aluminum; and an overlying layer including monocrystalline material overlying the metal layer including memory regions, wherein the memory regions include horizontally oriented transistors and at least one via through the overlying layer providing connection between the memory regions and at least one of the first transistors, and wherein the at least one via has a radius of less than 100 nm.

In another aspect, an integrated device comprising a first monocrystalline layer comprising logic circuit regions and a second monocrystalline layer comprising memory regions constructed above first monocrystalline layer, wherein the memory regions comprise second transistors, wherein said second transistors comprise drain and source that are horizontally oriented with respect to the second monocrystalline layer, and a multiplicity of vias through the second monocrystalline layer providing connections between the memory regions and the logic circuit regions, wherein at least one of the multiplicity of vias have a radius of less than 100 nm.

In another aspect, an integrated device comprising a first monocrystalline layer comprising logic circuit regions and a second monocrystalline layer of less than 150 nm thickness, comprising memory regions constructed above the first monocrystalline layer, wherein the memory regions comprise second transistors, wherein the memory regions comprise volatile memory, and wherein the logic circuit regions comprise memory management circuits to extend the proper functionality of the volatile memory.

In another aspect, an integrated device comprising at least one memory region and at least one logic region wherein the memory region is volatile memory, and wherein the volatile memory comprises a multiplicity of memory cells, wherein each of the memory cells comprises two ports, and wherein the logic region comprises refresh logic to refresh the memory cells using one of the ports.

In another aspect, an integrated device comprising at least one memory region and at least one logic region, comprising a semiconductor substrate and at least one metal layer, wherein the metal layer comprises copper or aluminum and an overlying monocrystalline layer of less than 100 nm thickness comprising memory regions, wherein the memory regions comprise horizontally oriented transistors.

Illustrated advantages of the embodiments may include one or more of the following. A 3DIC device with horizontal or horizontally oriented transistors and devices in monocrystalline silicon can be built at low temperatures. The 3D IC construction of partially preformed layers of transistors provides a high density of layer to layer interconnect.

The 3D ICs offer many significant potential benefits, including a small footprint—more functionality fits into a small space. This extends Moore's Law and enables a new generation of tiny but powerful devices. The 3D ICs have improved speed—The average wire length becomes much shorter. Because propagation delay may be proportional to the square of the wire length, overall performance increases. The 3D ICs consume low power—Keeping a signal on-chip reduces its power consumption by ten to a hundred times. Shorter wires also reduce power consumption by producing less parasitic capacitance. Reducing the power budget leads to less heat generation, extended battery life, and lower cost of operation. The vertical dimension adds a higher order of connectivity and opens a world of new design possibilities. Partitioning a large chip to be multiple smaller dies with 3D stacking could potentially improve the yield and reduce the fabrication cost. Heterogeneous integration—Circuit layers can be built with different processes, or even on different types of wafers. This means that components can be optimized to a much greater degree than if built together on a single wafer. Components with incompatible manufacturing could be combined in a single device. The stacked structure may hinder attempts to reverse engineer the circuitry. Sensitive circuits may also be divided among the layers in such a way as to obscure the function of each layer. 3D integration may allow large numbers of vertical vias between the layers. This may allow construction of wide bandwidth buses between functional blocks in different layers. A typical example would be a processor and memory 3D stack, with the cache memory stacked on top of the processor. This arrangement may allow a bus much wider than the typical 128 or 256 bits between the cache and processor. Wide buses in turn alleviate the memory wall problem.

BRIEF DESCRIPTION OF THE DRAWINGS

Various embodiments of the invention will be understood and appreciated more fully from the following detailed description, taken in conjunction with the drawings in which:

FIG. 3 is an exemplary drawing illustration of the 3D stacking of monolithic 3D DRAM with logic with TSV technology;

FIG. 4A-G are exemplary drawing illustrations of a process for monolithic 3D stacking of logic with DRAM produced using multiple memory layers and shared lithography steps;

FIG. 6A-J are exemplary drawing illustrations of a process flow for constructing monolithic 3D capacitor-based DRAMs with lithography steps shared among multiple memory layers;

FIG. 8A-B are exemplary drawing illustrations of potential challenges associated with high field effects in floating-body RAM;

FIG. 16A-C are exemplary drawing illustrations of configurations useful for controller functions;

FIG. 18 is an exemplary drawing illustration of a cache structure in a floating body RAM chip;

FIG. 19 is an exemplary drawing illustration of a dual-port refresh scheme for capacitor-based DRAM;

FIG. 21A is an exemplary drawing illustration of a 2D chip with memory, peripheral circuits, and logic circuits;

FIG. 21B is an exemplary drawing illustration of peripheral circuits may be stacked monolithically above or below memory arrays;

FIG. 23A-C are exemplary drawing illustrations of the behavior of the embedded BJT during the floating body operation, programming, and erase.

FIG. 31A is an exemplary drawing illustration of chamfering the custom function etching shape for stress relief;

FIG. 31B is an exemplary drawing illustration of potential depths of custom function etching a continuous array in 3DIC; and, FIG. 31C is an exemplary drawing illustration of a method to passivate the edge of a custom function etch of a continuous array in 3DIC;

FIG. 32A-J are exemplary drawing illustrations of a process flow for constructing monolithic 3D capacitor-based DRAMs with lithography steps shared among multiple memory layers;

FIG. 34A-L are exemplary drawing illustrations of a process flow for constructing monolithic 3D DRAMs with lithography steps shared among multiple memory layers that may not require high electric fields for write.

DETAILED DESCRIPTION

Figure 1:
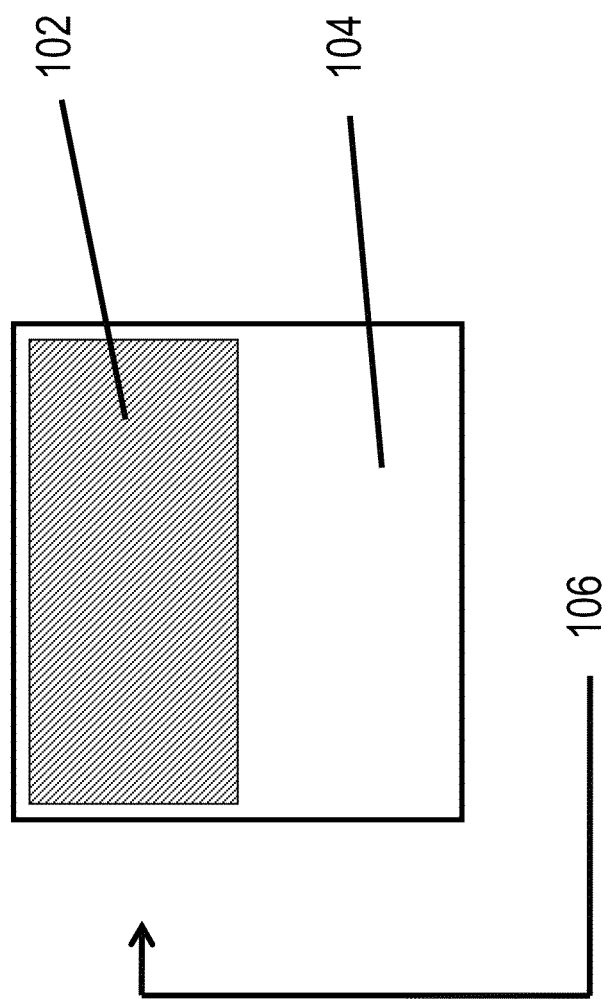
FIG. 1 illustrates the embedded memory portion of a standard 2D integrated circuit (prior art)

Embodiments of the invention are described herein with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing illustration figures may describe process flows for building devices. These process flows, which may be a sequence of steps for building a device, may have many structures, numerals and labels that may be common between two or more adjacent steps. In such cases, some labels, numerals and structures used for a certain step's figure may have been described in the previous steps' figures.

FIG. 1 illustrates an exemplary top view of a prior art 2D integrated circuit 106 which may have logic circuits 104 (such as, for example, arithmetic logic units, instruction fetch units, and instruction decode units) as well as memory circuits such as SRAM blocks 102. The SRAM blocks 102 may be concentrated in one area of the chip (shown) or there may be significant amounts of SRAM in multiple areas of the chip. Typically, in many 2D integrated circuits, embedded memory blocks such as SRAM may consume a bigger percentage of chip area with every successive technology generation. Furthermore, some chips may use DRAM as an embedded memory in addition to SRAM or in place of SRAM. Hence, substantially all or portions of SRAM blocks 102 may include DRAM memory.

Figure 2:
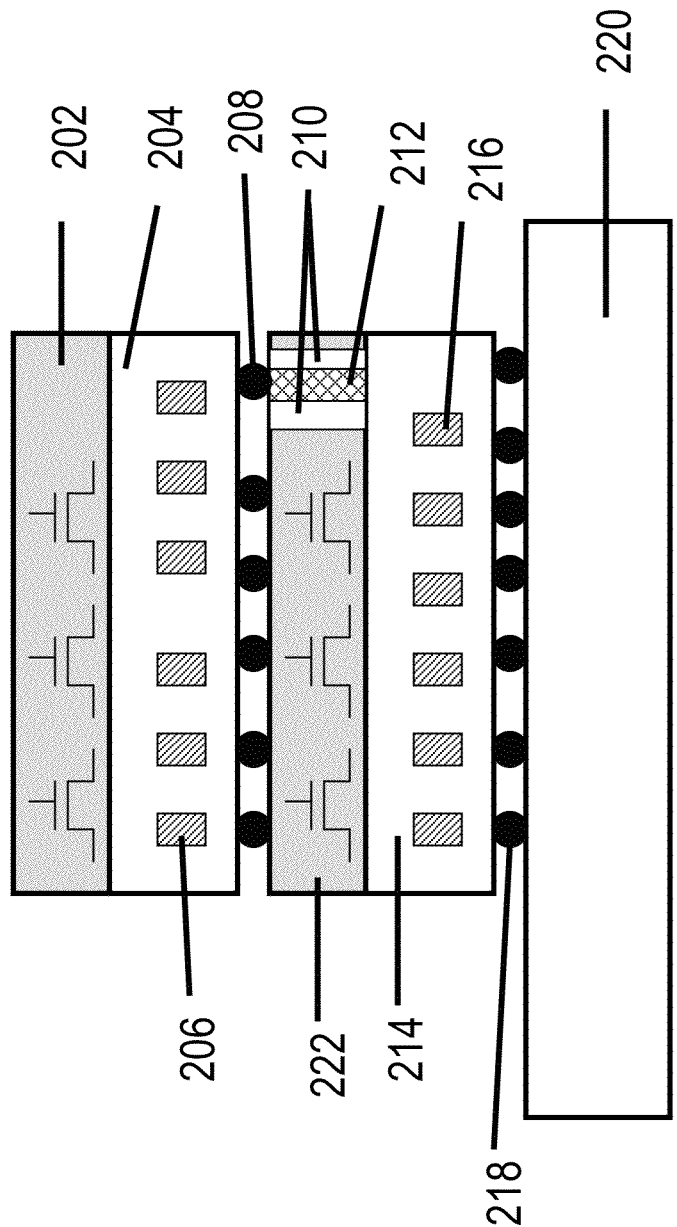
FIG. 2 illustrates the 3D stacking of embedded memory using through-silicon via (TSV) technology (prior art)

FIG. 2 shows a prior art illustration of embedded memory that may be in a 3D stacked layer above or below a logic chip and may be electrically connected to the logic chip using through-silicon via (TSV) technology. With TSV technology, two chips or wafers or transistor layers may be constructed separately, and then may be attached to each other using bonding and electrical vertical connections between the two chips or wafers or transistor layers may be made with through-silicon vias (TSVs). This type of configuration may allow embedded memory to be built with its own optimized technology and the logic chip to be built with its own optimized technology, thereby potentially improving the system. The embedded memory could be a volatile memory such as DRAM and/or SRAM, or any other type of memory, such as non-volatile memory (NVM). The example illustrated in FIG. 2 may include transistor regions of a top chip 202, interconnect dielectric regions of a top chip 204, metal interconnect regions of a top chip 206, solder bumps of a top chip 208, interconnect dielectric regions of a bottom chip 214, metal interconnect regions of a bottom chip 216, through-silicon via 212, dielectric regions surrounding a through-silicon via 210, solder bumps of a bottom chip 218, transistor regions of a bottom chip 222, and packaging substrate 220. The top chip may be a DRAM chip and the bottom chip may be a logic chip. Alternatively, the top chip may be a logic chip and the bottom chip may be a DRAM chip. Alternatively, SRAM may be used instead of DRAM in these configurations. The embedded memory elements such as DRAM may be built with an optimized for DRAM technology and may have optimized transistors, interconnect layers and other components such as capacitors.

FIG. 3 illustrates an embodiment of the invention, wherein monolithic 3D DRAM constructed with lithography steps shared among multiple memory layers may be stacked above or below a logic chip. DRAM, as well as SRAM and floating body DRAM, may be considered volatile memory, whereby the memory state may be substantially lost when supply power is removed. Monolithic 3D DRAM constructed with lithography steps shared among multiple memory layers (henceforth called M3DDRAM-LSSAMML) could be constructed using techniques, for example, described in co-pending published patent application 2011/0121366 (FIGS. 98A-H to FIGS. 100A-L). One configuration for 3D stack M3DDRAM-LSSAMML and logic 310 may include logic chip 304, M3DDRAM-LSSAMML chip 306, solder bumps 308, and packaging substrate 302. M3DDRAM-LSSAMML chip 306 may be placed above logic chip 304, and logic chip 304 may be coupled to packaging substrate 302 via solder bumps 308. A portion of or substantially the entirety of the logic chip 304 and the M3DDRAM-LSSAMML chip 306 may be processed separately on different wafers and then stacked atop each other using, for example, through-silicon via (TSV) stacking technology. This stacking may be done at the wafer-level or at the die-level or with a combination. Logic chip 304 and the M3DDRAM-LSSAMML chip 306 may be constructed in a monocrystalline layer or layers respectively. Another configuration for 3D stack M3DDRAM-LSSAMML and logic 320 may include logic chip 316, M3DDRAM-LSSAMML chip 314, solder bumps 318 and packaging substrate 312. Logic chip 316 may be placed above M3DDRAM-LSSAMML chip 314, and M3DDRAM-LSSAMML chip 314 may be coupled to packaging substrate 312 via solder bumps 318. A portion of or substantially the entirety of the logic chip 316 and the M3DDRAM-LSSAMML chip 314 may be processed separately on different wafers and then stacked atop each other using, for example, through-silicon via (TSV) stacking technology. This stacking may be done at the wafer-level or at the die-level or with a combination. The transistors in the monocrystalline layer or layers may be horizontally oriented, i.e., current flowing in substantially the horizontal direction in transistor channels, substantially between drain and source, which may be parallel to the largest face of the substrate or wafer. The source and drain of the horizontally oriented transistors may be within the same monocrystalline layer. A transferred monocrystalline layer may have a thickness of less than about 150 nm.

FIG. 4A-G illustrates an embodiment of the invention, wherein logic circuits and logic regions, which may be constructed in a monocrystalline layer, may be monolithically stacked with monolithic 3D DRAM constructed with lithography steps shared among multiple memory layers (M3DDRAM-LSSAMML), the memory layers or memory regions may be constructed in a monocrystalline layer or layers. The process flow for the silicon chip may include the following steps that may be in sequence from Step (1) to Step (5). When the same reference numbers are used in different drawing figures (among FIG. 4A-G), they may be used to indicate analogous, similar or identical structures to enhance the understanding of the invention by clarifying the relationships between the structures and embodiments presented in the various diagrams—particularly in relating analogous, similar or identical functionality to different physical structures.

Figure 4C:
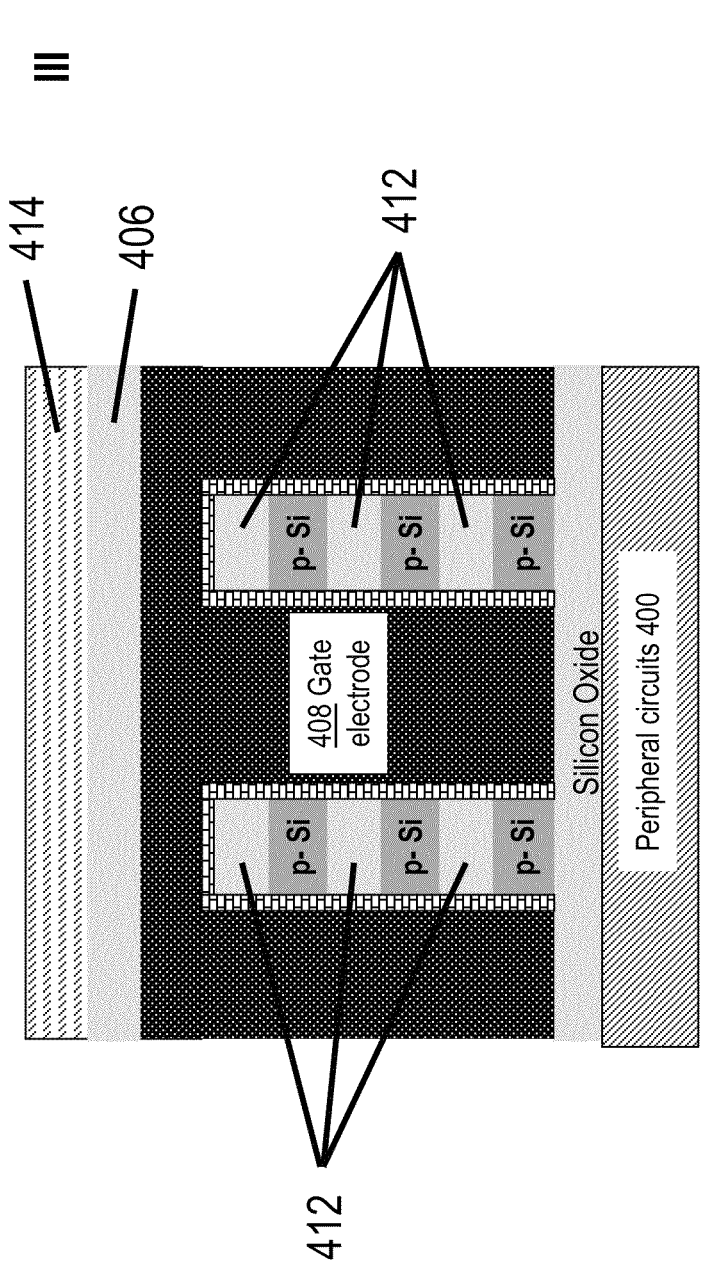
Figure 4D:
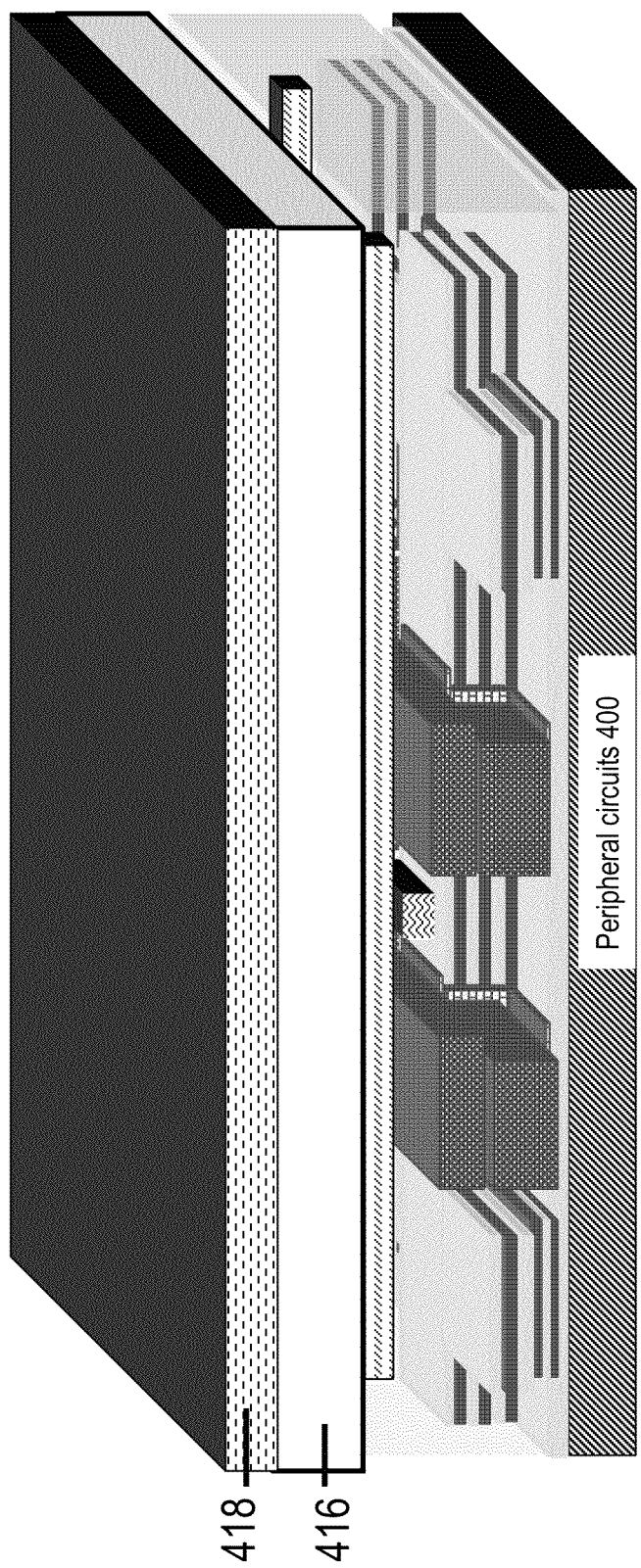

Step (1): This may be illustrated with FIG. 4A-C. FIG. 4A illustrates a three-dimensional view of an exemplary M3DDRAM-LSSAMML that may be constructed using techniques described in patent application 2011/0121366 (FIGS. 98A-H to FIGS. 100A-L). FIG. 4B illustrates a cross-sectional view along the II direction of FIG. 4A while FIG. 4C illustrates a cross-sectional view along the III direction of FIG. 4A. The legend of FIG. 4A-C may include gate dielectric 402, conductive contact 404, silicon dioxide 406 (nearly transparent for illustrative clarity), gate electrode 408, n+ doped silicon 410, silicon dioxide 412, and conductive bit lines 414. The conductive bit lines 414 may include metals, such as copper or aluminum, in their construction. The M3DDRAM-LSSAMML may be built on top of and coupled with vertical connections to peripheral circuits 400 as described in patent application 2011/0092030. The DRAM may operate using the floating body effect. Further details of this constructed M3DDRAM-LSSAMML are provided in patent application 2011/0121366 (FIGS. 98A-H to FIGS. 100A-L).

Step (2): This may be illustrated with FIG. 4D. Activated p Silicon layer 416 and activated n+ Silicon layer 418 may be transferred atop the structure shown in FIG. 4A using a layer transfer technique, such as, for example, ion-cut. P Silicon layer 416 and n+ Silicon layer 418 may be constructed from monocrystalline silicon. Further details of layer transfer techniques and procedures are provided in patent application 2011/0121366. A transferred monocrystalline layer, such as silicon layer 418, may have a thickness of less than about 150 nm.

Step (3): This may be illustrated with FIG. 4E. The p Silicon layer 416 and the n+ Silicon layer 418 that were shown in FIG. 4D may be lithographically defined and then etched to form monocrystalline semiconductor regions including p Silicon regions 420 and n+ Silicon regions 422. Silicon dioxide 424 (nearly transparent for illustrative clarity) may be deposited and then planarized for dielectric isolation amongst adjacent monocrystalline semiconductor regions.

Figure 4F:
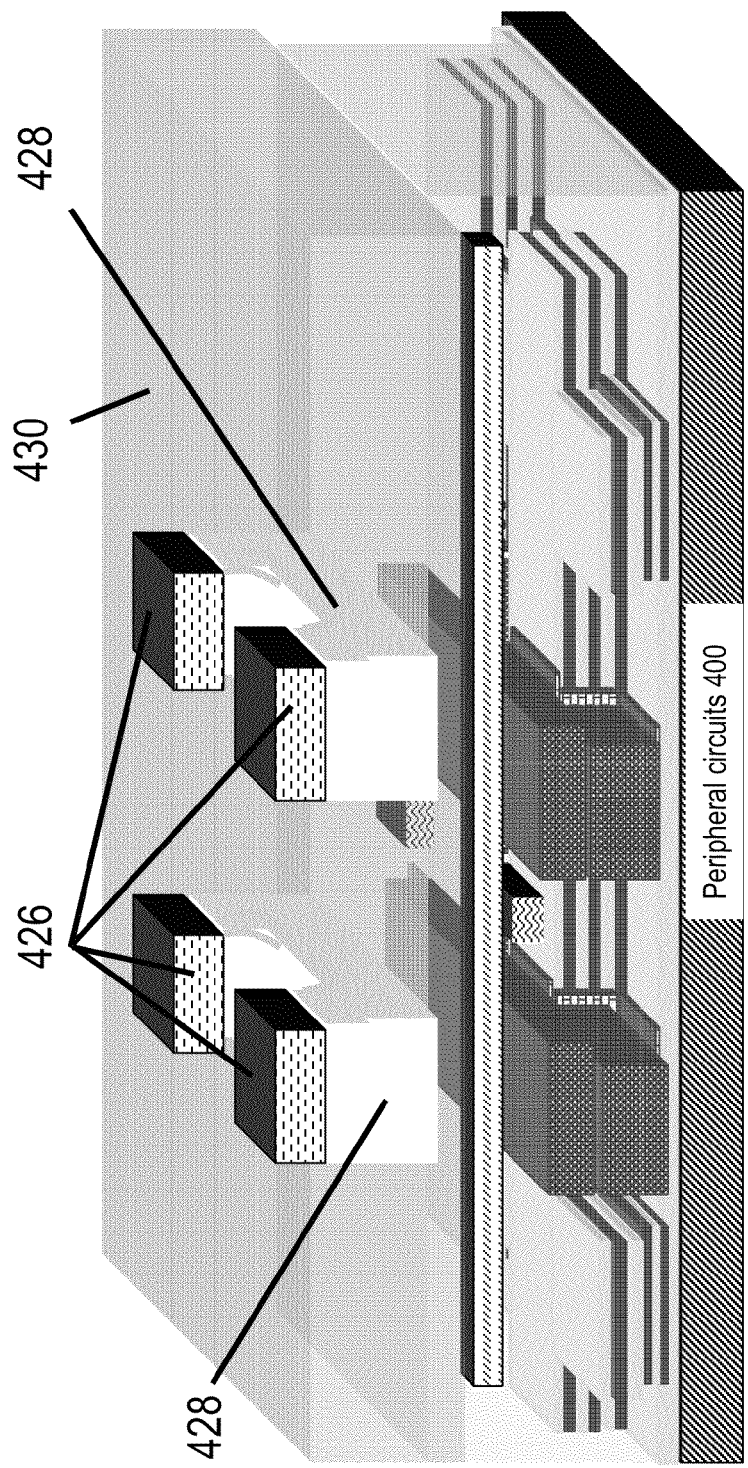
Figure 4G:
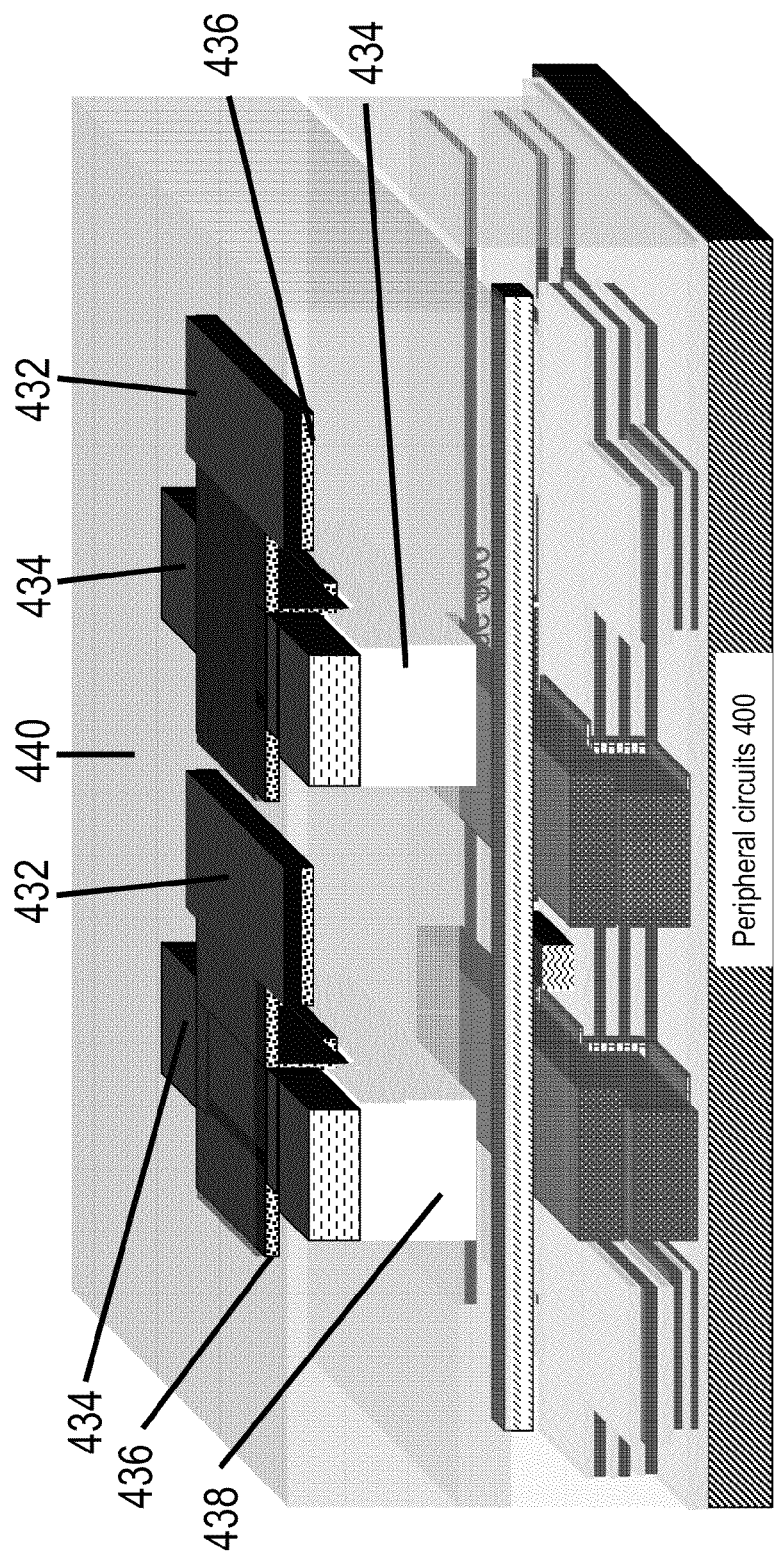

Step (4): This may be illustrated with FIG. 4F. The p Silicon regions 420 and the n+ Silicon regions 422 of FIG. 4E may be lithographically defined and etched with a carefully tuned etch recipe, thus forming a recessed channel structure such as shown in FIG. 4F and may include n+ source and drain Silicon regions 426, p channel Silicon regions 428, and oxide regions 430 (nearly transparent for illustrative clarity). Clean processes may then be used to produce a smooth surface in the recessed channel.

Step (5): This may be illustrated with FIG. 4G. A low temperature (less than about 400° C.) gate dielectric and gate electrode, such as hafnium oxide and TiAlN respectively, may be deposited into the etched regions in FIG. 4F. A chemical mechanical polish process may be used to planarize the top of the gate stack. Then a lithography and etch process may be used to form the pattern shown in FIG. 4G, thus forming recessed channel transistors that may include gate dielectric regions 436, gate electrode regions 432, silicon dioxide regions 440 (nearly transparent for illustrative clarity), n+ Silicon source and drain regions 434, and p Silicon channel and body regions 438.

A recessed channel transistor for logic circuits and logic regions may be formed monolithically atop a M3DDRAM-LSSAMML using the procedure shown in Step (1) to Step (5). The processes described in Step (1) to Step (5) do not expose the M3DDRAM-LSSAMML, and its associated metal bit lines 414, to temperatures greater than about 400° C.

Persons of ordinary skill in the art will appreciate that the illustrations in FIGS. 4A through 4G are exemplary only and are not drawn to scale. Such skilled persons will further appreciate that many variations may be possible such as, for example, the recessed channels etched in FIG. 4F may instead be formed before p Silicon layer 416 and n+ Silicon layer 418 may be etched to form the dielectric isolation and p Silicon regions 420 and n+ Silicon regions 422. Moreover, various types of logic transistors can be stacked atop the M3DDRAM-LSSAMML without exposing the M3DDRAM-LSSAMML to temperatures greater than about 400° C., such as, for example, junction-less transistors, dopant segregated Schottky source-drain transistors, V-groove transistors, and replacement gate transistors. This is possible using procedures described in patent application 2011/0121366 (FIGS. 98A-H to FIGS. 100A-L). The memory regions may have horizontally oriented transistors and vertical connections between the memory and logic layers may have a radius of less than 100 nm. These vertical connections may be vias, such as, for example, thru layer vias (TLVs), through the monocrystalline silicon layers connecting the stacked layers, for example, logic circuit regions within one monocrystalline layer to memory regions within another monocrystalline layer. Additional (eg. third or fourth) monocrystalline layers that may have memory regions may be added to the stack. Decoders and other driver circuits of said memory may be part of the stacked logic circuit layer or logic circuit regions. The memory regions may have replacement gate transistors, recessed channel transistors (RCATs), side-gated transistors, junction-less transistors or dopant-segregated Schottky Source-Drain transistors, which may be constructed using techniques described in patent applications 20110121366 and Ser. No. 13/099,010, the contents of the foregoing applications are incorporated herein by reference. Many other modifications within the scope of the illustrated embodiments of the invention will suggest themselves to such skilled persons after reading this specification. Thus the invention is to be limited only by the appended claims.

Figure 5:
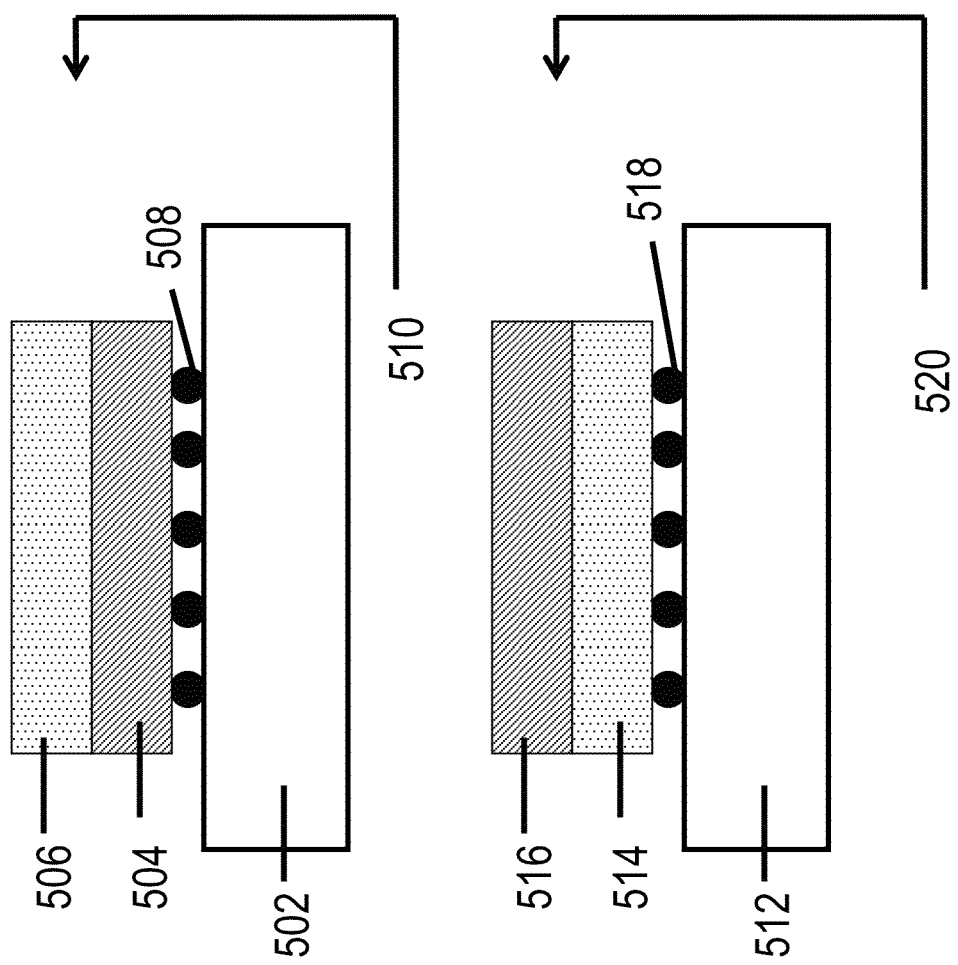
FIG. 5 is an exemplary drawing illustration of different configurations possible for monolithically stacked embedded memory and logic.

FIG. 5 illustrates an embodiment of the invention wherein different configurations for stacking embedded memory with logic circuits and logic regions may be realized. One stack configuration 510 may include embedded memory solution 506 made in a monocrystalline layer monolithically stacked atop the logic circuits 504 made in a monocrystalline layer using monolithic 3D technologies and vertical connections described in patent applications 20110121366 and Ser. No. 13/099,010, the contents of the foregoing applications are incorporated herein by reference. Logic circuits 504 may include metal layer or layers which may include metals such as copper or aluminum. Stack configuration 510 may include input/output interconnect 508, such as, for example, solder bumps and a packaging substrate 502. Another stack configuration 520 may include the logic circuits 516 monolithically stacked atop the embedded memory solution 514 using monolithic 3D technologies described in patent applications 20110121366 and Ser. No. 13/099,010, the contents of the foregoing applications are incorporated herein by reference. Embedded memory solution 514 may include metal layer or layers which may include metals such as copper or aluminum. Stack configuration 520 may include an input/output interconnect 518, such as, for example, solder bumps and a packaging substrate 512. The embedded memory solutions 506 and 514 may be a volatile memory, for example, SRAM. In this case, the transistors in SRAM blocks associated with embedded memory solutions 506 and 514 may be optimized differently than the transistors in logic circuits 504 and 516, and may, for example, have different threshold voltages, channel lengths and/or other parameters. The embedded memory solutions 506 and 514, if constructed, for example, as SRAM, may have, for example, just one device layer with 6 or 8 transistor SRAM. Alternatively, the embedded memory solutions 506 and 514 may have two device layers with pMOS and nMOS transistors of the SRAM constructed in monolithically stacked device layers using techniques described patent applications 20110121366 and Ser. No. 13/099,010, the contents of the foregoing applications are incorporated herein by reference. The transistors in the monocrystalline layer or layers may be horizontally oriented, i.e., current flowing in substantially the horizontal direction in transistor channels, substantially between drain and source, which may be parallel to the largest face of the substrate or wafer. The source and drain of the horizontally oriented transistors may be within the same monocrystalline layer. A transferred monocrystalline layer, such as logic circuits 504, may have a thickness of less than about 150 nm.

Persons of ordinary skill in the art will appreciate that the illustrations in FIG. 5 are exemplary only and are not drawn to scale. Such skilled persons will further appreciate that many variations may be possible such as, for example, the embedded memory solutions 506 and 514, if constructed, for example, as SRAM, may be built with three monolithically stacked device layers for the SRAM with architectures similar to "The revolutionary and truly 3-dimensional 25F$^2$ SRAM technology with the smallest S$^3$ (stacked single-crystal Si) cell, 0.16 um$^2$, and SSTFT (stacked single-crystal thin film transistor) for ultra high density SRAM", Symposium on VLSI Technology, 2004 by Soon-Moon Jung, et al. but implemented with technologies described in patent applications 20110121366 and Ser. No. 13/099,010, the contents of the foregoing applications are incorporated herein by reference. Moreover, the embedded memory solutions 506 and 514 may be embedded DRAM constructed with stacked capacitors and transistors. Further, the embedded memory solutions 506 and 514 may be embedded DRAM constructed with trench capacitors and transistors. Moreover, the embedded memory solutions 506 and 514 may be capacitor-less floating-body RAM. Further, the embedded memory solutions 506 and 514 may be a resistive memory, such as RRAM, Phase Change Memory or MRAM. Furthermore, the embedded memory solutions 506 and 514 may be a thyristor RAM. Moreover, the embedded memory solutions 506 and 514 may be a flash memory. Furthermore, embedded memory solutions 506 and 514 may have a different number of metal layers and different sizes of metal layers compared to those in logic circuits 504 and 516. This is because memory circuits typically perform well with fewer numbers of metal layers (compared to logic circuits). Many other modifications within the scope of the illustrated embodiments of the invention described herein will suggest themselves to such skilled persons after reading this specification. Thus the invention is to be limited only by the appended claims. Many of the configurations described with FIG. 5 may represent an integrated device that may have a first monocrystalline layer that may have logic circuit layers and/or regions and a second monolithically stacked monocrystalline layer that may have memory regions. The memory regions may have horizontally oriented transistors and vertical connections between the memory and logic layers may have a radius of less than 100 nm. These vertical connections may be vias, such as, for example, thru layer vias (TLVs), through the monocrystalline silicon layers connecting the stacked layers, for example, logic circuit regions within one monocrystalline layer to memory regions within another monocrystalline layer. Additional (eg. third or fourth) monocrystalline layers that may have memory regions may be added to the stack. Decoders and other driver circuits of said memory may be part of the stacked logic circuit layer or logic circuit regions. The memory regions may have replacement gate transistors, recessed channel transistors (RCATs), side-gated transistors, junction-less transistors or dopant-segregated Schottky Source-Drain transistors, which may be constructed using techniques described in patent applications 20110121366 and Ser. No. 13/099,010, the contents of the foregoing applications are incorporated herein by reference.

FIG. 6A-J illustrates an embodiment of the invention, wherein a horizontally-oriented monolithic 3D DRAM array may be constructed and may have a capacitor in series with a transistor selector. No mask may utilized on a "per-memorylayer" basis for the monolithic 3D DRAM shown in FIGS. 6A-J, and substantially all other masks may be shared among different layers. The process flow may include the following steps which may be in sequence from Step (A) to Step (H). When the same reference numbers are used in different drawing figures (among FIGS. 5A-J), the reference numbers may be used to indicate analogous, similar or identical structures to enhance the understanding of the invention by clarifying the relationships between the structures and embodiments presented in the various diagrams—particularly in relating analogous, similar or identical functionality to different physical structures.

Figure 6A:
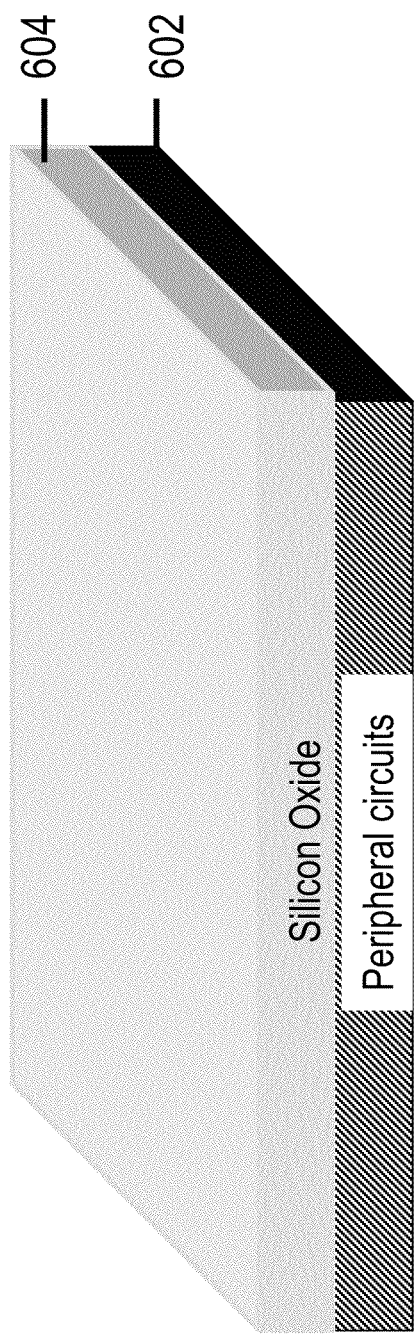

Step (A): Peripheral circuits 602, which may include high temperature wiring, made with metals such as, for example, tungsten, and which may include logic circuit regions, may be constructed. Oxide layer 604 may be deposited above peripheral circuits 602. FIG. 6A shows a drawing illustration after Step (A).

Figure 6B:
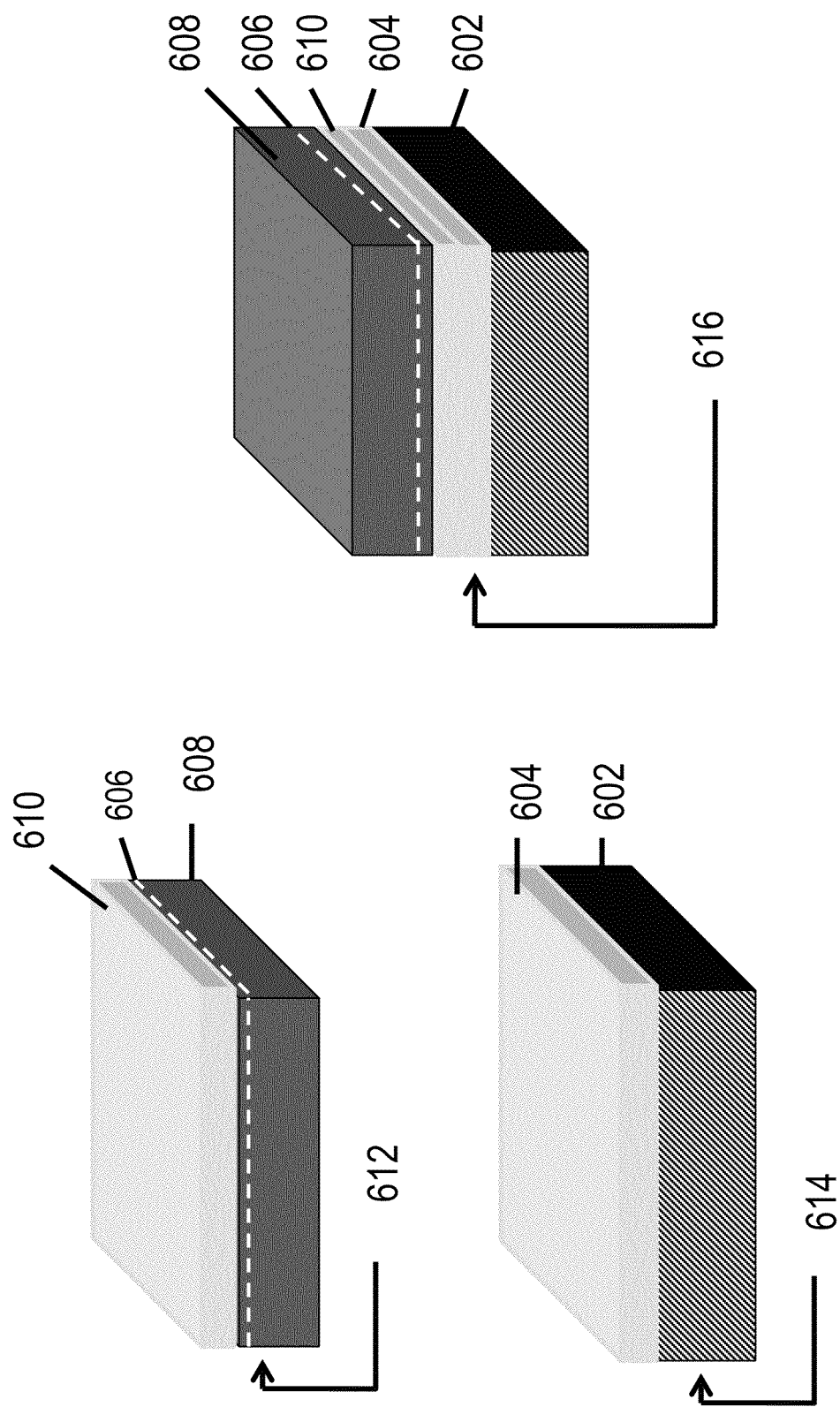

Step (B): FIG. 6B illustrates the structure after Step (B). N+ Silicon wafer 608 may have an oxide layer 610 grown or deposited above it. Hydrogen may be implanted into the n+ Silicon wafer 608 to a certain depth indicated by hydrogen plane 606. Alternatively, some other atomic species, such as Helium, may be (co-)implanted. Thus, top layer 612 may be formed. The bottom layer 614 may include the peripheral circuits 602 with oxide layer 604. The top layer 612 may be flipped and bonded to the bottom layer 614 using oxide-to-oxide bonding to form top and bottom stack 616.

Step (C): FIG. 6C illustrates the structure after Step (C). The top and bottom stack 616 may be cleaved at the hydrogen plane 606 using methods including, for example, a thermal anneal or a sideways mechanical force. A CMP process may be conducted. Thus n+ Silicon layer 618 may be formed. A layer of silicon oxide 620 may be deposited atop the n+ Silicon layer 618. At the end of this step, a single-crystal n+ Silicon layer 618 may exist atop the peripheral circuits 602, and this has been achieved using layer-transfer techniques.

Figure 6D:
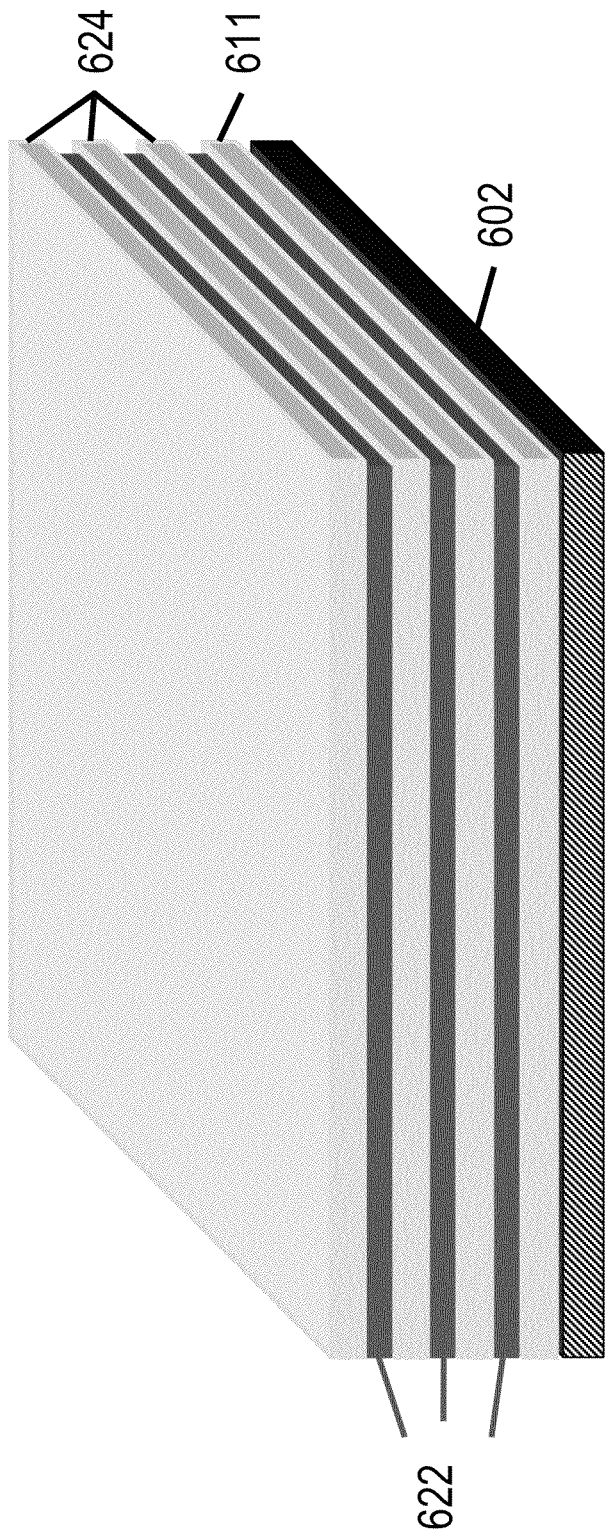

Step (D): FIG. 6D illustrates the structure after Step (D). Using methods similar to Step (B) and (C), multiple n+ silicon layers 622 (now including n+ Silicon layer 618) may be formed with associated silicon oxide layers 624. Oxide layer 604 and oxide layer 610, which were previously oxide-oxide bonded, are now illustrated as oxide layer 611.

Figure 6E:
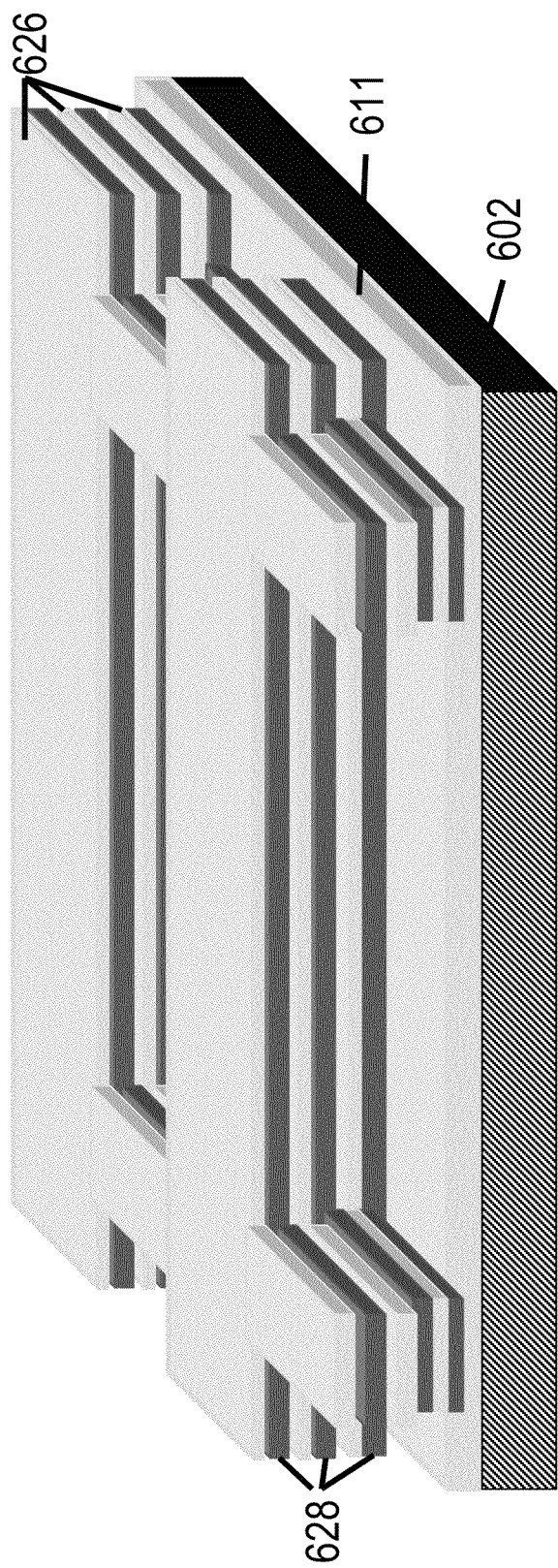

Step (E): FIG. 6E illustrates the structure after Step (E). Lithography and etch processes may then be utilized to make a structure as shown in the figure. The etch of multiple n+ silicon layers 622 and associated silicon oxide layers 624 may stop on oxide layer 611 (shown), or may extend into and etch a portion of oxide layer 611 (not shown). Thus exemplary patterned oxide regions 626 and patterned n+ silicon regions 628 may be formed.

Step (F): FIG. 6F illustrates the structure after Step (F). A gate dielectric, such as, for example, silicon dioxide or hafnium oxides, and gate electrode, such as, for example, doped amorphous silicon or TiAlN, may be deposited and a CMP may be done to planarize the gate stack layers. Lithography and etch may be utilized to define the gate regions, thus gate dielectric regions 632 and gate electrode regions 630 may be formed.

Step (G): FIG. 6G illustrates the structure after Step (G). A trench, for example two of which may be placed as shown in FIG. 6G, may be formed by lithography, etch and clean processes. A high dielectric constant material and then a metal electrode material may be deposited and polished with CMP. The metal electrode material may substantially fill the trenches. Thus high dielectric constant regions 638 and metal electrode regions 636 may be formed, which may substantially reside inside the exemplary two trenches. The high dielectric constant regions 638 may be include materials such as, for example, hafnium oxide, titanium oxide, niobium oxide, zirconium oxide and any number of other possible materials with dielectric constants greater than or equal to 4. The DRAM capacitors may be defined by having the high dielectric constant regions 638 in between the surfaces or edges of metal electrode regions 636 and the associated stacks of n+ silicon regions 628.

Step (H): FIG. 6H illustrates the structure after Step (H). A silicon oxide layer 627 may then be deposited and planarized. The silicon oxide layer is shown transparent in the figure for clarity. Bit Lines 640 may then be constructed. Contacts may then be made to Bit Lines, Word Lines and Source Lines of the memory array at its edges. Source Line contacts can be made into stair-like structures using techniques described in "Bit Cost Scalable Technology with Punch and Plug Process for Ultra High Density Flash Memory," *VLSI Technology,* 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for Source Lines could be done in steps prior to Step (H) as well. Vertical connections may be made to peripheral circuits 602 (not shown).

FIG. 6I and FIG. 6J show cross-sectional views of the exemplary memory array along FIG. 6H planes II and III respectively. Multiple junction-less transistors in series with capacitors constructed of high dielectric constant materials such as high dielectric constant regions 638 can be observed in FIG. 6I.

A procedure for constructing a monolithic 3D DRAM has thus been described, with (1) horizontally-oriented transistors—i.e. current flowing in substantially the horizontal direction in transistor channels, (2) some of the memory cell control lines—e.g., source-lines SL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut. The transistors in the monocrystalline layer or layers may be horizontally oriented, i.e., current flowing in substantially the horizontal direction in transistor channels, substantially between drain and source, which may be parallel to the largest face of the substrate or wafer. The source and drain of the horizontally oriented transistors may be within the same monocrystalline layer. A transferred monocrystalline layer, such as n+ Silicon layer 618, may have a thickness of less than about 150 nm.

Persons of ordinary skill in the art will appreciate that the illustrations in FIGS. 6A through 6J are exemplary only and are not drawn to scale. Such skilled persons will further appreciate that many variations may be possible such as, for example, layer transfer techniques other than the described hydrogen implant and ion-cut may be utilized. Moreover, while FIG. 6A-J described the procedure for forming a monolithic 3D DRAM with substantially all lithography steps shared among multiple memory layers, alternative procedures could be used. For example, procedures similar to those described in FIGS. 33A-K, FIGS. 34A-L and FIGS. 35A-F of patent application Ser. No. 13/099,010, the contents of the foregoing application is incorporated herein by reference, may be used to construct a monolithic 3D DRAM. The memory regions may have horizontally oriented transistors and vertical connections between the memory and logic/periphery layers may have a radius of less than 100 nm. These vertical connections may be vias, such as, for example, thru layer vias (TLVs), through the monocrystalline silicon layers connecting the stacked layers, for example, logic circuit regions within one monocrystalline layer to memory regions within another monocrystalline layer. Additional (eg. third or fourth) monocrystalline layers that may have memory regions may be added to the stack. Decoders and other driver circuits of said memory may be part of the stacked logic circuit layer or logic circuit regions. Many other modifications within the scope of the illustrated embodiments of the invention will suggest themselves to such skilled persons after reading this specification. Thus the invention is to be limited only by the appended claims.

FIG. 32A-J illustrates an embodiment of the invention, wherein a horizontally-oriented monolithic 3D DRAM array may be constructed and may have a capacitor in series with a transistor selector. No mask may utilized on a "per-memory-layer" basis for the monolithic 3D DRAM shown in FIGS. 32A-J, and substantially all other masks may be shared among different layers. The process flow may include the following steps which may be in sequence from Step (A) to Step (H). When the same reference numbers are used in different drawing figures (among FIGS. 32A-J), the reference numbers may be used to indicate analogous, similar or identical structures to enhance the understanding of the invention by clarifying the relationships between the structures and embodiments presented in the various diagrams—particularly in relating analogous, similar or identical functionality to different physical structures.

Figure 32A:
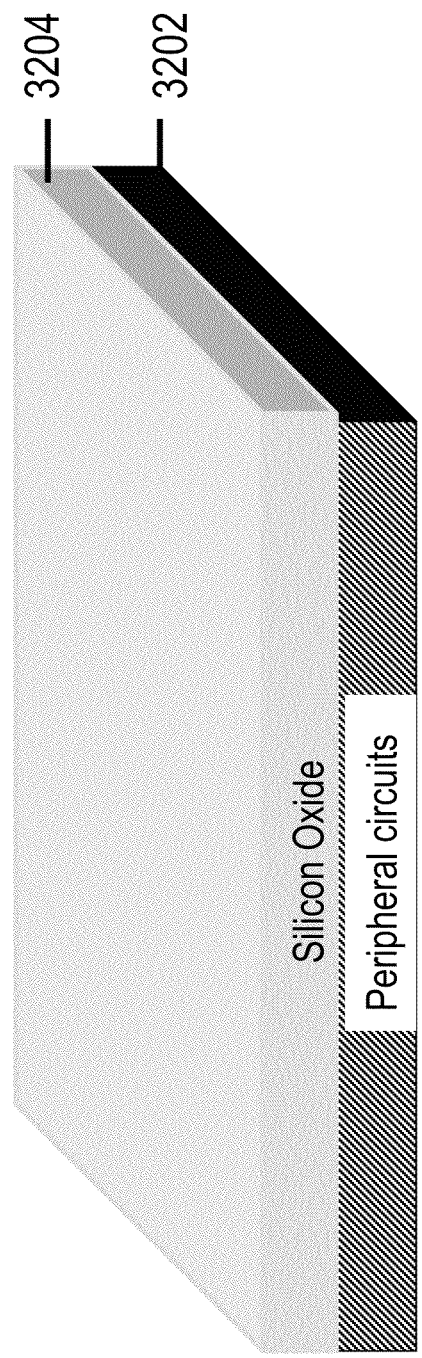

Step (A): Peripheral circuits 3202, which may include high temperature wiring, made with metals such as, for example, tungsten, and may include logic circuit regions, may be constructed. Oxide layer 3204 may be deposited above peripheral circuits 3202. FIG. 32A shows a drawing illustration after Step (A).

Figure 32B:
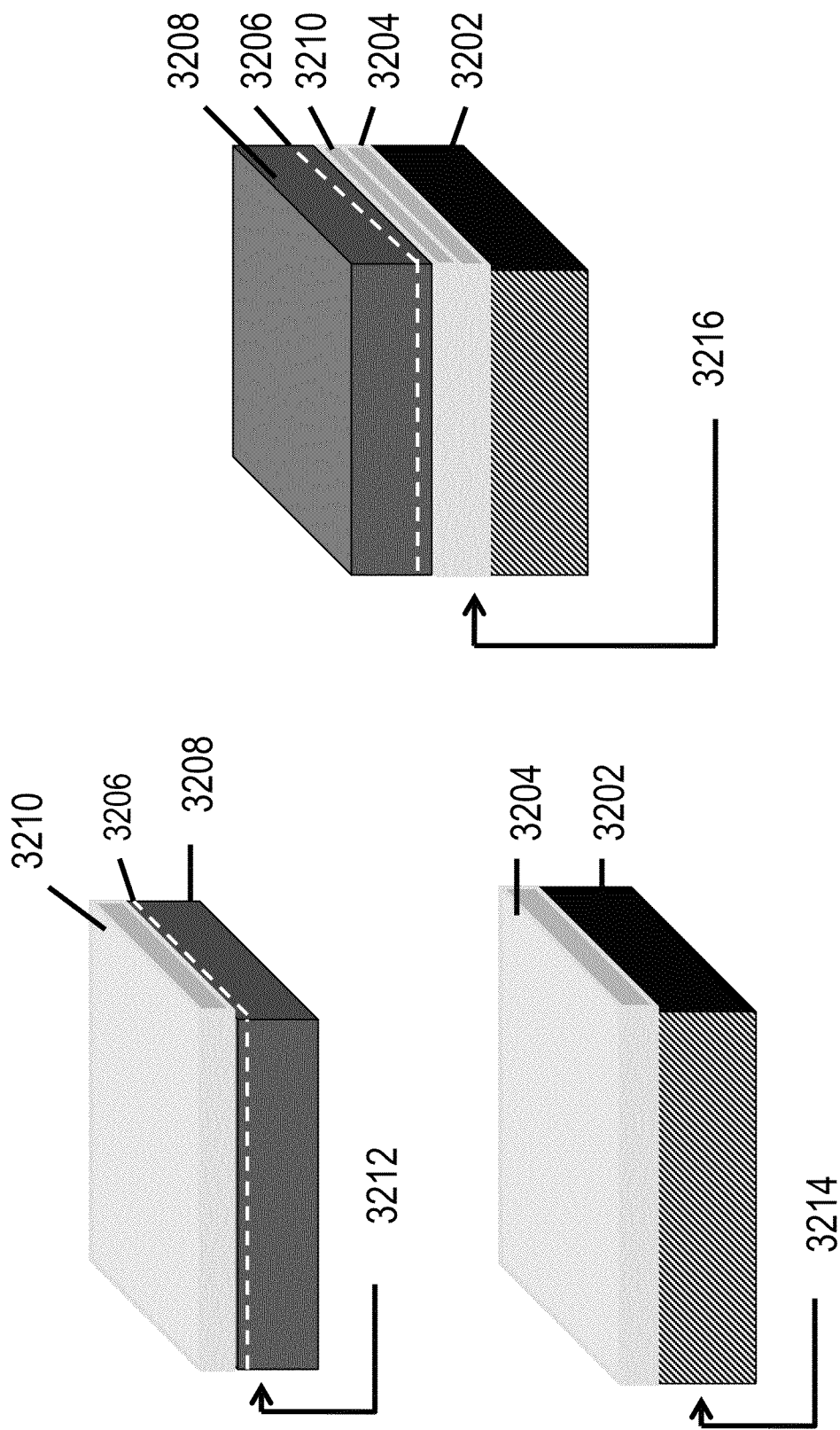

Step (B): FIG. 32B illustrates the structure after Step (B). N+ Silicon wafer 3208 may have an oxide layer 3210 grown or deposited above it. Hydrogen may be implanted into the n+ Silicon wafer 3208 to a certain depth indicated by hydrogen plane 3206. Alternatively, some other atomic species, such as Helium, may be (co-)implanted. Thus, top layer 3212 may be formed. The bottom layer 3214 may include the peripheral circuits 3202 with oxide layer 3204. The top layer 3212 may be flipped and bonded to the bottom layer 3214 using oxide-to-oxide bonding to form top and bottom stack 3216.

Step (C): FIG. 32C illustrates the structure after Step (C). The top and bottom stack 3216 may be cleaved at the hydrogen plane 3206 using methods including, for example, a thermal anneal or a sideways mechanical force. A CMP process may be conducted. Thus n+ Silicon layer 3218 may be formed. A layer of silicon oxide 3220 may be deposited atop the n+ Silicon layer 3218. At the end of this step, a single-crystal n+ Silicon layer 3218 may exist atop the peripheral circuits 3202, and this has been achieved using layer-transfer techniques.

Step (D): FIG. 32D illustrates the structure after Step (D). Using methods similar to Step (B) and (C), multiple n+ silicon layers 3222 (now including n+ Silicon layer 3218) may be formed with associated silicon oxide layers 3224. Oxide layer 3204 and oxide layer 3210, which were previously oxide-oxide bonded, are now illustrated as oxide layer 3211.

Figure 32E:
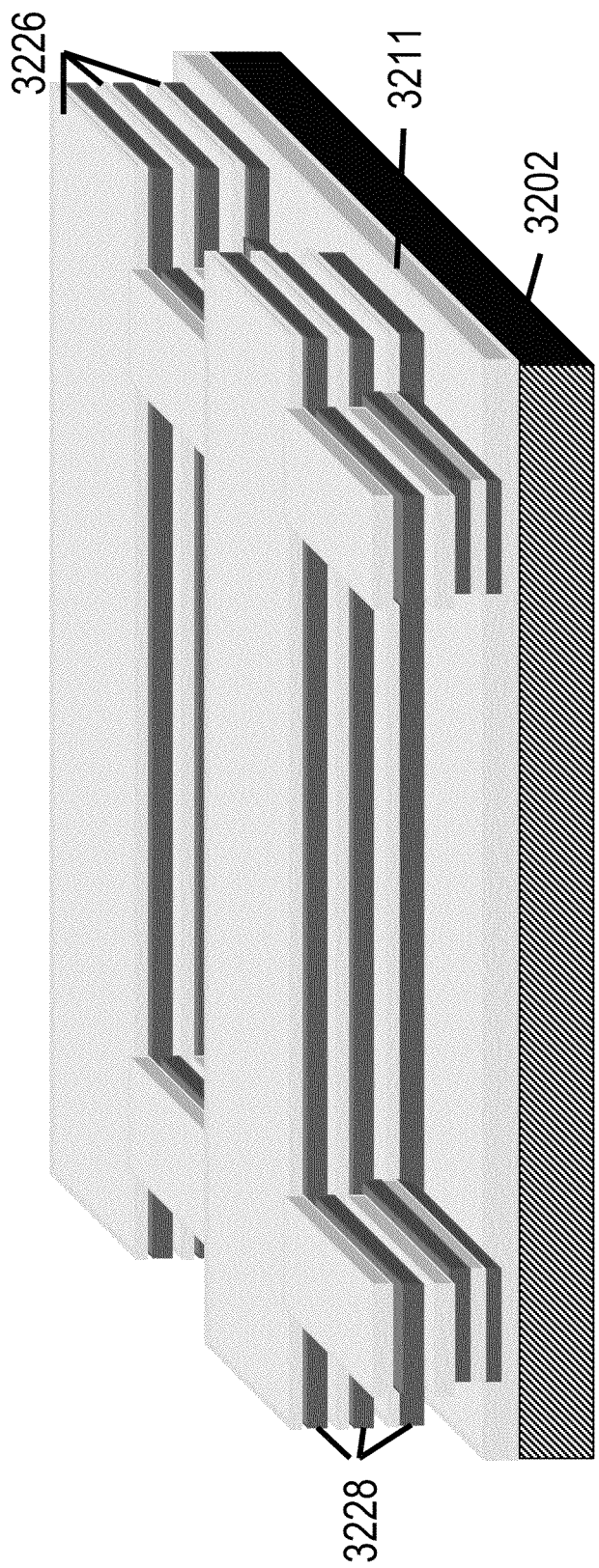

Step (E): FIG. 32E illustrates the structure after Step (E). Lithography and etch processes may then be utilized to make a structure as shown in the figure. The etch of multiple n+ silicon layers 3222 and associated silicon oxide layers 3224 may stop on oxide layer 3211 (shown), or may extend into and etch a portion of oxide layer 3211 (not shown). Thus exemplary patterned oxide regions 3226 and patterned n+ silicon regions 3228 may be formed.

Step (F): FIG. 32F illustrates the structure after Step (F). A gate dielectric, such as, for example, silicon dioxide or hafnium oxides, and gate electrode, such as, for example, doped amorphous silicon or TiAlN, may be deposited and a CMP may be done to planarize the gate stack layers. Lithography and etch may be utilized to define the gate regions, thus gate dielectric regions 3232 and gate electrode regions 3230 may be formed.

Step (G): FIG. 32G illustrates the structure after Step (G). A trench, for example two of which may be placed as shown in FIG. 32G, may be formed by lithography, etch and clean processes. A high dielectric constant material and then a metal electrode material may be deposited and polished with CMP. The metal electrode material may substantially fill the trenches. Thus high dielectric constant regions 3238 and metal electrode regions 3236 may be formed, which may substantially reside inside the exemplary two trenches. The high dielectric constant regions 3238 may be include materials such as, for example, hafnium oxide, titanium oxide, niobium oxide, zirconium oxide and any number of other possible materials with dielectric constants greater than or equal to 4. The DRAM capacitors may be defined by having the high dielectric constant regions 3238 in between the surfaces or edges of metal electrode regions 3236 and the associated stacks of n+ silicon regions 3228.

Step (H): FIG. 32H illustrates the structure after Step (H). A silicon oxide layer 3227 may then be deposited and planarized. The silicon oxide layer is shown partially transparent in the figure for clarity. Bit Lines 3240 may then be constructed. Word Lines 3242 may then be constructed. Contacts may then be made to Bit Lines, Word Lines and Source Lines of the memory array at its edges. Source Line contacts can be made into stair-like structures using techniques described in "Bit Cost Scalable Technology with Punch and Plug Process for Ultra High Density Flash Memory," *VLSI Technology, 2007 IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for Source Lines could be done in steps prior to Step (H) as well. Vertical connections may be made to peripheral circuits 602 (not shown).

Figure 32J:
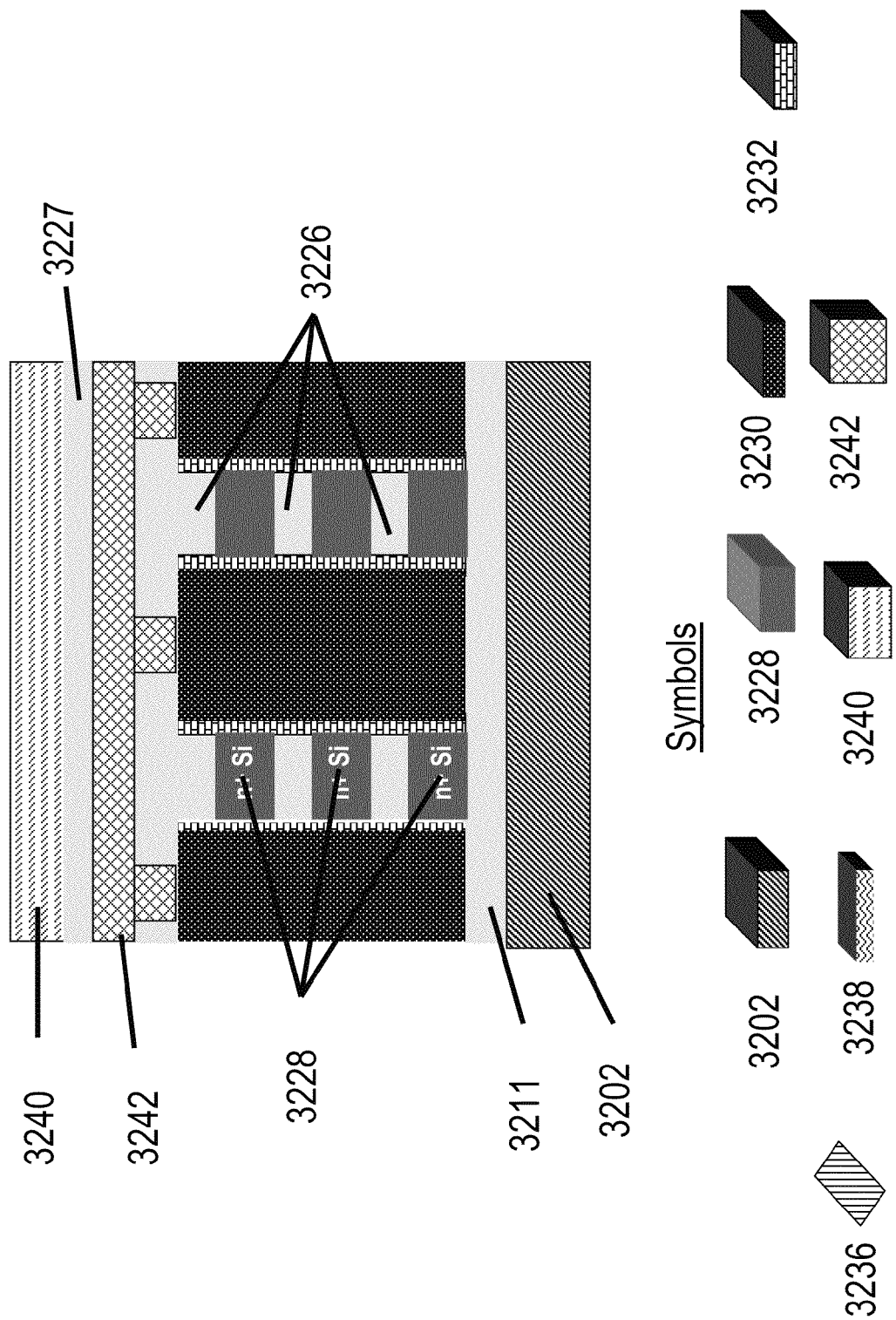

FIG. 32I and FIG. 32J show cross-sectional views of the exemplary memory array along FIG. 32H planes II and III respectively. Multiple junction-less transistors in series with capacitors constructed of high dielectric constant materials such as high dielectric constant regions 3238 can be observed in FIG. 32I.

A procedure for constructing a monolithic 3D DRAM has thus been described, with (1) horizontally-oriented transistors—i.e. current flowing in substantially the horizontal direction in transistor channels, (2) some of the memory cell control lines—e.g., source-lines SL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut. The transistors in the monocrystalline layer or layers may be horizontally oriented, i.e., current flowing in substantially the horizontal direction in transistor channels, substantially between drain and source, which may be parallel to the largest face of the substrate or wafer. The source and drain of the horizontally oriented transistors may be within the same monocrystalline layer. A transferred monocrystalline layer, such as n+ Silicon layer 3218, may have a thickness of less than about 150 nm.

Persons of ordinary skill in the art will appreciate that the illustrations in FIGS. 32A through 32J are exemplary only and are not drawn to scale. Such skilled persons will further appreciate that many variations may be possible such as, for example, layer transfer techniques other than the described hydrogen implant and ion-cut may be utilized. Moreover, while FIG. 32A-J described the procedure for forming a monolithic 3D DRAM with substantially all lithography steps shared among multiple memory layers, alternative procedures could be used. For example, procedures similar to those described in FIGS. 33A-K, FIGS. 34A-L and FIGS. 35A-F of patent application Ser. No. 13/099,010, the contents of the foregoing application is incorporated herein by reference, may be used to construct a monolithic 3D DRAM. The technique of making Word Lines perpendicular to the source-lines may be analogously used for flash memories, resistive memories and floating body DRAM with lithography steps shared among multiple memory layers. The memory regions may have horizontally oriented transistors and vertical connections between the memory and logic/periphery layers may have a radius of less than 100 nm. These vertical connections may be vias, such as, for example, thru layer vias (TLVs), through the monocrystalline silicon layers connecting the stacked layers, for example, logic circuit regions within one monocrystalline layer to memory regions within another monocrystalline layer. Many other modifications within the scope of the illustrated embodiments of the invention described herein will suggest themselves to such skilled persons after reading this specification. Thus the invention is to be limited only by the appended claims.

Circuit and System Techniques for Managing a Floating-Body RAM Array

Over the past few years, the semiconductor industry has been actively pursuing floating-body RAM technologies as a replacement for conventional capacitor-based DRAM or as a replacement for embedded DRAM/SRAM. In these technologies, charge may be stored in the body region of a transistor instead of having a separate capacitor. This could have several potential advantages, including lower cost due to the lack of a capacitor, easier manufacturing and potentially scalability. There are many device structures, process technologies and operation modes possible for capacitor-less floating-body RAM. Some of these are included in "Floating-body SOI Memory: The Scaling Tournament", Book Chapter of Semiconductor-On-Insulator Materials for Nanoelectronics Applications, pp. 393-421, Springer Publishers, 2011 by M. Bawedin, S. Cristoloveanu, A. Hubert, K. H. Park and F. Martinez ("Bawedin").

Figure 7:
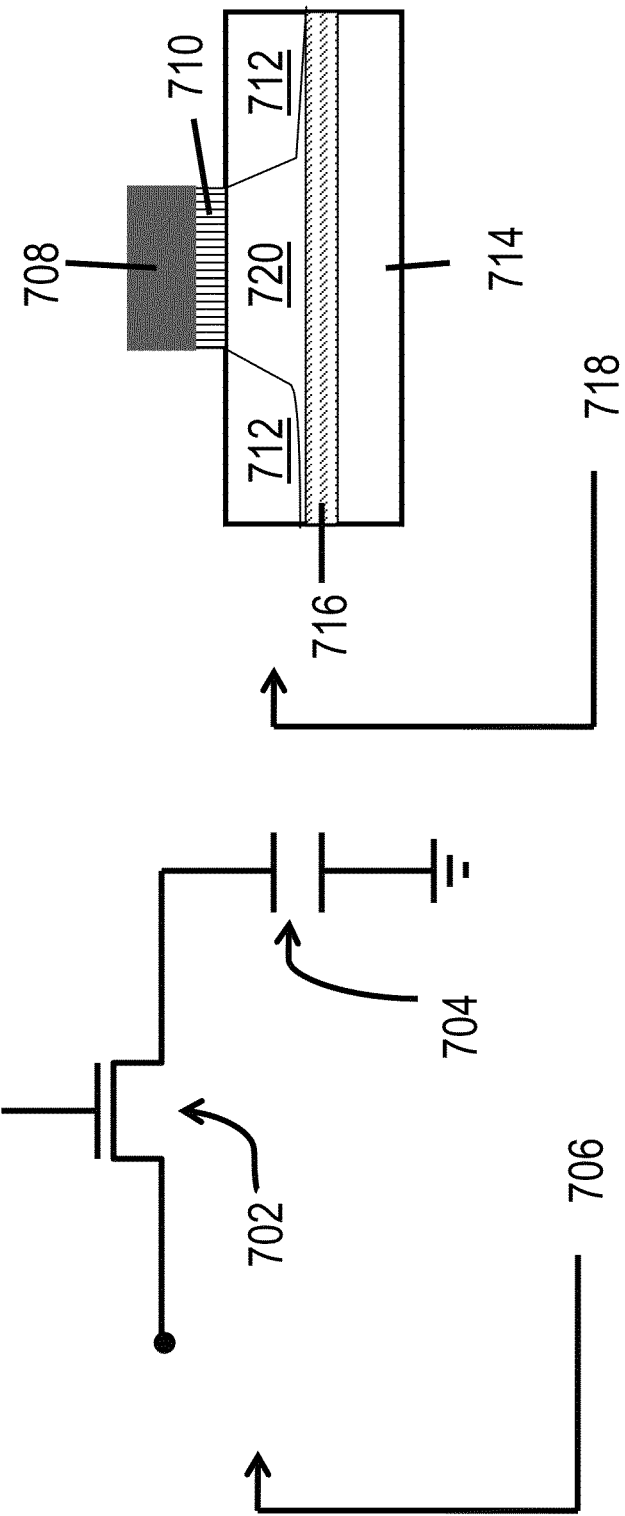
FIG. 7 illustrates a capacitor-based DRAM cell and capacitor-less floating-body RAM cell prior art)

FIG. 7 shows a prior art illustration of capacitor-based DRAM and capacitor-less floating-body RAM. A capacitor-based DRAM cell 706 may be schematically illustrated and may include transistor 702 coupled in series with capacitor 704. The transistor 702 may serve as a switch for the capacitor 704, and may be ON while storing or reading charge in the capacitor 704, but may be OFF while not performing these operations. One illustrative example capacitor-less floating-body RAM cell 718 may include transistor source and drain regions 712, gate dielectric 710, gate electrode 708, buried oxide 716 and silicon region 714. Charge may be stored in the transistor body region 720. Various other structures and configurations of floating-body RAM may be possible, and are not illustrated in FIG. 7. In many configurations of floating-body RAM, a high (electric) field mechanism such as impact ionization, tunneling or some other phenomenon may be used while writing data to the memory cell. High-field mechanisms may be used while reading data from the memory cell. The capacitor-based DRAM cell 706 may often operate at much lower electric fields compared to the floating-body RAM cell 718.

Figure 8A:
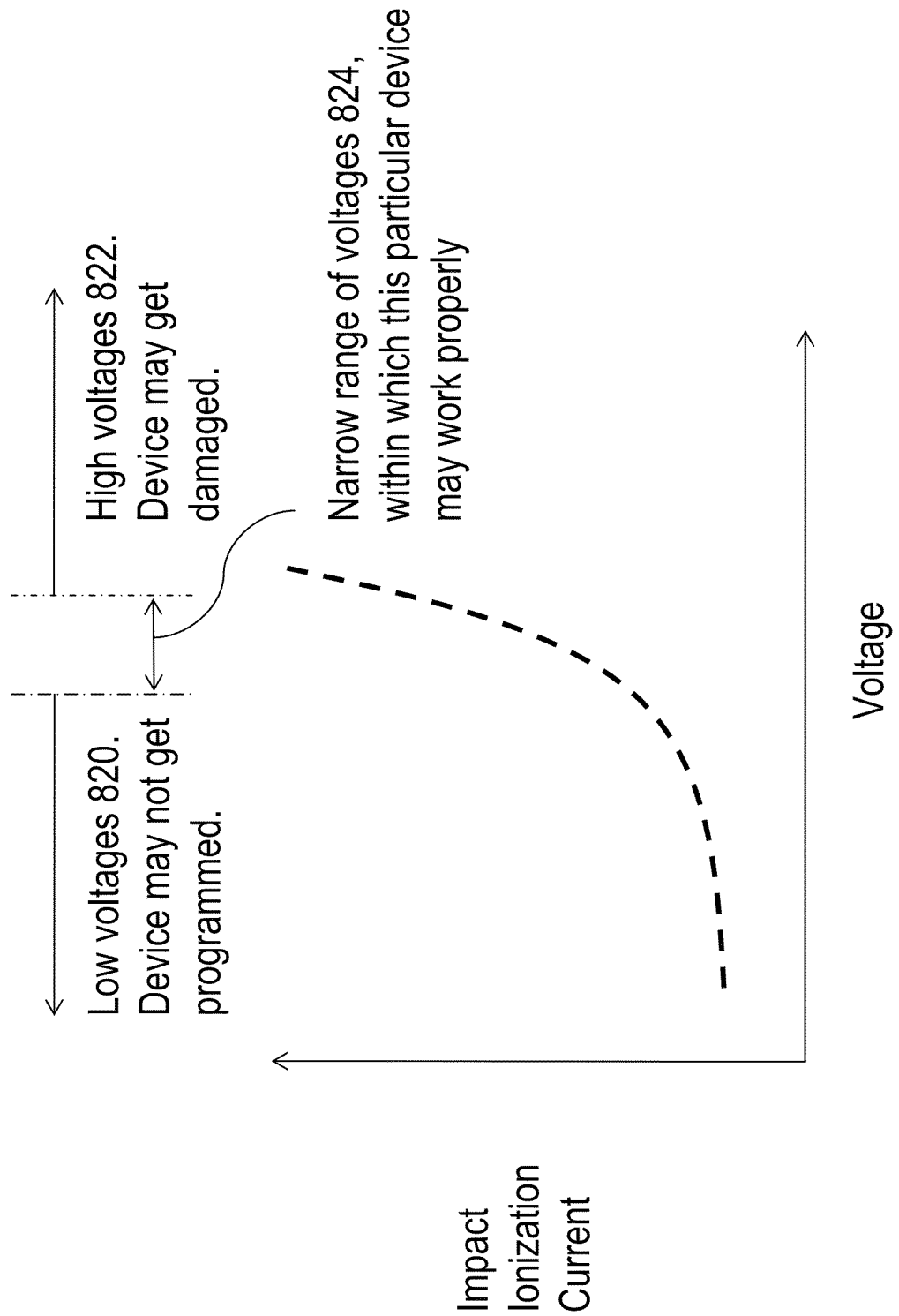

FIG. 8A-8B illustrates some of the potential challenges associated with possible high field effects in floating-body RAM. The Y axis of the graph shown in FIG. 8A may indicate current flowing through the cell during the write operation, which may, for example, consist substantially of impact ionization current. While impact ionization may be illustrated as the high field effect in FIG. 8A, some other high field effect may alternatively be present. The X axis of the graph shown in FIG. 8B may indicate some voltage applied to the memory cell. While using high field effects to write to the cell, some challenges may arise. At low voltages 820, not enough impact ionization current may be generated while at high voltages 822, the current generated may be exponentially higher and may damage the cell. The device may therefore work only at a narrow range of voltages 824.

A challenge of having a device work across a narrow range of voltages is illustrated with FIG. 8B. In a memory array, for example, there may be millions or billions of memory cells, and each memory individual cell may have its own range of voltages between which it operates safely. Due to variations across a die or across a wafer, it may not be possible to find a single voltage that works well for substantially all members of a memory array. In the plot shown in FIG. 8B, four different memory cells may have their own range of "safe" operating voltages 802, 804, 806 and 808. Thus, it may not be possible to define a single voltage that can be used for writing substantially all cells in a memory array. While this example described the scenario with write operation, high field effects may make it potentially difficult to define and utilize a single voltage for reading substantially all cells in a memory array. This situation may be unique to floating-body RAM and may not be generally present in capacitor-based DRAM. Solutions to this potential problem may be required.

Figure 9:
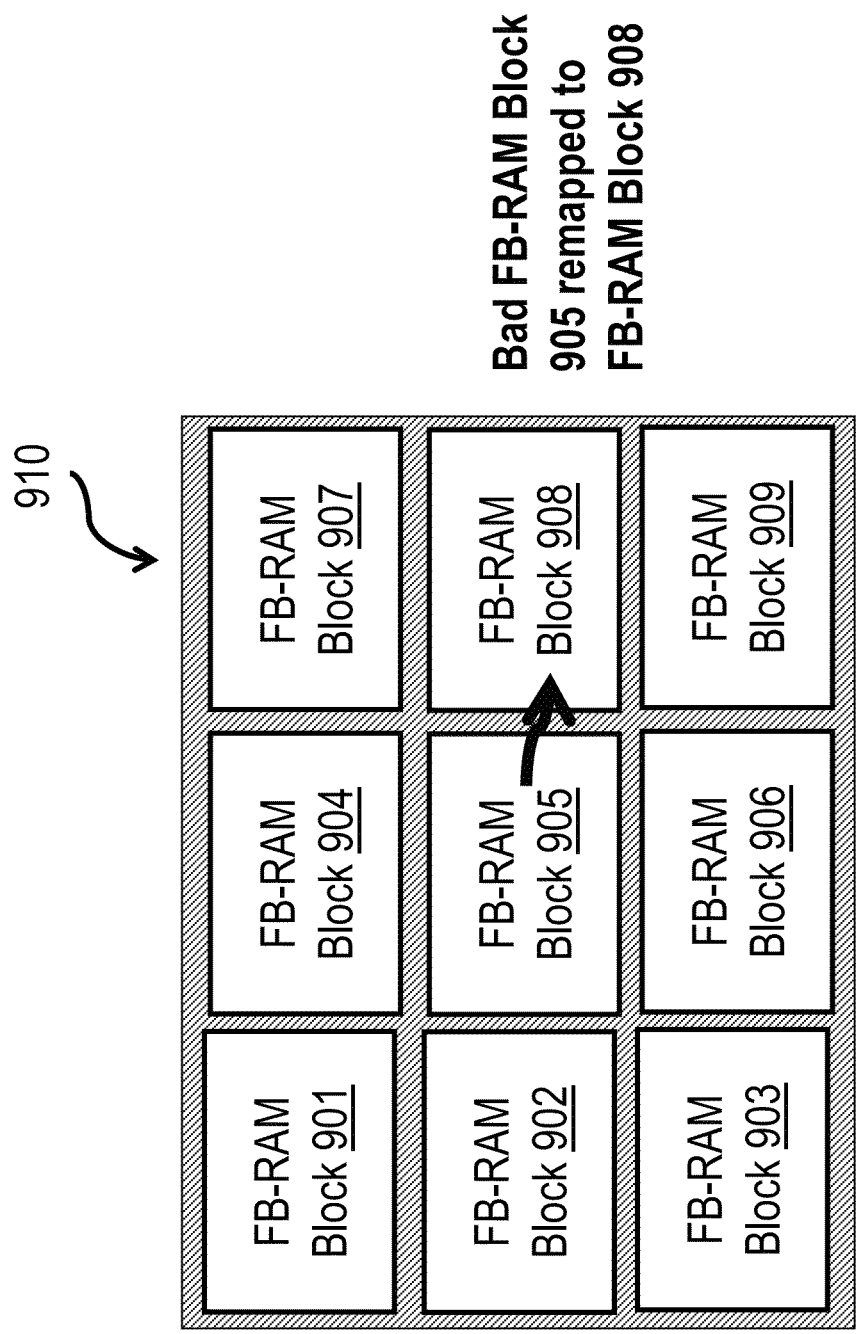
FIG. 9 is an exemplary drawing illustration of how a floating-body RAM chip may be managed when some memory cells may have been damaged.

FIG. 9 illustrates an embodiment of the invention that describes how floating-body RAM chip 910 may be managed wherein some memory cells within floating-body RAM chip 910 may have been damaged due to mechanisms, such as, for example, high-field effects after multiple write or read cycles. For example, a cell rewritten a billion times may have been damaged more by high field effects than a cell rewritten a million times. As an illustrative example, floating-body RAM chip 910 may include nine floating-body RAM blocks, 901, 902, 903, 904, 905, 906, 907, 908 and 909. If it is detected, for example, that memory cells in floating-body RAM block 905 may have degraded due to high-field effects and that redundancy and error control coding schemes may be unable to correct the error, the data within floating-body RAM block 905 may be remapped in part or substantially in its entirety to floating-body RAM block 908. Floating-body RAM block 905 may not be used after this remapping event.

Figure 10:
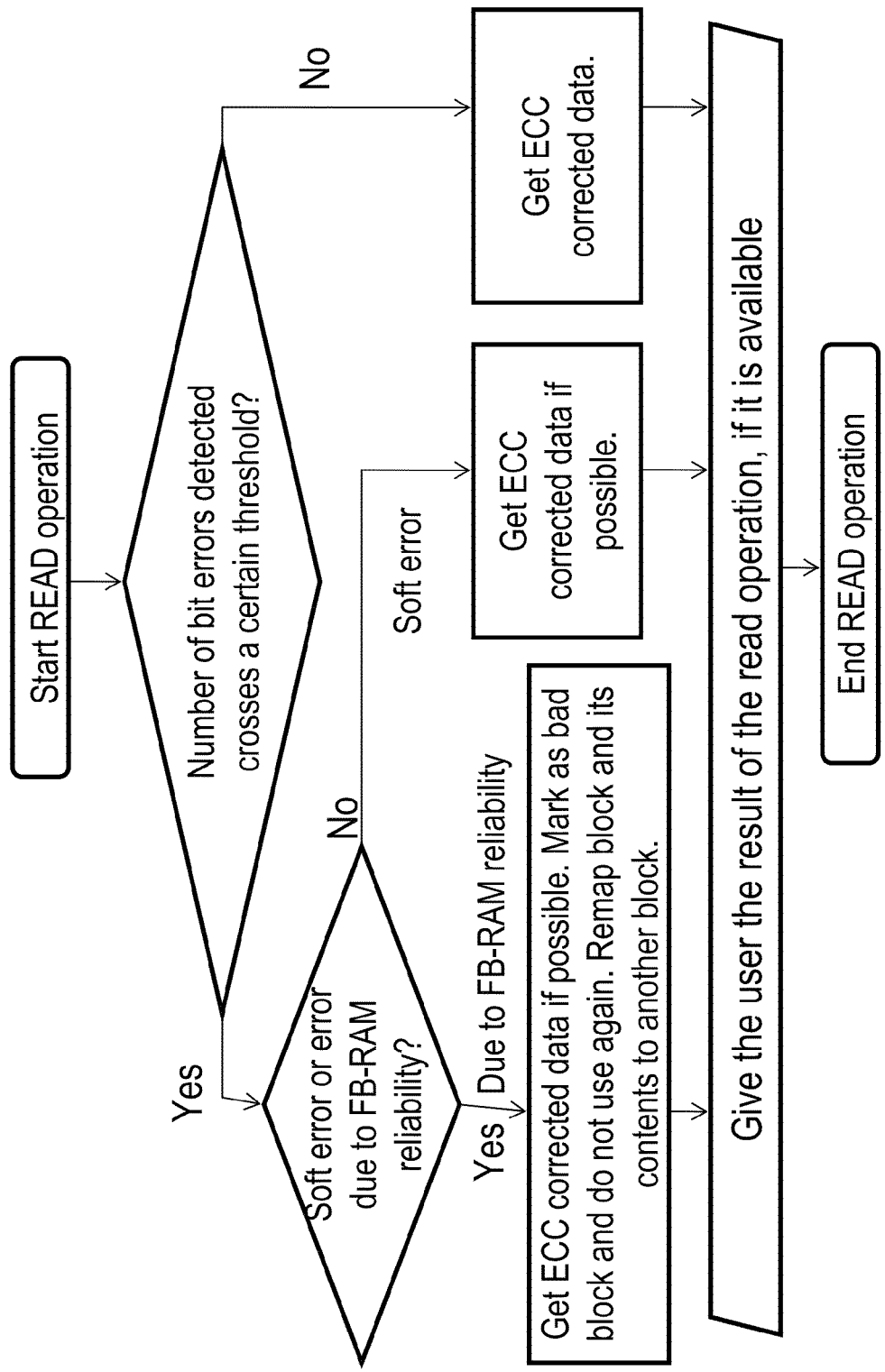
FIG. 10 is an exemplary drawing illustration of a methodology for implementing the bad block management scheme described with respect to FIG. 9.

FIG. 10 illustrates an embodiment of the invention of an exemplary methodology for implementing the bad block management scheme described with respect to FIG. 9. For example, during a read operation, if the number of errors increases beyond a certain threshold, an algorithm may be activated. The first step of this algorithm may be to check or analyze the causation or some characteristic of the errors, for example, if the errors may be due to soft-errors or due to reliability issues because of high-field effects. Soft-errors may be transient errors and may not occur again and again in the field, while reliability issues due to high-field effects may occur again and again (in multiple conditions), and may occur in the same field or cell. Testing circuits may be present on the die, or on another die, which may be able to differentiate between soft errors and reliability issues in the field by utilizing the phenomenon or characteristic of the error in the previous sentence or by some other method. If the error may result from floating-body RAM reliability, the contents of the block may be mapped and transferred to another block as described with respect to FIG. 9 and this block may not be reused again. Alternatively, the bad block management scheme may use error control coding to correct the bad data and may provide the user data about the error and correction. The read operation may end.

Figure 11:
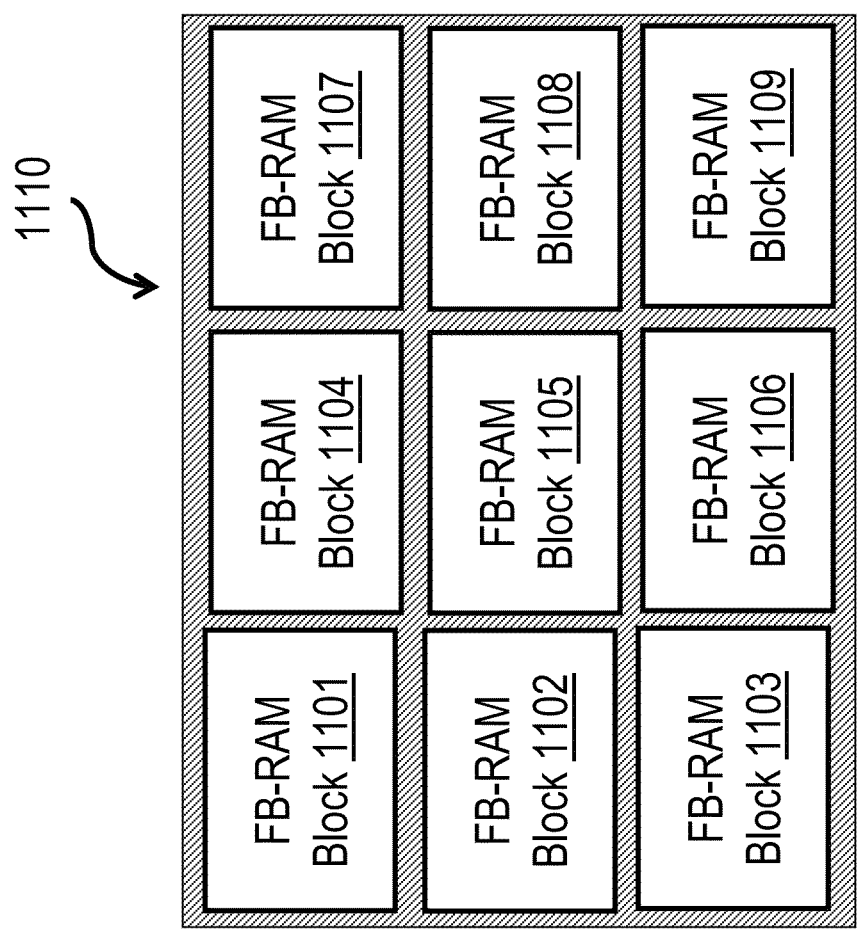
FIG. 11 is an exemplary drawing illustration of wear leveling techniques and methodology utilized in floating body RAM.

FIG. 11 illustrates an embodiment of the invention wherein wear leveling techniques and methodology may be utilized in floating body RAM. As an illustrative example, floating-body RAM chip 1110 may include nine floating-body RAM blocks 1101, 1102, 1103, 1104, 1105, 1106, 1107, 1108 and 1109. While writing data to floating-body RAM chip 1110, the writes may be controlled and mapped by circuits that may be present on the die, or on another die, such that substantially all floating-body RAM blocks, such as 1101-1109, may be exposed to an approximately similar number of write cycles. The leveling metric may utilize the programming voltage, total programming time, or read and disturb stresses to accomplish wear leveling, and the wear leveling may be applied at the cell level, or at a super-block (groups of blocks) level. This wear leveling may avoid the potential problem wherein some blocks may be accessed more frequently than others. This potential problem typically limits the number of times the chip can be written. There are several algorithms used in flash memories and hard disk drives that perform wear leveling. These techniques could be applied to floating-body RAM due to the high field effects which may be involved. Using these wear leveling procedures, the number of times a floating body RAM chip can be rewritten (i.e. its endurance) may improve.

Figure 12A:
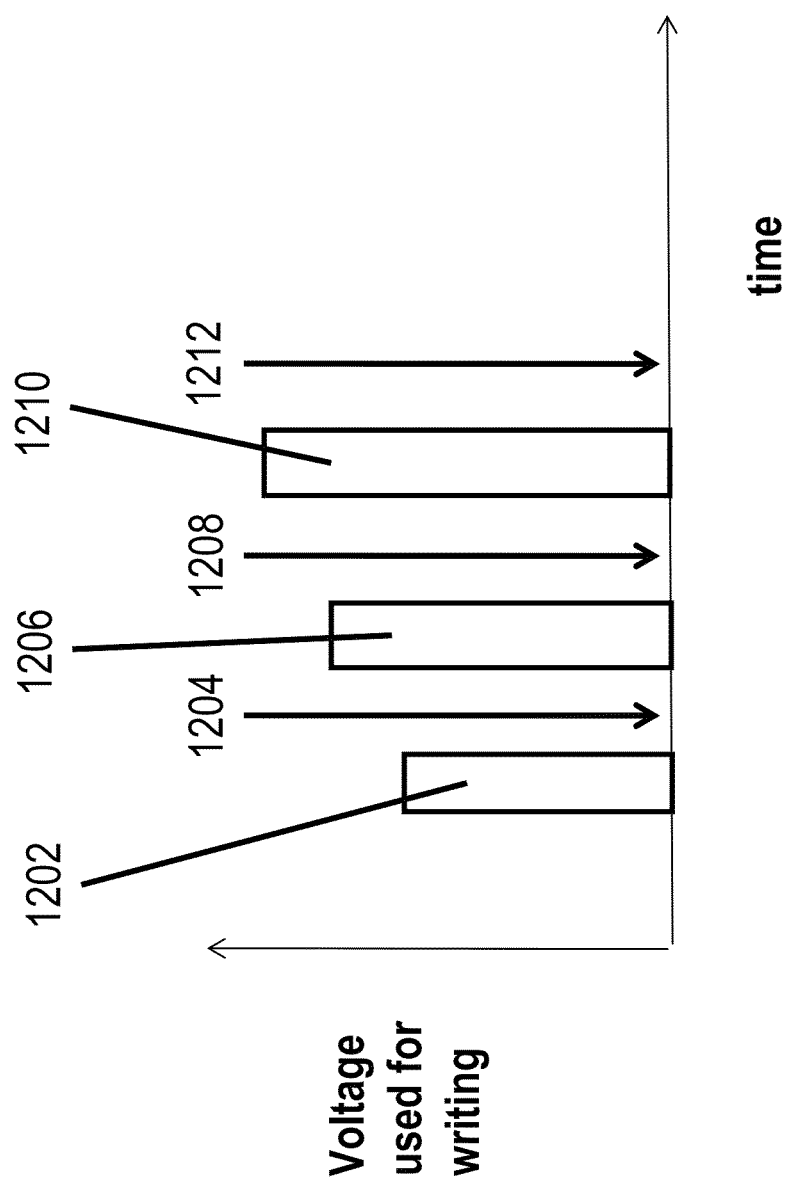
FIG. 12A-B are exemplary drawing illustrations of incremental step pulse programming techniques and methodology utilized for floating-body RAM.
Figure 12B:
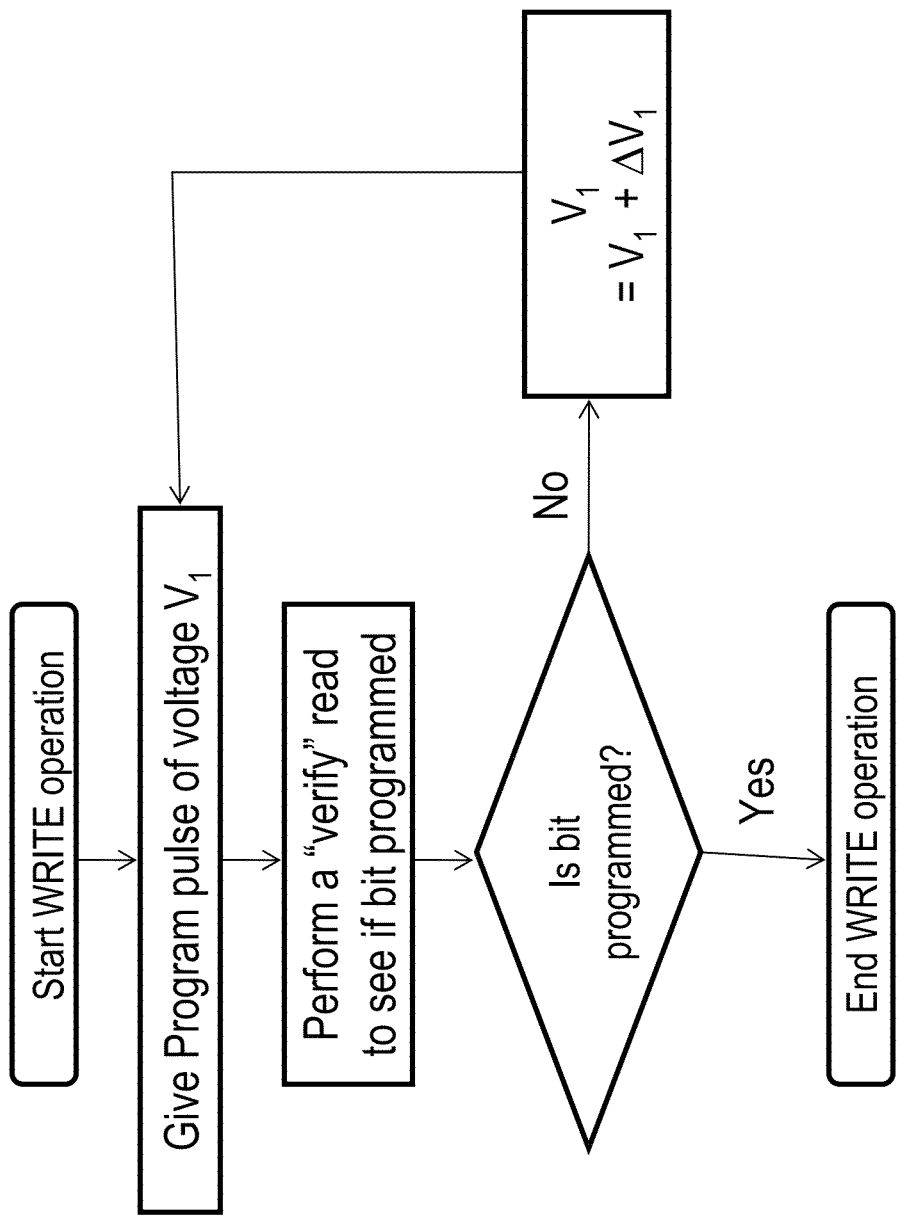

FIG. 12A-B illustrates an embodiment of the invention wherein incremental step pulse programming techniques and methodology may be utilized for floating-body RAM. The Y axis of the graph shown in FIG. 12A may indicate the voltage used for writing the floating-body RAM cell or array and the X axis of the graph shown in FIG. 12A may indicate time during the writing of a floating-body RAM cell or array. Instead of using a single pulse voltage for writing a floating-body RAM cell or array, multiple write voltage pulses, such as, initial write pulse 1202, second write pulse 1206 and third write pulse 1210, may be applied to a floating-body RAM cell or array. Write voltage pulses such as, initial write pulse 1202, second write pulse 1206 and third write pulse 1210, may have differing voltage levels and time durations ('pulse width'), or they may be similar. A "verify" read may be conducted after every write voltage pulse to detect if the memory cell has been successfully written with the previous write voltage pulse. A "verify" read operation may include voltage pulses and current reads. For example, after initial write pulse 1202, a "verify" read operation 1204 may be conducted. If the "verify" read operation 1204 has determined that the floating-body RAM cell or array has not finished storing the data, a second write pulse 1206 may be given followed by a second "verify" read operation 1208. Second write pulse 1206 may be of a higher voltage and/or time duration (shown) than that of initial write pulse 1202. If the second "verify" read operation 1208 has determined that the floating-body RAM cell or array has not finished storing the data, a third write pulse 1210 may be given followed by a third "verify" read operation 1212. Third write pulse 1210 may be of a higher voltage and/or time duration (shown) than that of initial write pulse 1202 or second write pulse 1206. This could continue until a combination of write pulse and verify operations indicate that the bit storage is substantially complete. The potential advantage of incremental step pulse programming schemes may be similar to those described with respect to FIG. 7 and FIG. 8A-8B as they may tackle the cell variability and other issues, such as effective versus applied write voltages.

FIG. 12B illustrates an embodiment of the invention of an exemplary methodology for implementing a write operation using incremental step pulse programming scheme described with respect to FIG. 12A. Although FIG. 12B illustrates an incremental step pulse programming scheme where subsequent write pulses may have higher voltages, the flow may be general and may apply to cases, for example, wherein subsequent write pulses may have higher time durations. Starting a write operation, a write voltage pulse of voltage $V_1$ may be applied to the floating-body RAM cell or array, following which a verify read operation may be conducted. If the verify read indicates that the bit of the floating-body RAM cell or array has been written satisfactorily, the write operation substantially completes. Otherwise, the write voltage pulse magnitude may be increased ($+\Delta V_1$ shown) and further write pulses and verify read pulses may be given to the memory cell. This process may repeat until the bit is written satisfactorily.

Persons of ordinary skill in the art will appreciate that the illustrations in FIGS. 12A through 12B are exemplary only and are not drawn to scale. Such skilled persons will further appreciate that many variations may be possible such as, for example, pulses may utilize delivered current rather than measured or effective voltage, or some combination thereof. Moreover, multiple write pulses before a read verify operation may be done. Further, write pulses may have more complex shapes in voltage and time, such as, for example, ramped voltages, soaks or holds, or differing pulse widths. Furthermore, the write pulse may be of positive or negative voltage magnitude and there may be a mixture of unipolar or bipolar pulses within each pulse train. The write pulse or pulses may be between read verify operations. Further, $\Delta V_1$ may be of polarity to decrease the write program pulse voltage $V_1$ magnitude. Moreover, an additional 'safety' write pulse may be utilized after the last successful read operation. Further, the verify read operation may utilize a read voltage pulse that may be of differing voltage and time shape than the write pulse, and may have a different polarity than the write pulse. Furthermore, the write pulse may be utilized for verify read purposes. Many other modifications within the scope of the illustrated embodiments of the invention described herein will suggest themselves to such skilled persons after reading this specification. Thus the invention is to be limited only by the appended claims.

Figure 13:
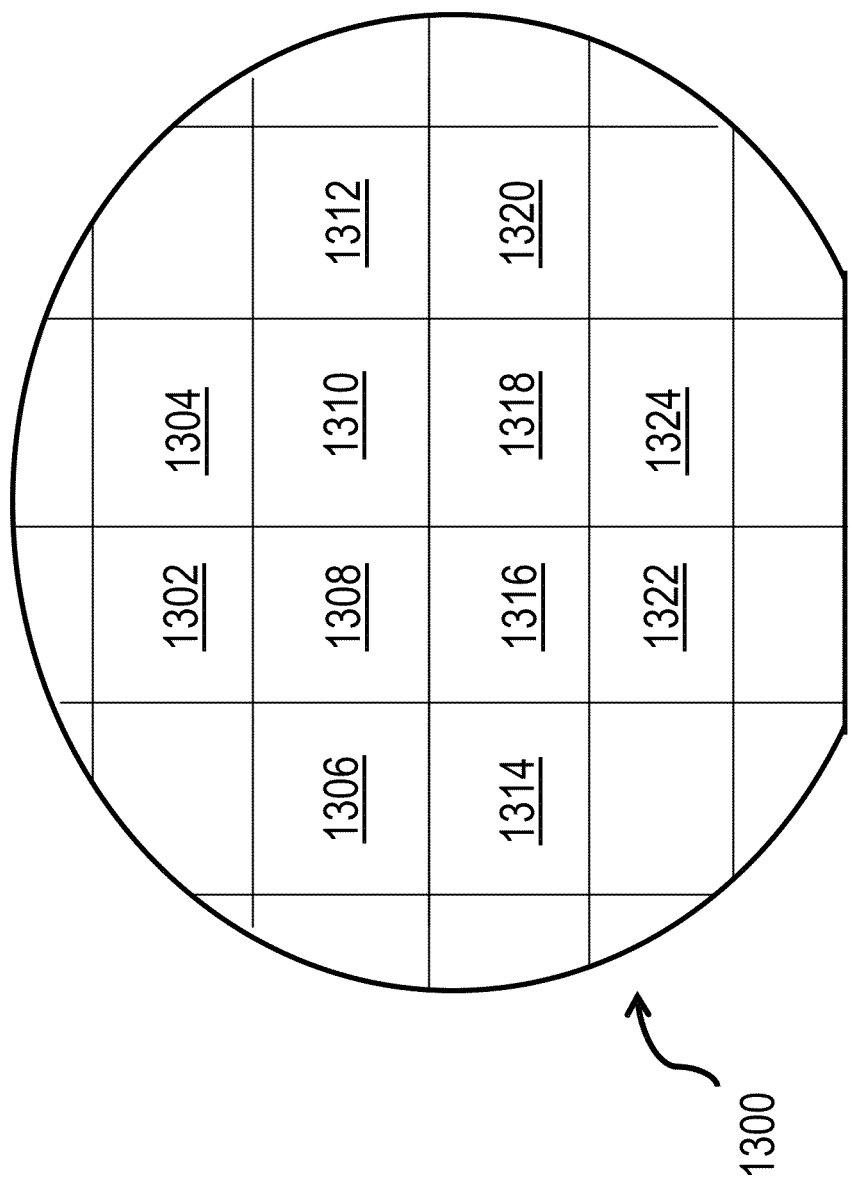
FIG. 13 is an exemplary drawing illustration of different write voltages utilized for different dice across a wafer.

FIG. 13 illustrates an embodiment of the invention wherein optimized and possibly different write voltages may be utilized for different dice across a wafer. As an illustrative example, wafer 1300 may include dice 1302, 1304, 1306, 1308, 1310, 1312, 1314, 1316, 1318, 1320, 1322 and 1324. Due to variations in process and device parameters across wafer 1300, which may be induced by, for example, manufacturing issues, each die, for example die 1302, on wafer 1300 may suitably operate at its own optimized write voltage. The optimized write voltage for die 1302 may be different than the optimized write voltage for die 1304, and so forth. During, for example, the test phase of wafer 1300 or individual dice, such as, for example, die 1302, tests may be conducted to determine the optimal write voltage for each die. This optimal write voltage may be stored on the floating body RAM die, such as die 1302, by using some type of non-volatile memory, such as, for example, metal or oxide fuseable links, or intentional damage programming of floating-body RAM bits, or may be stored off-die, for example, on a different die within wafer 1300. Using an optimal write voltage for each die on a wafer may allow higher-speed, lower-power and more reliable floating-body RAM chips.

Persons of ordinary skill in the art will appreciate that the illustrations in FIG. 13 are exemplary only and are not drawn to scale. Such skilled persons will further appreciate that many variations may be possible such as, for example, while FIG. 13 discussed using optimal write voltages for each die on the wafer, each wafer in a wafer lot may have its own optimal write voltage that may be determined, for example, by tests conducted on circuits built on scribe lines of wafer 1300, a 'dummy' mini-array on wafer 1300, or a sample of floating-body RAM dice on wafer 1300. Moreover, interpolation or extrapolation of the test results from, such as, for example, scribe line built circuits or floating-body RAM dice, may be utilized to calculate and set the optimized programming voltage for untested dice. For example, optimized write voltages may be determined by testing and measurement of die 1302 and die 1322, and values of write voltages for die 1308 and die 1316 may be an interpolation calculation, such as, for example, to a linear scale. Many other modifications within the scope of the illustrated embodiments of the invention described herein will suggest themselves to such skilled persons after reading this specification. Thus the invention is to be limited only by the appended claims.

Figure 14:
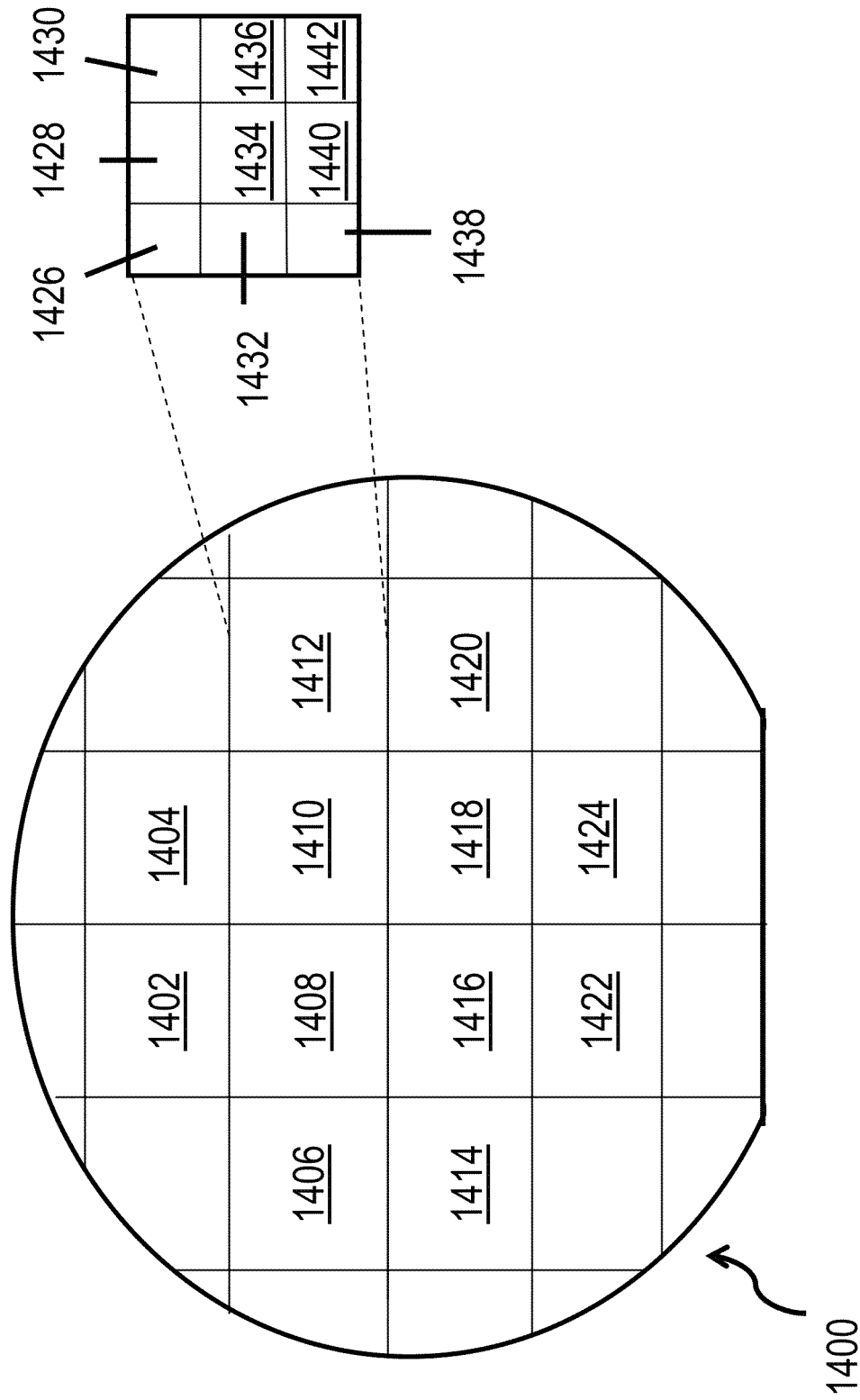
FIG. 14 is an exemplary drawing illustration of different write voltages utilized for different parts of a chip (or die)

FIG. 14 illustrates an embodiment of the invention wherein optimized for different parts of a chip (or die) write voltages may be utilized. As an illustrative example, wafer 1400 may include chips 1402, 1404, 1406, 1408, 1410, 1412, 1414, 1416, 1418, 1420, 1422 and 1424. Each chip, such as, for example, chip 1412, may include a number of different parts or blocks, such as, for example, blocks 1426, 1428, 1430, 1432, 1434, 1436, 1438, 1440 and 1442. Each of these different parts or blocks may have its own optimized write voltage that may be determined by measurement of test circuits which may, for example, be built onto the memory die, within each block, or on another die. This optimal write voltage may be stored on the floating body RAM die, such as die 1402, by using some type of non-volatile memory, such as, for example, metal or oxide fuse-able links, or intentional damage programming of floating-body RAM bits, or may be stored off-die, for example, on a different die within wafer 1400, or may be stored within a block, such as block 1426.

Figure 15:
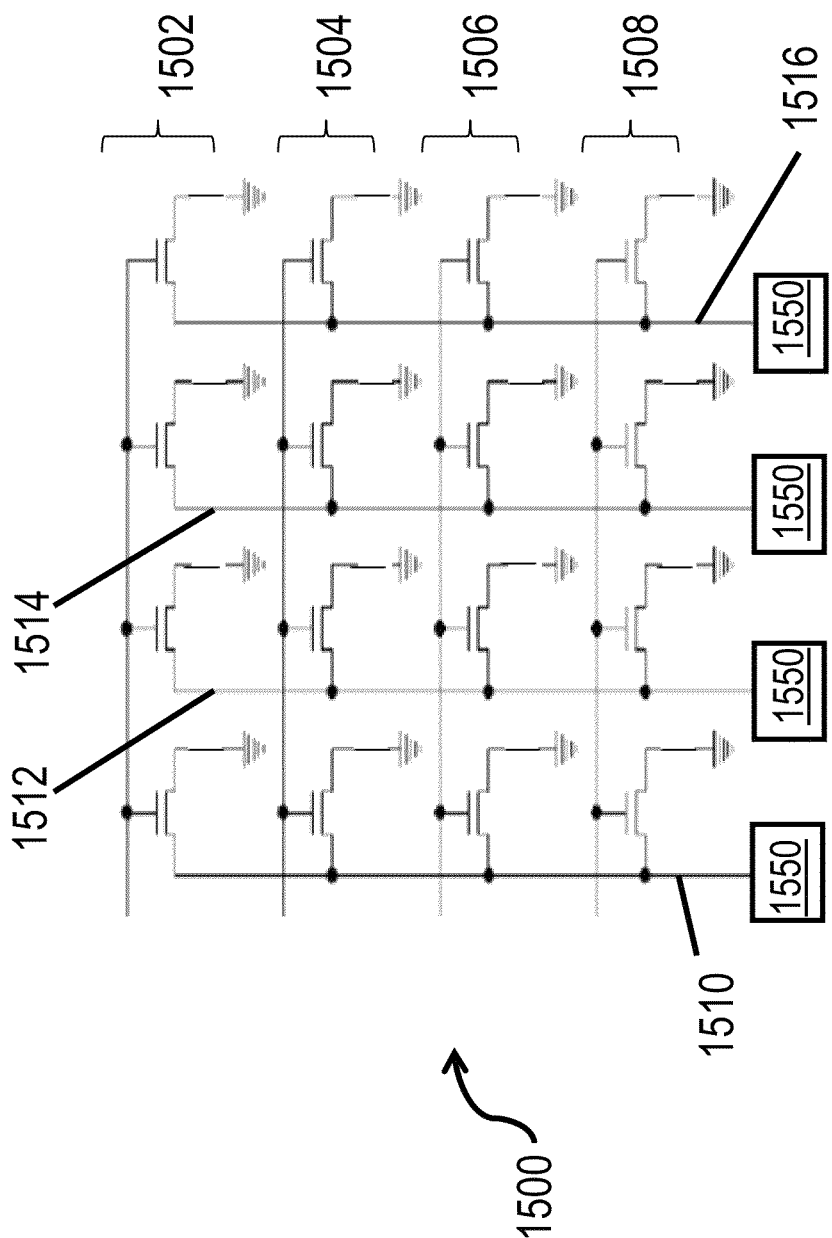
FIG. 15 is an exemplary drawing illustration of write voltages for floating-body RAM cells may be based on the distance of the memory cell from its write circuits.

FIG. 15 illustrates an embodiment of the invention wherein write voltages for floating-body RAM cells may be substantially or partly based on the distance of the memory cell from its write circuits. As an illustrative example, memory array portion 1500 may include bit-lines 1510, 1512, 1514 and 1516 and may include memory rows 1502, 1504, 1506 and 1508, and may include write driver circuits 1550. The memory row 1502 with memory cells may be farthest away from the write driver circuits 1550, and so, due to the large currents of floating-body RAM operation, may suffer a large IR drop along the wires. The memory row 1508 with memory cells may be closest to the write driver circuits 1550 and may have a low IR drop. Due to the IR drops, the voltage delivered to each memory cell of a row may not be the same, and may be significantly different. To tackle this issue, write voltages delivered to memory cells may be adjusted based on the distance from the write driver circuits. When the IR drop value may be known to be higher, which may be the scenario for memory cells farther away from the write driver circuits, higher write voltages may be used. When the IR drop may be lower, which may be the scenario for memory cells closer to the write driver circuits, lower write voltages may be used.

Write voltages may be tuned based on temperature at which a floating body RAM chip may be operating. This temperature based adjustment of write voltages may be useful since required write currents may be a function of the temperature at which a floating body RAM device may be operating. Furthermore, different portions of the chip or die may operate at different temperatures in, for example, an embedded memory application. Another embodiment of the invention may involve modulating the write voltage for different parts of a floating body RAM chip based on the temperatures at which the different parts of a floating body RAM chip operate. Refresh can be performed more frequently or less frequently for the floating body RAM by using its temperature history. This temperature history may be obtained by many methods, including, for example, by having reference cells and monitoring charge loss rates in these reference cells. These reference cells may be additional cells placed in memory arrays that may be written with known data. These reference cells may then be read periodically to monitor charge loss and thereby determine temperature history.

In FIG. 9 to FIG. 15, various techniques to improve floating-body RAM were described. Many of these techniques may involve addition of additional circuit functionality which may increase control of the memory arrays. This additional circuit functionality may be henceforth referred to as 'controller circuits' for the floating-body RAM array, or any other memory management type or memory regions described herein. FIG. 16A-C illustrates an embodiment of the invention where various configurations useful for controller functions are outlined. FIG. 16A illustrates a configuration wherein the controller circuits 1602 may be on the same chip 1606 as the memory arrays 1604. FIG. 16B illustrates a 3D configuration 1612 wherein the controller circuits may be present in a logic layer 1608 that may be stacked below the floating-body RAM layer 1610. As well, FIG. 16B illustrates an alternative 3D configuration 1614 wherein the controller circuits may be present in a logic layer 1618 that may be stacked above a floating-body RAM array 1616. 3D configuration 1612 and alternative 3D configuration 1614 may be constructed with 3D stacking techniques and methodologies, including, for example, monolithic or TSV. FIG. 16C illustrates yet another alternative configuration wherein the controller circuits may be present in a separate chip 1620 while the memory arrays may be present in floating-body chip 1622. The configurations described in FIG. 16A-C may include input-output interface circuits in the same chip or layer as the controller circuits. Alternatively, the input-output interface circuits may be present on the chip with floating-body memory arrays. The controller circuits in, for example, FIG. 16, may include memory management circuits that may extend the useable endurance of said memory, memory management circuits that may extend the proper functionality of said memory, memory management circuits that may control two independent memory blocks, memory management circuits that may modify the voltage of a write operation, and/or memory management circuits that may perform error correction and so on. Memory management circuits may include hardwired or soft coded algorithms.

Figure 17A:
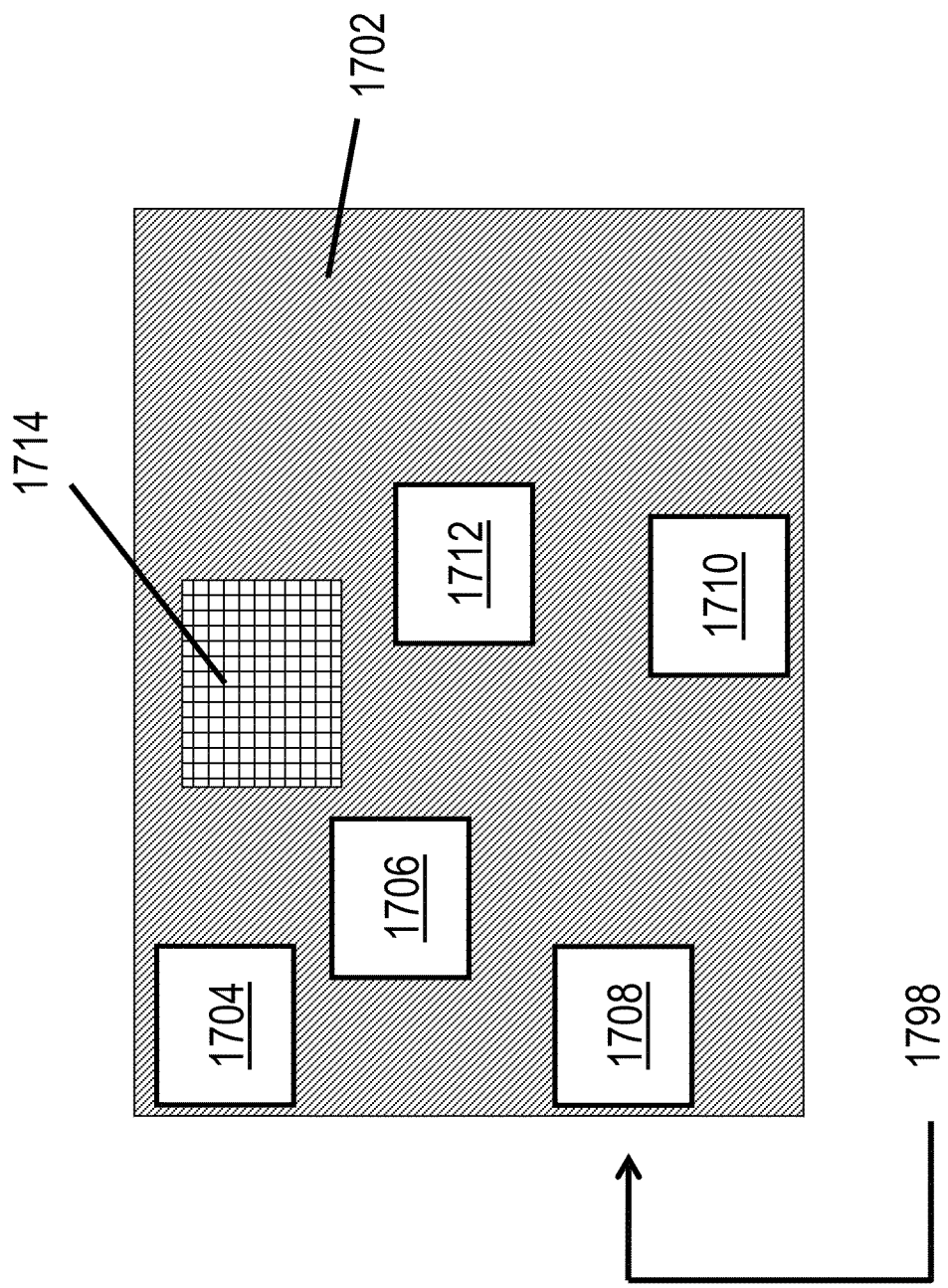
FIG. 17A-B are exemplary drawing illustrations of controller functionality and architecture applied to applications.
Figure 17B:
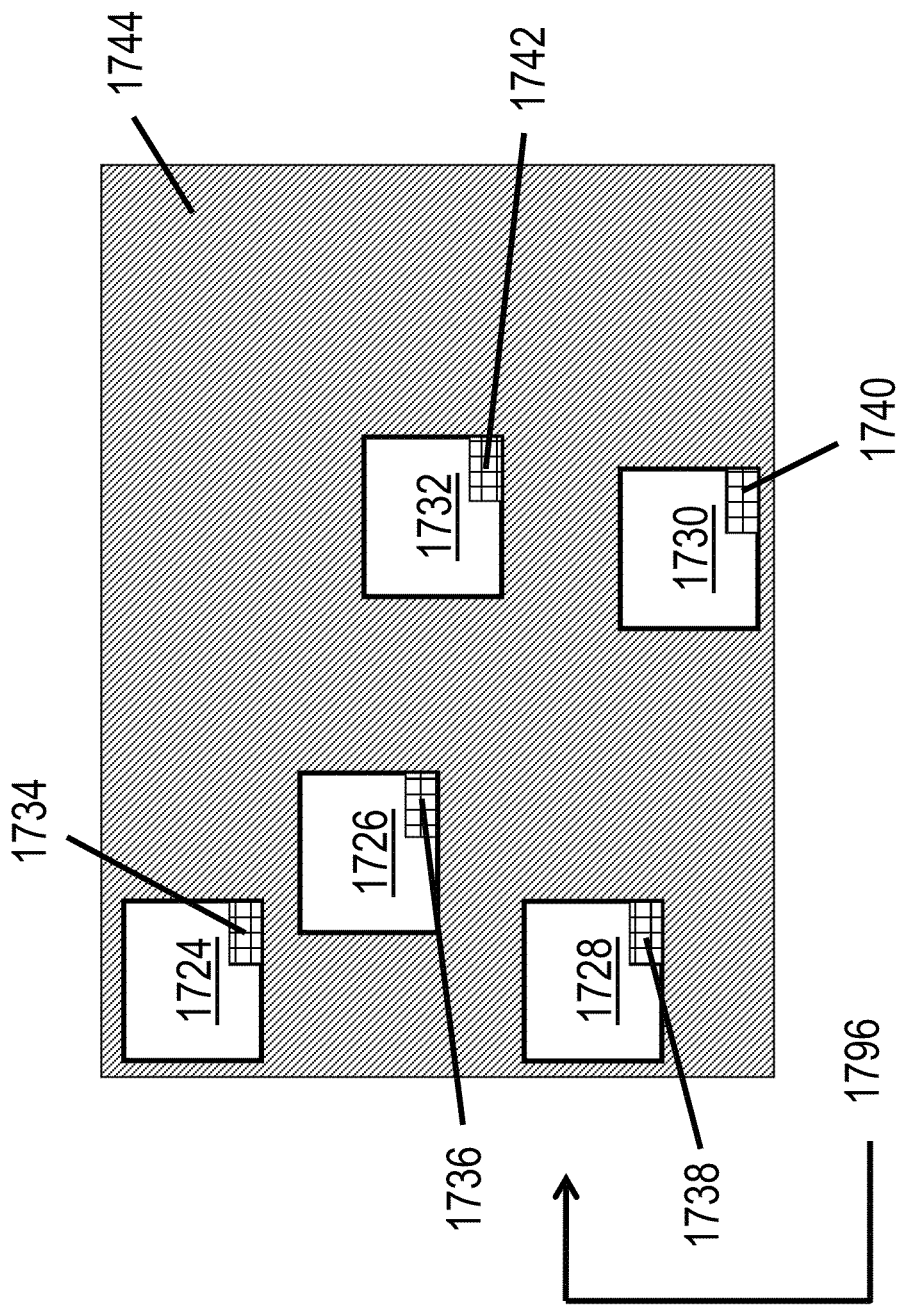

FIG. 17A-B illustrates an embodiment of the invention wherein controller functionality and architecture may be applied to applications including, for example, embedded memory. As an illustrated in FIG. 17A, embedded memory application die 1798 may include floating-body RAM blocks 1704, 1706, 1708, 1710 and 1712 spread across embedded memory application die 1798 and logic circuits or logic regions 1702. In an embodiment of the invention, the floating-body RAM blocks 1704, 1706, 1708, 1710 and 1712 may be coupled to and controlled by a central controller 1714. As illustrated in FIG. 17B, embedded memory application die 1796 may include floating-body RAM blocks 1724, 1726, 1728, 1730 and 1732 and associated memory controller circuits 1734, 1736, 1738, 1740 and 1742 respectively, and logic circuits or logic regions 1744. In an embodiment of the invention, the floating-body RAM blocks 1724, 1726, 1728, 1730 and 1732 may be coupled to and controlled by associated memory controller circuits 1734, 1736, 1738, 1740 and 1742 respectively.

FIG. 18 illustrates an embodiment of the invention wherein cache structure 1802 may be utilized in floating body RAM chip 1806 which may have logic circuits or logic regions 1844. The cache structure 1802 may have shorter block sizes and may be optimized to be faster than the floating-body RAM blocks 1804. For example, cache structure 1802 may be optimized for faster speed by the use of faster transistors with lower threshold voltages and channel lengths. Furthermore, cache structure 1802 may be optimized for faster speed by using different voltages and operating conditions for cache structure 1802 than for the floating-body RAM blocks 1804.

Persons of ordinary skill in the art will appreciate that the illustrations in FIGS. 9 through 18 are exemplary only and are not drawn to scale. Such skilled persons will further appreciate that many variations may be possible such as, for example, many types of floating body RAM may be utilized and the invention may not be limited to any one particular configuration or type. For example, monolithic 3D floating-body RAM chips, 2D floating-body RAM chips, and floating-body RAM chips that might be 3D stacked with through-silicon via (TSV) technology may utilize the techniques illustrated with FIG. 9 to FIG. 18. Many other modifications within the scope of the illustrated embodiments of the invention described herein will suggest themselves to such skilled persons after reading this specification. Thus the invention is to be limited only by the appended claims.

Figure 33:
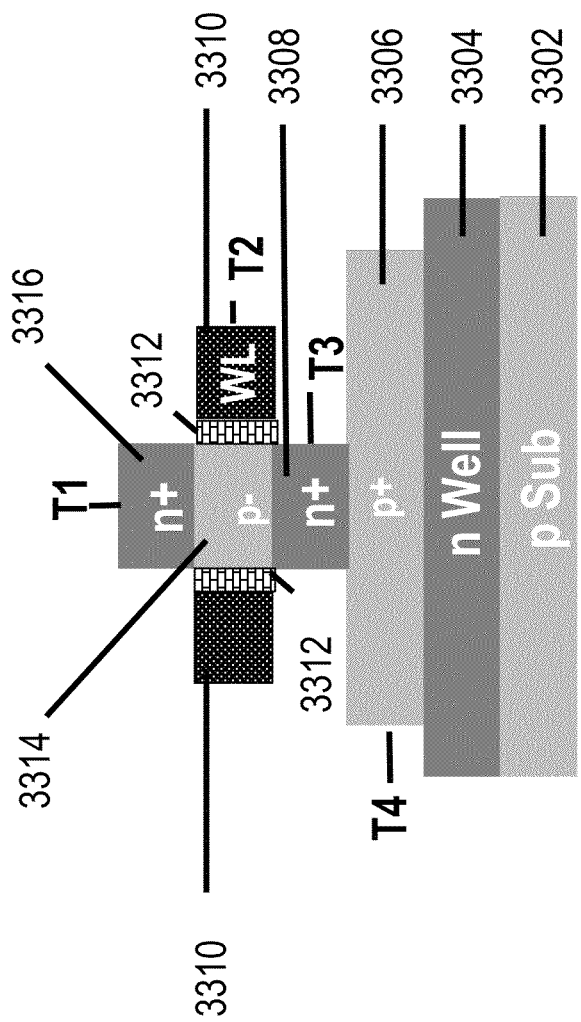
FIG. 33 is an exemplary drawing illustration of a floating body RAM that may not require high electric fields for write.

FIG. 33 illustrates a floating-body RAM cell that may require lower voltages than previous cells and may operate without the use of high-field effects. In FIG. 33, 3302 may be a p-type substrate, 3304 may be an n-well region, 3306 may be a p+ region, 3308 may be a n+ region, 3310 may be a word-line, 3312 may be a gate dielectric, 3314 may be a p type region and 3316 may be a second n+ region. The device may be controlled with four terminals, represented by T1, T2, T3 and T4. Several bias schemes may be used with a device such as this one. Further details of this floating-body RAM cell and its bias schemes may be described in pending patent application 2011/0019482.

FIG. 34A-L illustrates an embodiment of the invention, wherein a horizontally-oriented monolithic 3D Floating-Body RAM array may be constructed that may not require high-field effects for write operations. One mask may utilized on a "per-memory-layer" basis for the monolithic 3D DRAM shown in FIGS. 34A-L, and all other masks may be shared between different layers. The process flow may include the following steps which may be in sequence from Step (A) to Step (K). When the same reference numbers are used in different drawing figures (among FIGS. 34A-K), the reference numbers may be used to indicate analogous, similar or identical structures to enhance the understanding of the invention by clarifying the relationships between the structures and embodiments presented in the various diagrams—particularly in relating analogous, similar or identical functionality to different physical structures.

Figure 34A:
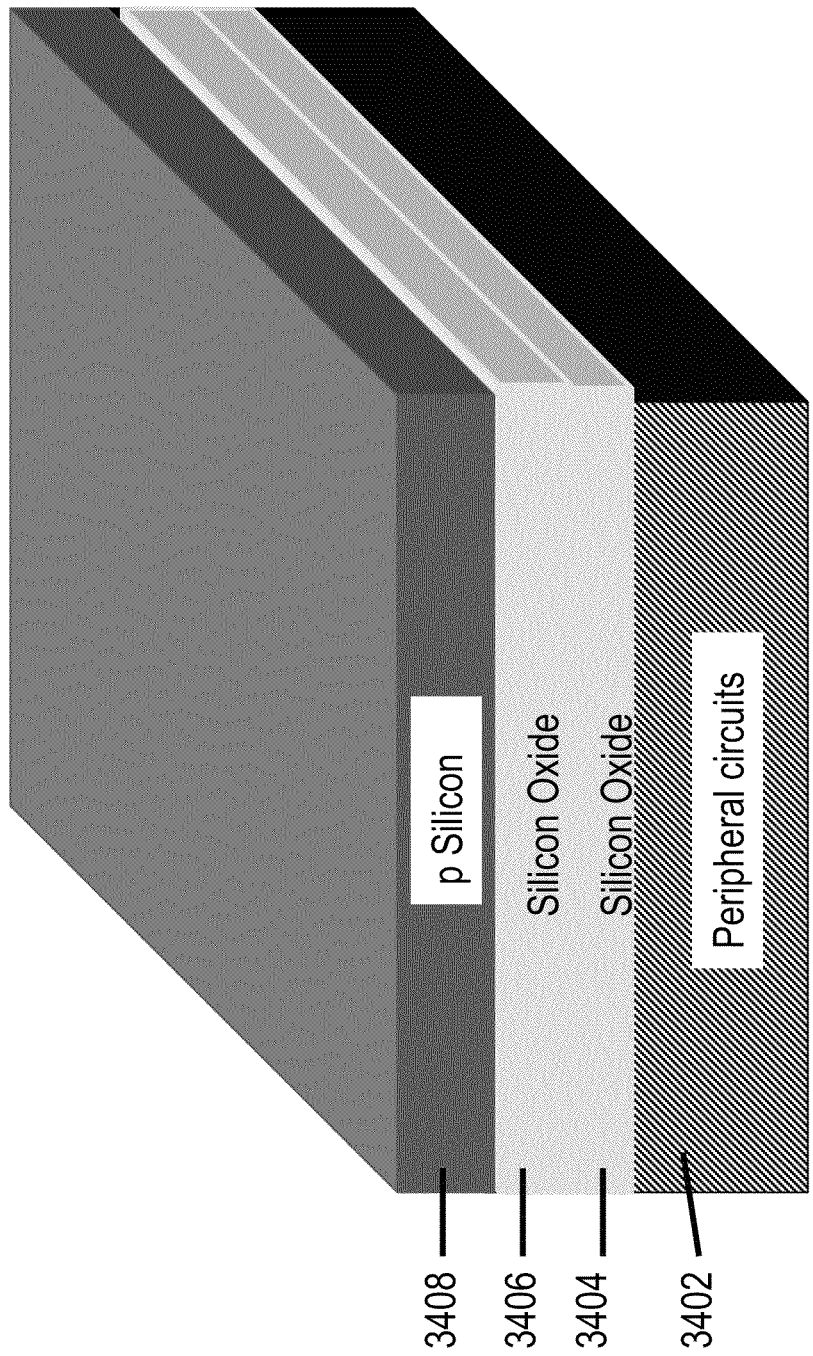

Step (A): FIG. 34A illustrates the structure after Step (A). Using procedures similar to those described in FIG. 32A-C, a monocrystalline p Silicon layer 3408 may be layer transferred atop peripheral circuits 3402. Peripheral circuits 3402 may utilize high temperature wiring (interconnect metal layers), made with metals, such as, for example, tungsten, and may include logic circuit regions. Oxide-to-oxide bonding between oxide layers 3404 and 3406 may be utilized for this transfer, in combination with ion-cut processes.

Step (B): FIG. 34B illustrates the structure after Step (B). Using a lithography step, implant processes and other process steps, n+ silicon regions 3412 may be formed. Thus p-silicon regions 3410 may be formed.

Step (C): FIG. 34C illustrates the structure after Step (C). An oxide layer 3414 may be deposited atop the structure shown in FIG. 34B.

Step (D): FIG. 34D illustrates the structure after Step (D). Using methods similar to Steps (A), (B) and (C), multiple silicon layers having n+ silicon regions 3420 and p silicon regions 3418 may be formed with associated silicon oxide layers 3416. Oxide layer 3404 and oxide layer 3406, which were previously oxide-oxide bonded, are now illustrated as oxide layer 3416.

Step (E): FIG. 34E illustrates the structure after Step (E). Using lithography, multiple implant processes, and other steps such as resist strip, p+ silicon regions 3424 may be formed in multiple layers. 3422 may represent p silicon regions, 3420 may indicate n+ silicon regions and silicon oxide layers 3416. A Rapid Thermal Anneal (RTA) may be conducted to activate dopants in all layers. The multiple implant steps for forming p+ silicon regions 3424 may have different energies when doping each of the multiple silicon layers.

Figure 34F:
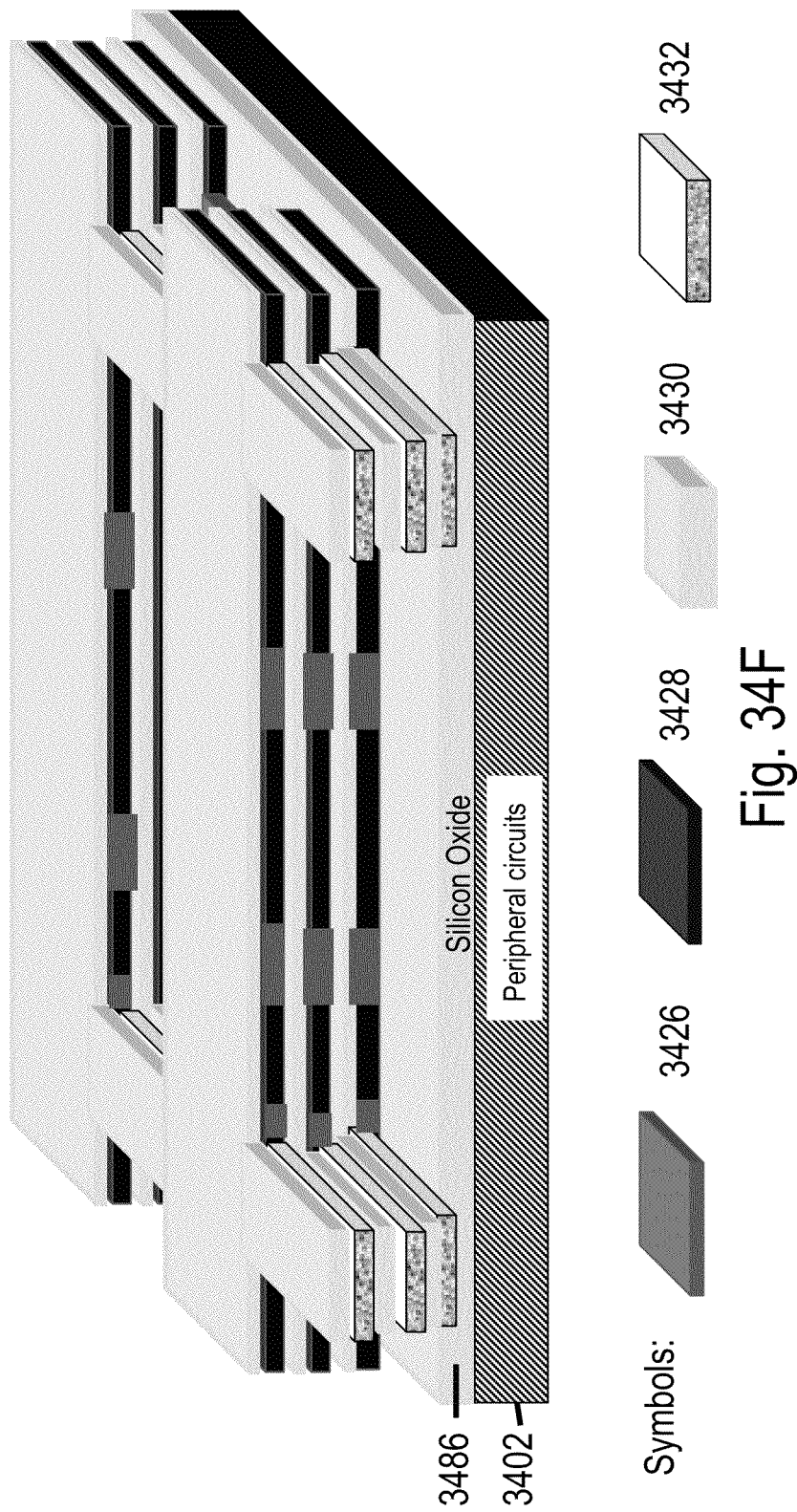

Step (F): FIG. 34F illustrates the structure after Step (F). Lithography and etch processes may then be utilized to make a structure as shown in the figure. The etch of multiple silicon layers and associated silicon oxide layers may stop on oxide layer 3486 (shown), or may extend into and etch a portion of oxide layer 3486 (not shown). Thus exemplary patterned oxide regions 3430 and patterned regions of n+ silicon 3428, p silicon 3426 and p+ silicon 3432 may be formed.

Figure 34G:
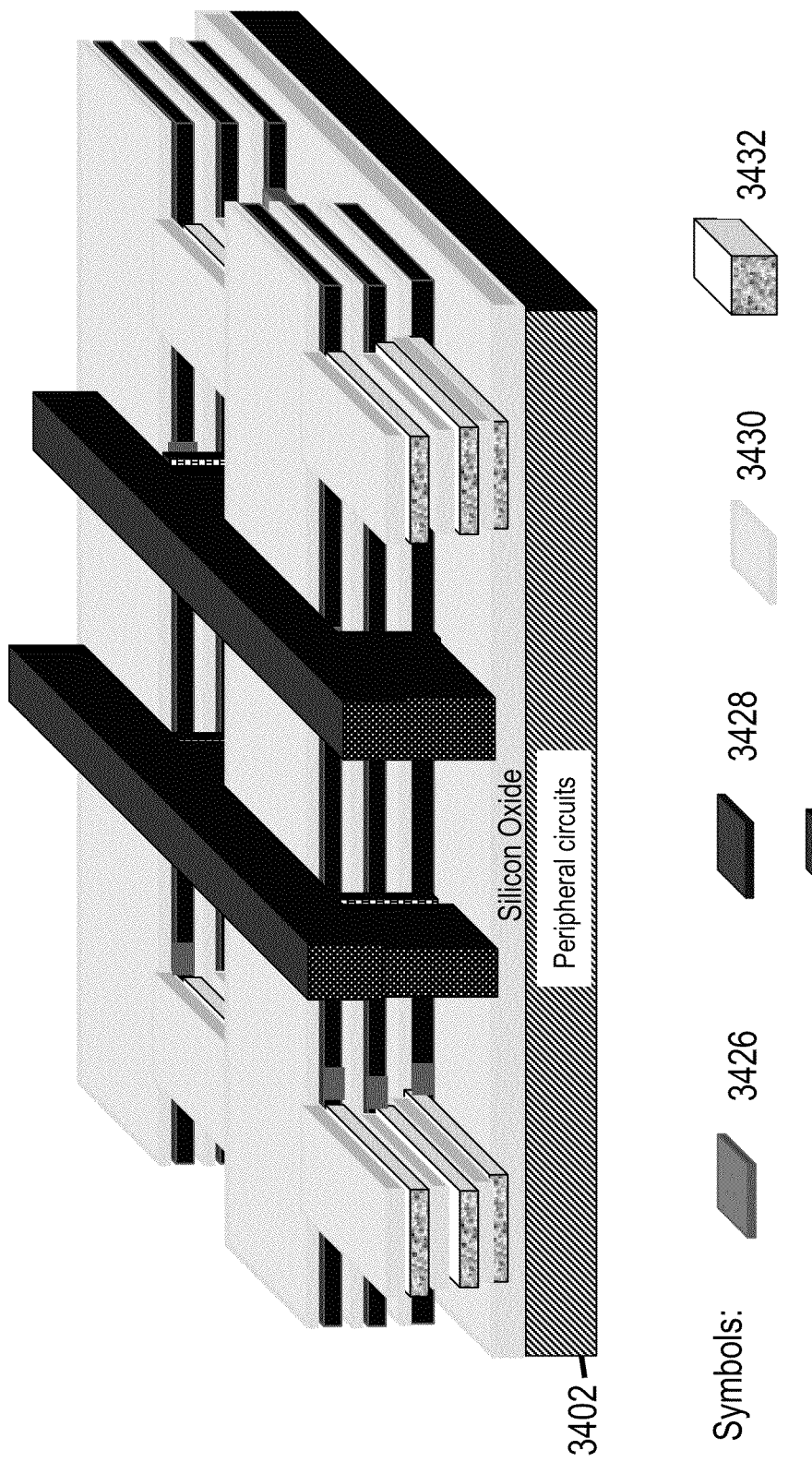

Step (G): FIG. 34G illustrates the structure after Step (G). A gate dielectric, such as, for example, silicon dioxide or hafnium oxides, and gate electrode, such as, for example, doped amorphous silicon or TiAlN, may be deposited and a CMP may be done to planarize the gate stack layers. Lithography and etch may be utilized to define the gate regions, thus gate dielectric regions 3434 and gate electrode regions 3436 may be formed.

Figure 34H:
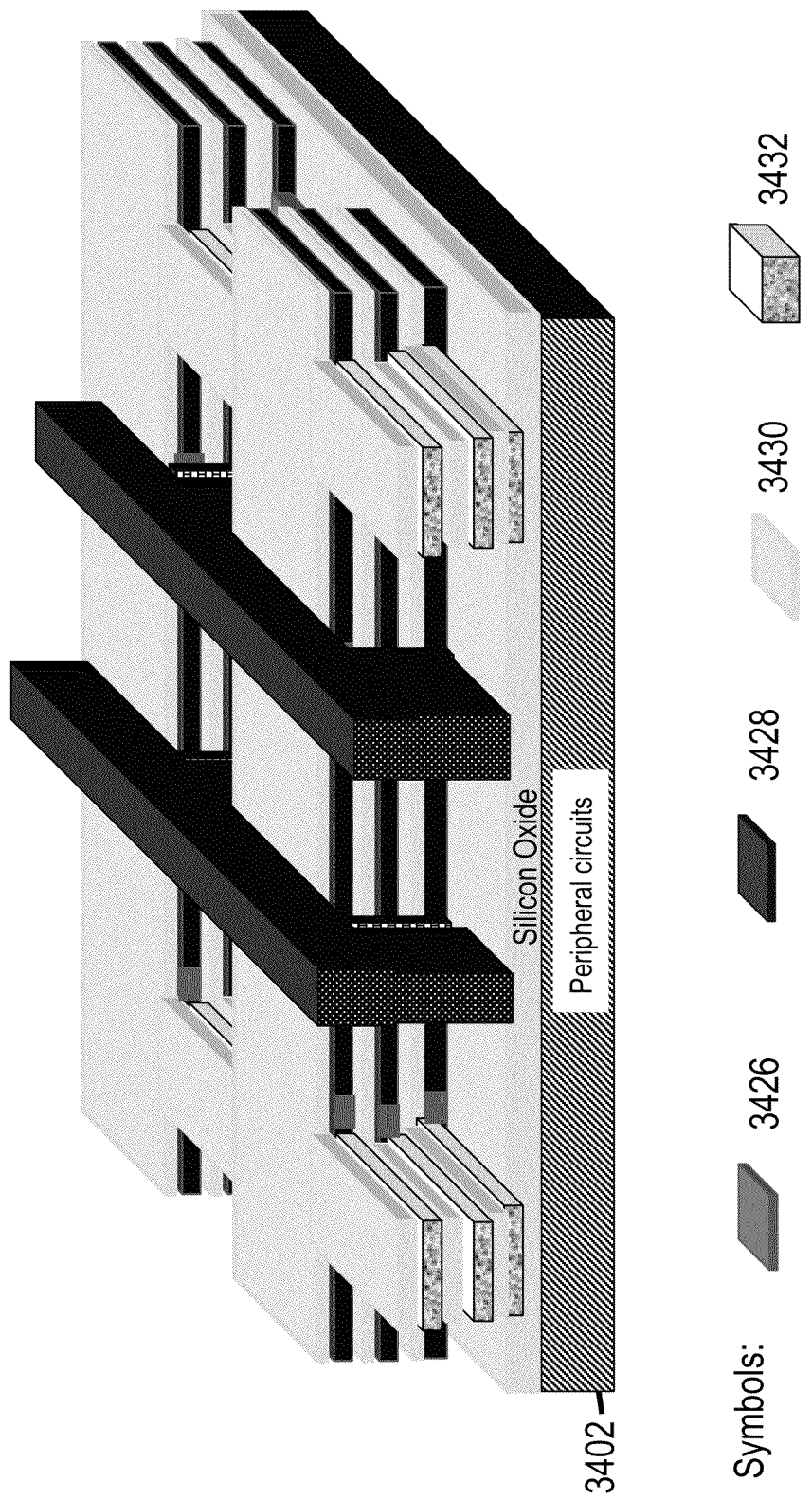

Step (H): FIG. 34H illustrates the structure after Step (H). Silicon dioxide (not shown) may be deposited and then planarized. In FIG. 34H and subsequent steps in the process flow, the overlying silicon dioxide regions may not be shown for clarity.

Figure 34I:
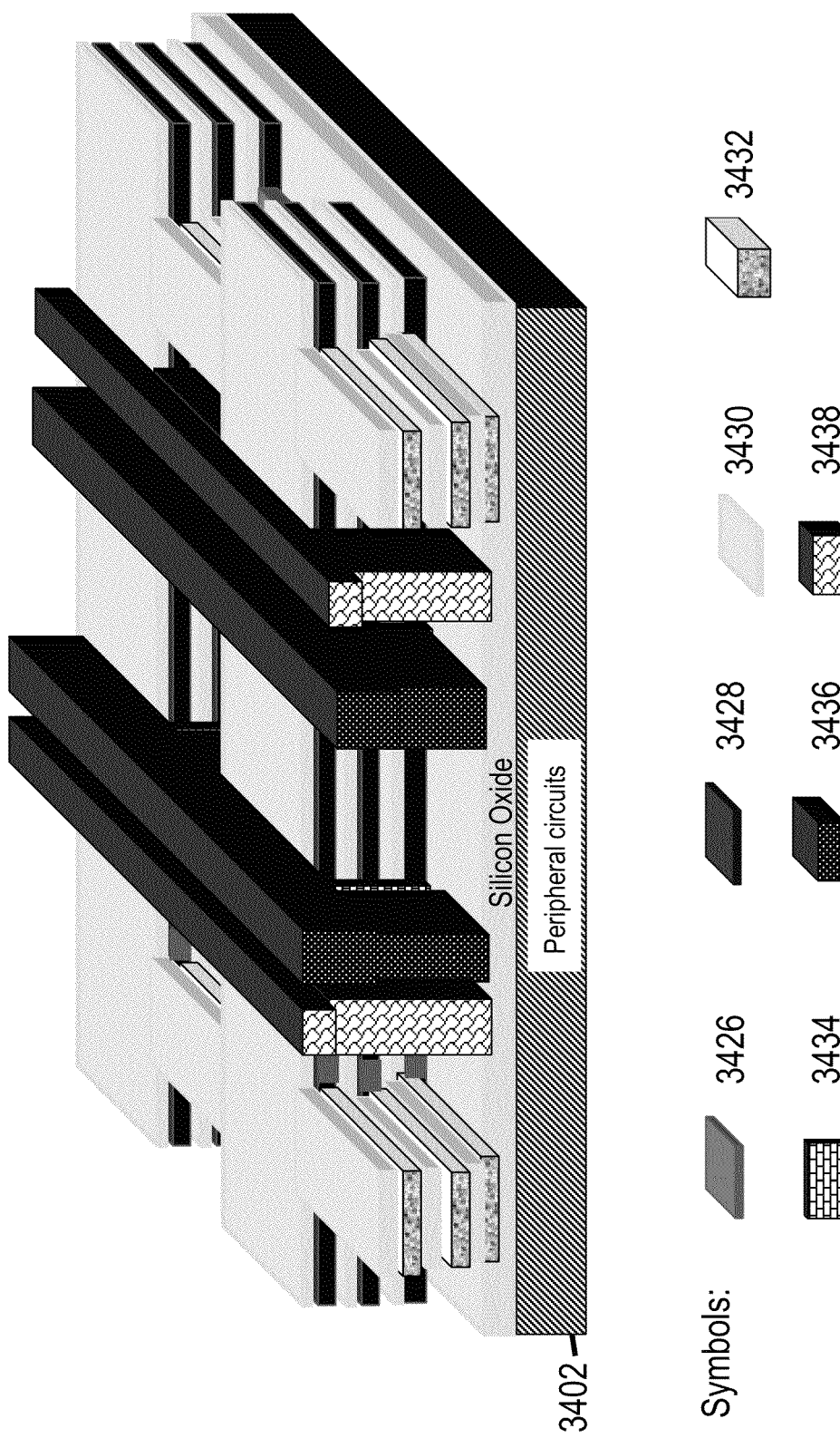

Step (I): FIG. 34I illustrates the structure after Step (I). Openings may be created within the (transparent) silicon oxide regions utilizing lithography and etch steps and other processes such as resist and residue cleaning. A contact material which may include, such as, for example, metal silicide, may be formed in these openings following which a chemical mechanical polish step may be conducted to form conductive regions 3438.

Step (J): FIG. 34J illustrates the structure after Step (J). A trench, for example two of which may be placed as shown in FIG. 34J, may be formed by lithography, etch and clean processes. The trench etch may etch multiple silicon layers and associated silicon oxide layers and may stop on oxide layer 3486 or may extend into and etch a portion of oxide layer 3486. A conductive contact material, such as aluminum, copper, tungsten and associated barrier metals, such as Ti/TiN, may then be filled in the trenches, thus forming conductive contact regions 3440.

Step (K): FIG. 34K illustrates the structure after Step (K). Wiring 3442 may be formed. The terminals of memory cells may include conductive regions 3438, gate electrode regions 3436, p+ silicon regions 3432 and conductive contact regions 3440. Contacts may then be made to terminals of the memory array at its edges. Contacts to regions 3432 at the edges of the array can be made into stair-like structures using techniques described in "Bit Cost Scalable Technology with Punch and Plug Process for Ultra High Density Flash Memory," *VLSI Technology,* 2007 *IEEE Symposium on,* vol., no., pp. 14-15, 12-14 Jun. 2007 by Tanaka, H.; Kido, M.; Yahashi, K.; Oomura, M.; et al., following which contacts can be constructed to them. Formation of stair-like structures for regions 3432 at the edges of the array could be done in steps prior to Step (K) as well.

FIG. 34L illustrates a single cell of the memory array. p+ regions 3494, p regions 3498, n+ silicon regions 3496, gate dielectric regions 3492, gate electrode regions 3490 and conductive contact regions 3488 may be parts of the memory cell. This cell may be operated using bias schemes described in pending patent application 2011/0019482. Alternatively, some other bias scheme may be used.

A procedure for constructing a monolithic 3D DRAM has thus been described, with (1) horizontally-oriented transistors—i.e. current flowing in substantially the horizontal direction in transistor channels, (2) some of the memory cell control lines may be constructed of heavily doped silicon and embedded in the memory cell layer, (3) side gates simultaneously deposited over multiple memory layers for transistors, (4) monocrystalline (or single-crystal) silicon layers obtained by layer transfer techniques such as ion-cut, and (5) high-field effects may not be required for write operations. The transistors in the monocrystalline layer or layers may be horizontally oriented, i.e., current flowing in substantially the horizontal direction in transistor channels, substantially between drain and source, which may be parallel to the largest face of the substrate or wafer. The source and drain of the horizontally oriented transistors may be within the same monocrystalline layer. A transferred monocrystalline layer, such as p Silicon layer 3408, may have a thickness of less than about 150 nm.

Persons of ordinary skill in the art will appreciate that the illustrations in FIGS. 34A through 34L are exemplary only and are not drawn to scale. Such skilled persons will further appreciate that many variations may be possible such as, for example, layer transfer techniques other than the described hydrogen implant and ion-cut may be utilized. Moreover, while FIG. 34A-L described the procedure for forming a monolithic 3D DRAM with one mask per memory layer and all other masks may be shared among multiple memory layers, alternative procedures could be used. For example, p+ regions 3432 may be formed by using an additional lithography step on a "per-layer" basis that may not be shared among all memory layers. Alternatively, both p+ regions 3432 and n+ regions 3428 may be formed with multiple energy implants and masks shared among all memory layers. Alternatively, procedures similar to those described in patent application Ser. No. 13/099,010, the contents of the foregoing application is incorporated herein by reference, may be used to construct the monolithic 3D DRAM. Alternatively, the directions of some or all of the wiring/terminals of the array may be perpendicular to the directions shown in FIG. 34A-K to enable easier biasing. The memory regions may have horizontally oriented transistors and vertical connections between the memory and logic/periphery layers may have a radius of less than 100 nm. These vertical connections may be vias, such as, for example, thru layer vias (TLVs), through the monocrystalline silicon layers connecting the stacked layers, for example, logic/periphery circuit regions within one monocrystalline layer to memory regions within another monocrystalline layer. Additional (eg. third or fourth) monocrystalline layers that may have memory regions may be added to the stack. Decoders and other driver circuits of said memory may be part of the stacked logic circuit layer or logic circuit regions. Many other modifications within the scope of the illustrated embodiments of the invention will suggest themselves to such skilled persons after reading this specification. Thus the invention is to be limited only by the appended claims.

Refresh Schemes for DRAMs and Floating Body RAM Arrays

Refresh may be a key constraint with conventional capacitor-based DRAM. Floating-body RAM arrays may require better refresh schemes than capacitor-based DRAM due to the lower amount of charge they may store. Furthermore, with an auto-refresh scheme, floating-body RAM may be used in place of SRAM for many applications, in addition to being used as an embedded DRAM or standalone DRAM replacement.

FIG. 19 illustrates an embodiment of the invention wherein a dual-port refresh scheme may be utilized for capacitor-based DRAM. A capacitor-based DRAM cell 1900 may include capacitor 1910, select transistor 1902, and select transistor 1904. Select transistor 1902 may be coupled to bit-line 1920 at node 1906 and may be coupled to capacitor 1910 at node 1912. Select transistor 1904 may be coupled to bit-line 1921 at node 1908 and may be coupled to capacitor 1910 at node 1912. Refresh of the capacitor-based DRAM cell 1900 may be performed using the bit-line 1921 connected to node 1908, for example, and leaving the bit-line 1920 connected to node 1906 available for read or write, i.e, normal operation. This may tackle the key challenge that some memory arrays may be inaccessible for read or write during refresh operations. Circuits required for refresh logic may be placed on a logic region located either on the same layer as the memory, or on a stacked layer in the 3DIC. The refresh logic may include an access monitoring circuit that may allow refresh to be conducted while avoiding interference with the memory operation. The memory or memory regions may, for example, be partitioned such that one portion of the memory may be refreshed while another portion may be accessed for normal operation. The memory or memory regions may include a multiplicity of memory cells such as, for example, capacitor-based DRAM cell 1900.

Persons of ordinary skill in the art will appreciate that the illustrations in FIG. 19 are exemplary only and are not drawn to scale. Such skilled persons will further appreciate that many variations may be possible such as, for example, a dual-port refresh scheme may be used for standalone capacitor based DRAM, embedded capacitor based DRAM that may be on the same chip or on a stacked chip, and monolithic 3D DRAM with capacitors. Moreover, refresh of the capacitor-based DRAM cell 1900 may be performed using the bit-line 1920 connected to node 1906 and leaving the bit-line 1921 connected to node 1908 available for read or write. Many other modifications within the scope of the illustrated embodiments of the invention described herein will suggest themselves to such skilled persons after reading this specification. Thus the invention is to be limited only by the appended claims.

Other refresh schemes may be used for monolithic 3D DRAMs and for monolithic 3D floating-body RAMs similar to those described in US patent application 2011/0121366 and in FIG. 6A-J of this patent application. For example, refresh schemes similar to those described in "The ideal SoC memory: 1T-SRAM™," *Proceedings of the ASIC/SOC Con-* ference, pp. 32-36, 2000 by Wingyu Leung, Fu-Chieh Hsu and Jones, M.-E may be used for any type of floating-body RAM. Alternatively, these types of refresh schemes may be used for monolithic 3D DRAMs and for monolithic 3D floating body RAMs similar to those described in US patent application 2011/0121366 and in FIG. 6A-J of this patent application. Refresh schemes similar to those described in "Autonomous refresh of floating body cells", Proceedings of the Intl. Electron Devices Meeting, 2008 by Ohsawa, T.; Fukuda, R.; Higashi, T.; et al. may be used for monolithic 3D DRAMs and for monolithic 3D floating body RAMs similar to those described in US patent application 2011/0121366 and in FIG. 6A-J of this patent application.

Figure 20:
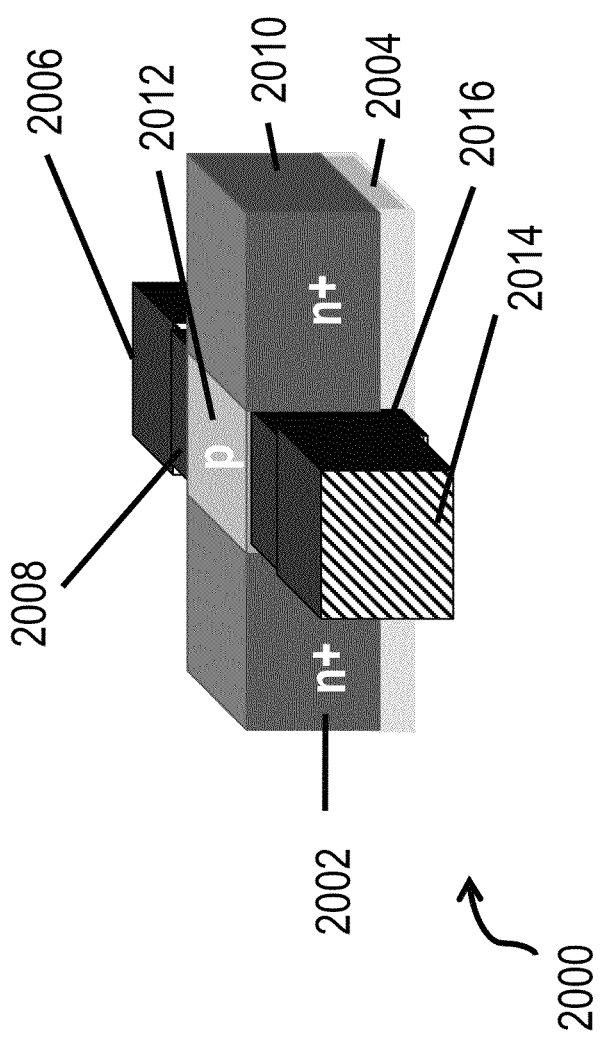
FIG. 20 is an exemplary drawing illustration of a double gate device used for monolithic 3D floating-body RAM.

FIG. 20 illustrates an embodiment of the invention in which a double gate device may be used for monolithic 3D floating-body RAM wherein one of the gates may utilize tunneling for write operations and the other gate may be biased to behave like a switch. As an illustrative example, nMOS double-gate DRAM cell 2000 may include n+ region 2002, n+ region 2010, oxide regions 2004 (partially shown for illustrative clarity), gate dielectric region 2008 and associated gate electrode region 2006, gate dielectric region 2016 and associated gate electrode region 2014, and p-type channel region 2012. nMOS double-gate DRAM cell 2000 may be formed utilizing the methods described in FIG. 6A-J of this patent application. For example, the gate stack including gate electrode region 2006 and gate dielectric region 2008 may be designed and electrically biased during write operations to allow tunneling into the p-type channel region 2012. The gate dielectric region 2008 thickness may be thinner than the mean free path for trapping, so that trapping phenomena may be reduced or eliminated.

Persons of ordinary skill in the art will appreciate that the illustrations in FIG. 20 are exemplary only and are not drawn to scale. Such skilled persons will further appreciate that many variations may be possible such as, for example, a pMOS transistor may be used in place of or in complement to nMOS double gate DRAM cell 2000. Moreover, nMOS double gate DRAM cell 2000 may be used such that one gate may be used for refresh operations while the other gate may be used for standard write and read operations. Furthermore, nMOS double-gate DRAM cell 2000 may be formed by method such as described in US patent application 20110121366. Many other modifications within the scope of the illustrated embodiments of the invention described herein will suggest themselves to such skilled persons after reading this specification. Thus the invention is to be limited only by the appended claims.

FIG. 21A illustrates a conventional chip with memory wherein peripheral circuits 2106 may substantially surround memory arrays 2104, and logic circuits or logic regions 2102 may be present on the die. Memory arrays 2104 may need to be organized to have long bit-lines and word-lines so that peripheral circuits 2106 may be small and the chip's array efficiency may be high. Due to the long bit-lines and word-lines, the energy and time needed for refresh operations may often be unacceptably high.

FIG. 21B illustrates an embodiment of the invention wherein peripheral circuits may be stacked monolithically above or below memory arrays using techniques described in patent application 2011/0121366, such as, for example, monolithic 3D stacking of memory and logic layers. Memory array stack 2122 may include memory array layer 2108 which may be monolithically stacked above peripheral circuit layer 2110. Memory array stack 2124 may include peripheral circuits 2112 which may be monolithically stacked above memory array layer 2114. Memory array stack 2122 and Memory array stack 2124 may have shorter bit-lines and word-lines than the configuration shown in FIG. 21A since reducing memory array size may not increase die size appreciably (since peripheral circuits may be located underneath the memory arrays). This may allow reduction in the time and energy needed for refresh.

Figure 21C:
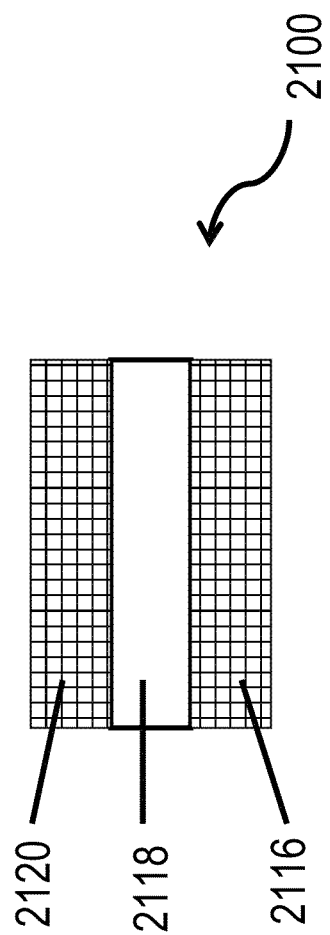
FIG. 21C is an exemplary drawing illustration of peripheral circuits may be monolithically stacked above and below memory arrays.

FIG. 21C illustrates an embodiment of the invention wherein peripheral circuits may be monolithically stacked above and below memory array layer 2118 using techniques described in US patent application 2011/0121366, such as, for example, monolithic 3D stacking of memory and logic layers including vertical connections. 3D IC stack 2100 may include peripheral circuit layer 2120, peripheral circuit layer 2116, and memory array layer 2118. Memory array layer 2118 may be monolithically stacked on top of peripheral circuit layer 2116 and then peripheral circuit layer 2120 may then be monolithically stacked on top of memory array layer 2118. This configuration may have shorter bit-lines and word-lines than the configuration shown in FIG. 21A and may allow shorter bit-lines and word-lines than the configuration shown in FIG. 21B. 3D IC stack 2100 may allow reduction in the time and energy needed for refresh. A transferred monocrystalline layer, such as, for example, memory array layer 2118 and peripheral circuit layer 2120, may have a thickness of less than about 150 nm.

Persons of ordinary skill in the art will appreciate that the illustrations in FIGS. 21A through 21C are exemplary only and are not drawn to scale. Such skilled persons will further appreciate that many variations may be possible such as, for example, 3D IC stack may include, for example, two memory layers as well as two logic layers. Many other modifications within the scope of the illustrated embodiments of the invention described herein will suggest themselves to such skilled persons after reading this specification. Thus the invention is to be limited only by the appended claims.

Figure 22:
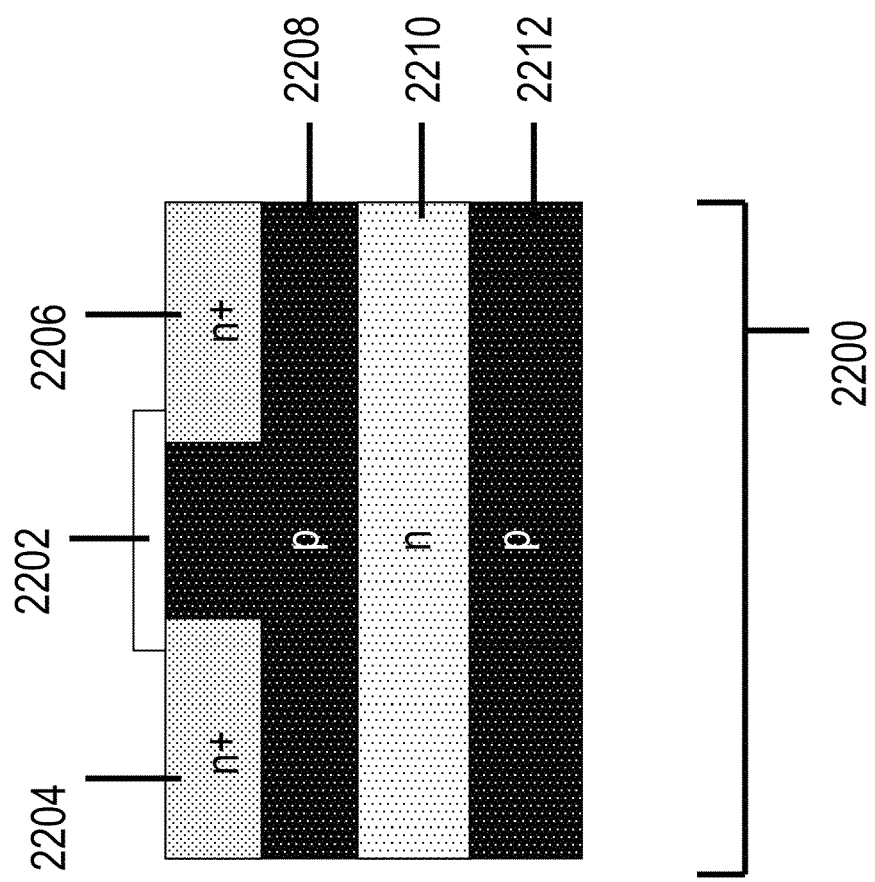
FIG. 22 is an exemplary drawing illustration of a Bipolar Junction Transistor.

FIG. 22 illustrates the cross-section of a floating body with embedded n layer NMOSFET 2200 with n+ source region 2204, n+ drain region 2206, p-well body 2208, gate metal and gate dielectric stack 2202, n layer 2210, and p substrate 2212. The n+ source region 2204, n+ drain region 2206, and p-well body 2208 may be of typical NMOSFET doping. As an embodiment of the invention, n layer 2210 may be formed by dopant ion implantation and dopant activation or by layer transfer below the p-well body 2208 of the floating body NMOSFET. Thus an NPN Bipolar Junction Transistor (BJT), referred hereafter as the embedded BJT, may be formed using the n+ source region 22014 as the emitter, the p-well body 2208 (floating) as the base, and the underlying n layer 2210 as the collector.

Figure 23B:
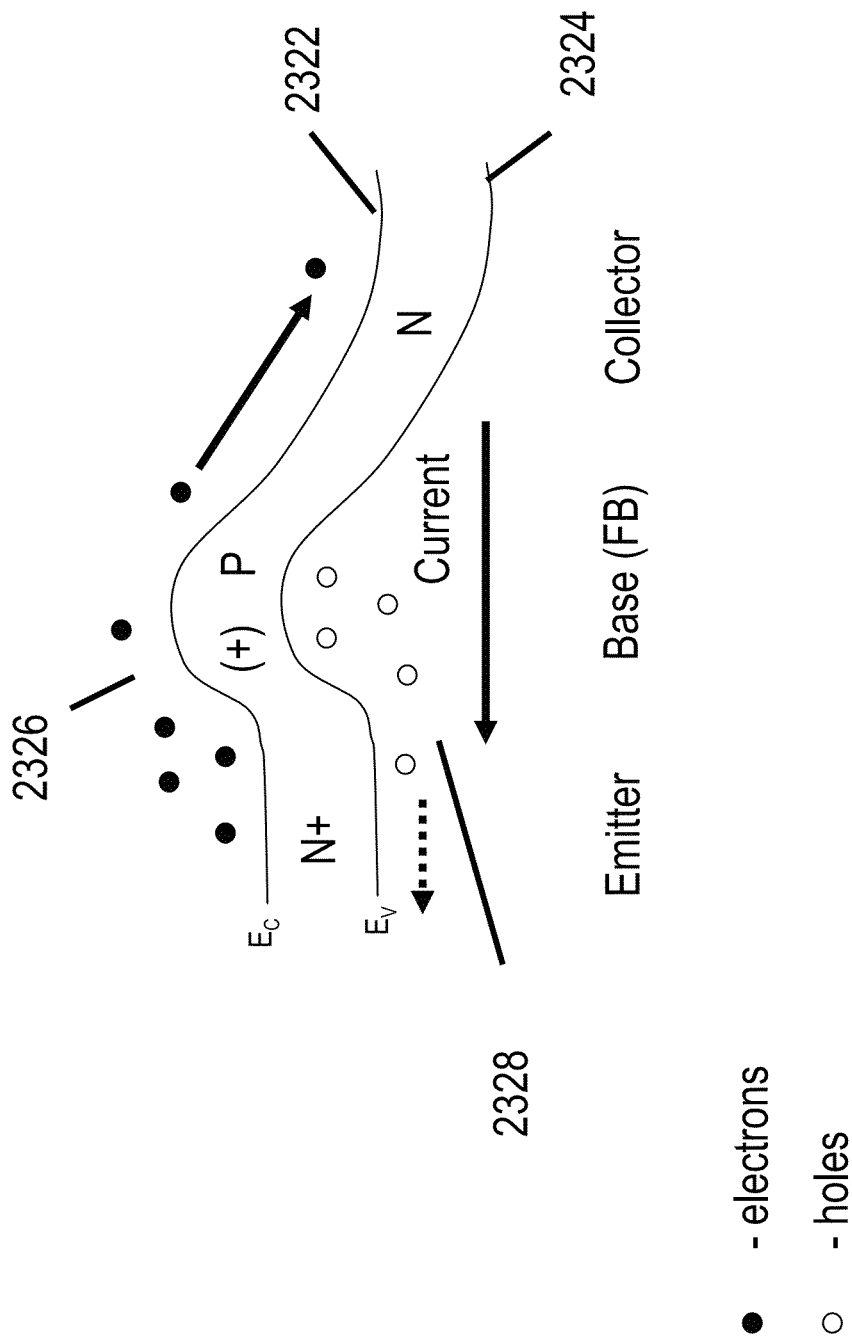
Figure 23C:
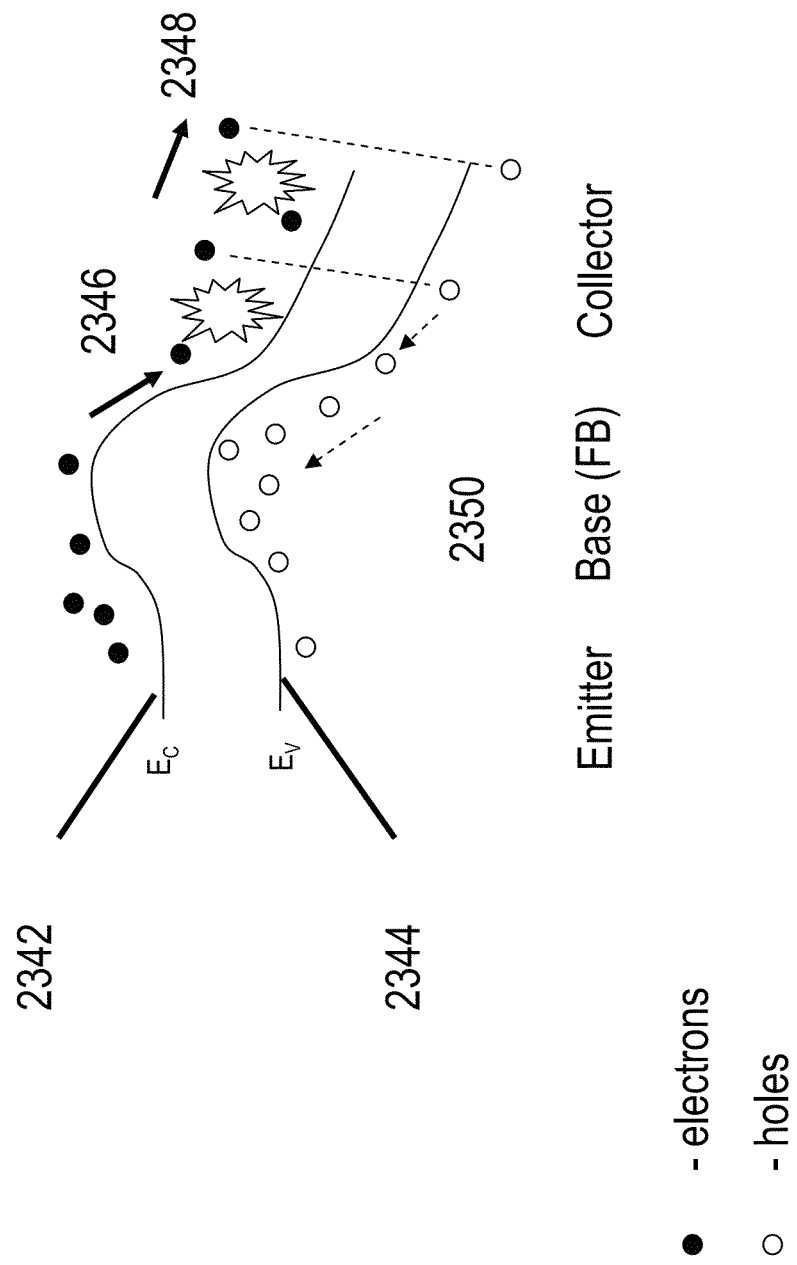

FIGS. 23A-C illustrate the behavior of the embedded BJT during the floating body operation, programming, and erase. The horizontal direction may indicate position within the transistor and the vertical direction may indicate the energy level of the electrons and holes and energy bands. "Emitter" in FIG. 23A-C may represent n+ source region 2204, "Base (FB)" in FIG. 23A-C may represent p-well body 2208 (floating), and "Collector" in FIG. 23A-C may represent n layer region 2210.

FIG. 23A illustrates the electronic band diagram of the embedded BJT when there may be only a small concentration of holes in the p-well body 2208. The conduction band 2302, valence band 2304, electrons 2306, and holes in p-well body 2308 are shown under this condition where there may be low hole concentration in the p-well body 2308, and the embedded BJT may remain turned off, with no current flowing through the BJT, regardless of collector bias.

FIG. 23B illustrates the electronic band diagram of the embedded BJT when there may be a significant concentration of holes in the p base region that may be enough to turn on the p-n diode formed by the p-well body 2308 and the emitter n+ source region 2304. The conduction band 2322, valence band 2324, electrons 2326, and holes 2328 are shown under this condition where there may be significant concentration of holes in the p-well body 2308, and the embedded BJT may turn on. The p-base region potential may allow electrons to flow from the emitter to the base, and the holes to flow from the base to the emitter. The electrons that arrive at the base and do not recombine may continue on to the collector and may then be swept towards the collector terminal by the collector reverse bias.

FIG. 23C illustrates the BJT band diagram with the impact ionization process 2346 which may create electron-hole pairs in the collector region given high enough collector bias to generate a field of at least approximately 1E6 V/cm in the said region. The BJT band diagram includes conduction band 2342, valence band 2344. The newly generated electrons flow in the direction of the collector terminal 2348, together with the original electrons, while the newly generated holes flow in the opposite direction towards the base/floating body 2350. This flow of holes into the base/floating body region acts to refresh the floating body such that they add to the hole population in the base/floating body 2350. Henceforth, this refresh scheme may be referred to as the "embedded BJT floating body refresh scheme".

In order to give favorable conditions for impact ionization to occur in the collector region, it may be desired to keep the BJT gain $\beta=I_C/I_B$ as high as possible. Thus, the p-base/p-well body 2208 among the two n regions n+ source region 2204 and n+ drain region 2206 may be designed to be about 50 nm or thinner, and the p base/p-well body 2208 and collector n layer 2210 may be highly doped with a value greater than approximately $1E18/cm^3$ for providing a high electric field favorable to the impact ionization process.

Moreover, a heterostructure bipolar transistor (HBT) may be utilized in the floating body structure by using silicon for the emitter region material, such as n+ source region 2204 in FIG. 22, and SiGe for the base and collector regions, such as p-well body 2208 and the underlying n layer 2210 respectively, as shown in FIG. 22, thus giving a higher beta than a regular BJT.

Figure 24:
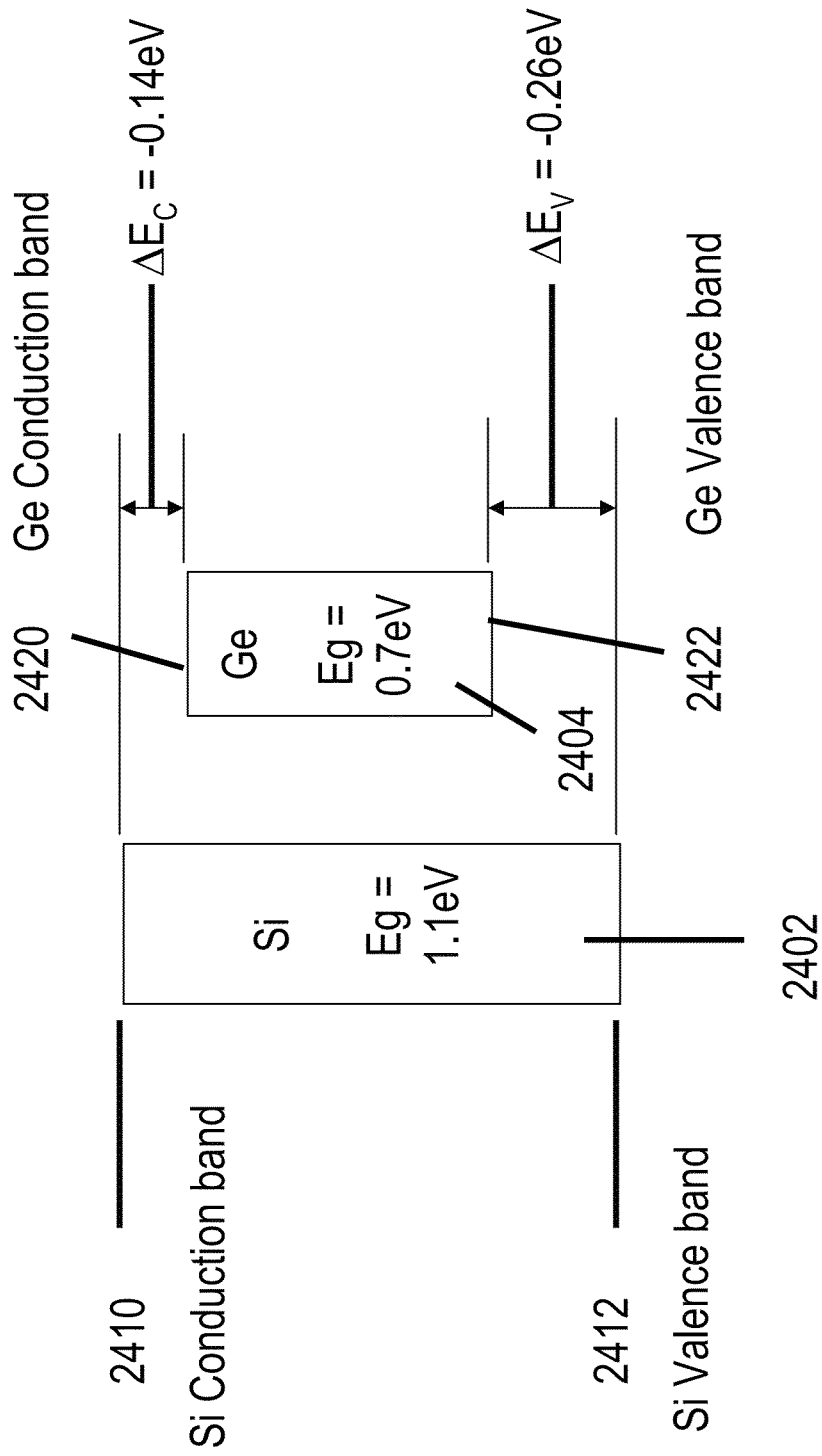
FIG. 24 is an exemplary drawing illustration of energy band alignments.

FIG. 24 illustrates the energy band alignments of Silicon 2402 with bandgap of 1.1 eV, Si conduction band 2410, Si valence band 2412, and Germanium 2404 with bandgap of 0.7 eV, Ge conduction band 2420, Ge valence band 2422. The offset between the Si conduction band 2410 and the Ge conduction band 2420 may be −0.14 eV, and the offset between the Si Si valence band 2412 and the Ge valence band 2422 may be −0.26 eV. Persons of ordinary skill in the art will recognize that SiGe will have band offsets in its conduction and valence bands in linear proportion to the molar ratio of its Silicon and Germanium components. Thus, the HBT will have most of its band alignment offset in the valence band, thereby providing favorable conditions in terms of a valence band potential well for collecting and retaining holes.

Figure 25A:
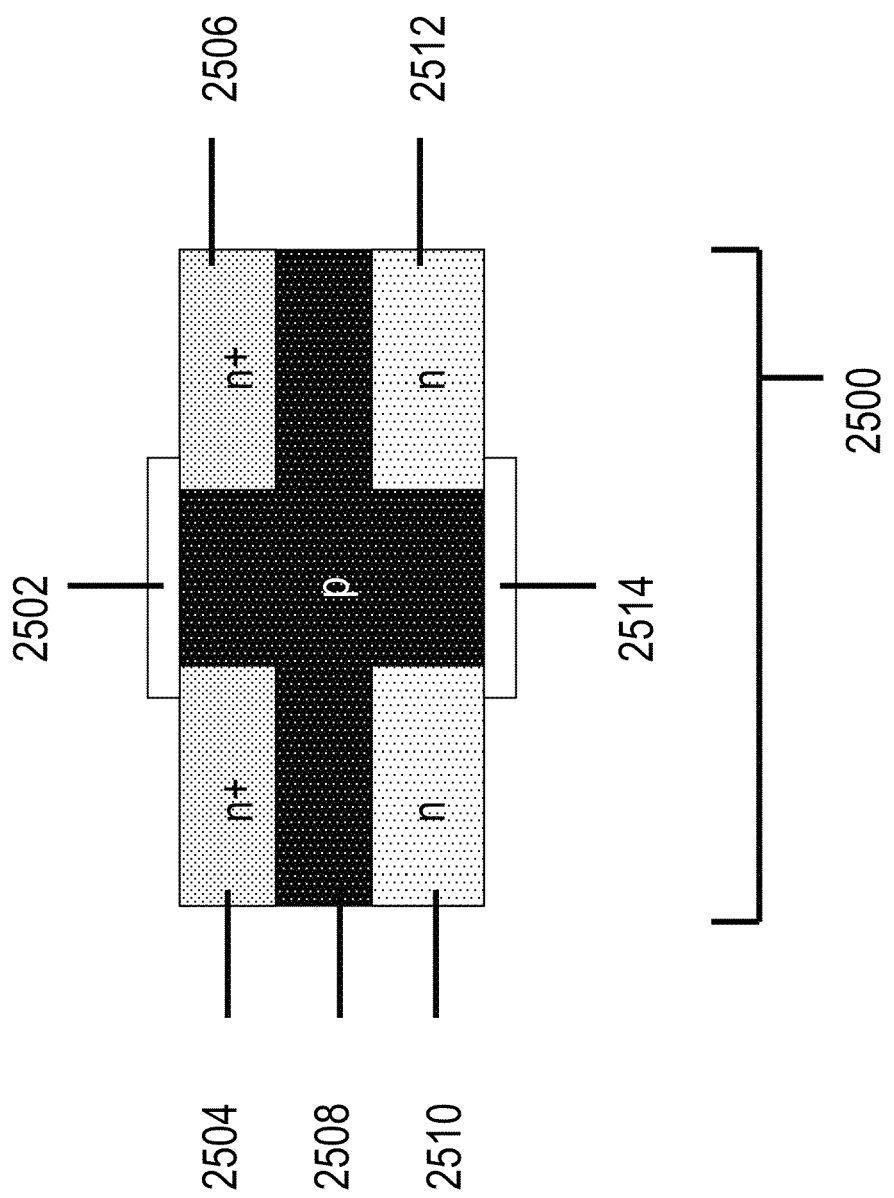
FIG. 25A-B is an exemplary drawing illustration of a double-gated floating body NMOSFET.

Double-Gated Floating Body:

FIG. 25A illustrates the cross-section of a floating body NMOSFET 2500 with top gate metal and dielectric stack 2502 and bottom gate metal and dielectric stack 2514, source/emitter n+ region 2504, n+ drain region 2506, p floating body 2508, n collector region 2510, and second n collector region 2512.

As an embodiment of the invention, n collector region 2510 and second n collector region 2512 may be formed by dopant ion implantation and dopant activation, using the same mask (self-aligned) as for the source region 2504 and drain region 2506, but with higher implant energies.

The embedded BJT structure formed by source/emitter n+ region 2504, p floating body 2508, n collector region 2510 can be used for the embedded BJT floating body refreshing scheme as discussed above. The bottom gate metal and dielectric stack 2514 may be biased with a negative voltage to increase hole retention. The second n collector region 2512 may be utilized to further optimize hole generation, by acting together with n+ drain region 2506 and p floating body 2508 as another BJT substructure utilizing the embedded BJT floating body refresh scheme above. The bottom gate metal and dielectric stack 2514 can be used with the bottom MOSFET structure, including n collector region 2510, p floating body 2508, second n collector region 2512, and bottom gate and dielectric stack 2514, for hole generation.

Figure 25B:
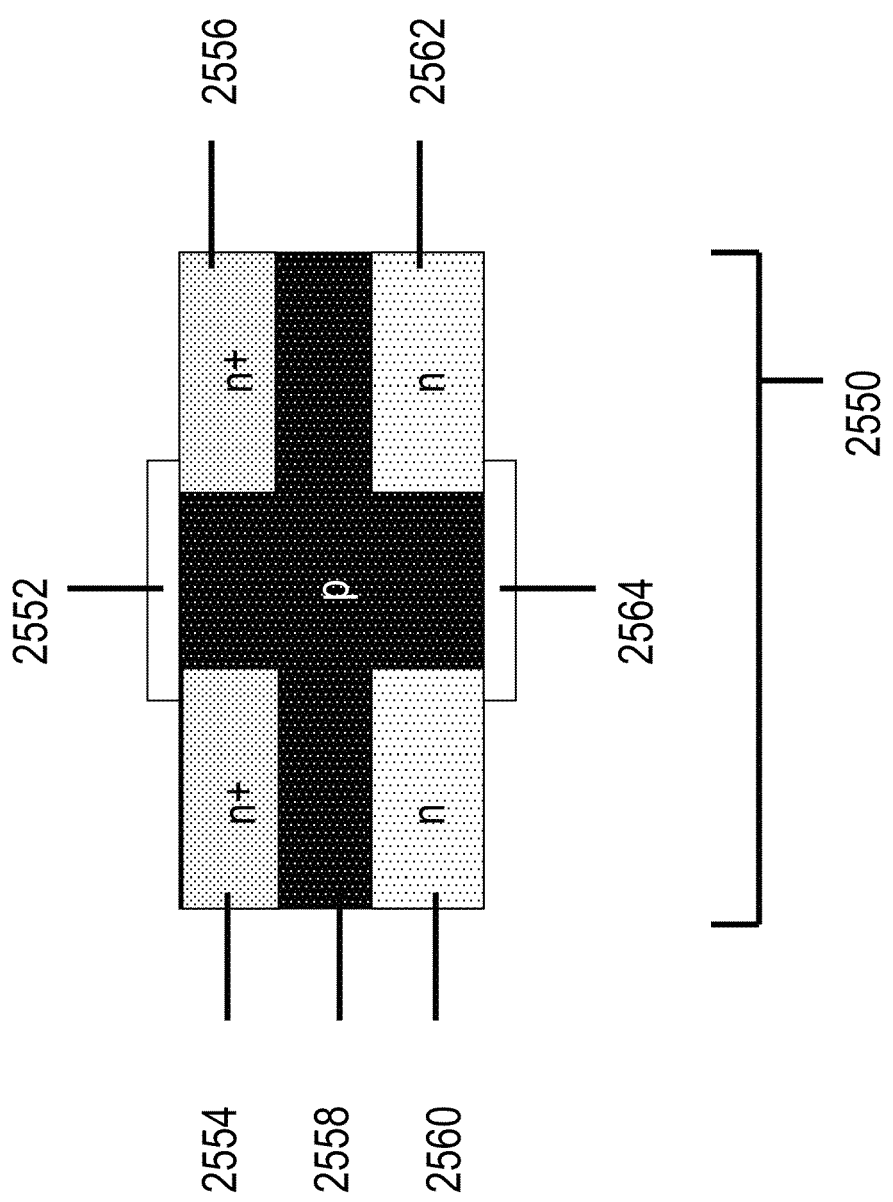

FIG. 25B illustrates the top view of an embodiment of the invention, the device 2550 including gate metal and dielectric stack 2552 formed on a side of the p floating body 2558, and second gate metal and dielectric stack 2564 formed on the opposite side of the p floating body 2558, source/emitter n+ region 2554, n+ drain region 2556, n collector region 2560, and second n collector region 2562.

The source/emitter n+ region 2554, n+ drain region 2556, n collector region 2560, and second n collector region 2562 may be formed via dopant ion implantation and dopant activation with the geometry defined using a lithographic mask.

The embedded BJT structure formed by source/emitter n+ region 2554, p floating body 2558, n collector region 2560 may be used for the embedded BJT floating body refresh scheme as discussed above. The second gate metal and dielectric stack 2564 may be biased with a negative voltage to increase hole retention. The second n collector region 2562 may be utilized to further optimize hole generation, by acting together with n+ drain region 2556 and p floating body 2558 as another BJT substructure utilizing the embedded BJT floating body refresh scheme above. The second gate metal and dielectric stack 2564 may be used with the second MOSFET substructure, which may include n collector region 2560, p floating body 2558, second n collector region 2562, and second gate and dielectric stack 2564, for hole generation.

Figure 26:
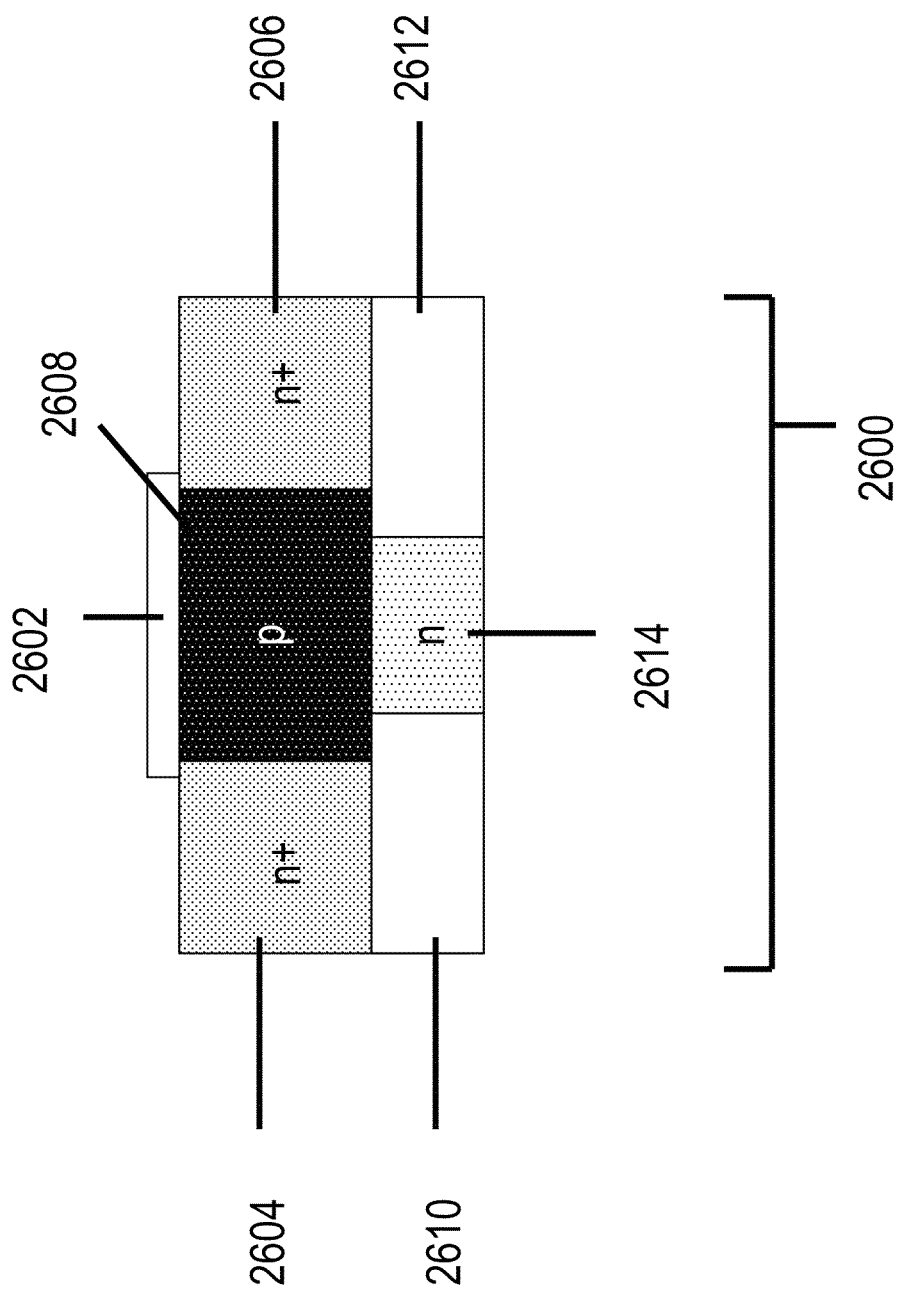
FIG. 26 is an exemplary drawing illustration of FinFET floating body structure.

FinFET Floating Body:

FIG. 26 illustrates the cross-section of a FinFET floating body structure 2600 with surrounding gate dielectrics 2602 on three sides of the channel (only the top gate stack is shown), n+ source region 2604, n+ drain region 2606, p floating body 2608, and n collector region 2614 on the bottom side of the floating body 2608 insulated from the source and drain regions by oxide regions 2610 and 2612. A spacer patterning technology using a sacrificial layer and a chemical vapor deposition spacer layer developed by Y-K Choi et al (IEEE TED vol. 49 no. 3 2002) may be used to pattern the Silicon fin for the FinFET. As an embodiment of the invention, n collector region 2614 may be formed by dopant ion implantation and dopant activation, and oxide regions 2610 and 2612 may be formed by ion implantation of oxygen which, upon thermal anneal, may react with silicon to form the oxide.

The embedded BJT structure formed by n+ source region 2604 as emitter, p floating body 2608 as base, n collector region 2614 may be used for the embedded BJT floating body refresh scheme as discussed above.

Figure 27:
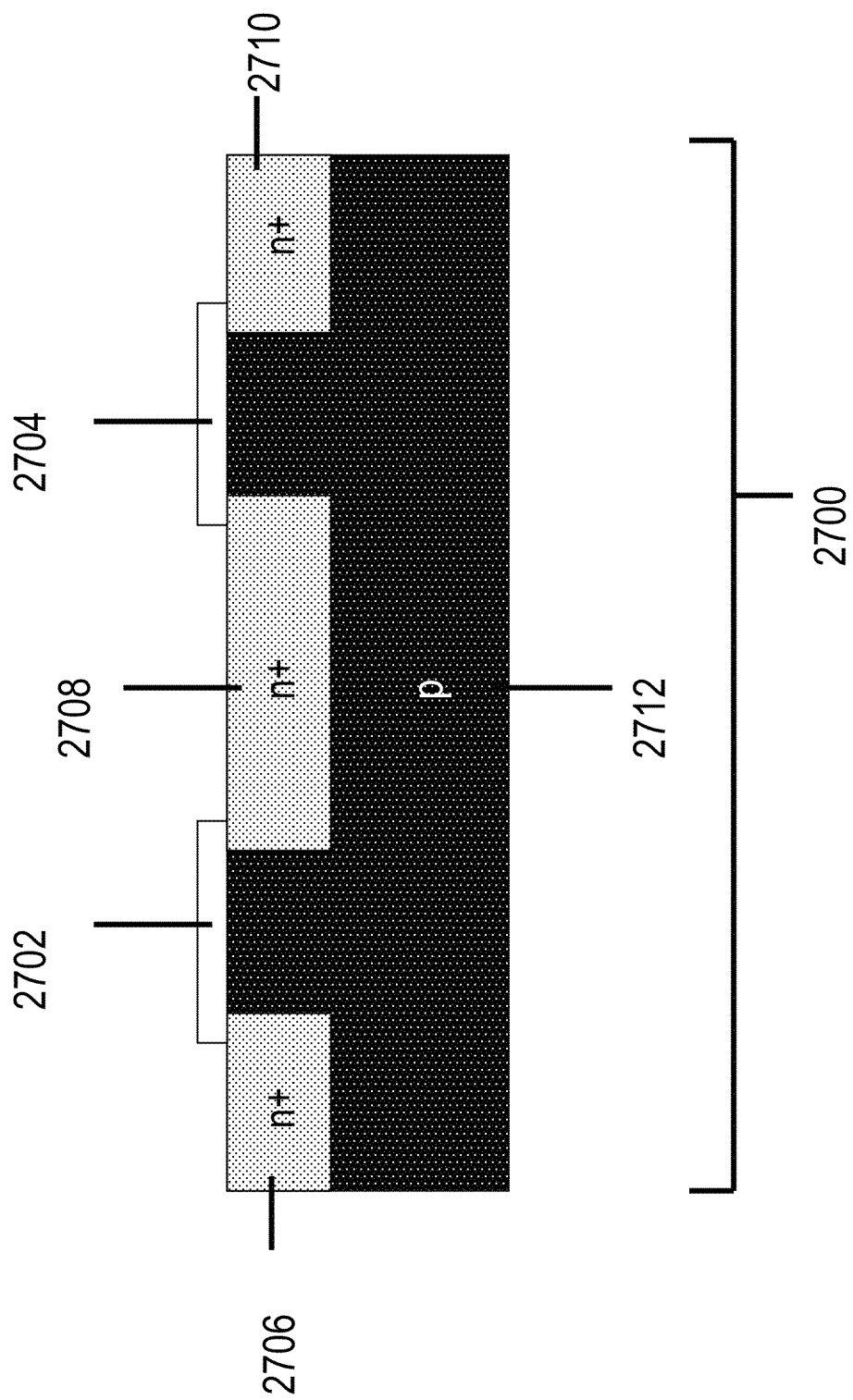
FIG. 27 is an exemplary drawing illustration of back-to-back two-transistor floating body structure.

Back-to-Back Transistor Structure:

FIG. 27 illustrates a back-to-back two-transistor configuration 2700 where n+ drain region 2706, n+ source/emitter region 2708, p floating body region 2712 and gate metal and dielectric stack 2702 may form a NMOSFET transistor used for the reading and programming p floating body region 2712 N+ source/emitter region 2708 as emitter, p floating body region 2712 as base, and n+ collector region 2710 may form a BJT transistor which may be used for the embedded BJT floating body refreshing scheme described above. The dummy gate and dielectric stack 2704 may remain unbiased, and the source/emitter region 2708 may be tied to ground during device operation. Using a conventional CMOS planar 2D flow, n+ drain region 2706, n+ source/emitter region 2708, and n+ collector region 2710 may be formed by a self-aligned to gate dopant ion implantation and thermal anneal, and the gate dielectrics of gate metal and dielectric stack 2702 and dummy gate metal and dielectric stack 2704 may be formed by oxide growth and/or deposition.

Figure 28:
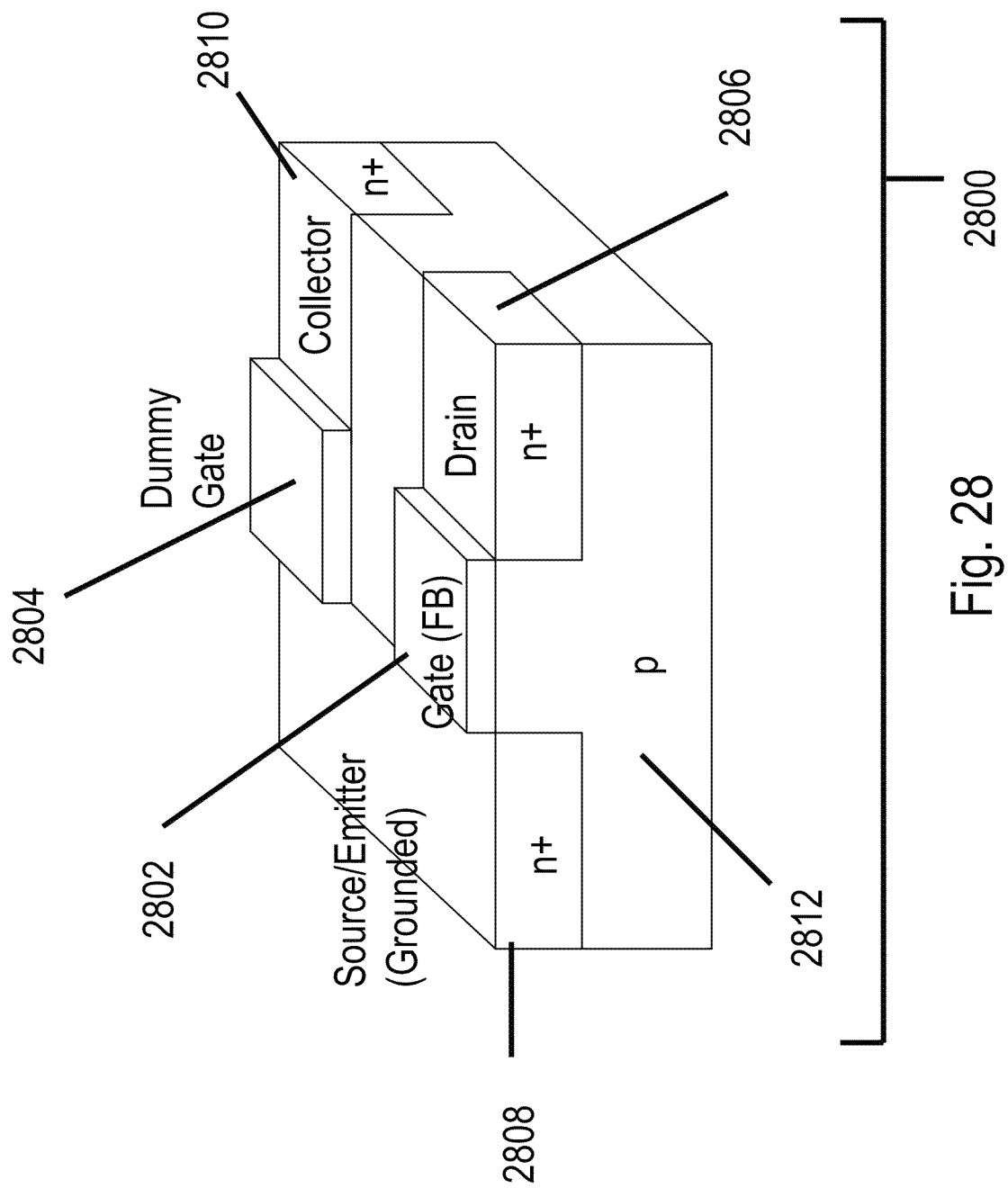
FIG. 28 is an exemplary drawing illustration of a side-to-side two-transistor floating body structure.

Side-to-Side Transistor Structure:

FIG. 28 illustrates a side-to-side two-transistor configuration 2800 where n+ drain region 2806, n+ source/emitter region 2808, p floating body region 2812 and gate metal and dielectric stack 2802 may form a NMOSFET transistor used for the reading and programming of the p floating body region 2812. N+ source/emitter region 2808 as emitter, p floating body region 2812 as base, and n+ collector 2810 may form a BJT transistor which may be used for the embedded BJT floating body refreshing scheme described above. The dummy gate and dielectric stack 2804 may remain unbiased, and the source/emitter region 2808 may be tied to ground during device operation. Using a conventional CMOS planar 2D flow, n+ drain region 2806, n+ source/emitter region 2808, and n+ collector region 2810 may be formed by a self-aligned to gate dopant ion implantation and thermal anneal, and the gate dielectrics of gate metal and dielectric stack 2802 and dummy gate metal and dielectric stack 2804 may be formed by oxide growth and/or deposition.

Persons of ordinary skill in the art will appreciate that the illustrations in FIGS. 22 through 28 are exemplary only and are not drawn to scale. Such skilled persons will further appreciate that many variations may be possible such as, for example, a PNP embedded BJT may be constructed by constructing p type regions in the place of the n type regions shown, and n type regions in the place of the p regions shown. Additionally, n layer 2210 may be a formed region. Moreover, n+ source region 2204, n+ drain region 2206, and p-well body 2208 doping concentrations may be factors of about 10 and 100 different than above. Further, gate metal and dielectric stacks, such as gate metal and dielectric stack 2802, may be formed with Hi-k oxides, such as, for example, hafnium oxides, and gate metals, such as, for example, TiAlN. Many other modifications within the scope of the invention described herein will suggest themselves to such skilled persons after reading this specification. Thus the invention is to be limited only by the appended claims.

Continuous Array Approaches:

In general, logic devices may need varying amounts of logic, memory, and I/O, and memory devices, such as, for example, floating body DRAM, may need varying amounts of I/O, logic, and controller circuits. The continuous array ("CA") of U.S. Pat. No. 7,105,871 allows flexible definition of the logic device size, yet for any size the ratio among the three components remained fixed, barring minor boundary effect variations. Further, there exist other types of specialized logic that may be difficult to implement effectively using standard logic such as DRAM, Flash memory, DSP blocks, processors, analog functions, or specialized I/O functions such as SerDes. The continuous array of prior art does not provide an effective solution for these specialized yet not common enough functions that would justify their regular insertion into CA wafer.

Some embodiments of the invention enable a different and more flexible approach. Additionally the prior art proposal for continuous array were primarily oriented toward Gate Array and Structured ASIC where the customization includes some custom masks. In contrast, the some embodiments of the invention propose an approach which could fit well with memory and logic including embodiments without any custom masks. Instead of adding a broad variety of such blocks into the CA which would make it generally area-inefficient, and instead of using a range of CA types with different block mixes which would require large number of expensive mask sets, some embodiments of the current allow using Through Silicon Via or monolithic 3DIC approaches to enable a new type of configurable system.

The technology of "Package of integrated circuits and vertical integration" has been described in U.S. Pat. No. 6,322,903 issued to Oleg Siniaguine and Sergey. Accordingly, an embodiment of the invention suggests the use of CA tiles, each made of one type, or of very few types, of elements. The target system may then be constructed using desired number of tiles of desired type stacked on top of each other and electrically connected with TSVs or monolithic 3D approaches, thus, a 3D Configurable System may result.

Figure 29A:
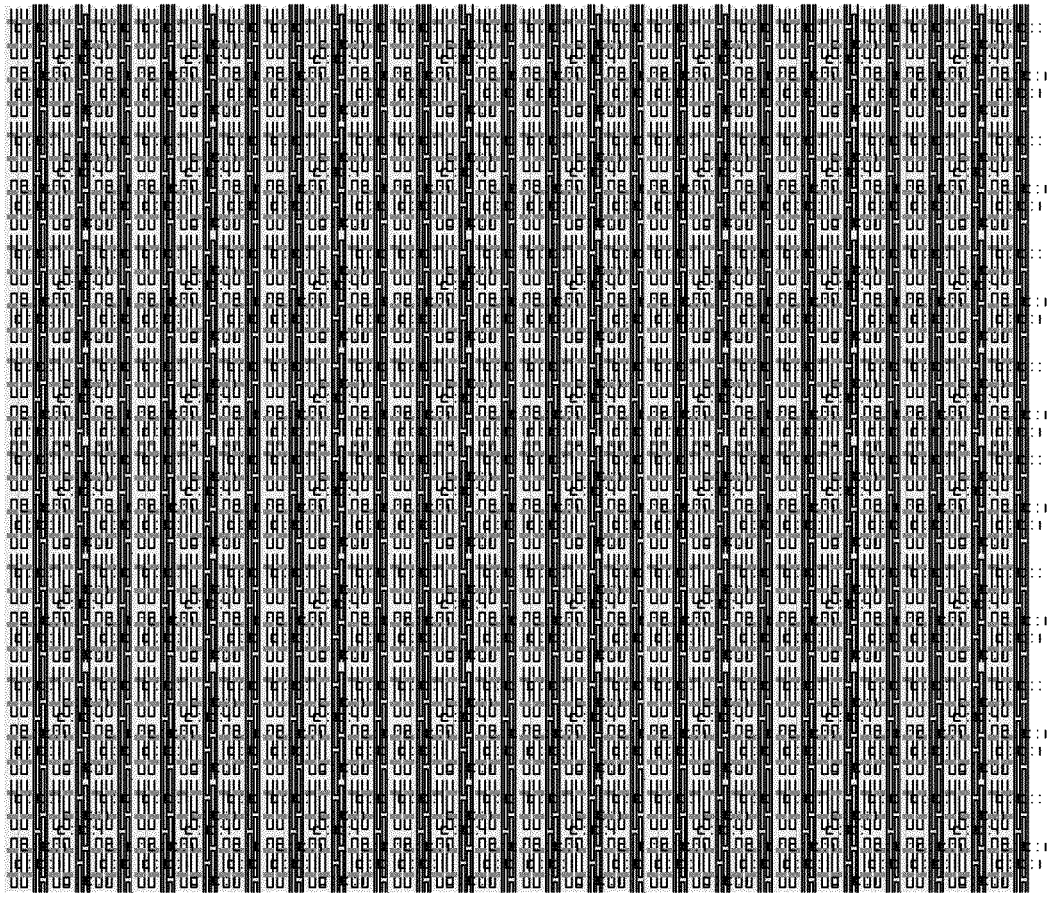
FIG. 29A is an exemplary drawing illustration of a reticle of a repeatable device structure.
Figure 29B:
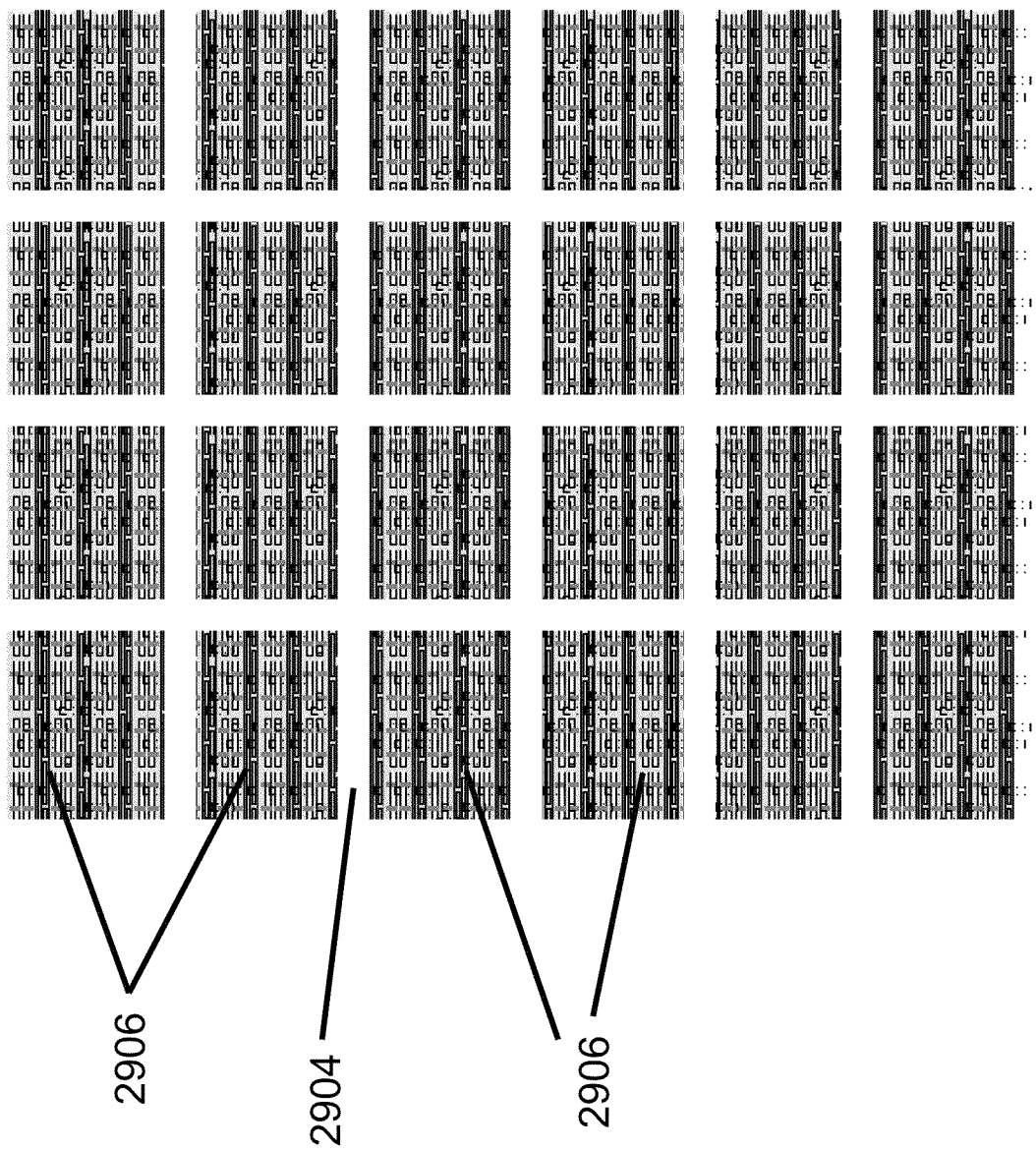
FIG. 29B is an exemplary drawing illustration of the application of a dicing line mask to a continuous array.

FIG. 29A illustrates an embodiment of the invention wherein a continuous array of, for example, floating-body RAM cells or logic cells, may fill a full reticle sized area 2903 with floating-body DRAM memory cells as described above or with the exemplary 8×12 array 8402 pattern of FIG. 84A of US patent application 2011/0121366 respectively. Reticle sized area 2903, such as shown by FIG. 29A, may then be repeated across the entire wafer to form a wafer-sized continuous array of device structures (not shown). One or more custom lithographic and etch steps may be utilized to define custom dice lines within the wafer-sized continuous array of device structures, which may also be called a generic wafer. Accordingly a specific custom device may be diced from the previously generic wafer. The custom dice lines may be created by etching away some of the structures such as transistors of the continuous array or floating body DRAM as illustrated in FIG. 29B. This custom function etching may have a shape of multiple thin strips 2904 created by a custom mask, such as a dicing line mask, to etch away a portion of the devices. Thus custom forming logic or memory function, blocks, arrays, or devices 2906 (for clarity, not all possible blocks are labeled). A portion of these logic functions, blocks, arrays, or devices 2906 may be interconnected horizontally with metallization and may be electrically connected with vertical connections to circuitry above and below using TSV or utilizing the monolithic 3D variation, including, for example, some of the embodiments in this document and US patent application 2011/0121366. The invention may allow the use of a generic continuous array and then a customization process may be applied to construct multiple device sizes out of the same mask set. Therefore, for example, a continuous array as illustrated in FIG. 29A may be customized to a specific device size by etching the multiple thin strips 2904 as illustrated in FIG. 29B. Accordingly, wafers may be processed using one generic mask set of more than ten masks and then multiple device offerings may be constructed by a few custom function masks which may define specific sizes out of the generic continues array structure. And, accordingly, the wafer may then be diced to different device sizes for each device offering.

The concept of customizing a Continuous Array can be applied to logic, memory, I/O and other structures. Memory arrays have non-repetitive elements such as bit and word decoders, or sense amplifiers, which may need to be tailored to each memory size. An embodiment of the invention is to tile substantially the entire wafer with a dense pattern of memory cells, and then customize it using selective etching as before (custom function etching), and providing the required non-repetitive structures through an adjacent logic layer below or above the memory layer.

Figure 30A:
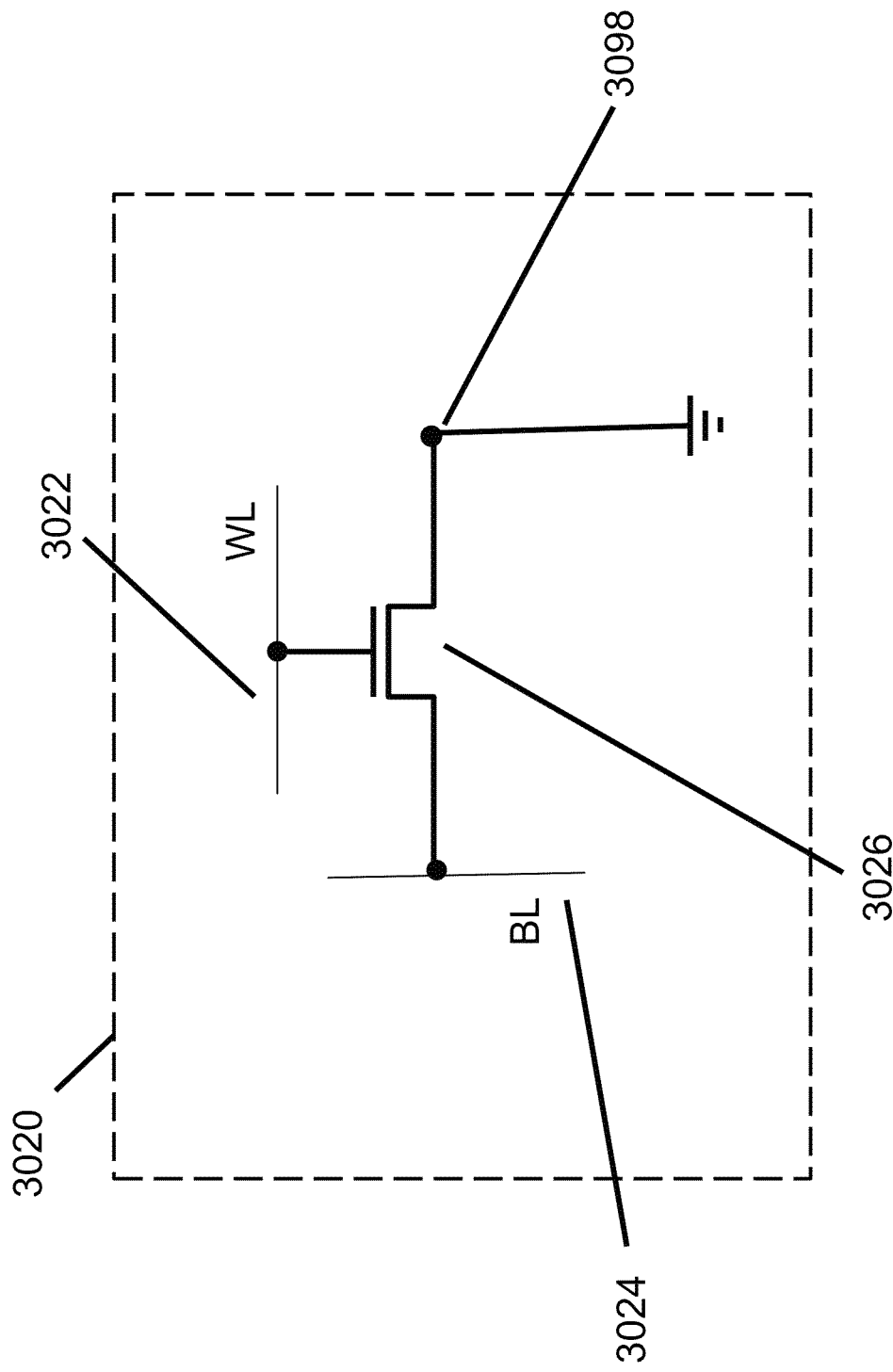
FIG. 30A is an exemplary drawing illustration of a floating-body memory cell suitable for use in a continuous array memory.

FIG. 30A is a drawing illustration of an exemplary floating-body DRAM cell 3020, with its word line 3022, bit line 3024, and transistor 3026. Such a bit cell may be typically densely packed and highly optimized for a given process. While terminal 3098 is shown to be connected to a "ground" voltage in FIG. 30A, one familiar with the art will recognize that it may be given a specific non-zero voltage as well.

Figure 30B:
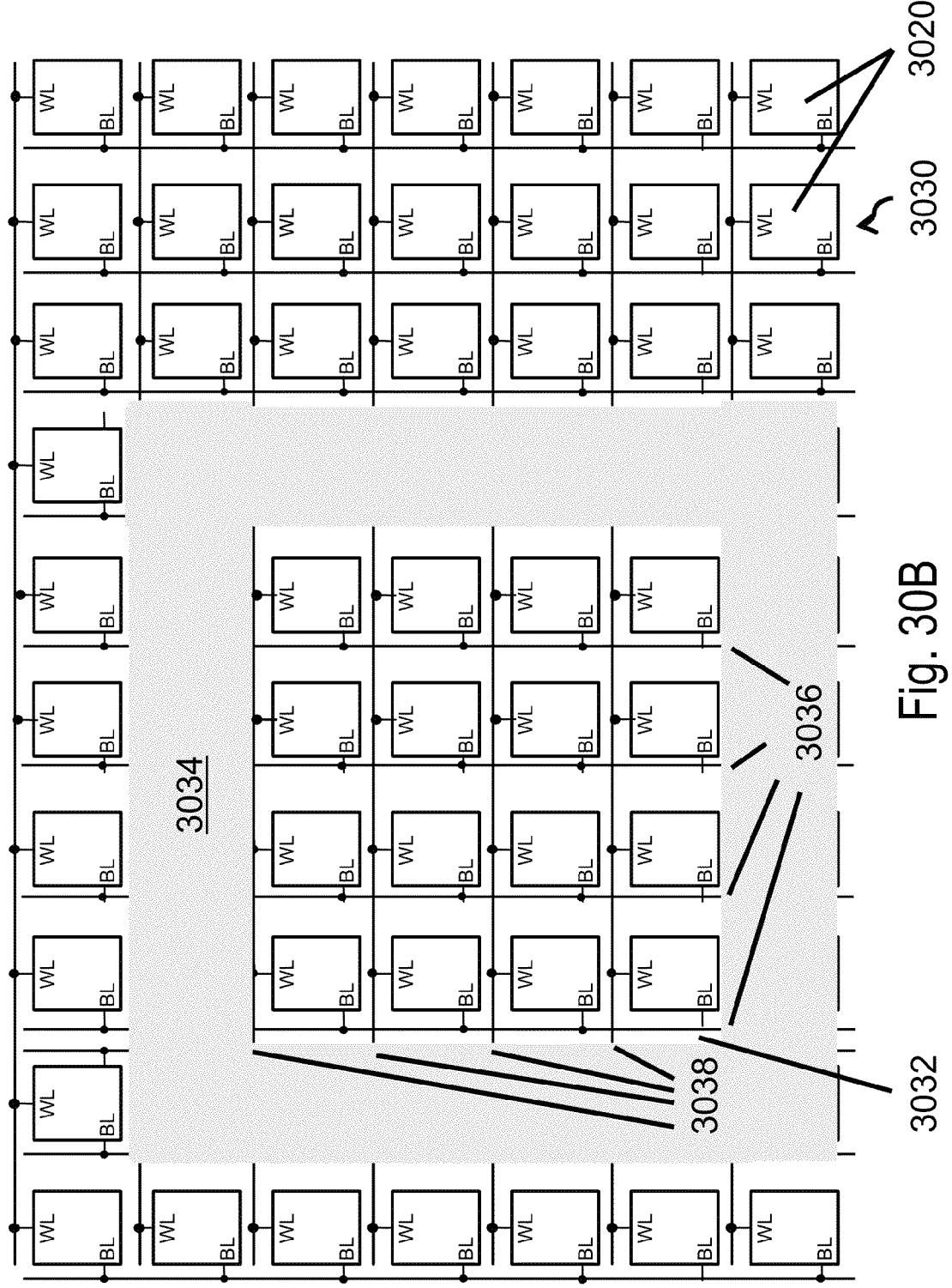
FIG. 30B is an exemplary drawing illustration of a continuous array of the memory cells of FIG. 30A with an etching pattern defining an exemplary 4×4 array.

A dense floating-body DRAM array 3030 (an exemplary memory region) may be constructed of a plurality of floating-body DRAM cells 3020 as illustrated in FIG. 30B. For example, a four by four array 3032 may be defined through custom etching away the cells in channel 3034, leaving bit lines 3036 and word lines 3038 unconnected. These word lines 3038 may be then electrically connected to an adjacent logic layer below or above that may have a word decoder (not shown). Similarly, the bit lines 3036 may be driven by another decoder such as bit line decoder (not shown). Connections may be made to other circuits such as sense amplifiers. A feature of this approach may be that the customized logic, such as word decoders, bit line decoders, and sense amplifiers, may be provided from below or above in close vertical proximity to the area where it may be needed, thus assuring high performance customized memory blocks.

Persons of ordinary skill in the art will appreciate that the illustrations in FIGS. 29 through 30 are exemplary only and are not drawn to scale. Such skilled persons will further appreciate that many variations may be possible such as, for example, the CA concept may include pre-defined scribe-lines, such as described in a US patent application 2011/0121366 FIG. 84. Moreover, memory architectures in addition to floating-body RAM, such as, for example, RRAM, SRAM, and conductive bridge, may utilize the continuous array concept and 3D IC application. Moreover, dense floating-body DRAM array 3030 may be a substantially wafer-sized CA or may less than a wafer-sized CA. Many other modifications within the scope of the invention described herein will suggest themselves to such skilled persons after reading this specification. Thus the invention is to be limited only by the appended claims.

As illustrated in FIG. 31A, the custom dicing line mask referred to in the FIG. 29B discussion to create multiple thin strips 2904 for etching may be shaped to create chamfered block corners 3102 of custom blocks 3104 to relieve stress. Custom blocks 3104 may include functions, blocks, arrays, or devices of architectures such as logic, FPGA, I/O, or memory.

As illustrated in FIG. 31B, this custom function etching and chamfering may extend thru the BEOL metallization of one device layer of the 3DIC stack as shown in first structure 3150, or extend thru the entire 3DIC stack to the bottom substrate and shown in second structure 3170, or truncate at the isolation of any device layer in the 3D stack as shown in third structure 3160. The cross sectional view of an exemplary 3DIC stack may include second layer BEOL dielectric 3126, second layer interconnect metallization 3124, second layer transistor layer 3122, substrate layer BEOL dielectric 3116, substrate layer interconnect metallization 3114, substrate transistor layer 3112, and substrate 3110.

Passivation of the edge created by the custom function etching may be accomplished as follows. If the custom function etched edge is formed on a layer or strata that is not the topmost one, then it may be passivated or sealed by filling the etched out area with dielectric, such as a Spin-On-Glass (SOG) method, and CMPing flat to continue to the next 3DIC layer transfer or TSV bonding. As illustrated in FIG. 31C, the topmost layer custom function etched edge may be passivated with an overlapping layer or layers of material including, for example, oxide, nitride, or polyimide. Oxide may be deposited over custom function etched block edge 3180 and may be lithographically defined and etched to overlap the custom function etched block edge 3180 shown as oxide structure 3184. Silicon nitride may be deposited over wafer and oxide structure 3184, and may be lithographically defined and etched to overlap the custom function etched block edge 3180 and oxide structure 3184, shown as nitride structure 3186.

In such way a single expensive mask set can be used to build wafers for different memory sizes and finished through another mask set that may be used to build logic wafers that can be customized by a few metal layers.

Persons skilled in the art will recognize that it is now possible to assemble a true monolithic 3D stack of mono-crystalline silicon layers or strata with high performance devices using advanced lithography that repeatedly reuse same masks, with only few custom metal masks for each device layer. Such person will also appreciate that one can stack in the same way a mix of disparate layers, some carrying transistor array for general logic and other carrying larger scale blocks such as memories, analog elements, Field Programmable Gate Array (FPGA), and I/O. Moreover, such a person would also appreciate that the custom function formation by etching may be accomplished with masking and etching processes such as, for example, a hard-mask and Reactive Ion Etching (RIE), or wet chemical etching, or plasma etching. Furthermore, the passivation or sealing of the custom function etching edge may be stair stepped so to enable improved sidewall coverage of the overlapping layers of passivation material to seal the edge.

It will also be appreciated by persons of ordinary skill in the art that the invention is not limited to what has been particularly shown and described hereinabove. Rather, the scope of the embodiments of the invention includes both combinations and sub-combinations of the various features described herein above as well as modifications and variations which would occur to such skilled persons upon reading the foregoing description. Thus the invention is to be limited only by the appended claims.

What is claimed is:

1. A semiconductor device, comprising:
   a first semiconductor layer comprising first transistors,
      wherein said first transistors are interconnected by at least one metal layer comprising aluminum or copper; and
   a second mono-crystallized semiconductor layer comprising second transistors and overlaying said at least one metal layer,
      wherein said at least one metal layer is in-between said first semiconductor layer and said second mono-crystallized semiconductor layer,
      wherein said second mono-crystallized semiconductor layer is less than 100 nm in thickness, and
      wherein said second transistors comprise horizontally oriented transistors.

2. A semiconductor device according to claim 1, further comprising:

a plurality of connection paths between said second transistors and said first transistors,
wherein said plurality of connection paths comprise vias through said second mono-crystallized semiconductor layer, and
wherein at least one of said vias have a radius of less than 100 nm.

3. A semiconductor device according to claim 1, further comprising:
a plurality of connection paths between said second transistors and said first transistors, and said first semiconductor layer comprising first alignment marks,
wherein at least one of said connection paths has a contact to said second transistors, and
wherein said contact is aligned to one of said first alignment marks.

4. A mobile phone comprising a semiconductor device according to claim 1.

5. A semiconductor device according to claim 1 wherein at least one of said second transistors is one of:
(i) a replacement gate transistor;
(ii) a recessed channel transistor (RCAT);
(iii) a side-gated transistor;
(iv) a junction-less transistor;
(v) a Finfet transistor;
(vi) a double gate transistor; or
(vii) a dopant-segregated Schottky Source Drain Transistor.

6. An integrated device, comprising:
a first monocrystalline layer comprising first transistors;
a first metal layer comprising copper or aluminum and providing connections to said first transistors; and
a second layer comprising monocrystalline material and comprising at least one memory cell constructed above said first metal layer,
wherein said at least one memory cell comprises second transistors,
wherein said second transistors comprise drain and source that are horizontally oriented with respect to said second layer; and
at least one via through said second layer providing connection between at least one of said second transistors and at least one of said first transistors,
wherein said at least one via has a radius of less than 100 nm.

7. An integrated device according to claim 6, further comprising:
a third layer comprising monocrystalline material and comprising memory regions,
wherein said memory regions comprise third transistors, and
wherein at least one of said third transistors substantially overlays one of said second transistors.

8. An integrated device according to claim 6, wherein the decoder logic for selecting said at least one memory cell comprises said first transistors.

9. An integrated device according to claim 6, wherein said at least one memory cell is a DRAM cell utilizing capacitors.

10. An integrated device according to claim 6, wherein said at least one memory cell is a floating body DRAM cell.

11. An integrated device according to claim 6, wherein said at least one memory cell is an SRAM cell.

12. An integrated device according to claim 6, wherein said second layer is less than 100 nm in thickness.

13. A mobile phone comprising a semiconductor device according to claim 6.

14. A semiconductor device according to claim 6, wherein said at least one via is aligned to said first metal layer.

15. An integrated device, comprising:
a semiconductor substrate and at least one metal layer,
wherein said metal layer comprises copper or aluminum; and
an overlying layer comprising monocrystalline material of less than 100 nm thickness comprising memory regions,
wherein said memory regions comprise horizontally oriented transistors.

16. An integrated device according to claim 15 wherein at least one of said horizontally oriented transistors is one of:
(i) a replacement gate transistor;
(ii) a recessed channel transistor (RCAT);
(iii) a side-gated transistor;
(iv) a junction-less transistor;
(v) a Finfet transistor;
(vi) a double gate transistor; or
(vii) a dopant-segregated Schottky Source Drain Transistor.

17. An integrated device according to claim 15, further comprising:
a memory management circuit to extend the proper functionality of said memory regions.

18. An integrated device according to claim 15, further comprising:
a multiplicity of vias through said overlying layer providing connections between said memory regions and said metal layer,
wherein at least one of said multiplicity of vias have a radius of less than 100 nm.

19. An integrated device according to claim 15, further comprising:
a third layer comprising monocrystalline material and comprising second memory regions,
wherein said second memory regions comprise third transistors, and
wherein at least one of said third transistors substantially overlays one of said horizontally oriented transistors.

20. A mobile phone comprising a semiconductor device according to claim 15.

21. An integrated device, comprising:
a semiconductor substrate comprising first transistors and at least one metal layer providing connection to said transistors,
wherein said metal layer comprises copper or aluminum; and
an overlying layer comprising monocrystalline material overlying said metal layer comprising memory regions,
wherein said memory regions comprise horizontally oriented transistors and at least one via through said overlying layer providing connection between said memory regions and at least one of said first transistors, and
wherein said at least one via has a radius of less than 100 nm.

22. An integrated device according to claim 21, further comprising:
a memory management circuit to extend the proper functionality of said memory regions.

23. An integrated device according to claim 21, wherein said monocrystalline material is less than 100 nm in thickness.

24. An integrated device according to claim 21, further comprising:

a third layer comprising monocrystalline material and comprising second memory regions,
  wherein said second memory regions comprise third transistors, and
  wherein at least one of said third transistors substantially overlays one of said horizontally oriented transistors.

25. A mobile phone comprising a semiconductor device according to claim 21.

* * * * *